US009613704B2

(12) United States Patent
Lee

(10) Patent No.: US 9,613,704 B2
(45) Date of Patent: Apr. 4, 2017

(54) 2D/3D NAND MEMORY ARRAY WITH BIT-LINE HIERARCHICAL STRUCTURE FOR MULTI-PAGE CONCURRENT SLC/MLC PROGRAM AND PROGRAM-VERIFY

(71) Applicant: Aplus Flash Technology, Inc, Fremont, CA (US)

(72) Inventor: Peter Wung Lee, Saratoga, CA (US)

(*) Notice: Subject to any disclaimer, the term of this patent is extended or adjusted under 35 U.S.C. 154(b) by 124 days.

(21) Appl. No.: 14/583,178

(22) Filed: Dec. 25, 2014

(65) Prior Publication Data

US 2015/0179269 A1    Jun. 25, 2015

Related U.S. Application Data

(60) Provisional application No. 61/920,767, filed on Dec. 25, 2013.

(51) Int. Cl.
| | |
|---|---|
| G11C 16/04 | (2006.01) |
| G11C 16/14 | (2006.01) |
| G11C 16/24 | (2006.01) |
| G11C 16/34 | (2006.01) |
| G11C 8/12 | (2006.01) |

(52) U.S. Cl.
CPC .......... G11C 16/14 (2013.01); G11C 8/12 (2013.01); G11C 16/0483 (2013.01); G11C 16/24 (2013.01); G11C 16/3445 (2013.01); G11C 16/3459 (2013.01); G11C 2211/5641 (2013.01)

(58) Field of Classification Search
CPC . G11C 16/10; G11C 16/3459; G11C 16/0483; G11C 16/24; G11C 11/5628; G11C 16/08; G11C 11/4087

USPC ............ 365/185.02–185.03, 185.11–185.13, 365/185.17, 185.25
See application file for complete search history.

(56) References Cited

U.S. PATENT DOCUMENTS

| | | | |
|---|---|---|---|
| 5,734,609 | A | 3/1998 | Choi |
| 5,867,429 | A | 2/1999 | Chen |
| 6,522,580 | B2 | 2/2003 | Chen |
| 6,542,407 | B1 | 4/2003 | Chen |
| 6,657,891 | B1 | 12/2003 | Shibata |
| 6,781,877 | B2 | 8/2004 | Cernea |
| 6,807,095 | B2 | 10/2004 | Chen |
| 6,816,409 | B2 | 11/2004 | Tanaka |
| 6,847,553 | B2 | 1/2005 | Chen |

(Continued)

*Primary Examiner* — David Lam
(74) *Attorney, Agent, or Firm* — Fang Wu

(57) ABSTRACT

This invention discloses 2D or 3D NAND flash array in two-level BL-hierarchical structure with flexible multi-page or random-page-based concurrent, mixed SLC and MLC Read, Program or Program-Verify operations including bit-flipping for each program state or any combinations of above operations. Tracking techniques of self-timed control and algorithm of programming, read and local-bit line (LBL) voltage generations are proposed for enhancing automatic controls over charging and discharging of a plurality of WLs and LBLs in one or more randomly selected Blocks in one or more Segments of one or more Groups in a NAND plane for m-page concurrent operations using Vdd/Vss to Vinh/Vss Program page data conversion, multiple pseudo CACHEs based on LBL capacitors for storing raw SLC and MSB/LSB loaded page data, writing back or reading from Sense-Amplifier, Program/Read Buffer, real CHCHE, and multiple pseudo CACHEs with M-fold reduction in latency and power consumption.

124 Claims, 42 Drawing Sheets

(56) References Cited

U.S. PATENT DOCUMENTS

| | | |
|---|---|---|
| 6,870,768 B2 | 3/2005 | Cernea |
| 6,888,758 B1 | 5/2005 | Hemink |
| 6,917,542 B2 | 7/2005 | Chen |
| 7,023,735 B2 | 4/2006 | Ban |
| 7,046,548 B2 | 5/2006 | Cernea |
| 7,061,798 B2 | 6/2006 | Chen |
| 7,102,924 B2 | 9/2006 | Chen |
| 7,187,585 B2 | 3/2007 | Li |
| 7,196,928 B2 | 3/2007 | Chen |
| 7,224,613 B2 | 5/2007 | Chen |
| 7,289,344 B2 | 10/2007 | Chen |
| 7,301,808 B2 | 11/2007 | Li |
| 7,301,813 B2 | 11/2007 | Chen |
| 7,301,839 B2 | 11/2007 | Li |
| 7,315,477 B2 | 1/2008 | Chen |
| 7,321,510 B2 | 1/2008 | Li |
| 7,372,730 B2 | 5/2008 | Chen |
| 7,397,698 B2 | 7/2008 | Fong |
| 7,443,729 B2 | 10/2008 | Li |
| 7,499,329 B2 | 3/2009 | Nazarian |
| 7,499,338 B2 | 3/2009 | Ito |
| 7,506,113 B2 | 3/2009 | Li |
| 7,522,454 B2 | 4/2009 | Li |
| 7,570,517 B2 | 8/2009 | Kwak et al. |
| 7,652,929 B2 | 1/2010 | Li |
| 7,839,690 B2 | 11/2010 | Lee |
| 7,876,611 B2 | 1/2011 | Dutta |
| 8,036,041 B2 | 10/2011 | Li |
| 8,130,556 B2 | 3/2012 | Lutze |
| 8,148,763 B2 | 4/2012 | Kim |
| 8,189,391 B2 | 5/2012 | Itagaki |
| 8,194,453 B2 | 6/2012 | Maejima |
| 8,203,882 B2 | 6/2012 | Hishida |
| 8,218,348 B2 | 7/2012 | Roohparvar |
| 8,274,823 B2 | 9/2012 | Roohparvar |
| 8,284,606 B2 | 10/2012 | Li |
| 8,284,613 B2 | 10/2012 | Yamada |
| 8,334,551 B2 | 12/2012 | Itagaki |
| 8,335,111 B2 | 12/2012 | Fukuzumi |
| 8,400,826 B2 | 3/2013 | Roohparvar |
| 8,400,839 B2 | 3/2013 | Li |
| 8,437,192 B2 | 5/2013 | Lung |
| 8,446,777 B2 | 5/2013 | Ueno |
| 8,461,000 B2 | 6/2013 | Alsmeier et al. |
| 8,462,559 B2 | 6/2013 | Yamada |
| 8,477,533 B2 | 7/2013 | Kang |
| 8,488,382 B1 | 7/2013 | Li |
| 8,503,230 B2 | 8/2013 | Yoo |
| 8,503,245 B2 | 8/2013 | Yamada |
| 8,526,236 B2 | 9/2013 | Jones |
| 8,559,222 B1 | 10/2013 | Iwai et al. |
| 8,559,236 B2 | 10/2013 | Nakai |
| 8,559,237 B2 * | 10/2013 | Kim ................. G11C 8/08 365/185.17 |
| 8,570,810 B2 | 10/2013 | Fong |
| 8,599,617 B2 | 12/2013 | Shiino |
| 8,605,503 B2 | 12/2013 | Futatsuyama |
| 8,605,511 B2 | 12/2013 | Tanaka |
| 8,619,468 B2 | 12/2013 | Shibata |
| 8,625,356 B2 | 1/2014 | Shibata |
| 8,625,357 B2 | 1/2014 | Cho |
| 8,625,359 B2 | 1/2014 | Jeon |
| 8,630,115 B2 | 1/2014 | Pascucci |
| 8,630,116 B2 | 1/2014 | Maejima |
| 8,634,251 B2 | 1/2014 | Chung |
| 8,637,915 B2 | 1/2014 | Ichige |
| 8,638,608 B2 | 1/2014 | Lai |
| 8,638,609 B2 | 1/2014 | Lin |
| 8,644,081 B2 | 2/2014 | Chang |
| 8,654,585 B2 | 2/2014 | Oh |
| 8,654,588 B2 | 2/2014 | Aritome |
| 8,659,951 B2 | 2/2014 | Nawata |
| 8,661,294 B2 | 2/2014 | Lee |
| 8,665,649 B2 | 3/2014 | Park |
| 8,670,272 B2 | 3/2014 | Radke |
| 8,675,416 B2 | 3/2014 | Lee |
| 8,681,543 B2 | 3/2014 | Jang |
| 8,681,545 B2 | 3/2014 | Kim et al. |
| 8,681,563 B1 | 3/2014 | Lee |
| 8,687,430 B2 | 4/2014 | Sarin et al. |
| 8,687,431 B2 | 4/2014 | Sarin |
| 8,694,720 B2 | 4/2014 | Lee |
| 8,694,766 B2 | 4/2014 | Toelkes |
| 8,700,879 B2 | 4/2014 | Porzio |
| 8,705,277 B2 | 4/2014 | Moschiano et al. |
| 8,705,290 B2 | 4/2014 | Damle |
| 8,705,293 B2 | 4/2014 | She |
| 8,711,621 B2 | 4/2014 | Kim |
| 8,711,624 B2 | 4/2014 | Choi |
| 8,717,819 B2 | 5/2014 | Aritome |
| 8,730,733 B2 | 5/2014 | Youn |
| 8,737,140 B2 | 5/2014 | Kim |
| 8,755,224 B2 | 6/2014 | Yun |
| 8,773,910 B2 | 7/2014 | Jones |
| 8,773,911 B2 | 7/2014 | Park |
| 8,893,247 B1 | 11/2014 | Faaborg |

* cited by examiner

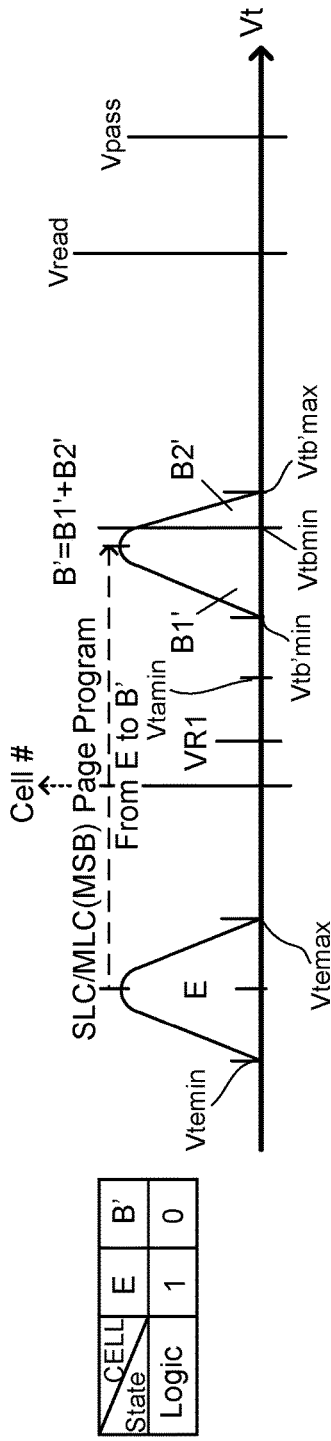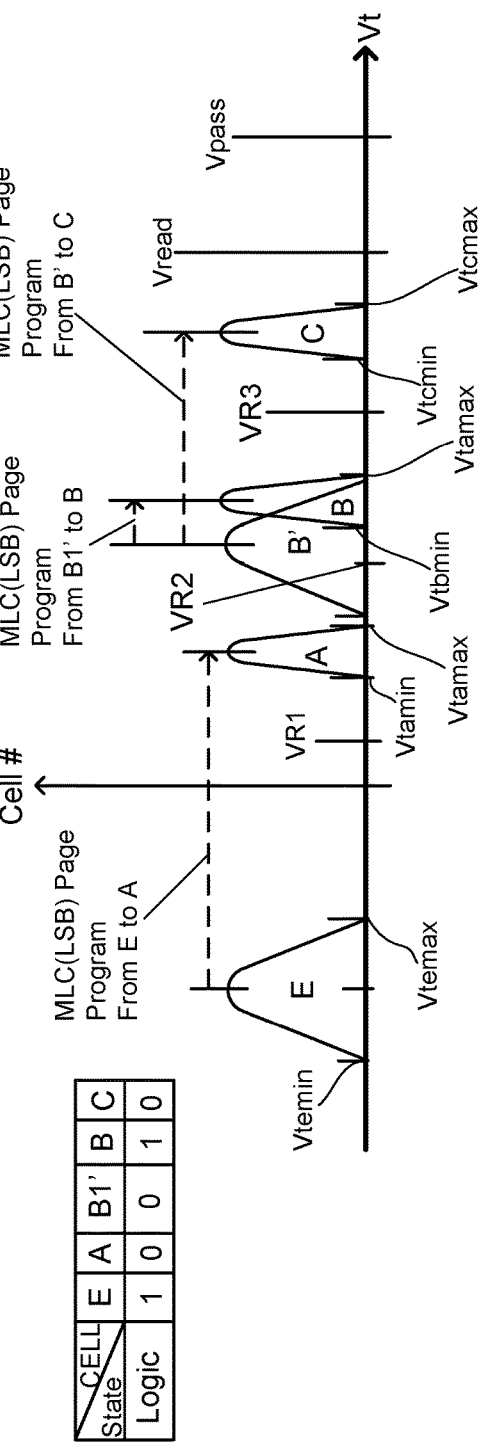
FIG. 4

MLC(LSB Page) m-page Data Loading & B'-Adjustment Methodology

Note:
0=Vss; V1=Vdd,
H1=Vinh+Vtn, V2=Vinh
1) Precharge all CACHE(cel, int, msb, & lsb)
2) Discharge CACHE(cel & int) at s-WL=Vtamin
3) Discharge CACHEcel at s-WL=Vtbmin
4) LD/LT Cache Register data to CACHElsb
5) Charge sharing CACHEint to Multiplier (MSB)
6) LD/LT Sense Amplifier data to CACHEmsb (MSB)
7) Charge sharing CACHEcel to Multiplier (B' state)
8) Precharge CACHEcel and CACHEint
9) LD/LT P/RB data to CACHEcel and CACHEint

| 1  | 2  | 3  | 4e | 4o | 5e | 5o | 6e | 6o | 7e | 7o | 8e | 8o | 9e | 9o |
|----|----|----|----|----|----|----|----|----|----|----|----|----|----|----|
| 0  | 0  | 0  | 0  | 0  | 0  | 0  | 0  | 0  | H1 | 0  | 0  | 0  | V1 | 0  |
| 0  | 0  | 0  | 0  | 0  | 0  | 0  | 0  | 0  | 0  | H1 | 0  | 0  | 0  | V1 |
| H1 | 0  | 0  | 0  | 0  | 0  | 0  | 0  | 0  | 0  | 0  | H1 | 0  | 0  | 0  |
| H1 | 0  | 0  | 0  | 0  | 0  | 0  | 0  | 0  | 0  | 0  | 0  | H1 | 0  | 0  |
| V2 | 0  | 0  | 0  | 0  | 0  | 0  | 0  | 0  | 0  | 0  | V2 | V2 | 0  | 0  |
| 0  | H1 | 0  | 0  | 0  | 0  | 0  | 0  | 0  | 0  | 0  | 0  | 0  | 0  | 0  |
| 0  | 0  | 0  | 0  | 0  | 0  | 0  | 0  | 0  | 0  | 0  | V2 | V2 | 0  | 0  |
| H1 | 0  | 0  | 0  | 0  | 0  | 0  | 0  | 0  | 0  | 0  | 0  | H1 | 0  | 0  |
| H1 | 0  | 0  | 0  | 0  | 0  | 0  | 0  | 0  | 0  | 0  | H1 | 0  | 0  | 0  |
| 0  | 0  | 0  | 0  | 0  | 0  | H1 | 0  | 0  | 0  | 0  | 0  | 0  | 0  | V1 |
| 0  | 0  | 0  | 0  | 0  | H1 | 0  | 0  | 0  | 0  | 0  | 0  | 0  | V1 | 0  |
| 0  | 0  | 0  | V1 | 0  | 0  | 0  | 0  | 0  | 0  | 0  | 0  | 0  | 0  | 0  |
| 0  | 0  | 0  | 0  | V1 | 0  | 0  | 0  | 0  | 0  | 0  | 0  | 0  | 0  | 0  |
| H1 | 0  | 0  | 0  | 0  | 0  | 0  | 0  | 0  | 0  | 0  | 0  | 0  | 0  | 0  |
| H1 | 0  | 0  | 0  | 0  | 0  | 0  | 0  | 0  | 0  | 0  | 0  | 0  | 0  | 0  |
| V2 | 0  | 0  | 0  | 0  | 0  | 0  | 0  | 0  | 0  | 0  | 0  | 0  | 0  | 0  |
| 0  | 0  | 0  | 0  | 0  | 0  | 0  | 0  | 0  | 0  | 0  | 0  | 0  | 0  | 0  |
| V2 | 0  | 0  | 0  | 0  | 0  | 0  | 0  | 0  | 0  | 0  | 0  | 0  | 0  | 0  |
| H1 | 0  | 0  | 0  | 0  | 0  | 0  | 0  | 0  | 0  | 0  | 0  | 0  | 0  | 0  |
| H1 | 0  | 0  | 0  | 0  | 0  | 0  | 0  | 0  | 0  | 0  | 0  | 0  | 0  | 0  |
| 0  | 0  | 0  | 0  | 0  | 0  | 0  | 0  | V1 | 0  | 0  | 0  | 0  | 0  | 0  |
| 0  | 0  | 0  | 0  | 0  | 0  | 0  | V1 | 0  | 0  | 0  | 0  | 0  | 0  | 0  |

Continue to next page

FIG. 7A

MLC(LSB Page) m-page A-state PGM-VFY Methodology

Note:
0=Vss; V1=Vdd,
H1=Vinh+Vtn, V2=Vinh
1) Precharge CACHEcel
2) Discharge CACHEcel at s-WL=Vtamin
3) Charge sharing CACHEint to Multiplier (updated PGM patterns)
4) Charge sharing CACHEmsb to Multiplier (MSB)
5) Precharge CACHEmsb
6) LD/LT Sense Amplifier data to CACHEmsb (MSB)
7) Charge sharing CACHEcel to Multiplier (A state)
8) Precharge CACHEcel and CACHEint
9) LD/LT P/RB data to CACHEcel and CACHEint

| 1 | 2 | 3e | 3o | 4e | 4o | 5e | 5o | 6e | 6o | 7e | 7o | 8e | 8o | 9e | 9o |
|---|---|----|----|----|----|----|----|----|----|----|----|----|----|----|----|
| 0 | 0 | 0  | 0  | 0  | 0  | 0  | 0  | 0  | 0  | H1 | 0  | 0  | 0  | V1 | 0  |
| 0 | 0 | 0  | 0  | 0  | 0  | 0  | 0  | 0  | 0  | 0  | H1 | 0  | 0  | 0  | V1 |
|   |   |    |    |    |    |    |    |    |    |    |    |    |    |    |    |
| H1| 0 | 0  | 0  | 0  | 0  | 0  | 0  | 0  | 0  | 0  | 0  | H1 | 0  | 0  | 0  |
| H1| 0 | 0  | 0  | 0  | 0  | 0  | 0  | 0  | 0  | 0  | 0  | 0  | H1 | 0  | 0  |
| V2| 0 | 0  | 0  | 0  | 0  | 0  | 0  | 0  | 0  | 0  | 0  | V2 | V2 | 0  | 0  |
| 0 | 0 | 0  | 0  | 0  | 0  | 0  | 0  | 0  | 0  | 0  | 0  | 0  | 0  | 0  | 0  |
| 0 | 0 | 0  | 0  | 0  | 0  | 0  | 0  | 0  | 0  | 0  | 0  | V2 | V2 | 0  | 0  |
| H1| 0 | 0  | 0  | 0  | 0  | 0  | 0  | 0  | 0  | 0  | 0  | 0  | H1 | 0  | 0  |
| H1| 0 | 0  | 0  | 0  | 0  | 0  | 0  | 0  | 0  | 0  | 0  | H1 | 0  | 0  | 0  |
|   |   |    |    |    |    |    |    |    |    |    |    |    |    |    |    |
| 0 | 0 | 0  | H1 | 0  | 0  | 0  | 0  | 0  | 0  | 0  | 0  | 0  | 0  | 0  | V1 |
| 0 | 0 | H1 | 0  | 0  | 0  | 0  | 0  | 0  | 0  | 0  | 0  | 0  | 0  | V1 | 0  |
| 0 | 0 | 0  | 0  | 0  | 0  | 0  | 0  | 0  | 0  | 0  | 0  | 0  | 0  | 0  | 0  |
| 0 | 0 | 0  | 0  | 0  | 0  | 0  | 0  | 0  | 0  | 0  | 0  | 0  | 0  | 0  | 0  |
|   |   |    |    |    |    |    |    |    |    |    |    |    |    |    |    |
| 0 | 0 | 0  | 0  | 0  | 0  | 0  | 0  | 0  | 0  | 0  | 0  | 0  | 0  | 0  | 0  |
| 0 | 0 | 0  | 0  | 0  | 0  | 0  | 0  | 0  | 0  | 0  | 0  | 0  | 0  | 0  | 0  |
| 0 | 0 | 0  | 0  | 0  | 0  | 0  | 0  | 0  | 0  | 0  | 0  | 0  | 0  | 0  | 0  |
| 0 | 0 | 0  | 0  | 0  | 0  | 0  | 0  | 0  | 0  | 0  | 0  | 0  | 0  | 0  | 0  |
| 0 | 0 | 0  | 0  | 0  | 0  | V2 | V2 | 0  | 0  | 0  | 0  | 0  | 0  | 0  | 0  |
| 0 | 0 | 0  | 0  | 0  | 0  | 0  | H1 | 0  | 0  | 0  | 0  | 0  | 0  | 0  | 0  |
| 0 | 0 | 0  | 0  | 0  | 0  | H1 | 0  | 0  | 0  | 0  | 0  | 0  | 0  | 0  | 0  |
|   |   |    |    |    |    |    |    |    |    |    |    |    |    |    |    |
| 0 | 0 | 0  | 0  | 0  | H1 | 0  | 0  | 0  | V1 | 0  | 0  | 0  | 0  | 0  | 0  |
| 0 | 0 | 0  | 0  | H1 | 0  | 0  | 0  | V1 | 0  | 0  | 0  | 0  | 0  | 0  | 0  |

(Continue to next page)

FIG. 7B

MLC(LSB Page) m-page B-state PGM-VFY Methodology

Note:
0=Vss; V1=Vdd,
H1=Vinh+Vtn, V2=Vinh
1) Precharge CACHEcel
2) Discharge CACHEcel at s-WL=Vtamin
3) Charge sharing CACHEint to Multiplier (updated PGM patterns)
4) Charge sharing CACHElsb to Multiplier (LSB)
5) Precharge CACHElsb
6) LD/LT Sense Amplifier data to CACHEmsb (LSB)
7) Charge sharing CACHEcel to Multiplier (B state)
8) Precharge CACHEcel and CACHEint
9) LD/LT P/RB data to CACHEcel and CACHEint

| 1 | 2 | 3e | 3o | 4e | 4o | 5e | 5o | 6e | 6o | 7e | 7o | 8e | 8o | 9e | 9o |
|---|---|---|---|---|---|---|---|---|---|---|---|---|---|---|---|
| 0 | 0 | 0 | 0 | 0 | 0 | 0 | 0 | 0 | 0 | H1 | 0 | 0 | 0 | V1 | 0 |
| 0 | 0 | 0 | 0 | 0 | 0 | 0 | 0 | 0 | 0 | 0 | H1 | 0 | 0 | 0 | V1 |
|  |  |  |  |  |  |  |  |  |  |  |  |  |  |  |  |
| H1 | 0 | 0 | 0 | 0 | 0 | 0 | 0 | 0 | 0 | 0 | 0 | H1 | 0 | 0 | 0 |
| H1 | 0 | 0 | 0 | 0 | 0 | 0 | 0 | 0 | 0 | 0 | 0 | 0 | H1 | 0 | 0 |
| V2 | 0 | 0 | 0 | 0 | 0 | 0 | 0 | 0 | 0 | 0 | 0 | V2 | V2 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | V2 | V2 | 0 | 0 |
| 0 | 0 | 0 | 0 | 0 | 0 | 0 | 0 | 0 | 0 | 0 | 0 | 0 | H1 | 0 | 0 |
| 0 | 0 | 0 | 0 | 0 | 0 | 0 | 0 | 0 | 0 | 0 | 0 | H1 | 0 | 0 | 0 |
| 0 | 0 | 0 | 0 | 0 | 0 | 0 | 0 | 0 | 0 | 0 | 0 | H1 | 0 | 0 | 0 |
|  |  |  |  |  |  |  |  |  |  |  |  |  |  |  |  |
| 0 | 0 | 0 | H1 | 0 | 0 | 0 | 0 | 0 | 0 | 0 | 0 | 0 | 0 | 0 | V1 |
| 0 | 0 | H1 | 0 | 0 | 0 | 0 | 0 | 0 | 0 | 0 | 0 | 0 | 0 | V1 | 0 |
| 0 | 0 | 0 | 0 | 0 | 0 | 0 | 0 | V1 | 0 | 0 | 0 | 0 | 0 | 0 | 0 |
| 0 | 0 | 0 | 0 | 0 | 0 | 0 | 0 | 0 | V1 | 0 | 0 | 0 | 0 | 0 | 0 |
|  |  |  |  |  |  |  |  |  |  |  |  |  |  |  |  |
| 0 | 0 | 0 | 0 | H1 | 0 | H1 | 0 | 0 | 0 | 0 | 0 | 0 | 0 | 0 | 0 |
| 0 | 0 | 0 | 0 | 0 | H1 | 0 | H1 | 0 | 0 | 0 | 0 | 0 | 0 | 0 | 0 |
| 0 | 0 | 0 | 0 | 0 | 0 | V2 | V2 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |
|  |  |  |  |  |  |  |  |  |  |  |  |  |  |  |  |
| 0 | 0 | 0 | 0 | 0 | 0 | 0 | 0 | 0 | 0 | 0 | 0 | 0 | 0 | 0 | 0 |
| 0 | 0 | 0 | 0 | 0 | 0 | 0 | 0 | 0 | 0 | 0 | 0 | 0 | 0 | 0 | 0 |

FIG. 7C

MLC(LSB Page) m-page C-state PGM-VFY Methodology

Note:
0=Vss; V1=Vdd,
H1=Vinh+Vtn, V2=Vinh
1) Precharge CACHEcel
2) Discharge CACHEcel at s-WL=Vtamin
3) Charge sharing CACHEint to Multiplier (updated PGM patterns)
4) Charge sharing CACHEcel to Multiplier (C state)
5) Precharge CACHEcel and CACHEint
6) LD/LT P/RB data to CACHEcel and CACHEint

| 1  | 2 | 3e | 3o | 4e | 4o | 5e | 5o | 6e | 6o |
|----|---|----|----|----|----|----|----|----|----|
| 0  | 0 | 0  | 0  | H1 | 0  | 0  | 0  | V1 | 0  |
| 0  | 0 | 0  | 0  | 0  | H1 | 0  | 0  | 0  | V1 |
|    |   |    |    |    |    |    |    |    |    |
| H1 | 0 | 0  | 0  | 0  | 0  | H1 | 0  | 0  | 0  |
| H1 | 0 | 0  | 0  | 0  | 0  | 0  | H1 | 0  | 0  |
| V2 | 0 | 0  | 0  | 0  | 0  | V2 | V2 | 0  | 0  |
| 0  | 0 | 0  | 0  | 0  | 0  | 0  | 0  | 0  | 0  |
| 0  | 0 | 0  | 0  | 0  | 0  | V2 | V2 | 0  | 0  |
| 0  | 0 | 0  | 0  | 0  | 0  | 0  | H1 | 0  | 0  |
| 0  | 0 | 0  | 0  | 0  | 0  | H1 | 0  | 0  | 0  |
|    |   |    |    |    |    |    |    |    |    |
| 0  | 0 | 0  | H1 | 0  | 0  | 0  | 0  | 0  | V1 |
| 0  | 0 | H1 | 0  | 0  | 0  | 0  | 0  | V1 | 0  |
| 0  | 0 | 0  | 0  | 0  | 0  | 0  | 0  | 0  | 0  |
| 0  | 0 | 0  | 0  | 0  | 0  | 0  | 0  | 0  | 0  |
|    |   |    |    |    |    |    |    |    |    |
| 0  | 0 | 0  | 0  | 0  | 0  | 0  | 0  | 0  | 0  |
| 0  | 0 | 0  | 0  | 0  | 0  | 0  | 0  | 0  | 0  |
| 0  | 0 | 0  | 0  | 0  | 0  | 0  | 0  | 0  | 0  |
| 0  | 0 | 0  | 0  | 0  | 0  | 0  | 0  | 0  | 0  |
| 0  | 0 | 0  | 0  | 0  | 0  | 0  | 0  | 0  | 0  |
| 0  | 0 | 0  | 0  | 0  | 0  | 0  | 0  | 0  | 0  |
|    |   |    |    |    |    |    |    |    |    |
| 0  | 0 | 0  | 0  | 0  | 0  | 0  | 0  | 0  | 0  |
| 0  | 0 | 0  | 0  | 0  | 0  | 0  | 0  | 0  | 0  |

Continue to next page

FIG. 7D

LSB data B' adjustment in even page

| MLC Cell / Logic State | @SA | | | | | @P/RB | | | | |
|---|---|---|---|---|---|---|---|---|---|---|
| | E | A | B1' | B2' | C | E | A | B1' | B2' | C |
| Load LSB data from I/O to CR (step 441) | X | X | X | X | X | X | X | X | X | X |
| LD/LT LSB data from CR to CACHElsb (step 445) | 1 | 0 | 1 | 1 | 0 | X | X | X | X | X |
| Load LSB data from CR to P/RB via SA (steps 446~448) | 1 | 0 | 1 | 1 | 0 | 1 | 0 | 1 | 1 | 0 |
| Read MSB data from cell (steps 434,435,449) | 0 | 0 | 1 | 1 | 1 | 1 | 0 | 1 | 1 | 0 |
| LD/LT MSB data from SA to CACHEmsb by WRT2 (step 445) | 0 | 0 | 1 | 1 | 1 | 1 | 0 | 1 | 1 | 0 |
| Adjust LSB data of B1'/B2' to 0 (step 451) | 1 | 1 | 0 | 0 | 0 | 1 | 0 | 0 | 0 | 0 |
| Final LSB adjusted data LD/LT to CACHEcel & CACHEint (steps 452~455) | 0 | 0 | 0 | 1 | 1 | 1 | 0 | 0 | 1 | 0 |

SLC m-page Read Methodology

Note:
0=Vss; V1=Vdd;
H1=Vinh+Vtn; V2=Vinh;
1) Precharge CACHEcel
2) Discharge CACHEcel
at s-WL=VR1
3) Charge sharing
CACHEcel to Multiplier
(sensed E/B' state)

| 1 | 2 | 3e | 3o |
|---|---|----|----|
| 0 | 0 | H1 | 0 |
| 0 | 0 | 0 | H1 |
| | | | |
| H1 | 0 | 0 | 0 |
| H1 | 0 | 0 | 0 |
| V2 | 0 | 0 | 0 |
| 0 | 0 | 0 | 0 |
| V2 | 0 | 0 | 0 |
| 0 | 0 | 0 | 0 |
| 0 | 0 | 0 | 0 |
| | | | |
| 0 | 0 | 0 | 0 |
| 0 | 0 | 0 | 0 |
| 0 | 0 | 0 | 0 |
| 0 | 0 | 0 | 0 |
| | | | |
| 0 | 0 | 0 | 0 |
| 0 | 0 | 0 | 0 |
| 0 | 0 | 0 | 0 |
| 0 | 0 | 0 | 0 |
| 0 | 0 | 0 | 0 |
| 0 | 0 | 0 | 0 |
| 0 | 0 | 0 | 0 |
| | | | |
| 0 | 0 | 0 | 0 |
| 0 | 0 | 0 | 0 |

Continue to next page

FIG. 8A

MLC(MSB Page) m-page Read Methodology @ Flag Cell=1

Note:
0=Vss; V1=Vdd;
H1=Vinh+Vtn; V2=Vinh;
1) Precharge CACHEcel, CACHEint, and CACHEmsb
2) Discharge CACHEcel & CACHEint at s-WL=VR1
3) Discharge CACHEcel at s-WL=VR2
4) Charge sharing CACHEcel to Multiplier (sensed data at VR2)
5) Charge sharing CACHEint to Multiplier (sensed data at VR1)

| 1 | 2 | 3e | 3o | 4e | 4o | 5e | 5o |
|---|---|----|----|----|----|----|----|
| 0 | 0 | 0  | 0  | H1 | 0  | 0  | 0  |
| 0 | 0 | 0  | 0  | 0  | H1 | 0  | 0  |
|   |   |    |    |    |    |    |    |
| H1| 0 | 0  | 0  | 0  | 0  | 0  | 0  |
| H1| 0 | 0  | 0  | 0  | 0  | 0  | 0  |
| V2| 0 | 0  | 0  | 0  | 0  | 0  | 0  |
| 0 | H1| 0  | 0  | 0  | 0  | 0  | 0  |
| V2| 0 | 0  | 0  | 0  | 0  | 0  | 0  |
| H1| 0 | 0  | 0  | 0  | 0  | 0  | H1 |
| H1| 0 | 0  | 0  | 0  | 0  | H1 | 0  |
|   |   |    |    |    |    |    |    |
| 0 | 0 | 0  | 0  | 0  | 0  | 0  | 0  |
| 0 | 0 | 0  | 0  | 0  | 0  | 0  | 0  |
| 0 | 0 | 0  | 0  | 0  | 0  | 0  | 0  |
| 0 | 0 | 0  | 0  | 0  | 0  | 0  | 0  |
|   |   |    |    |    |    |    |    |
| 0 | 0 | 0  | 0  | 0  | 0  | 0  | 0  |
| 0 | 0 | 0  | 0  | 0  | 0  | 0  | 0  |
| 0 | 0 | 0  | 0  | 0  | 0  | 0  | 0  |
| 0 | 0 | 0  | 0  | 0  | 0  | 0  | 0  |
| V2| 0 | 0  | 0  | 0  | 0  | 0  | 0  |
| H1| 0 | 0  | 0  | 0  | 0  | 0  | 0  |
| H1| 0 | 0  | 0  | 0  | 0  | 0  | 0  |
|   |   |    |    |    |    |    |    |
| 0 | 0 | 0  | 0  | 0  | 0  | 0  | 0  |
| 0 | 0 | 0  | 0  | 0  | 0  | 0  | 0  |

(Continue to next page)

FIG. 8B

MLC(MSB/LSB Page) m-page Read Methodology @ Flag Cell=0

Note:
0=Vss; V1=Vdd;
H1=Vinh+Vtn; V2=Vinh;
1) Precharge CACHEcel, CACHEint, and CACHEmsb
2) Discharge CACHEcel CACHEint at s-WL=VR1
3) Discharge CACHEcel at s-WL=VR2
4) Charge sharing CACHEcel to Multiplier (sensed data at VR2)
5) LD/LT SA data to CACHEmsb (MSB)
6) Precharge CACHEcel
7) Discharge CACHEcel at s-WL=VR3
8) Charge sharing CACHEint to Multiplier (sensed data at VR1)
9) Charge sharing CACHmsb to Multiplier (sensed data at VR2)
10) Charge sharing CACHEcel to Multiplier (sensed data at VR3)

| 1 | 2 | 3 | 4e | 4o | 5e | 5o | 6 | 7 | 8e | 8o | 9e | 9o | 10e | 10o |
|---|---|---|----|----|----|----|---|---|----|----|----|----|-----|-----|
| 0 | 0 | 0 | H1 | 0  | 0  | 0  | 0 | 0 | 0  | 0  | 0  | 0  | H1  | 0   |
| 0 | 0 | 0 | 0  | H1 | 0  | 0  | 0 | 0 | 0  | 0  | 0  | 0  | 0   | H1  |
|   |   |   |    |    |    |    |   |   |    |    |    |    |     |     |
| H1| 0 | 0 | 0  | 0  | 0  | 0  | H1| 0 | 0  | 0  | 0  | 0  | 0   | 0   |
| H1| 0 | 0 | 0  | 0  | 0  | 0  | H1| 0 | 0  | 0  | 0  | 0  | 0   | 0   |
| V2| 0 | 0 | 0  | 0  | 0  | 0  | V2| 0 | 0  | 0  | 0  | 0  | 0   | 0   |
| 0 | H1| 0 | 0  | 0  | 0  | 0  | 0 | 0 | 0  | 0  | 0  | 0  | 0   | 0   |
| V2| 0 | 0 | 0  | 0  | 0  | 0  | 0 | 0 | 0  | 0  | 0  | 0  | 0   | 0   |
| H1| 0 | 0 | 0  | 0  | 0  | 0  | 0 | 0 | 0  | 0  | 0  | 0  | 0   | 0   |
| H1| 0 | 0 | 0  | 0  | 0  | 0  | 0 | 0 | 0  | 0  | 0  | 0  | 0   | 0   |
|   |   |   |    |    |    |    |   |   |    |    |    |    |     |     |
| 0 | 0 | 0 | 0  | 0  | 0  | 0  | 0 | 0 | H1 | 0  | 0  | 0  | 0   | 0   |
| 0 | 0 | 0 | 0  | 0  | 0  | 0  | 0 | 0 | 0  | H1 | 0  | 0  | 0   | 0   |
| 0 | 0 | 0 | 0  | 0  | 0  | 0  | 0 | 0 | 0  | 0  | 0  | 0  | 0   | 0   |
| 0 | 0 | 0 | 0  | 0  | 0  | 0  | 0 | 0 | 0  | 0  | 0  | 0  | 0   | 0   |
|   |   |   |    |    |    |    |   |   |    |    |    |    |     |     |
| 0 | 0 | 0 | 0  | 0  | 0  | 0  | 0 | 0 | 0  | 0  | 0  | 0  | 0   | 0   |
| 0 | 0 | 0 | 0  | 0  | 0  | 0  | 0 | 0 | 0  | 0  | 0  | 0  | 0   | 0   |
| 0 | 0 | 0 | 0  | 0  | 0  | 0  | 0 | 0 | 0  | 0  | 0  | 0  | 0   | 0   |
| 0 | 0 | 0 | 0  | 0  | 0  | 0  | 0 | 0 | 0  | 0  | 0  | 0  | 0   | 0   |
| V2| 0 | 0 | 0  | 0  | 0  | 0  | 0 | 0 | 0  | 0  | 0  | 0  | 0   | 0   |
| H1| 0 | 0 | 0  | 0  | 0  | 0  | 0 | 0 | 0  | 0  | 0  | 0  | 0   | 0   |
| H1| 0 | 0 | 0  | 0  | 0  | 0  | 0 | 0 | 0  | 0  | 0  | 0  | 0   | 0   |
|   |   |   |    |    |    |    |   |   |    |    |    |    |     |     |
| 0 | 0 | 0 | 0  | 0  | V1 | 0  | 0 | 0 | 0  | 0  | 0  | H1 | 0   | 0   |
| 0 | 0 | 0 | 0  | 0  | V1 | 0  | 0 | 0 | 0  | 0  | H1 | 0  | 0   | 0   |

(Continue to next page)

FIG. 8C

MLC Read of Even Page (Flag Cell = 0)

| MLC Cell / Logic State | @ SA | | | | @ P/RB | | | |
|---|---|---|---|---|---|---|---|---|
| | E | A | B | C | E | A | B | C |
| Discharge E cell in CACHEint by VR1 (steps: 825~826) | X | X | X | X | X | X | X | X |
| Discharge E/A cell in CACHEcel by VR2 (steps: 829~830) | X | X | X | X | X | X | X | X |
| Read MSB data from SA to IO Via CR (steps: 832, 851~856) | 0 | 0 | 1 | 1 | X | X | X | X |
| LD/LT MSB status to CACHEmsb (step 850) | 0 | 0 | 1 | 1 | X | X | X | X |
| Discharge E/A/B cell in CACHEcel by VR3 (steps: 863~864) | 0 | 0 | 1 | 1 | X | X | X | X |
| Restore data of VR1 read from CACHEint to P/RB (steps: 865~866) | 0 | 1 | 1 | 1 | 0 | 1 | 1 | 1 |
| Restore data of VR2 read from CACHEmsb to SA (step 867) | 1 | 1 | 0 | 0 | 0 | 1 | 1 | 1 |
| Store MSB data to CAP1 & CAP2 (step 868) | 1 | 1 | 0 | 0 | 0 | 1 | 1 | 1 |
| Restore data of VR3 read from CACHEcel to SA (step 869) | 0 | 0 | 0 | 1 | 0 | 1 | 1 | 1 |
| Flip B state cell in P/RB (step 870) | 0 | 0 | 0 | 1 | 0 | 1 | 0 | 1 |
| Read LSB data from P/RB to IO Via CR (steps: 871~876, 880) | 0 | 0 | 0 | 1 | 0 | 1 | 0 | 1 |

FIG. 8H

2D/3D NAND MEMORY ARRAY WITH BIT-LINE HIERARCHICAL STRUCTURE FOR MULTI-PAGE CONCURRENT SLC/MLC PROGRAM AND PROGRAM-VERIFY

1. CROSS-REFERENCES TO RELATED APPLICATIONS

This application claims priority to U.S. Provisional Application No. 61/920,767, filed Dec. 25, 2013, commonly assigned and incorporated by reference herein for all purposes.

This application is related to U.S. Pat. No. 8,542,535, U.S. Pat. No. 8,542,530, U.S. Pat. No. 8,334,551, U.S. Pat. No. 8,456,918, U.S. Pat. No. 8,407,400, U.S. Pat. No. 8,135,913, and U.S. Pat. No. 8,514,636, incorporated by reference herein for all purposes.

2. BACKGROUND OF THE INVENTION

The present invention generally is directed to a multiple-level or particularly a 2-level metal BL-hierarchical structure for a hybrid NAND array termed as HiNAND2 array.

In conventional NAND array, the main memory organization and its associated DB (Data Buffer), SA (Sense Amplifier), CACHE Buffers Block-decoder, Row and Column decoders are much simpler but less flexibility. As a result, there are more latency and power consumption in all operations and usages. Fundamentally, the conventional NAND array is formed into a simple matrix that comprises 1-level BL structure that comprises a plurality of NAND blocks cascaded and connected by a plurality of long, tight-pitch ($2\lambda$), low-resistance metal1 bit lines (BLs) in parallel in column (y) direction and each block is further made of a plurality of NAND strings cascaded in row (x) direction. The inter-string gate connections in x-direction in a same block are easily made by a plurality of horizontal rows (or pages) using a tight-pitch ($2\lambda$) poly-gate word line (WL).

Typically, each conventional NAND String is made of M NAND cells that are connected in series with one top median-high voltage (MHV) NMOS select transistor and one bottom MHV NMOS select transistor, where M=8, 16, 32, 64, 128 or any arbitrary integer number. The connections of all NAND Strings in each column of a NAND array are made between a long tight-pitch $2\lambda$ metal BL and each N-active drain contact of each NAND string. For a conventional NAND array with 1-level BL scheme including an 8 KB physical page size in x-dimension and 64-cell physical string in y-dimension, there are totally 8 KB metal BLs in one physical page being divided into 4 KB odd-number metal1 BLs for an odd-half page and 4 KB even-number metal BLs for an even-half page with 64 common WLs. Every physical page includes two common string-select gate lines per one 8 KB block formed within a same Triple P-well (TPW) region within a same N-well region on top of a same P-substrate in one physical 2D NAND plane. Note, the 3D NAND may have different number of WLs per block in different P-substrate but have similar 1-level 3D metal BL structure.

In conventional NAND array, the SLC and MLC cells are physically placed in different blocks in either a same plane or different planes. So far, no SLC-page cells and MLC-page cells are physically placed within a single physical NAND block. As NAND manufacturing technology migrates toward extremely dense 10 nm class node, coupling effects of inter-WL and inter-BL cells become very severe to interfere the cell threshold level Vt. The degree of BL-BL and WL-WL coupling effects is almost same owing to the identical $1\lambda$ physical spacing. As a result, the NAND data quality and reliability are seriously degraded and require more sophisticated ECC algorithm and techniques applied on-chip or off-chip to correct the rising error bits. In the present application, BL-BL coupling effect will not be addressed here. This WL-WL coupling interfere effect is getting worse when all NAND cells of adjacent WLs within the same block are utilized to store same 4 MLC states. These WLs are referred as MLC-WL or MLC-page of the present application. The reason of worsen WL-WL interfering effect for a MLC-WL over a SLC-WL is because a 4-Vt MLC-WL cell has two more higher positive-Vt state cells, a B-state and a C-state, than a 2-Vt SLC cell which has only one lower positive-Vt A-state cell. The degree of coupling effect is proportional to the relative cell's Vt difference between any two adjacent cells physically residing on either different WLs but in same BL or different BLs but in same WL.

The higher MLC Vts of B-state and C-state store more electrons in a 2-poly floating-gate NAND cell or in a 1-poly charge-trapping Nitride NAND cell of the selected MLC-page, the more WL-WL coupling interfere effect will be than a SLC cell for storing at lower Vts of E-state and A-state. Thereby, it would result in the selected MLC cells with Vt levels of E-state, A-state, and even B-state being increased more by two MLC's C-state cells from two physically adjacent, top and bottom, MLC-WLs than SLC cells with E-state being increased by two adjacent SLC's B-state cells from two physically adjacent SLC-WLs.

Conventionally, the NAND memory is formed entirely separated as either a MLC NAND or a SLC NAND in separate chip. But due to new NAND application need recently, a hybrid NAND design containing both types of MLC and SLC storages in one die is required. When it comes to a hybrid MLC and SLC NAND design, reliable maintaining both data quality and integrity of SLC and MLC of NAND array in one chip is a big concern. There are many ways to construct this hybrid NAND array in prior art. One example, each physically separate plane of a hybrid NAND array to respectively acts as a big unit to store SLC-only data or MLC-only data. This can be referred as a plane-based hybrid NAND array.

Another example, each physically separate Block of a hybrid NAND plane to respectively acts as a medium unit to store SLC-only data or MLC-only data. This can be referred as a block-based hybrid NAND array. The block that stores SLC data is referred as SLC-block, while the block that stores MLC data is referred as MLC-block.

For above conventional SLC-block, the WL-WL coupling effects from two adjacent WLs is less severe, thus the cell data quality and integrity of each SLC-block can be reliably maintained. By contrast, the cell quality of each MLC-block is greatly degraded due to much more severe WL-WL coupling effect when the technology migrates to below 20 nm node.

As a result, a conventional hybrid NAND memory inherently provides improved quality of SLC data along with a degraded MLC data, however, MLC data is prone to be corrupted so that a more sophisticated ECC method is required to correct those MLC errors when it happens.

Additionally, the conventional NAND Erase scheme is performed in a unit of a physical block. In other words, all physical WLs' NAND cells in one physical NAND block are getting erased collectively and concurrently. So far, a page-based Erase operation is not allowed, not mentioning a random page-erase operation. This is a tremendous inconvenience of updating file system if only a small size of page change is required. As a result, many unnecessary big-block erase and a plurality of small page programs are disadvantageously performed so that NAND P/E endurance cycles are greatly reduced for both SLC, MLC, TLC and even XLC NAND, regardless of 2D or 3D NAND, or regardless of 2-poly floating-gate NAND or 1-poly charge-trapping Nitride NAND, regardless of PMOS NAND or NMOS NAND.

Typically, the state-of-art 2D NAND cell's Erase operation is performed by using a FN-channel tunneling scheme to decrease cell's Vts from all high programmed positive-Vt states to a low negative-Vt state, regardless of SLC, MLC, TLC, XLC and even Analog storages. As defined in a conventional NAND cell Vt distribution diagram, commonly there is only one negative-Vt state (Vte≤−0.5V) which is termed as E-state with data being set to "1" for all storage types. Similarly, NAND program operation also uses same FN-channel tunneling scheme to increase cell's Vt to multiple higher positive values. The number of the positive values of multiple programmed Vt states is determined by NAND cell's preferred storage type. For example, a SLC-type NAND cell has only one positive programmed Vt state which is referred as A-state with a center value of Vta set to be around 1.0V. For a MLC-type NAND cell, it has three positive programmed states conventionally termed as A-state, B-state, and C-state with a respective Vt center value set as Vta=1.0V, Vtb=2.0V, and Vtc=3.0V. Similarly, a TLC cell has seven positive programmed states, a XLC cell has fifteen positive programmed states and a Analog NAND cell can have up to 255 positive programmed states but with a much narrowly-spaced Vt spacing between any two adjacent programmed states. Typically, a Vt spacing, ΔVt1, between the negative erased state of Vte and next positive programmed state of Vta is much larger than other Vt spacing, ΔVts, between any two higher positive programmed Vt states such as ΔVt2=Vtb−Vta, ΔVt3=Vtc−Vtb, etc. In NAND design with more multiple positive programmed states, it has smaller ΔVt in a nLC NAND cell. As a result, nLC is more prone to data corruption, when n>1 (for MLC, XLC, TLC, etc.).

When performing a page-program operation on a selected page of a state-of-art NAND product, a pre-erase-before-program is required. The first step is to follow a block-erase command to carry out a block-based Erase operation. After a long time of about 2-5 ms erase time, all NANDs' Vts in a selected block that contains the selected page are reset to E-state with Vte below 0V. Even a typical NAND block comprising N physical pages of WLs (N=16, 32, 64, or 128) only needs to change one single page (WL) data, the whole block has to be erased to allow one or even partial WL program.

The final required erase time is heavily depending on NAND cell's storage type, block size, technology node of 2D or 3D NAND flash. Although program time, program gate voltages, and Program-Verify conditions vary with Vt and the storage types of SLC, MLC, TLC, XLC or Analog, the erase time remains the pretty much identical because so far the NAND cell has only one erased state with one erased Vt=Vte. During an Erase operation, the TPW of the selected NAND plane of NAND array has to be coupled with a HV of +20V along with the multiple WLs in one selected erased block coupled to 0V to induce the desired FN-channel tunneling effect to remove the stored electrons out from the floating-gate of 2-poly NAND cells or the Nitride charge-trapping layer in 1-poly SONOS or MONOS NAND cells.

For those cells in the unselected WLs and in the unselected blocks are left in a floating state initially so that when the subsequent voltage rise of the selected TPW to 20V for Erase operation, the unselected floating WLs' voltage would also be coupled up to near 20V so that the voltage drop between the unselected WLs and common TPW would be small. As a result, no FN-tunneling effect would be induced. Thus, the NAND cells' Vts in the unselected blocks in both selected or unselected NAND plane would remain unchanged with a negligible ΔVt.

Since the NAND erase size in spec is performed in unit of Block, but the NAND program size is performed in unit of single page, thus there are many disadvantages in above said Erase-before-Program step, as listed below.

1) Erase-before-Program step reduces NAND's limited P/E endurance cycles:
    Any one page or partial Program operation of NAND requires a Block-erase to reset all NANDs' Vts to Vte of all pages in one selected Block. Even there is only one page to be programmed with a new data, the rest of M−1 WLs in the selected Block need to be reprogrammed back with the old data in the selected erased Block. Therefore an operation of any single page data change in a selected Block, cells in each of M−1 pages suffer unnecessary one erase 20V TPW stress and M−1 page program 20V WL voltage stresses, thus NAND's P/E endurance cycles would be degraded and reduced per each new data change.
2) Erase-before-Program step drastically shorten NAND's life cycle:
    In the state-of-art 2D or 3D NAND spec, the Block-erase time is set to be ~2.5 ms per block. But SLC program time spec is set to be 250 ms. Thus each Block-erase time is about 10-fold of each page-program time. Thus, the lengthy Erase-before-Program operation rather than page-program operation is the speed bottleneck to change NAND data.
3) Block-erase step results in more power consumption than unnecessary page-program:
    In the pre-erase step, a 20V HV has to be coupled to the selected TPW in selected NAND plane. Typically, a whole big NAND array is only being divided into 2 or 4 or 8 planes. Thus even only one NAND plane is selected for Erase, the 20V HV requirement in the selected NAND plane is still consuming huge power because the area of the selected TPW area is still a big parasitic capacitor that needs to be filled up with a 20V by An Erase pump circuit. Although the Block-erase time seems to be same as page-erase, the unnecessary extra program time and power consumption for M−1 pages slows down and degrades overall operation.

Since it is impractical to physically separate the common TPW between any adjacent WLs or BLs without a big penalty in NAND array layout area, the conventional NAND spec only allows the Erase operation to be conducted on a block-based manner, rather than on a page-based manner as the page-program operation.

Conversely, NAND Program operation only applies Vpgm of 20V to a selected WL and Vpass (of 10V) to the remaining M−1 WLs of the selected Block with TPW coupled to Vss. Thus in NAND Program operation, no big TPW disturbance exists at the unselected pages (WLs) and Blocks. Thereby, the NAND Program is performed on page-based manner with a page-program time of approximate 250 μs for a SLC cell as only one programmed A-state is required. For a MLC cell a 3-fold program time of 750 μs is required as three programmed states of A-state, B-state, and C-state are required. Further, the page-program time is proportionally increased even more when programming a TLC-type cell and a XLC-type cell or an Analog cell. Practically, Erase operations in prior art NAND can be randomly and independently executed on single page base. But in reality, due to above said program sequence drawback, typical NAND Erase spec only allows the block-based Erase, no random page-based Erase is allowed.

Moreover, even the spec of Program operation is allowed to be performed in unit of page, the sequence of page-program WL in the selected Block has a stringent restriction. The sequence of NAND's page-program in the erased Block has to start from the first WL nearing the bottom of NAND Strings to the last WL nearing the top of NAND Strings. Usually, the Block size comprises 64 WLs, although other numbers like 32 or 128 physical pages or WLs are also used. The page-program sequence starts from WL0, then WL1, then to last WL63 in a 64-cell NAND strings. A random WL program is prohibited in the conventional NAND array, regardless of SLC or MLC and 2D or 3D type of cells.

One conspicuous reason to prohibit the conventional NAND from providing random page program scheme is because the limitation of all self-boost (SB) Program-Inhibit schemes, regardless of SB, ESB and LSB techniques. A successful random page program operation requires a SB program-inhibit scheme to well boost the channel's initial inhibited voltage of Vdd or Vdd-Vt to more than 7.0V when a selected WL is coupled with a rising Vpgm=20V and the rest of N−1 unselected WLs in the selected block are coupled with a rising Vpass=10V. In a random-page program scenario, it means the unselected N−1 NAND cells in WLn+1 or WLn−1, above or below the selected WLn, may be in the programmed states with Vta, Vtb, and Vtc which are higher than Vte (a negative Vt) state. Then the Vpass coupling from gates of non-selected WLs to channels of non-selected cells would be drastically reduced to 3V. As a consequence, the selected WL coupling of 20V would not be strong enough to boost the channel of selected cell above 7V due to its leakage to the adjacent under-boosted channels of unselected cells in the same NAND string. Thus the program operation may fail and the situation becomes worse if the cells in a same selected WL but in two adjacent BLs are in program state with channel voltage at Vss because the boosted WL voltage of 20V has to boost higher BL voltage coupling BL parasitic capacitance.

But if the program sequence starts from NAND bottom with the unprogrammed NAND cells' Vt in WLn+1 to top WL being still in Vte states, that would maintain a high Vpass coupling ratio to assist Vpgm boosting on the channel of selected cell so that a higher success rate in program-inhibit operation.

For the reasons stated above and strong market demands, it is desirable to provide advanced NAND products for supporting random-page operation along with the page-based Erase operation to avoid the unnecessary Erase and Program operations to those unselected pages or WLs. It is desirable to have new hybrid NAND memory technique to improve MLC data quality. Further it is desired to achieve a faster write operation with a higher P/E endurance cycle and superior NAND data integrity and reliability for a low-current NAND regardless of 2D or 3D NAND, or 1-poly charge-trapping Nitride SONOS or MONOS NAND, or 2-poly floating-gate type NAND for either PMOS or NMOS NAND.

3. BRIEF SUMMARY OF THE INVENTION

The present invention is related to techniques of NAND operations. Particularly, embodiments of a hybrid SLC/MLC NAND scheme can provide not only all conventional operations such as paged-based Read, page-based Program, paged-based Program-Verify but Block-based Erase and Erase-Verify, but also provide novel concurrent multi-page Read, multi-page Program, multi-page Program-Verify, multi-random-page Erase and Erase-Verify on either consolidated or dispersed Blocks as well as mixed page-based and multi-page SLC and MLC operations.

In certain embodiments, the present invention discloses multi-page (m-page), page-based, or mixed SLC and MLC NAND operations that have many advantages over prior-art NAND. These preferred NAND operations include concurrent/pipeline Program, Program-Verify, Erase-Verify and Read, BL-precharge, BL-discharge, WL-precharge, and WL-discharge in all NAND planes as long as no contention happening in BL lines, WLs, and corresponding XT, GSLp, and SSLp bus lines. The XT, GSLp, and SSLp bus lines are the commonly shared row lines for all WLs and two string-select control lines SSLs and GSLs per block. In other words, the subsequently disclosed techniques of the present invention allow the following random SLC, MLC MSB, and MLC LSB operations in all NAND planes simultaneously and independently:

a) Random page-based and m-page Erase in each independent Segment, b) Random page-based and m-page SLC or MLC Program in each independent Segment, c) Random page-based and m-page SLC and MLC Program-Verify in each independent Segment, d) Random page-based and m-page Erase-Verify in each independent Segment, e) Random page-based and m-page SLC and MLC Read in each independent Segment.

f) Self-timed concurrent WL HV voltage and operating time controls. The automatic WL HV voltages include Vpgm, Vpass, and $V_{READ}$ for various operations. The HV time controls include detection, precharge and discharge of WL of specific voltages for varied operations such as Program, Program-Verify, Erase-Verify and Read for NAND.

Note, in the present invention, one option is that a full physical WL page can be divided into N-bit odd ½-page (or simply called odd page) and N-bit even ½-page (or simply called even page) to respectively accommodate for two ½-page N-bit top-level metal2 GBLs but one 1-page 2N-bit lower-level metal1 LBLs in a HiNAND2 array. In another option, a full physical WL page can be divided into first ¼-page, second ¼-page, third ¼-page, and fourth ¼-page to accommodate for a ¼-page, N-bit, metal2 GBL lines but a full-page, 4N-bit, metal1 LBL lines in a HiNAND2 array. The bit number of Data Buffer (DB) is preferably kept the same number of GBL lines to save DB area and have an easier layout between DB and HiNAND2 array in BL areas.

Before undertaking the detailed description below, it is advantageous to set forth definitions of certain words, phrases used throughout this patent application: the terms "include" and "comprise," as well as derivatives thereof, mean inclusion without limitation; the term "or," is inclusive, meaning and/or; the phrase "associated with" as well as derivatives thereof may mean to include, be included within, interconnect with, contain, be contained within, cooperate with, connect to or with, couple to or with, be communicable with, cooperate with, interleave, juxtapose, be proximate to, be bound to or with, have, have a property of, or the like; and the terms of "2D" or "3D" NAND flash means any part or whole of either NMOS or PMOS NAND cell device, component, die or chip made of any varied kinds of twodimension or three-dimension manufacturing process, technology, designs or the like, associated with 2-poly floating-gate or 1-poly charge trapping Nitride layer 3D cell structure; any Vertical-gate or Vertical channel 3D NAND cell structure or the like or the derivatives are included.

Note, the definition of terminology of a "Block" is meant as a "Physical-Block" or "Consolidated Block" in prior-art NAND. In this application "Block-based operation" means "Dispersed Block" or "Logic-Block" which contains selected multiple physical pages or WLs and each page or WL is from a random "Physical-Block" of one random Segment of one random Group in a NAND plane. For example, a conventional Physical-Block definition, a NAND string has M cells connected in series. Then each Physical-Block contains a plurality of M-WL Strings where M=8, 16, 32, 64, 128 or any integer number. During conventional block-erase, all NAND cells in all selected M pages in a single one selected Physical-Block would get erased simultaneously. If M=64, then any WL number ≤63 is not allowed to perform erase operation because the concern of unselected NAND cells data in the non-selected M pages in same Physica-Block would either be unintentionally lost or corrupted due to the severe coupling effect of common P-well being coupled to an HV erase voltage of 20V. This is called a "Consolidated Block" or "Physical-Block" in prior art NAND array and its associated erase set up conditions.

Conversely, a m-page "Block-based" operation of the present invention means operation on one "Logic-Block" that comprises "multiple physical WLs or multiple physical pages" dispersed randomly in multiple Physical-Blocks in multiple physically dispersed Segments of multiple physically dispersed Groups in one NAND plane. Each of the "Multiple", denoted as m, physical WLs or pages is preferably selected from one Physical-Block within one selected Segment to use one Segment $C_{LBL}$ capacitor at a time during a preferred m-page Operation. The m-page operation means "plurality" or "many" selected WLs in m Blocks are selected for concurrent operations such as Read, Program, Program-Verify, Erase-Verify, full-page (full WL) or partial-page (Odd/Even halved, partial interleaved or non-interleaved) $C_{LBL}$ capacitor precharging, discharging, WL precharging and discharging operation. "Concurrent" means more than one WL or page are selected for performing same or different key NAND operations at the same time. "Concurrent" does not means the whole operating duration or interval or period but means that at least in some overlapping time intervals more than one operations are performed in different Segments in a same or different Groups of a same HiNAND plane so that the NAND idle time can be dramatically reduced, thus the NAND storage usage in system can be maximized.

Note, although "Dispersed Block" means "multiple WLs from more than one different Physical Blocks", only one selected WL in one selected Block per one selected Segment is allowed. But one or more Segments can be selected in one Group simultaneously in a NAND plane formed under the HiNAND2 array structure. Note, one selected Block within a Segment of a Group of a plane means one physical NAND Block, rather than multiple. The total number m of selected WLs in the Dispersed Block can be very flexible. Larger number of m is preferred to save more than m-fold reduction in power consumption, latency and operation time for m-page Read, Verify and Program operations. The final m number choice is a tradeoff between performances, power consumption, latency, silicon area, and the extent of circuit complexity implemented by on-chip Controller designs.

Some terminologies defined by the present invention are summarized and explained below (Referring to HiNAND2 of FIG. 1A).

1) Data Buffer (DB): It is used to store single N-bit page data. It is comprised of three circuits with same bit length such as 1-bit Multiplier, 1-bit Latch-type SA and 1-bit Program/Read Buffer (P/RB).
2) P/RB: N-bit Program/Read Buffer
   a) "0" page bit data is to pass Vss to channel of a program cell through each corresponding metal2 GBL and metal1 LBL.
   b) "1" page bit data is to pass Vdd to channel of a program-inhibit cell through each corresponding metal2 GBL and metal1 LBL.
3) N-bit real CACHE Register is made of glue logic circuit to store one inputted N-bit page data for a preferred m-page Program operation.
4) CACHEcel: This is a first 2N-bit pseudo CACHE Register by using 2N metal1 LBL capacitors ($C_{LBL}$) to temporarily store current new page data.
5) CACHEint: This is a second 2N-bit pseudo CACHE Register, paired with CACHEcel, by using 2N metal1 LBL $C_{LBL}$ capacitors to temporarily store last odd-number N-bit and even-number N-bit transient page data.
6) CACHEmsb: This is a third 2N-bit pseudo CACHE Register by using 2N metal1 LBL $C_{LBL}$ capacitors to temporarily store last odd-number N-bit and even-number N-bit MLC's MSB page data.
7) CACHElsb: This is a fourth 2N-bit pseudo CACHE Register, paired with CACHEmsb, by using 2N metal1 LBL $C_{LBL}$ capacitors to temporarily store last odd-number N-bit and even-number N-bit MLC's LSB page data.

Note, each name of above four pseudo CACHE registers is not given to a fixed 2N metal1 capacitor but is used in rotational manner. In other words, the name of CACHEcel is used whenever a selected WL is within it. For example, if the first CACHE has the selected Block that contains the selected WL, then this CACHE is termed as CACHEcel. The second CACHE that is connected to the CACHEcel is preferably termed as CACHEint when a TIE transistor, MLBLb, is used to connect them. But subsequently when a selected WL comes from the second CACHE, CACHEint, then the name of the second CACHE will be changed to CACHEcel and the paired first CACHE should be renamed to CACHEint.

Similarly, the third CACHEmsb and fourth CACHElsb work as a paired CACHEs joined by one TIE transistor, MLBLb, as above the first CACHEcel and the second CACHEint. If one WL in one Block in the third CACHEmsb is selected, then the name of the third CACHEmsb should be turned to the first CACHEcel and the paired fourth CACHElsb will become the second CACHEint. Accordingly, the first CACHEcel will be changed to the third CACHEmsb and the second CACHEint would be changed to the fourth CACHElsb for these rotational names for four selected CACHEs.

In an embodiment, the present invention provides a hybrid HiNAND2 array configured to interleavely mix both MLC-WLs and SLC-WLs in one physical Block so that the severe MLC WL-WL interference coupling effect can be greatly reduced. Each SLC-WL is purposely inserted between two adjacent top and bottom MLC-WLs, vise versa; each MLC-WL is inserted between two physically adjacent top SLC-WL and bottom SLC-WL. In this configuration, no single selected MLC-WL's MLC NAND cells' Vts will suffer the WL-WL coupling effect from two physically adjacent MLC-WLs' MLC NAND cells. Each SLC-WL is used as a WL-buffer between two physically adjacent MLC-WLs.

More specifically, the present invention will disclose a hybrid SLC and MLC HiNAND2 array formed preferably with a physically interleaved SLC-WL and MLC-WL in every NAND Block. For example, if a SLC-WL is formed in every odd WL, then a MLC-WL is preferably formed in every even WL. For a typical 64-cell hybrid HiNAND2 String, the preferred interleaved WL array means it is organized with 32 odd-number SLC-WLs such as SLC-WL1, SLC-WL3, . . . , SLC-WL61, and SLC-WL63 and 32 even-number MLC-WLs such as MLC-WL2, MLC-WL4, . . . , MLC-WL62, and MLC-WL64 or vice versa. The top and bottom string-select transistors are kept same as prior art.

In addition, more advantages are found for the present invention because the circuits of Y-pass of BLs, Drivers of WL voltages, X/Y Decoders, SAs and P/RBs, GBLs and LBLs can be shared in same physical NAND plane. Thus, more flexibility of NAND operations and area reductions can be achieved. As a result, the advantages of the mixed SLC and MLC in NAND can be fully attained without any sacrifice of the array area and NAND data quality and reliability.

Besides the disclosures of above novel 2-level BL-hierarchical architecture with interleaved SLC-WL and MLC-WL in one physical Block, the present invention also discloses many preferred advantageous flexible m-page-based NAND operations to replace the conventional slow single-page-based NAND operations including Program, Read, Program-Verify with a disadvantageous restriction of page-Program sequence that must be performed from NAND String bottom to NAND String top without flexibility.

Each 2N-bit MLC physical page data is divided into 2N-bit MSB logic page data and 2N-bit LSB logic page data, while SLC has only one 2N-bit page data. Therefore, for a hybrid HiNAND2 design with interleaved MLC and SLC WLs, two 2N-bit CACHEcel capacitors are required to store both 2N-bit MSB logic page data and 2N-bit LSB logic page data per one physical WL per one Segment but only one 2N-bit CACHEcel capacitor is required for SLC page data per one Segment.

Note, in the present application, 2N-bit or 8 KB of one full-page of one full physical WL or N-bit or 4 KB terms of one ½-page or one ½ physical WL page are alternately referred in many embodiments shown in following sections of the specification. An 8 KB WL means 8 KB NAND cells are connected to one physical WL without including any extra ECC parity bytes for description simplicity. Moreover, each physical WL length can have smaller numbers of NAND cells such as 4 KB, 2 KB, 1 KB and even 512K. In application, whenever one physical WL's NAND cell number is decreased, the bit number of metal2 GBLs and DB (Data Buffer) are also scaled down as well. As a result, the present invention enables to keep using relaxing layout design rules for metal2 GBLs and GBL-interface pitch issue between the NAND array and DB circuit.

The present invention also provides several preferred HiNAND2 hierarchical arrays that comprise a plurality of pseudo CACHE registers that are made of a plurality of bottom-level metal1 LBLs and top-level metal2 GBLs and the associated peripheral circuits such as DBs that comprise a plurality of Multipliers, SAs, P/RBs, Program-Verify detecting circuit, real CACHE, Block-decoders, Segment-decoders, a Dummy WL charging Vpgm, Vpass, Vread, and discharging Vss voltage detectors, a BL LBLps charging and discharging detector, Power-down detector for latching plurality of BL program page data.

The varied CACHE metal1 $C_{LBL}$ and metal2 $C_{GBL}$ capacitors the novel techniques of LD/LT (Loading and Latching) page data, precharging Vinh Program-Inhibit voltage, and converting Vdd/Vss data pattern to Vinh/Vss together provide the most flexible and reliable Read, Program, and Erase quality with potential up to multiple fold reduction in latency and power-consumption for above preferred M-page concurrent operation. Note, the disclosed circuits, flows and methodologies can be applied to all kinds of NAND flash memories, regardless of 2D or 3D NAND, regardless of 2-poly floating-gate or 1-poly charge-trapping Nitride NAND flash, regardless of PMOS or NMOS NAND flash technology.

According to certain embodiments of the present invention, the preferred low-current FN-channel tunneling scheme is used for both Program and Erase operation. In contrast, both Program and Erase operations of the present invention are preferably performed in unit of both random page and random Block with only restriction at one selected page per one Segment. There is no restriction in Program sequence as the conventional program operation which has to start from bottom of a NAND String to top of NAND String with very limited flexibility. All Read, Program and Erase can be performed in one or more random physical pages in one or more physical Groups with one selected page per one Segment to avoid the undesired contentions in plurality of metal1 LBLs and metal2 GBLs and 64 XTs, 1 SSLp and 1 GSLp bus lines.

According to some aspects of these embodiments of the present invention, the preferred HiNAND2 m-page Program operations, an Erase operation before performing every random page Program is required. In the following summarized inventive objectives of the present invention, the reference is made with respect to the accompanying drawings, flows and tables that form a part hereof, and in which is shown, by way of illustration, specific embodiments in which the disclosure may be practiced. In the drawings, like numerals describe substantially similar components throughout the several views. These embodiments are described in sufficient detail to enable those skilled in regular NAND art to practice the embodiments to capture the foundations of the following claimed objectives. Other embodiments may be utilized and structural, logical, and electrical changes may be made without departing from the scope and objectives of the present disclosure. The following detailed objectives and descriptions, therefore, not to be taken in a limitation sense.

In a specific embodiment, the present invention provides a first option of HiNAND2 array structure as shown in FIG. 1A that is comprised of a plurality of rows and columns with a 2-level metal BL-hierarchical structure. The top-level BL is preferably comprised of J broken 4 k-pitch metal2 GBLs per two HiNAND2 columns, where J is an arbitrary integer with a value more than one, e.g., J≥2. The whole HiNAND2 array in y-direction is being divided into a J Groups such as Group 1 to Group J by using J−1 GBL divided device which is a MHV (~10V) NMOS transistor, MGBL, such as $MGBL_1$ to $MGBL_{J-1}$. Each Group size can be flexibly made to be same or different. The bottom-level BL is comprised of L broken 2λ-pitch metal1 LBLs per one HiNAND22λ-pitch columns, where L is an arbitrary integer greater than one, e.g., L≥2. Each Group is preferably further divided into L/2 pairs of Segments. Each pair of Segments comprises two Segments arranged in BL direction being physically tied by one row of LBL-divided transistors, MLBLb, which can connect or disconnect the two Segments electrically.

Each Segment further includes K Blocks that are connected by one bottom-level metal1 2λ-pitch LBL. Each Block is comprised of 2N NAND Strings cascaded in x-direction (row) and each String is comprised of M NAND cells connected in series with a first BL-select transistor MS and a second SL-selected transistor MG, where M=64 in some examples explained within this application, though other integer is possible. In this HiNAND2 array with N top-level metal2 4λ-pitch GBLs and 2N bottom-level metal1 2λ-pitch LBLs, the preferred minimum DB size is 4 KB with N-bit to accommodate for 4 KB N top-level metal2 GBLs.

In another specific embodiment, the present invention provides a second option of a HiNAND2 array structure that is comprised of a plurality of rows and columns with same total memory bits and a similar 2-level metal BL-hierarchical structure with top-level N, 2 KB, 8λ broken metal2 GBLs but keeps same bottom-level 4N, 8 KB, 2λ metal1 LBLs. The whole HiNAND2 array in y-direction (column) is divided into J Groups such as Group 1 to Group J by using J−1 GBL-divided devices, each of which is a MHV (~10V) NMOS transistor, MGBL, such as $MGBL_1$ through $MGBL_{J-1}$. Each Group size can be flexibly made to be the same or different. Each of the bottom-level BL is comprised of L metal1 2λ-pitch broken-LBLs per one HiNAND2 column, where L is an arbitrary integer with a value more than one, e.g., L≥2. Each Group is preferably further divided into L number of Segments. Between one pair of Segments in bit line direction there is one row of 2λ-pitch metal1 LBL-divided devices, which are MHV (~10V) NMOS transistors of MLBLb for connecting or disconnecting the pair of Segments. Each Segment is further made of K Blocks that are connected by 4N broken metal1 2λ-pitch LBLs. Each Block is comprised of 4N NAND Strings cascaded in x-direction and each String is comprised of M NAND cells in series with one BL-select transistor MS and one SL-selected transistor MG, where M=64 in this example.

Note, further bit number of DB and real CACHE reduction from 4N to N, by $\frac{1}{2}^t$-fold where t=2. This is a tradeoff between area saving and page loading cycles of DB and real CACHE. In this HiNAND2 array with N metal2 8λ-pitch GBLs and 4N metal12λ-pitch LBLs, the required minimum DB size is N-bit to accommodate for N metal2 GBLs. Thus DB size is further reduced.

In yet another specific embodiment, the present invention provides a 2-Vt SLC and 4-Vt MLC hybrid HiNAND2 array structure that is preferably organized to have one SLC-WL in odd/even WL and alternatively have one MLC-WL in another even/old WL. In other words, all SLC-WLs are surrounded by two adjacent MLC-WLs or vice versa all MLC-WLs are surrounded by two adjacent SLC-WLs to avoid the worst coupling between two MLC WLs.

In still another specific embodiment, the present invention discloses a preferred set of bias conditions for arbitrary number up to M WLs per Block selected from arbitrary number of Blocks in arbitrary number of Segments in one or more Groups and Planes for Erase operation including setting the selected WLs to 0V; setting selected TPW in the selected plane to Verase (20V in this example); then subsequently floating unselected WLs, SSLs, GSLs in any selected and unselected Blocks, Segments, Groups, and Planes.

In yet still another specific embodiment, the present invention discloses a preferred set of the bias conditions for m WLs selected on one-WL-per-Block in one-Block-per-Segment basis from m number of selected Blocks of m selected Segments in one or more Groups and Planes for an Erase-Verify operation including setting all selected m WLs to 0V; setting unselected (M−1) WLs in each selected Block to Vread (~6V); selected SSLs and GSLs to Vdd or Vread; setting unselected WLs, SSLs and GSLs of unselected Blocks to 0V; setting TPW in the selected plane to 0V. The condition of pass or fail of Erase-Verify operation is determined by voltages of all selected m×2N $C_{LBL}$ capacitors. If the precharged Vinh voltage of any one of the m pages of all 2N $C_{LBL}$ capacitors changes to Vss, then the Erase-Verify for the corresponding page passes, otherwise, it fails. The passed pages then should be prohibited from being further erased. Iterative Erase operation should be continued on the failed pages.

In an alternative embodiment, the present invention provides a preferred LBL's Program-Inhibit/Program voltages of Vinh/Vss replacing conventional Vdd/Vss for m selected 8 KB page data to achieve the superior m-page Program-Inhibit and Program conditions in accordance with m-page MLC or SLC Program page patterns. This is referred as a super self-boosting Program-Inhibit (SSBPI) scheme with a much higher initial precharged LBL voltage of Vinh than Vdd or Vdd-Vt used in prior art.

In another alternative embodiment, the present invention provides a technique of Vdd/Vss to Vinh/Vss conversion at each selected LBL for several preferred m-page operations such as Program, Program-Verify, Erase, and Read storing Vdd/Vss at each P/RB in accordance with each corresponding SLC or MLC bit data through each corresponding metal2 GBL. The Vinh is concurrently supplied by a metal0 power line LBLps Driver per each selected Segment.

In yet another alternative embodiment, the present invention provides a controllable DRAM-like charge-sharing on page-by-page basis between one row of N small metal1 parasitic $C_{LBL}$ capacitors and up to J corresponding N large metal2 parasitic $C_{GBL}$ capacitors for each SLC or MLC random page Read or Program-Verify.

Before performing charging-sharing, the initial LBL voltages of a selected page of cells are Vinh/Vss after voltage conversion and the initial GBL voltage is reset to Vss in all connected Groups. During GBL and LBL charge-sharing step, the corresponding MGBL transistors have to be turned on to allow each sensed analog signal of Vinh in $C_{LBL}$ capacitor is shared and diluted by up to J $C_{GBL}$ capacitors when Group J's Segment is selected along the GBL for each corresponding Multiplier to perform the first analog amplification. Then the diluted analog signal is amplified by a corresponding Multiplier to a final full digital Vdd/Vss signal and transferred and latched in each corresponding bit of P/RB.

In still another alternative embodiment, the present invention provides a Segment decoder circuit with 3 LV (Low-Voltage) inputs of Ri, Tj, and Gk supplied by three pre-decoders, R-dec, T-dec, and G-dec, shared by two separate outputs, SEGo for Odd selection of a Segment and SEGe for Even selection of the Segment, incorporating with one local VHV pump circuit and one paired MHV inputs of SEGpe and SEGpo. The two outputs of SEGe and SEGo are used to control respective Even and Odd NMOS MHV (Medium-High-Voltage) Segment-select transistors, MLBLpe and MLBLpo, as shown in FIG. 1A. When an Even MLBLpe is selected during the charge-sharing cycle between each Even metal1 $C_{LBL}$ capacitor and each common metal2 $C_{GBL}$ capacitor, then SEGpe≥Vinh+Vt+1V (1V is a margin voltage) to allow Vinh (pass Program-Verify or Read) to be fully passed to each corresponding 4 KB metal2 GBL. When SEGpo and SEGo are set to Vss, thereby disconnecting 4 KB Odd metal1 LBLs of the Segment from 4 KB metal2 GBLs so that the bus contention can be avoided. The connection and disconnection of each SEGe and SEGo can be independently set with following preferred conditions:

a) SEGe≥Vinh+Vt with SEGo=Vss when 4 KB Even CACHE $C_{LBL}$ capacitors of one Segment are selected only, for 4 KB Even LBLs charge-sharing with common 4 KB GBLs,
  b) SEGo≥Vinh+Vt with SEGe=Vss when 4 KB Odd CACHE $C_{LBL}$ capacitors of one Segment are selected only, for 4 KB Odd LBLs charge-sharing with common 4 KB GBLs,
  c) SEGe=SEGo=Vss when both 4 KB Even and 4 KB Odd 4 KB CACHE $C_{LBL}$ capacitors of one Segment are not selected for any charge-sharing operation.

In still another alternative embodiment, the present invention discloses N paired Segments selections when one full or partial of 4 KB page data are selected for loading from 4 KB DBs or 4 KB SAs. The value of N≥2 and N is an integer. This condition is frequently used in the present invention along with a TIE transistor that connected one paired CACHEe such as CACHEcel and CACHEint.

In yet still another alternative embodiment, the present invention discloses a second preferred Segment decoder circuit with 3 similar LV (Low-voltage) inputs of Ri, Tj, and Gk supplied by 3 pre-decoders, R-dec, T-dec, and G-dec shared by four separate inputs, SEGpa, SEGpb, SEGpc, and SEGpd and four separate outputs SEGa, SEGb, SEGc, and SEGd but one shared VHV pump circuit. The four outputs of SEGa, SEGb, SEGc, and SEGd are used to control four respective Segment-select transistors, MLBLpa, MLBLpb, MLBLpc, and MLBLpd, as shown in FIG. 1B. When one of the four Segment-select transistors MLBLpa-MLBLpd is selected for charge-sharing, then the rest 3 of Segment-select transistors MLBLpa-MLBLpd transistors have to be shut off to disconnect the corresponding $C_{LBL}$ capacitors from 4 KB metal2 GBLs without disturbing on-going charge-sharing on the one sector of the Segment selected by the one of four outputs of SEGa, SEGb, SEGc, and SEGd.

In yet still another alternative embodiment, the present invention provides a preferred Segment-decoder function to instantly set a HXS node to Vss by setting one-shot pulse of ESB=Vdd for a preset duration when unintentional Vdd power lose is detected. In this manner, the SEGo and SEGe voltages of selected Segment can be set to Vss so that all LBL voltages of on-going Segments' CACHE $C_{LBL}$ capacitors can be immediately saved after unexpected power-down but can be reused to continue the operations after Vdd being powered back within a certain idle time.

In an alternative embodiment, the present invention discloses a preferred Block decoder circuit as shown in FIG. 2A including a latch circuit coupled with one pre-decoder with three inputs of Pi, Qj, and Sk and a HV pump circuit with 64 separate inputs of XT1 to XT64, GSLp, and SSLp, a VHH input, and one set of corresponding outputs of WL1 to WL64, SSL, and GSL lines to control the word line gates and String-select gates of a selected NAND Block. For m-page Program and Program-Verify operation, the latch is used to set an HXD node voltage to control both charging and latching of the corresponding voltages of each selected set of 64WLs, a SSL line, and a GSL line under different m-page concurrent operations as summarized below:

a) HXD≥Vpgm+Vt during NAND SLC or MLC Program operation,
  b) HXD≥Vread+Vt during NAND SLC or MLC Read operation,
  c) HXD≥Vread+Vt during NAND SLC or MLC Program-Verify operation,
  d) HXD≥Vread+Vt during NAND SLC or MLC N-page random Erase-Verify operation,
  e) HXD=Vss during 64WL+1SSL+1GSL voltage latching operation.

In another alternative embodiment the present invention discloses a preferred Block-decoder function configured to immediately set a HXD node to Vss by setting one-shot pulse of ENB=Vdd for a preset duration when unintentional Vdd power lose is detected. In this manner, the one set of 64WLs+1SSL+1GSL voltages of selected Block can be locked to continue the last operation. This can be done by quickly setting ENB to Vdd and CLWL to Vss in accordance with the circuit of FIG. 2A.

In yet another alternative embodiment, the present invention discloses preferred Cell's Vt assignments for 2 Vts of each SLC bit, 2 Vts of each MLC MSB-bit, and 4 Vts of each MLC cell storing both MSB and LSB bits. The common B'-state defined a transient state in both 2-Vt SLC and 2-Vt MSB bit preferably have common Vtb'min≥Vtamax for a larger ΔVt margin between each E-state erase cell and each B'-state program cell (as shown in FIG. 4).

In still another alternative embodiment, the present invention discloses a preferred Command sets and Timing waveforms for m-page concurrent operations. The concept is first adding m consecutive page Addresses followed by adding m SLC page data or 2m MLC page data between the Start code and End code, where m≥1. The m-page Addresses and m-page SLC or 2 m-page MLC data can be separated in two separate commands with its own start code and end code.

In yet still another alternative embodiment, the present discloses a preferred 1-bit data buffer (DB) circuit that is comprised of 1-bit Multiplier for a first amplification of small analog cell signal, 1-bit Sense Amplifier (SA) for a second analog amplification to a full digital signal, 1-bit P/RB (Program/Read Buffer) for temporarily storing bit data and 1-bit Program-check circuit.

In a specific embodiment, the present invention provides a method for performing both m-page SLC and MLC (MSB page) pipeline data loading and m-page concurrent and pipeline Program as shown in FIG. 6A in accordance with a HiNAND2 array (FIG. 1A) and its associated peripheral circuits of 4 KB DB and 4 KB real CACHE. Up to m random-page 8 KB (All-BL) Program operations can be performed with partially overlapping programming time intervals in a concurrent/pipeline manner. For SLC and MLC MSB Program per cell, the number of cell-state increases from one initial erase state to two states including an erase state (E-state) and a program state defined as B'-state with a predetermined minimum Vt value no smaller than a maximum Vt value for an A-state which is the lowest program state for a programmed MLC cell. Note, in a scheme of non-random m-page 8 KB Program operation, m non-random pages can be performed concurrently in fully overlapping time interval with m-fold reduction in program time. The definition of non-random m pages means all m selected pages having a same physical WL address corresponding location in each 64-cell String. For example, if WL31 is selected from one Block, then all the remaining m−1 pages are also selected from same address of WL31 in the remaining m−1 dispersed NAND Blocks. In this preferred flow, two pseudo 8 KB CACHEcel and CACHEint registers are required for storing temporary 8 KB random or non-random page data.

In another specific embodiment, the present invention provides a method for performing both 2N-bit SLC and 2N-bit MLC (N-bit MSB Even and N-bit MSB Odd page) concurrent m-page All-BL Program-Verify as shown in FIG. 6B and FIG. 6C in accordance with a HiNAND2 array (FIG. 1A) and its associated peripheral circuits of 4 KB DB and 4 KB real CACHE as well as two pseudo CACHEs. All-BL Program-Verify operation can be performed up to m pages simultaneously in one cycle during 2N-bit LBL-precharge step and 2N-bit LBL-discharge-and-Vinh-retaining step on page-by-page basis and performed sequentially in two cycles during N-bit GBL-LBL charge-sharing step on half-page-by-half-page basis, because Program-Verify has to be done in the commonly shared N-bit SA and P/RB with 50% area reduction in data buffer.

In yet another specific embodiment, the present invention provides a method for performing MLC (LSB) m-page data loading and m-page B'-bit adjustment as shown in FIG. 7A in accordance with a HiNAND2 array (FIG. 1A) and its associated peripheral circuits of 4 KB DB and 4 KB real CACHE and a preferred 4-Vt MLC MSB and LSB assignments. Up to m pages 8 KB B'-bit data adjustment on page-by-page basis before a m-page All-BL LSB Program operation can be performed in a concurrent/pipeline manner, regardless of m random-page or m non-random-page schemes. Up to four pseudo CACHEs such as 8 KB CACHEcel, 8 KB CACHEint, 8 KB CACHEmsb, and 8 KB CACHElsb registers per LSB page are required for locally storing four temporary 8 KB random or non-random page data during B'-state bit-flipping purpose of each selected page or WL without using data buffer. B'-state bit-flipping step is required for correctly generating final two higher MLC program states of a B-state and a C-state. During the m-page All-BL MLC (LSB) Program operation, some cells of E-state are selectively programmed into A-state and some cells of B'-state are selectively programmed into B and C-states in accordance with the MLC LSB page data. The m pages are from total m Segments distributed in one or more of J Groups.

In still another specific embodiment, the present invention provides a method for performing m-page A-state Program-Verify operation as shown in FIG. 7B. Up to m pages A-state Program-Verify operations can be performed with partially overlapping time intervals on page-by-page basis in a concurrent/pipeline manner, regardless of m random non-random pages due to the same reason of Data Buffer limited capacity for area saving purpose. Note, only three pseudo 8 KB CACHEs are required such as CACHEcel, CACHEint, and CACHEmsb for A-state bit flipping purpose. CACHEcel is utilized for temporarily storing full page of currently updated verify data, CACHEint for temporarily storing, and CACHEmsb for storing retrieved MLC MSB page data. A-state Program-Verify operation using Vtamin as a verify voltage includes transferring last updated data from CACHEint to two first storage nodes of P/RB per bit, transferring MLC MSB page data from CACHEmsb to SA per bit through Multiplier for amplification and then writing back to CACHEmsb in same data polarity and transferring into one second storage node of P/RB per bit, verifying currently updated data from CACHEcel in SA per bit against data in both the first store nodes and a second storage node of P/RB per bit based on Vt distribution of A-state.

In yet still another specific embodiment, the present invention discloses a method for performing m-page B-state Program-Verify as shown in FIG. 7C. Up to m pages B-state Program-Verify operations can be performed simultaneously with partially overlapping time intervals on page-by-page basis in a concurrent/pipeline manner, regardless of m random pages or m non-random pages due to the same reason of Data Buffer limited capacity for area saving purpose. Note, only three pseudo 8 KB CACHEs are required such as CACHEcel, CACHEint, and CACHElsb for B-state bit flipping purpose. B-state Program-Verify operation using Vtbmin as a verify voltage includes transferring MLC LSB page data from CACHElsb to SA per bit through Multiplier for amplification and then writing back to CACHElsb in same data polarity and transferring into one second store node of P/RB per bit, verifying currently updated data from CACHEcel in SA per bit against data in the first store nodes, transferred from CACHEint during A-State verify, and data in second store node of P/RB per bit based on Vt distribution of B-state.

In yet still another specific embodiment, the present invention discloses a method for performing m-page C-state Program-Verify as shown in FIG. 7D. Up to m pages C-state Program-Verify operations can be performed simultaneously with partially overlapping time intervals on page-by-page basis in a concurrent/pipeline manner, regardless of m random pages or m non-random pages due to the same reason of Data Buffer limited capacity for area saving purpose. Note, only three pseudo 8 KB CACHEs are required such as CACHEcel, CACHEint, and CACHElsb for C-state bit flipping purpose. C-state Program-Verify operation using Vtcmin as a verify voltage includes verifying currently updated data from CACHEcel in SA per bit against only data in the first store nodes, transferred from CACHEint during A-State verify, based on Vt distribution of C-state, updating data in CACHEcel and CACHEint, continuously performing next iterative All-BL MLC LSB Program based on the updated data in CACHEcel and stop until the Program-Verify is passed.

In yet still another specific embodiment, the present invention discloses a method for performing m-page MLC (LSB page) data loading and concurrent B'-bit adjustment before m-page All-BL Program as shown in Even LSB page in FIG. 7E and Odd LSB page in FIG. 7F in accordance with a HiNAND2 array (FIG. 1A) and its associated peripheral circuits of 4 KB DB and 4 KB real CACHE, regardless of m random or non-random pages. Total four CACHEs are required such as CACHEcel, CACHEint, CACHElsb, and CACHEmsb for B'-bit flipping purpose. A preferred m-page B'-bit Adjustment Flow is provided for a MLC physical cell that stores four final logic states such as E, A, B, and C states but with five preferred initial MLC states such as E, A, B1', B2', and C states, where each final B-state is split into two initial B1' and B2' temporary states by setting corresponding Vt values of Vtb1'min≤Vtb1'≤Vtb1'max, where Vtb1'max≤Vtb2 min=Vtbmin.

The goal of MLC B'-bit adjustment is to turn each LSB bit data with a logic pattern of 10110 for E, A, B1', B2', C initial state to five desired final logic pattern of 10010 for subsequent m-page LSB Program operation as shown in FIG. 7G. In such manner, a MLC cell with a tighter 4-Vt distribution can be achieved.

In yet still another specific embodiment, the present invention discloses a method for performing m-page SLC or MLC Program-Verify. Up to m pages Even and Odd Program-Verify operations can be performed simultaneously with partially overlapping time intervals on page-by-page basis in a concurrent/pipeline manner, regardless of m random pages or m non-random pages but optionally the sequence of Program-Verify of Even and Odd pages can be alternatively reversed once per iterative verify step.

In an alternative embodiment, the present invention discloses a method for performing m-page All-BL SLC Read operation. Up to m pages SLC Even and Odd All-BL Read operations can be performed simultaneously with partially overlapping time interval on page-by-page basis in a concurrent/pipeline manner, regardless of m random pages or m non-random pages. Totally one CACHEcel is required per page because no need of any bit flipping.

In another alternative embodiment, the present invention discloses a method for performing m-page All-BL MLC (MSB page) Read operation. Up to m pages Even and Odd MLC (MSB) Read operations, with a condition that each page Flag cell is assigned to 1, can be performed simultaneously with partially overlapping time intervals on page-by-page basis in a concurrent/pipeline manner, regardless of m random pages or m non-random pages. The features of m-page MLC (MSB) Read operation include assigning a Flag cell to 1 to indicate that the addressed MLC-WL only stores 2-Vt of MLC MSB page data and each LSB bit data of a MLC cell is not stored yet. In this case, a MLC LSB bit data is set to "1". i.e., LSB=1. Then each flow of m-page MLC MSB Read operation has fewer steps. For this preferred MLC (MSB) Read operation, only the CACHEcel is required for storing temporary read data for distinguishing an initial program B'-state from erase E-state per cell.

In yet another alternative embodiment, the present invention discloses a method for performing m-page MLC (LSB page) Read operation. Up to m pages Even and Odd MLC (LSB) Read operations, with condition that each page Flag cell is assigned to 0, can be performed simultaneously with partially overlapping time intervals on page-by-page basis in a concurrent/pipeline manner, regardless of m random pages or m non-random pages. The m-page MLC (LSB) Read is performed when the Flag cell is assigned to 0 to indicate the addressed MLC-cell storing 4-Vt of both MSB and LSB bits. Total three pseudo CACHEs including CACHEcel, CACHEint, and CACHEmsb, are required for MLC LSB Read operation. One pair of CACHEcel and CACHEint is tied to simultaneously store temporary data for distinguishing E-state from A, B, and C states via VR1 (first read voltage) read. Then, TIE signal is turned off to isolate CACHEint from CACHEcel. Next, CACHEcel is utilized for storing temporary data for distinguishing E and A states from B and C states via VR2 (second read voltage) read which is equivalent to MSB data. Then, this MSB data is transferred to the SA to I/O via CACHE register and write back to CACHEmsb. Next, CACHEcel is utilized for storing temporary data for distinguishing E, A, B states from C state from VR3 (third read voltage) read. Data in CACHEint is restored to store nodes of the P/RB per bit and data in CACHEmsb is restored to SA per bit and further transferred to CAP1 and CAP2 of the P/RB per bit. Data in CACHEcel is restored to SA per bit. B-state cell data is flipped in polarity in P/RB per bit. Lastly, MLC LSB data is read from the P/RB.

Further, the present invention discloses a method for performing SLC Block Read operation with only one CACHEcel.

Additionally, the present invention discloses a method for performing alternative m-page MLC Read operations with total three CACHEs such as CACHEcel, CACHEint, and CACHEmsb.

In an embodiment, the present invention discloses a m-page MLC Read Flow for differentiating four final logic states, E, A, B, and C states, in a MLC physical cell. Each MLC MSB-bit logic read data is 0011 for four respective E, A, B, and C states, while each MLC LSB-bit logic read data pattern is 0101 for four respective E, A, B, and C states by flipping B-state=1 to B-state=0 to program C-state.

In another embodiment, the present invention discloses a sequential load/latch (LD/LT) technique on ½-page by ½-page basis along with a plurality of latches incorporated in Even and Odd Segments-decoders and Block-decoders to store and lock in m random-page 8 KB SLC, MLC MSB, and MLC LSB page data into m designated random 8 KB pseudo CACHE capacitors concurrently. As a result, only one 4 KB (½-page) data buffer (DB) rather than m×8 KB DBs is required to perform this preferred m random-page Block operations with a big saving in the peripheral area. The 8 KB page data stored in the pseudo CACHE include:
  I. Externally-loaded page data: 8 KB MSB Vinh/Vss conversion page data or 8 KB LSB Vinh/Vss conversion page data;
  II. Internally-generated iterative Vinh/Vss conversion page data: B'-adjustment 8 KB page data before 8 KB Program;
  III. Internally-generated iterative Vinh/Vss conversion page data: 8 KB MSB page data by VR1 reading from 8 KB CACHEcel that stores 8 KB MSB conversion page data;
  IV. Several internally-generated temporary iterative 8 KB Vinh/Vss conversion page data: A-state, B'-state, B-state, C-state iterative Program-Verify 8 KB page data;
  V. Internally-generated 8 KB Vinh precharged data;
  VI. Internally-generated 8 KB Vinh/Vss conversion data by Read operation.

In yet another embodiment, the present invention discloses a method for performing M-page concurrent operations such as 1) m randomly selected Full-page Block SLC Program; 2) m randomly selected Full-page Block MLC MSB Program; 3) m randomly selected Full-page Block MLC LSB Program; 4) m random-page Block Full-page SLC Program-Verify; 5) m random-page Block Full-page MLC MSB Program-Verify; 6) m random-page Block Full-page MLC LSB Program-Verify, 7) m random-page Block Full-page MLC MSB Read; 8) m random page Block Full-page MLC LSB Read; 9) m random-page Block Full-page SLC Read; 10) m random-page Block Full-page CACHE Vdd/Vss to Vinh/Vss conversion in accordance with each Vdd/Vss page data from 4 KB P/RB or 4 KB SA; 11) m random-page concurrent Full-page CACHE Vinh discharging or retaining in accordance with SLC, MLC MSB and MLC LSB Read and Verify page data; 12) m randomly-selected Full-page CACHE $C_{LBL}$ capacitors concurrent Vinh precharging by m randomly selected metal0 Segment power lines of LBLps in accordance with m selected random Segment addresses; and 13) m randomly selected WLs, unselected WLs, selected SSL and GSL lines are precharged to Vpgm, VR, Vpass, $V_{READ}$, Vdd, and Vss concurrently.

In still another embodiment, the present invention discloses a method for performing one Full-page-based 8 KB concurrent precharging or discharging operation between one or more paired CACHE pseudo registers or $C_{LBL}$ capacitors that are connected together by a transistor MLBLb with a gate signal TIE. This is to provide more flexibility in fewer steps when more than one CACHE is selected for performing same concurrent operations in one cycle. Particularly, in same Read or Verify operation, one CACHE $C_{LBL}$ is discharged by selected cells, the other paired CACHE's corresponding $C_{LBL}$ capacitors will be discharged as well without using the common sharing 4 KB GBLs. When TIE signal is set to Vinh+Vt, the precharged voltage is Vinh for 8 KB CACHEcel and 8 KB CACHEint; when TIE≥Vdd, the paired 8 KB CACHEcel and CACHEint is discharged to Vss; when TIE is Vss, independent Vinh/Vss voltages are on both 8 KB CACHEcel and 8 KB CACHEint.

In yet still another embodiment, the present invention discloses a preferred flow path of Segment or CACHE $C_{LBL}$ for precharging inhibit voltage Vinh from the selected corresponding LBLps line supplied by a Vinh Driver (not shown). The Vinh voltage of LBLps line is set to be Vdd≤Vinh≤10V. Each LBLps line is connected to one 20V NMOS buffer device for protecting the rest of Vinh Driver circuit during Erase operation, otherwise an erase voltage of 20V will couple from Triple P-well of NAND array.

In yet still another embodiment, the present invention discloses that a number (n1) of each DB is preferred to be smaller than a number (n2) of physical NAND cells residing in one physical WL. In other words, it is preferred to have n1<n2. More particularly, n1=α×n2, where α=1/(2$^t$) and t is any integer number equal to or greater than 1. Further, it is preferred that a number (n4) of tight lower-level 2λ-pitch metal1 LBLs is more than a number (n3) of loose higher-level metal2 GBLs. In other words, it is preferred to have n3<n4. More particularly, n3=α×n4.

In an alternative embodiment, the present invention provides a flexible inhibit voltage Vinh setting during voltage conversion of Vdd/Vss to Vinh/Vss in $C_{LBL}$ capacitors depending on locations of those HiNAND2 Groups relative to DB. For regularly selected Groups, the voltage of Vinh can be flexibly set as Vdd≤Vinh≤–10V depending on degree of charge-sharing dilution. The Vinh=10V is determined by the NMOS BVDS of MLBLps, MLBLp, MLBLs, MLBLb, MGBL, MG, and MS transistors. For those selected Groups near DB, less dilution due to charge-sharing between each $C_{LBL}$ and each $C_{GBL}$ lines, thus lower Vinh of Vdd can be used for less precharging current consumption.

In yet another alternative embodiment, a preferred m-page concurrent NAND operation can be also performed in 1-level BL structure with a plurality of metal1 broken-GBLs. This 1-level BL structure is termed as a HiNAND1 array which can be applied in both 2D and 3D NAND using 1-level metal tight 2λ-pitch 4 KB GBLs. Because of 1-level-only BL structure, more GBL-divided MGBL transistors per one GBL are required. As a result, thus more complex and slower metal1 broken-GBL traffic control are required. HiNAND1 array has less flexible m-page concurrent operations than HiNAND2 array but only needs one level of metal GBL in NAND array for cost reduction.

In a specific embodiment, the present invention discloses a self-timed control circuit and scheme for precharging m sets of 64WLs+1SSL+1GSL lines by a Vpgm WL Detector made of a 2-input Differential Amplifier (DA1) with one input connected to a dummy Vpgm WL and the other input coupled to Vpgm reference voltage. This dummy Vpgm WL voltage is initially reset to Vss before m selected sets of 64WLs+1SSL+1GSL lines of m Blocks are selected for concurrent SLC or MLC program. Once the concurrent m-page Program starts, then m randomly selected sets of 64WLs+1SSL+1GSL lines will be precharged to corresponding desired voltages such as Vpgm, Vpass, and Vdd. Since Vpgm is the highest and slowest HV voltage for m randomly selected WLs, the dummy WL mimics m randomly selected WLs to be charged with a Vpgm only during both SLC and MLC Program operations. Once Vpgm is detected by the DA, then the precharging of for m selected sets of 64WLs+1SSL+1GSL lines would be automatically stopped. This is referred as Vpgm-DA.

In another specific embodiment, the present invention discloses a self-timed control circuit and scheme for precharging m sets of 64WL+1SSL+1GSL lines by a Vread WL Detector made of a 2-input Differential Amplifier (DA2) with one input connected to a dummy Vread WL and the other input coupled to Vread reference voltage. This is referred as Vread-DA. This dummy Vread WL voltage is initially reset to Vss before m selected sets of 64WLs+1SSL+1GSL lines of m Blocks are selected for concurrent m-page SLC or MLC Read or Program-Verify or Erase-Verify. Once the concurrent m-page Read or Program-Verify or Erase-Verify starts, then m randomly selected sets of 64WLs+1SSL+1GSL lines will be precharged to corresponding desired voltages such as Vread and Vdd. Since Vread is the highest and slowest HV voltage for m randomly selected WLs, the dummy Vread WL mimics m randomly selected WLs to be charged with a Vread only during both m-page SLC and MLC Program-Verify or Erase-Verify or Read operations. Once Vread is detected by the DA2, then the precharging of for m selected sets of 64WLs+1SSL+1GSL lines would be automatically stopped.

In yet another specific embodiment, the present invention discloses a self-timed control circuit and scheme for precharging m sets of CACHE $C_{LBL}$ to Vinh voltage using a Vinh Precharging Detector made of a similar 2-input Differential Amplifier (DA3) with one input connected to a dummy Vread WL and the other input coupled to Vread reference voltage to detect the corresponding LBLps Vinh power line. During CACHE $C_{LBL}$ precharging from Vss to Vinh, the selected LBLps line would be charged by a Vinh Driver at one end and detected by the DA3 connected at another end. Once voltage of each LBLps line reaches Vinh, each corresponding DA3 will detect it and issues a signal to stop the Vinh precharging operation automatically. This is referred as VLBL-DA or LBLps-DA.

In still another specific embodiment, the present invention discloses a self-timed control circuit and scheme for discharging m sets of CACHE $C_{LBL}$ lines by the same Vinh Precharging Detector DA3 but with reference connected to a discharge voltage set at 2.0V or lower. Once 2.0V is detected, then the MLBLse and MLBLso transistors are immediately shut off to prevent the leakage between adjacent $C_{LBL}$ capacitors when gate voltages PREo and PREe are set to 2.0V+Vt initially. Note, during $C_{LBL}$ capacitor discharging detection, the initial voltage of LBLps line is precharged with a Vinh voltage left in the previous precharge operation without consuming power again.

In yet still another specific embodiment, the present invention discloses a self-timed control circuit for setting one iterative program time, Tpgm. One typical program time is about 250 µs for SLC, which programs only one A-state. But for each iterative program time is about 25 µs if 10 successive iterative ISSP pulses are used for a tighter programmed Vt control. The Tpgm circuit can be triggered by Vpgm Detector once the Vpgm voltage is reached per each ISSP program step. Note, since each iterative Vpgm voltage is gradually increased by ΔVpgm of 0.2V to 0.4V, thus the Vpgm Detector voltage has to be adjusted higher accordingly. Each iterative Tpgm time of 25 µs can be designed by using a simple RC-based delay with preferably a high10 Meg ohms MOS-type resistor with a 2.5 pf MOS-type capacitor. This RC-based Tpgm adjustment can be made of trimming or empirical experiment data to finalize. Once the self-timed Tpgm is reached, then an immediate self-timed HV discharging of 64WLs+1SSL+1GSL lines will be automatically executed by the same Vpgm or Vread Detector that uses a value≤1.0V to replace Vpgm or Vread as Vref at dummy WL.

Further, the present invention discloses a preferred method to build a tracking dummy WL layout for above Vpgm and Vread Detectors. Practically, in layout, at least three dummy WLs of same length as each regular WL are laid out together to form one. The dummy WL used for Vpgm or Vread Detector is the middle WL with two adjacent WLs surrounding it so that the parasitic WL-WL adjacent capacitance and one WL resistance can be counted to simulate the real worst-case WL delay. One end of the middle dummy WL is connected to a Vpgm generator and the other end of middle WL is connected to one input of a Vpgm or a Vread Detector. Using three dummy WLs is to save the circuit size because there are too many Blocks in NAND array. It would take too much overhead if one dummy WL detector is built per one Block.

Furthermore, an objective of the present invention is to add a pair of gated capacitors CAP1 and CAP2 as a second storage nodes to a pair of first storage nodes Qi and QiB for each P/RB so that an extra temporary storage bits are created in a small area to allow more flexible and effective MC MSB and LSB page concurrent Program-Verify and bit flipping logic operations.

Alternatively, the present invention discloses a method for transferring those failed m-page SLC or MLC Program pages of a first selection to another already-erased pages of a second selection for continuing the SLC and MLC Program and Program-Verify operations. As such, each preferred m-page Program operation with m loaded page data can be completed without failure so that no need of reloading those failed page data into the HiNAND2 array again. This can be done by mapping the newly erased page Addresses into new correspondingly selected Segments and Block-decoders latches. The Host or Flash Controller should have records to connect those Blocks being erased for continue programming on those failed pages.

Further alternatively, the present invention also discloses a method for performing mixed m-page concurrent operations whenever no contention happens on those shared 4 KB metal2 $C_{GBL}$ lines, metal1 8 KB $C_{LBL}$ lines in pseudo 4 KB CAHCE registers, one set of 64XTs+1SSLp+1GSLp bus lines and 4 KB real CACHE registers in accordance with HiNAND2 array shown in FIG. 1A. The concurrent m-page operations include m-page concurrent SLC Program operations on m Segments, m-page concurrent mixed SLC-page/MLC Program operations on m Segments, m-page concurrent SLC Read operations on m Segments, m-page concurrent MLC Read operations on m Segments, m-page concurrent mixed SLC Program operations in some Segments while MLC Read operations on other Segments, m-page concurrent mixed MLC Program operations in some Segments while SLC Read operations on other Segments, m-page concurrent mixed SLC Program operations in some Segments while MLC Verify operations on other Segments, m-page concurrent mixed MLC Program operations in some Segments while MLC Verify operations on other Segments, m-page concurrent mixed SLC Program operations in some Segments while Erase-Verify operations on other Segments, concurrent m-page mixed MLC Program operations in some Segments while Erase-Verify operations on other Segments, m-page concurrent mixed SLC Program data loading operations in some Segments while Program-Verify operations on other Segments, m-page concurrent mixed MLC Program operations in some Segments while Erase-Verify operations on other Segments, m-page concurrent mixed SLC Read operations in some Segments while MLC Program operations in other Segments and MLC Program-Verify operations on some other Segments, m-page concurrent mixed MLC Program operations in some Segments while SLC Read operations on some Segments and MLC Read operations in other Segments, and m-page concurrent multiple mixed operations.

Still further, the present invention also discloses one common lowest-level horizontal metal0 power line of LBLps per Segment disposed perpendicular to a plurality of 1-level higher metal1 LBLs and/or a plurality of 2-level higher metal2 GBLs through a plurality of NMOS transistors MLBLs with their common gate tied to a common signal PRE for performing a plurality of concurrent m-page NAND operations. Each LBLps line is configured for supplying a precharging or discharging current to a plurality of LBLs by each corresponding LBLps driver instead of a plurality of DB bits and for providing a flexible Vinh voltage ranging from Vdd to 10V. Vinh voltage is only limited by the device BVDS spec of corresponding precharge transistor MLBLs that is preferably made of a same device like NAND String-select transistor MG or MS.

Furthermore, embodiments of the present invention also are applicable to TLC, XLC-type of NAND array structures and even analog NAND array as long as the pseudo CACHEs are used to store the temporary data without using the real CACHEs. In other words, the on-chip novel pseudo CACHEs can store m-page of data in both digital form and analog form temporarily with voltages ranging between Vss to Vinh which is only limited by the minimum BDVS of all NMOS devices connected to each $C_{LBL}$ node, Vinh pass-transistors and Vinh source.

4. BRIEF DESCRIPTION OF THE DRAWINGS

In following description, when 2N-bit is referred, it means that total 8 KB physical NAND cells residing in one physical WL or Page. In this application, 2N-bit means a full physical WL page of 8 KB cells. Thereby, N-bit means 4 KB which is ½ of one full physical page or ½ WL size.

Figure 2A:
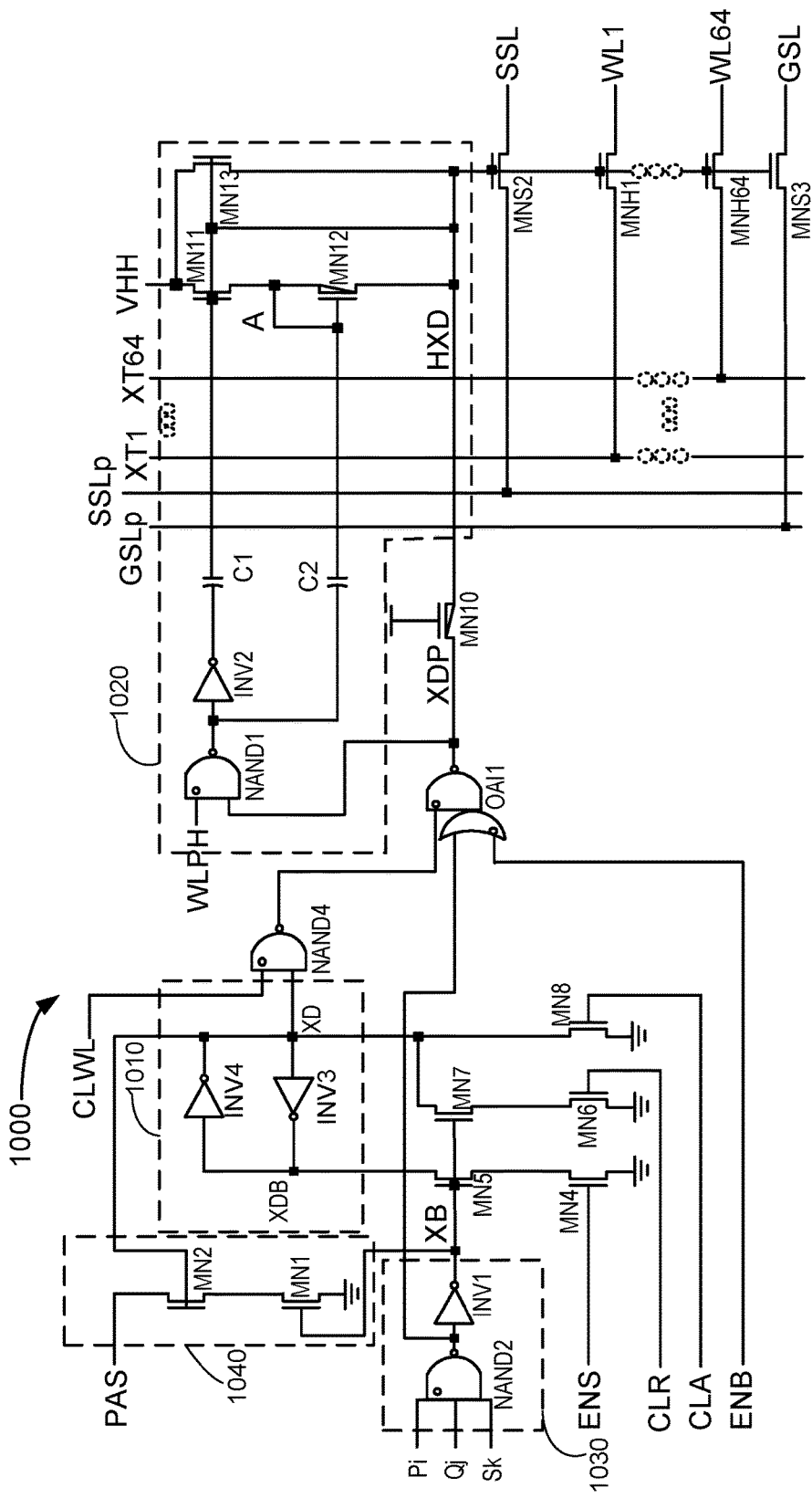

FIG. 2A is a preferred Block-decoder circuit comprising a latch circuit with a status check circuit PAS, a Pre-decoder circuit with three inputs of Pi, Qj, and Sk, and a Local HV Pump circuit to enable HV/LV connections between each Block's Pre-decoder inputs of XT1-XT64, GSLp, and SSLp and the corresponding WL1-WL64, GSL, and SSL outputs of m selected Blocks of a HiNAND2 array and associated circuits of DB (Data-Buffer), CACHE register, and I/O Control during preferred multi-page mixed SLC/MLC Program, Program-Verify, Read, Erase-Verify operations according to embodiments of the present invention.

Figure 2B:
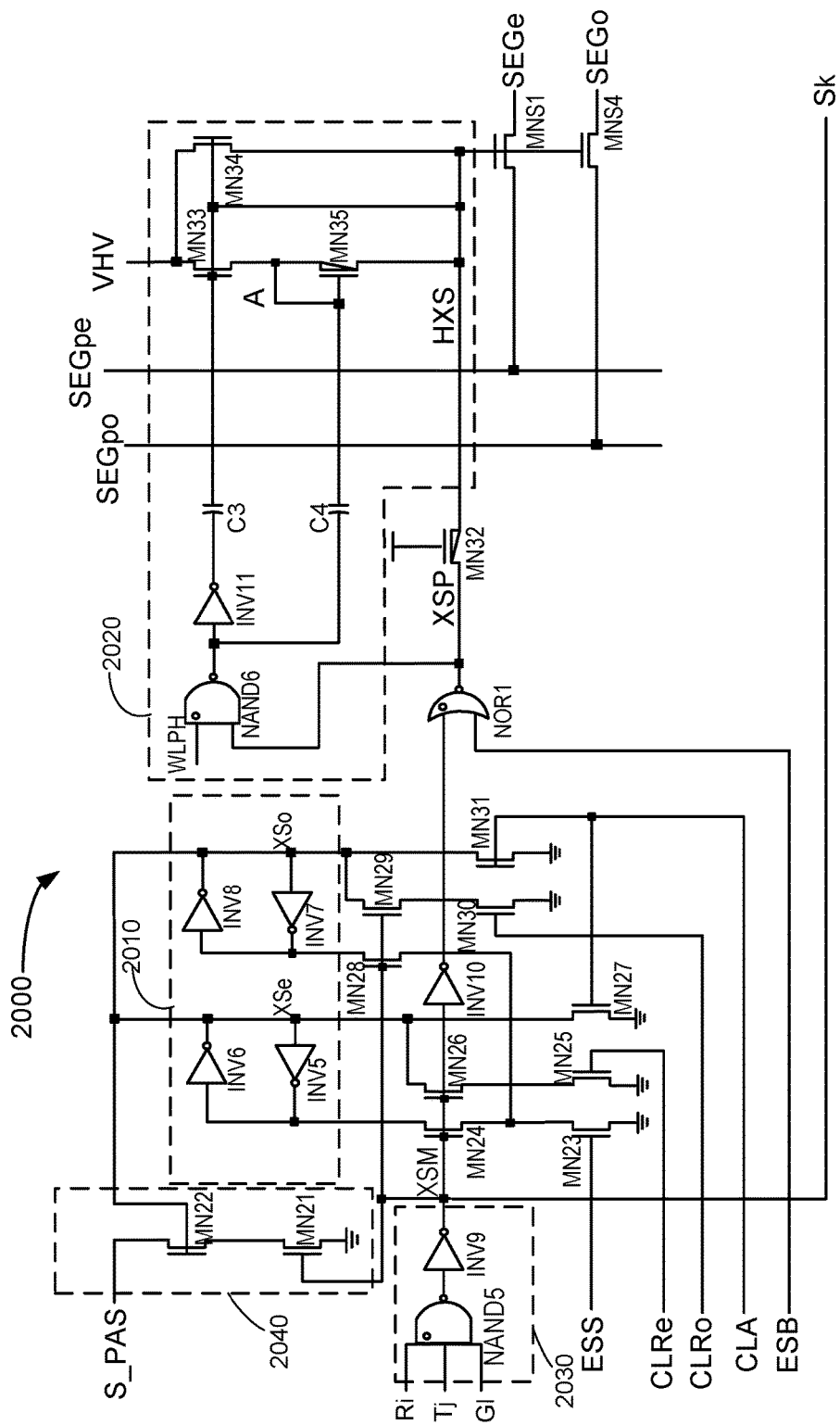

FIG. 2B is a preferred Segment-decoder circuit comprising a latch circuit with status check circuit S_PAS, a Pre-decoder circuit with three inputs of Ri, Tj, and Gk, and one Local HV Pump circuit to enable connection of a HV or LV SEGp input to be coupled to a corresponding SEG output for properly operating a Segment of a HiNAND2 array and associated circuits of DB, CACHE register, and I/O Control during preferred multi-page mixed SLC/MLC Program, Program-Verify, Read, Erase-Verify operations according to embodiments of the present invention.

Figure 1A:
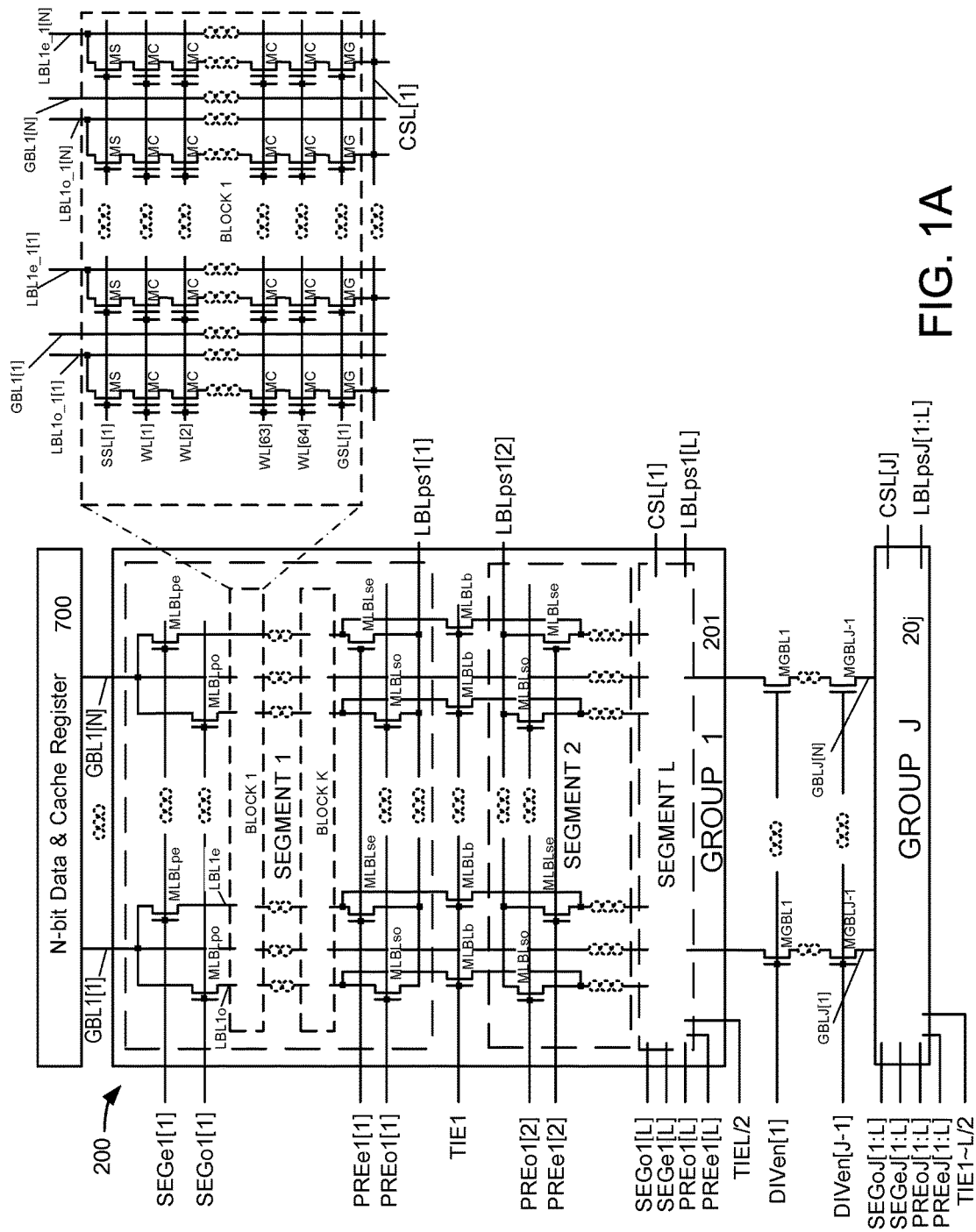
FIG. 1A is circuit diagram showing a preferred 2D HiNAND2 with 2-level BL-hierarchical structure including 2N (8 KB) local bit lines (LBLs) pseudo CACHE capacitors connected to N-bit Data/Cache Register via N global bit lines (GBLs) according to an embodiment of the present invention.
Figure 3:
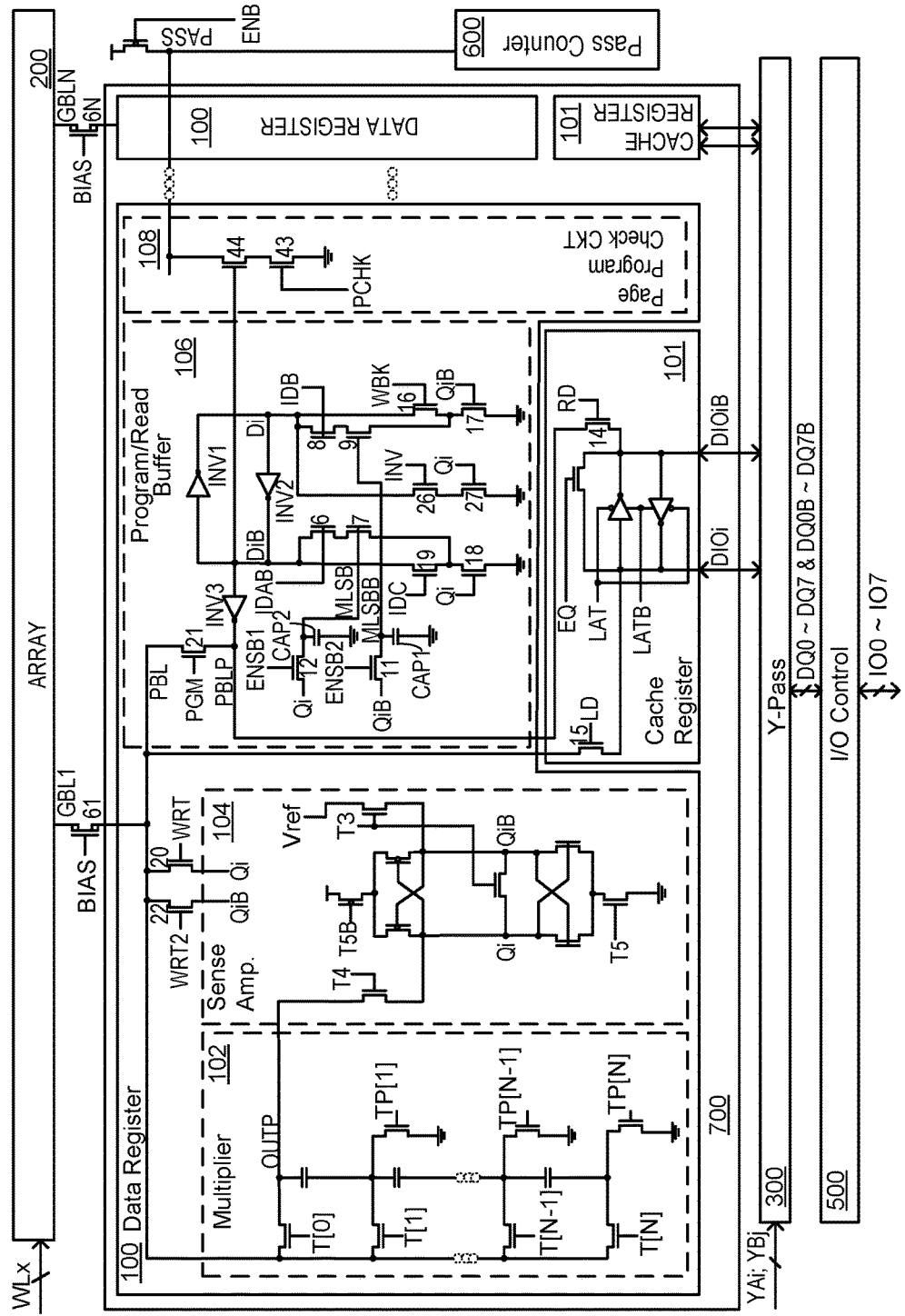

FIG. 3 is a block diagram of a N-bit Data Register circuit associated with the preferred HiNAND2 cell array in FIG. 1A along with one NMOS Y-Pass circuit with YAi and YBj column decoder inputs and one Byte-wide I/O Control circuit to demonstrate both the desired SLC and MLC multi-page operations of the present invention.

FIG. 4 is a diagram showing two Vt distributions of a 2-Vt SLC NAND cell or a 2-Vt MLC MSB cell and a 4-Vt MLC NAND cell containing both 2-Vt MSB bit and 2-Vt LSB bit used in the preferred hybrid HiNAND2 array of FIG. 1A according to an embodiment of the present invention.

Figure 5:
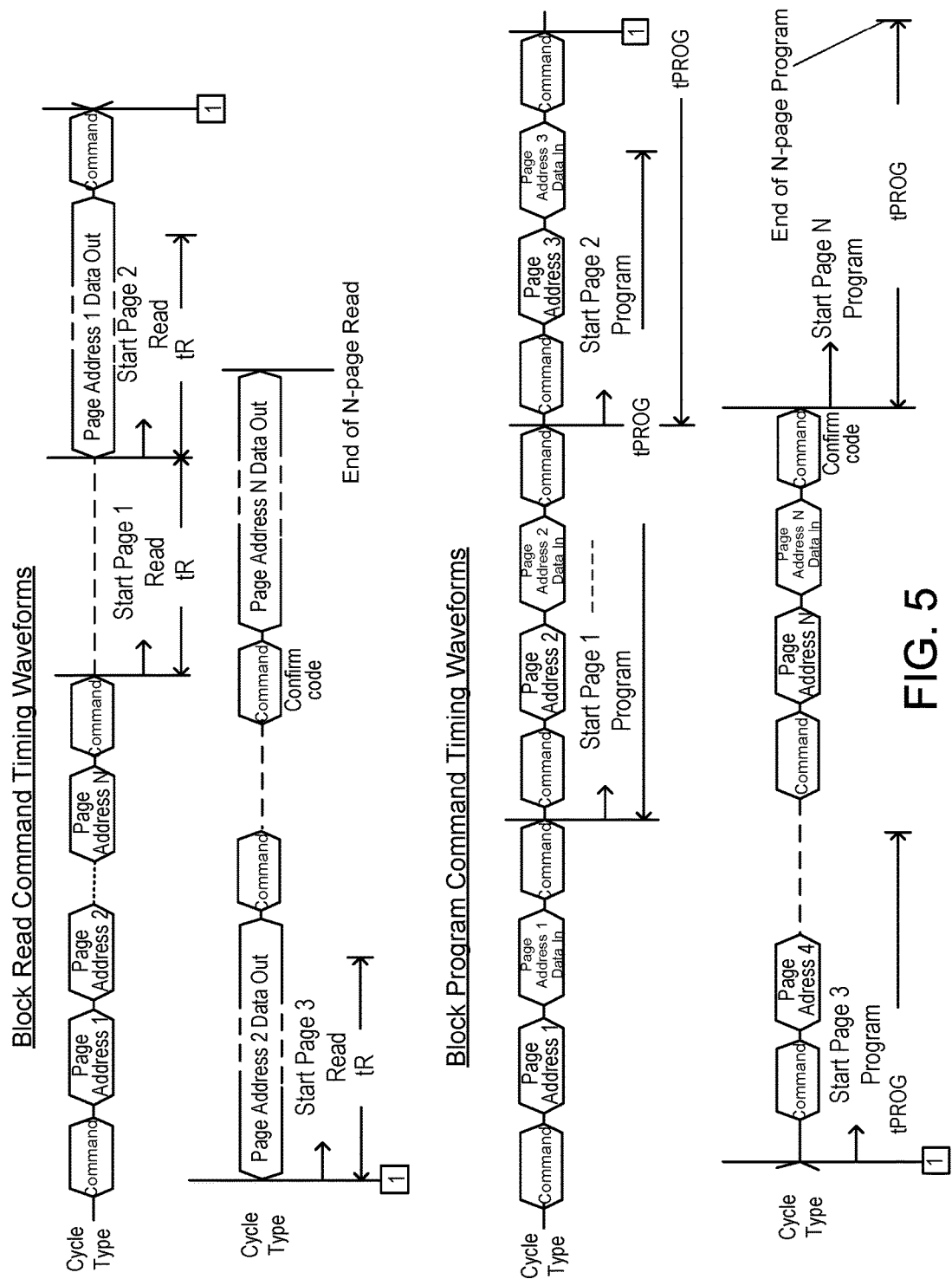

FIG. 5 is a diagram showing a preferred multi-page Read and Program Command Timing Waveforms of a SLC, a MLC, or a mixed SLC/MLC hybrid HiNAND2 array of the present invention.

Figure 6A:
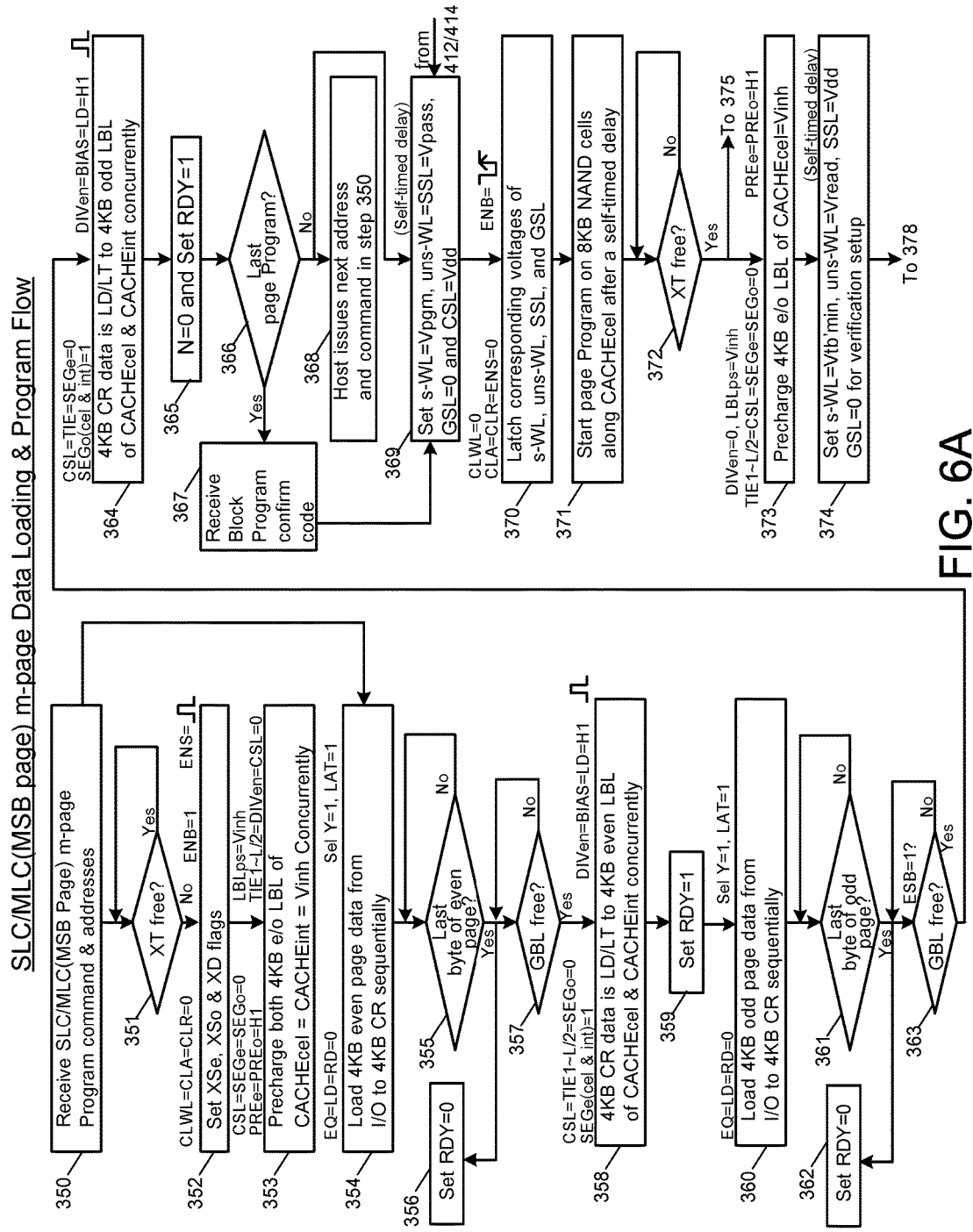
Figure 6B:
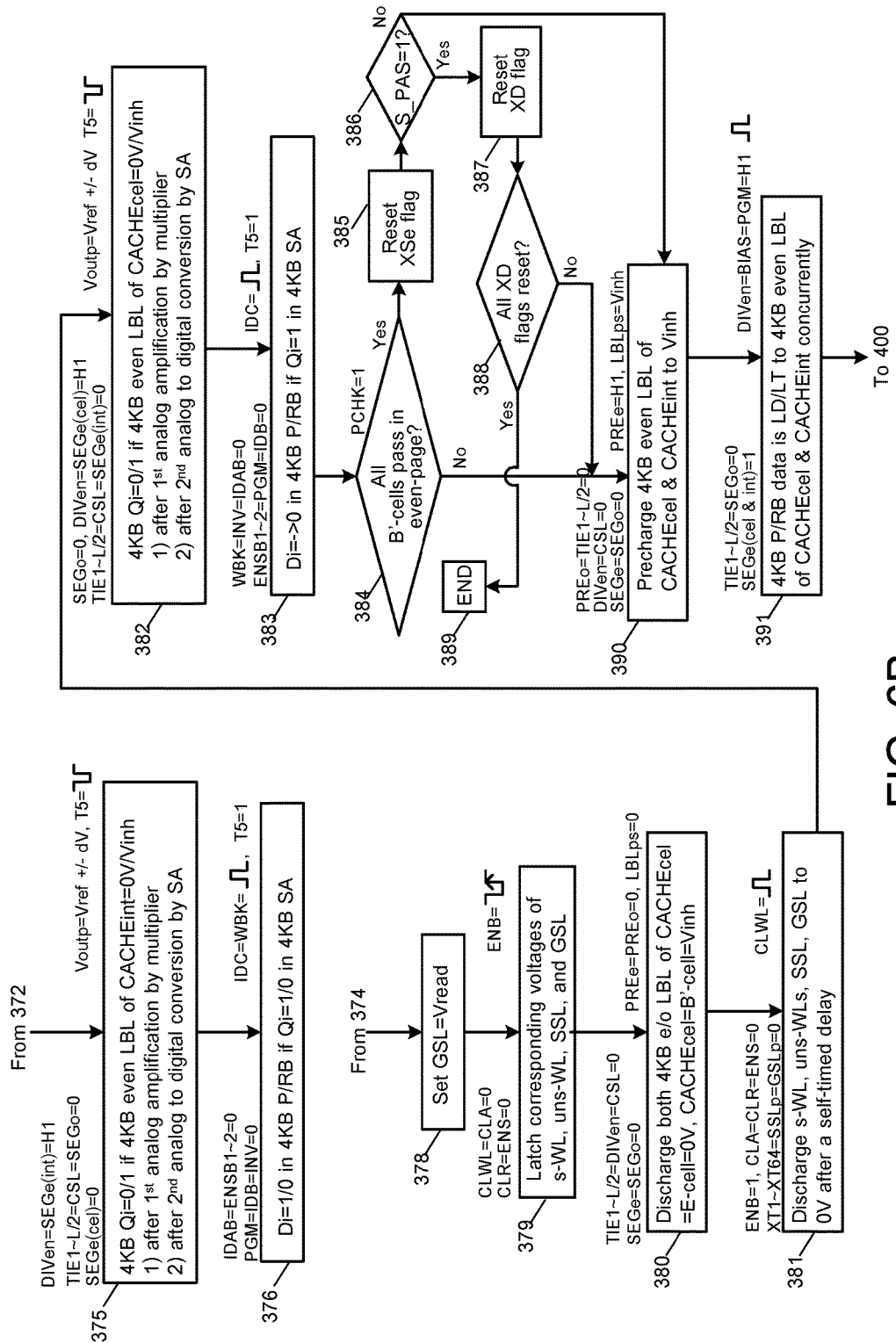
Figure 6C:
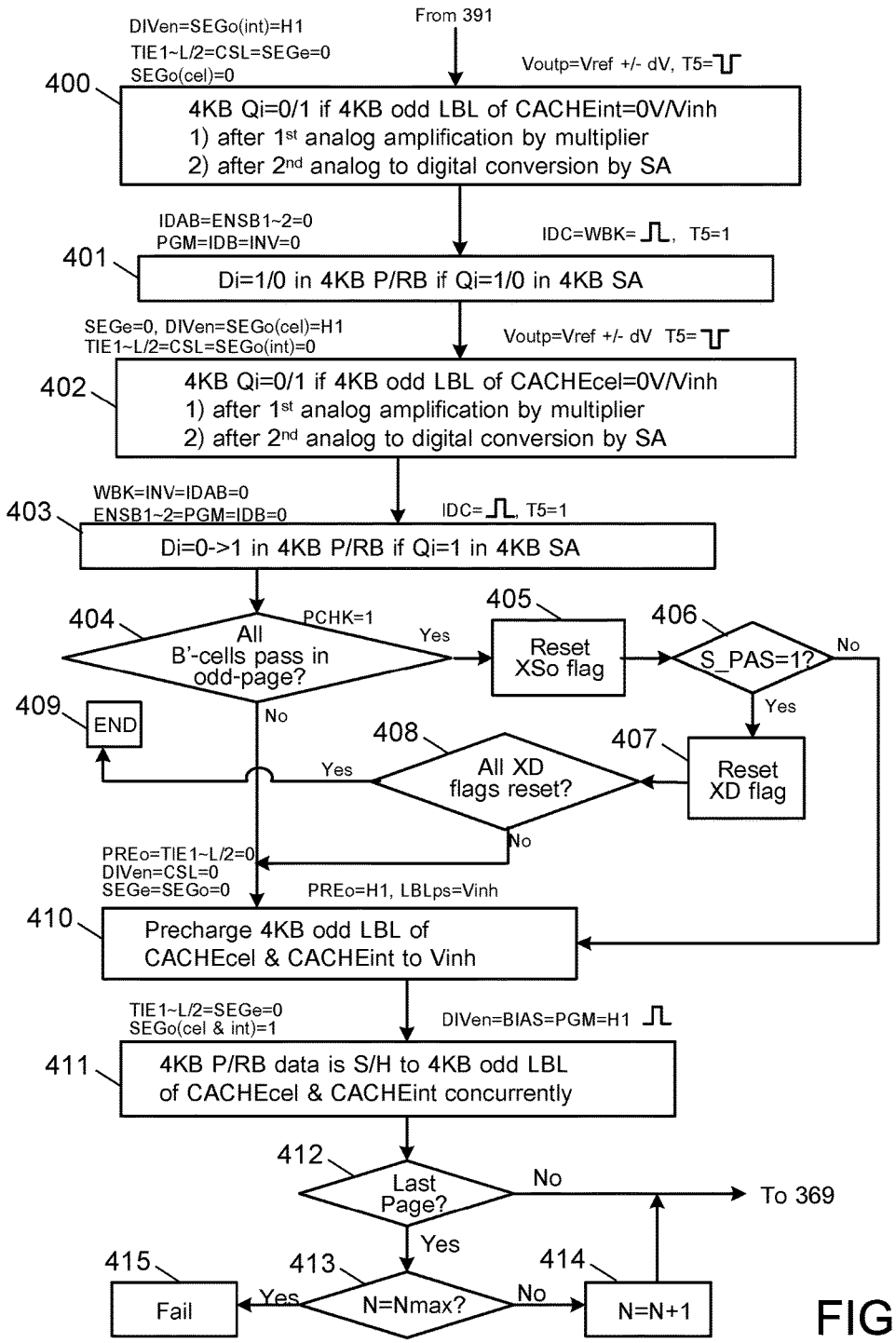

FIGS. 6A-6C are flow charts showing multi-page SLC or MLC (MSB page) data loading, Program, and Program-Verify operations associated with a plurality of pseudo CACHEs in accordance with the HiNAND2 array shown in FIG. 1A, the Block-decoder shown in FIG. 2A, the Segment-decoder shown in FIG. 2B, the Data & CACHE Register shown in FIG. 3, and the MLC cell's 4-Vt assignment shown in FIG. 4 according to embodiments of the present invention.

FIGS. 7A-7D are schematic diagrams showing methodologies of multi-page SLC, MLC MSB and MLC LSB in various Read, Program and Program-Verify operations and a plurality of pseudo CACHEs in accordance with the HiNAND2 array shown in FIG. 1A, the Block-decoder shown in FIG. 2A, the Segment-decoder shown in FIG. 2B, the DB shown in FIG. 3, and the MLC cell's 4-Vt assignment shown in FIG. 4 according to embodiments of the present invention.

Figure 7A:
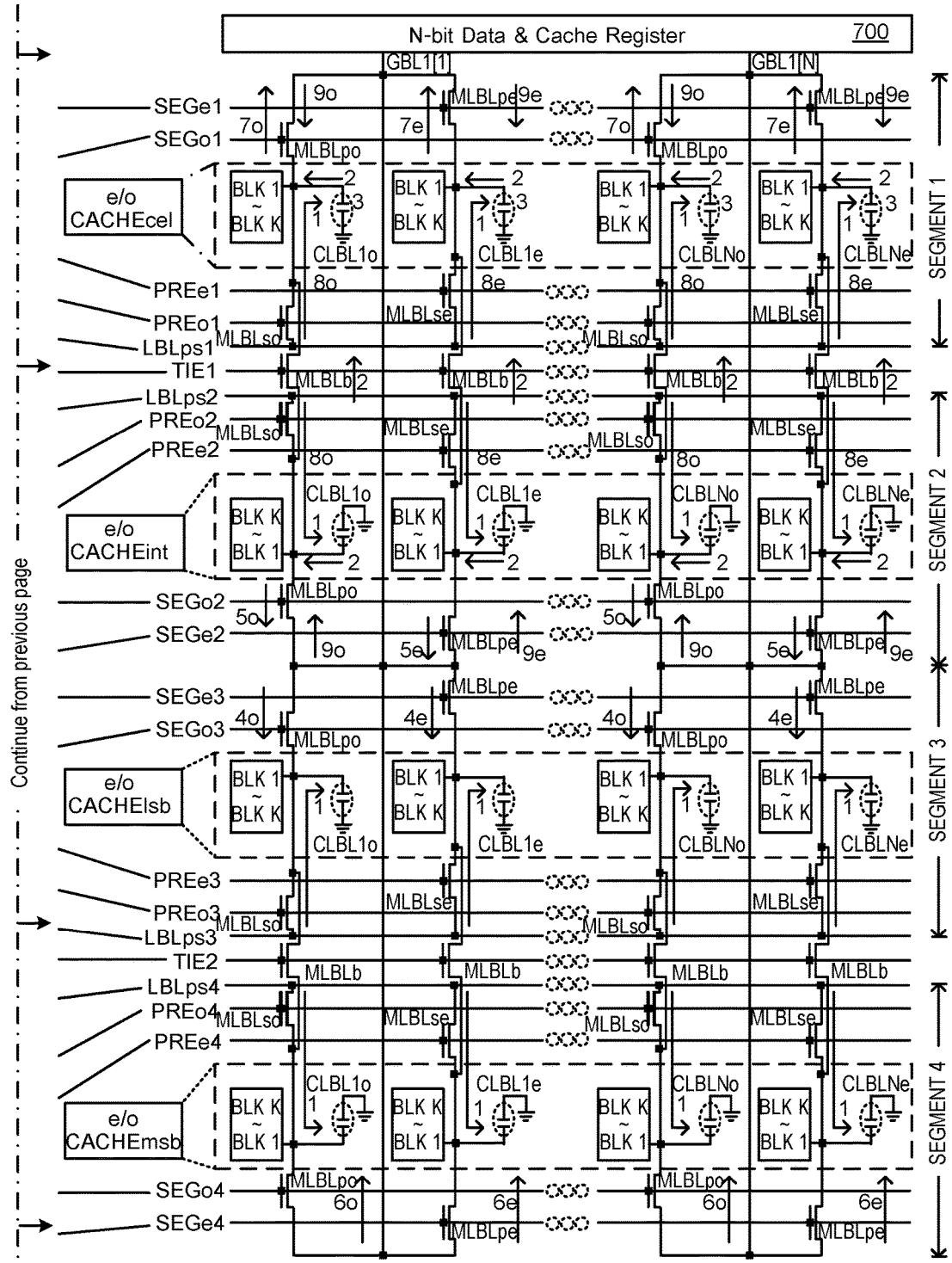
Figure 7B:
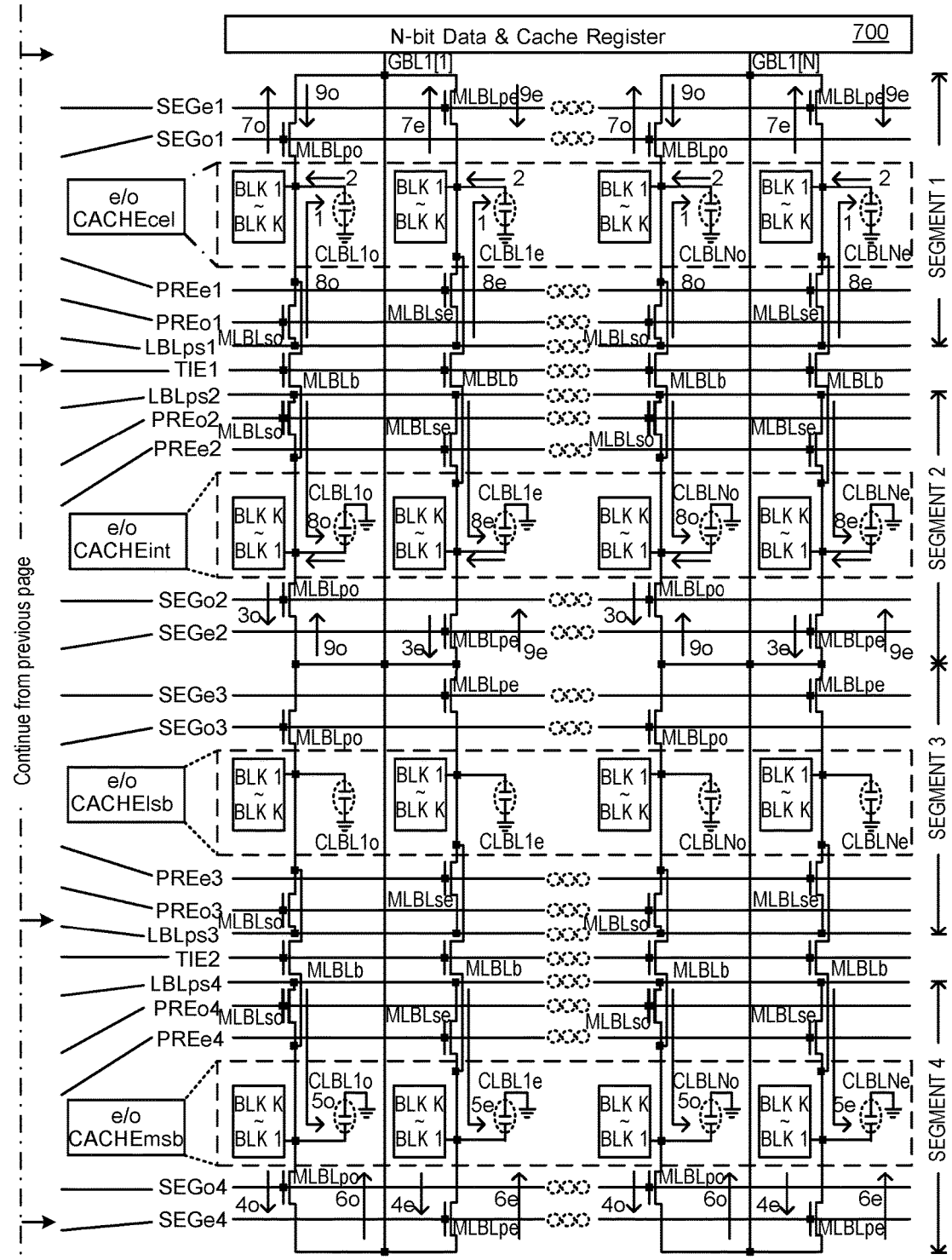
Figure 7C:
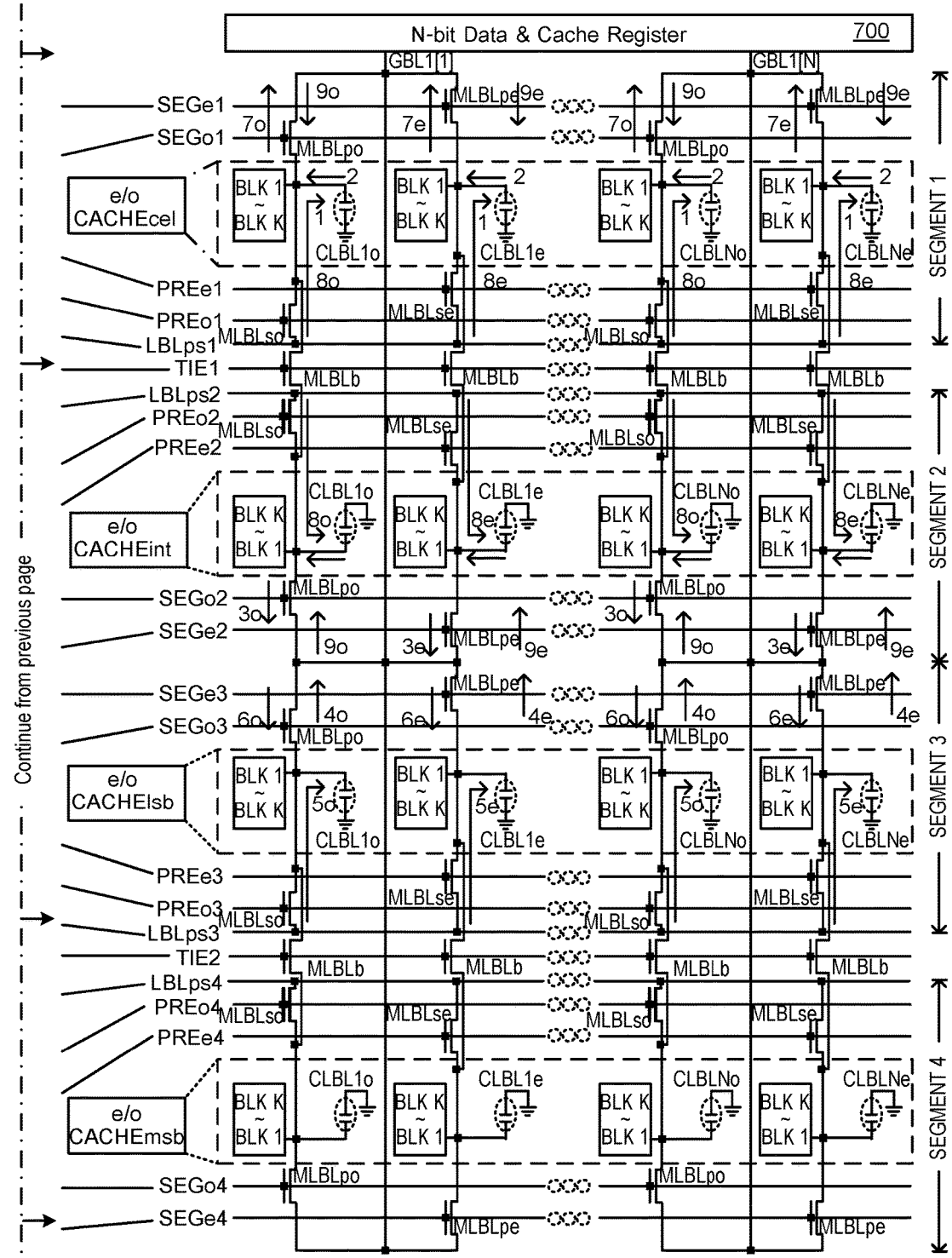
Figure 7D:
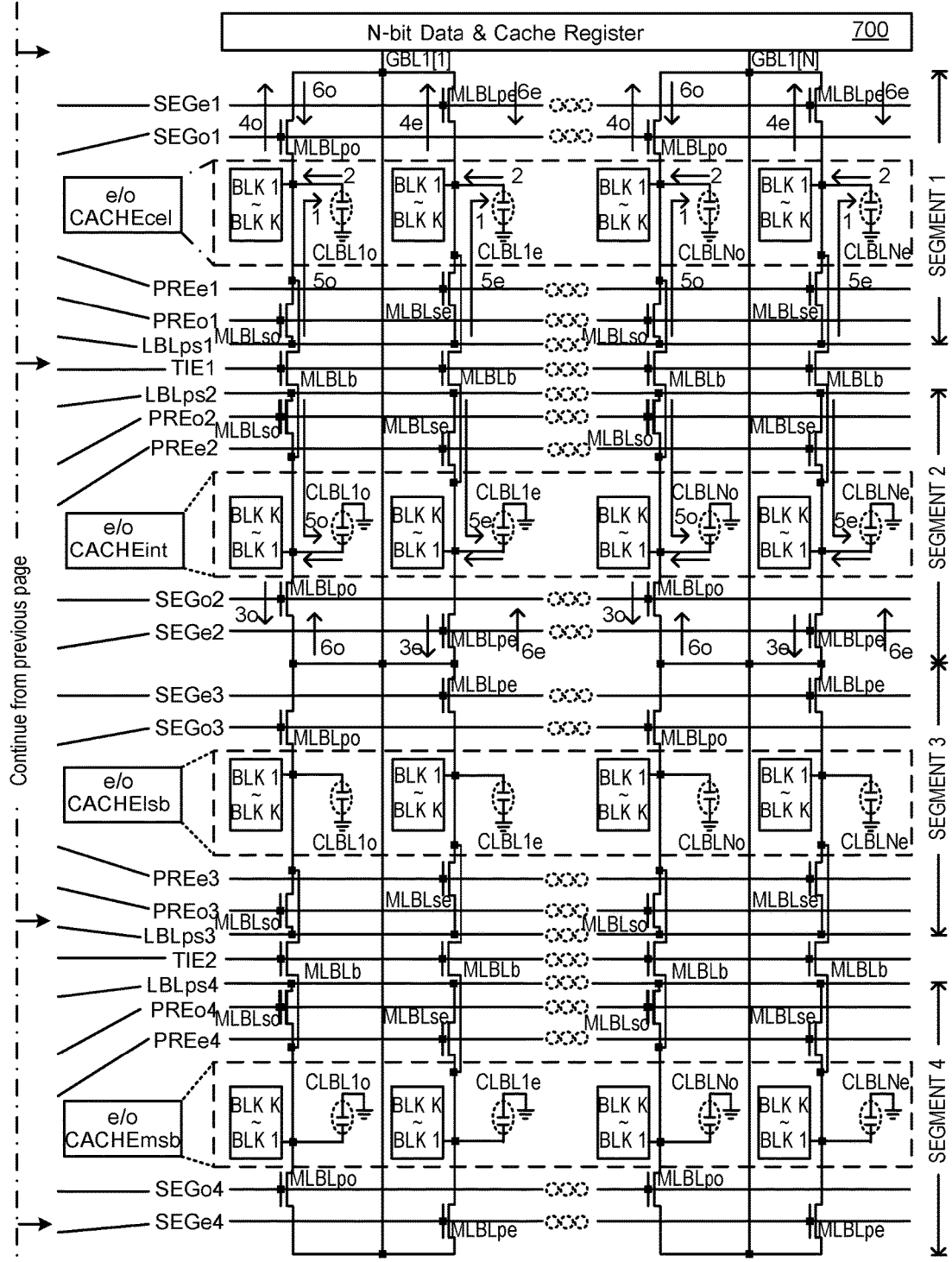
Figure 7E:
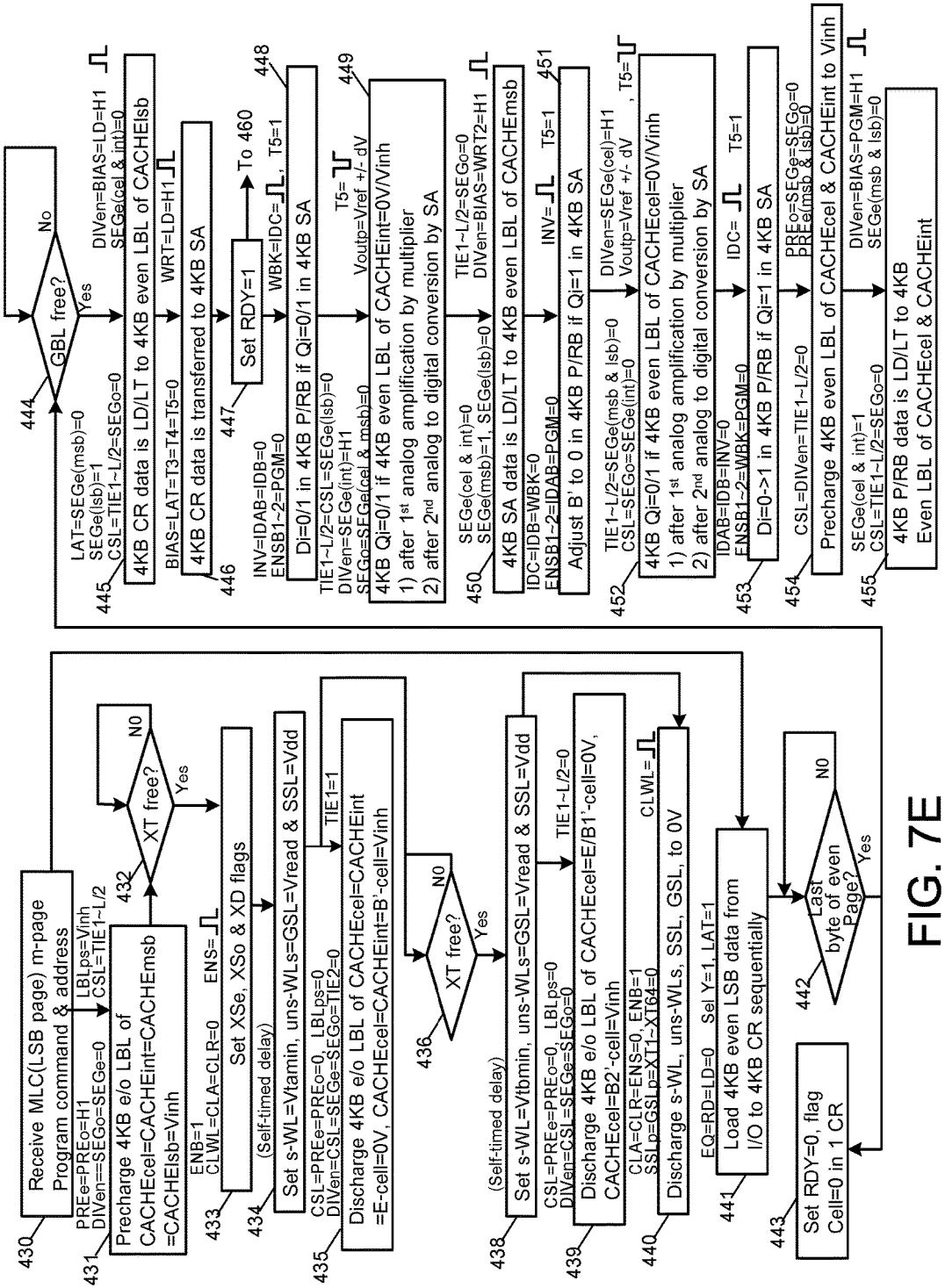
Figure 7F:
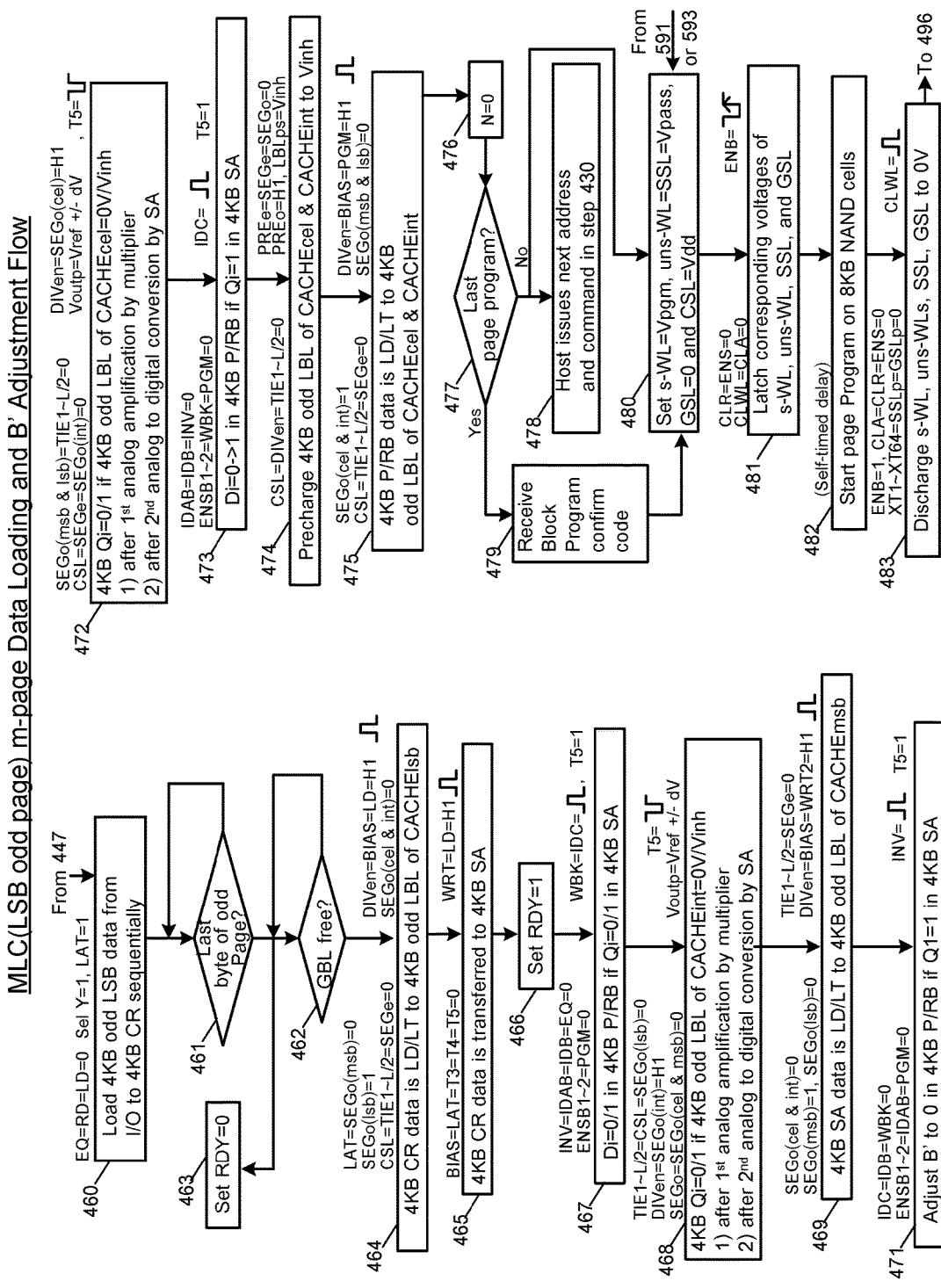

FIGS. 7E-7G are flow charts and bias conditions for multi-page MLC (LSB Page) data loading and B' Adjustment operations in accordance with the HiNAND2 array shown in FIG. 1A, the Block-decoder shown in FIG. 2A, the Segment-decoder shown in FIG. 2B, the Data & CACHE Register shown in FIG. 3, and the MLC cell's 4-Vt assignment shown in FIG. 4 according to embodiments of the present invention.

FIGS. 7H-7M are flow charts for multi-page MLC (LSB Page) A-state Program-Verify operation and B' Adjustment, B-state Program-Verify operation, and C-state Program-Verify operation in accordance with the HiNAND2 array shown in FIG. 1A, the Block-decoder shown in FIG. 2A, the Segment-decoder shown in FIG. 2B, the Data & CACHE Register shown in FIG. 3, and the MLC cell's 4-Vt assignment shown in FIG. 4 according to embodiments of the present invention.

Figure 8A:
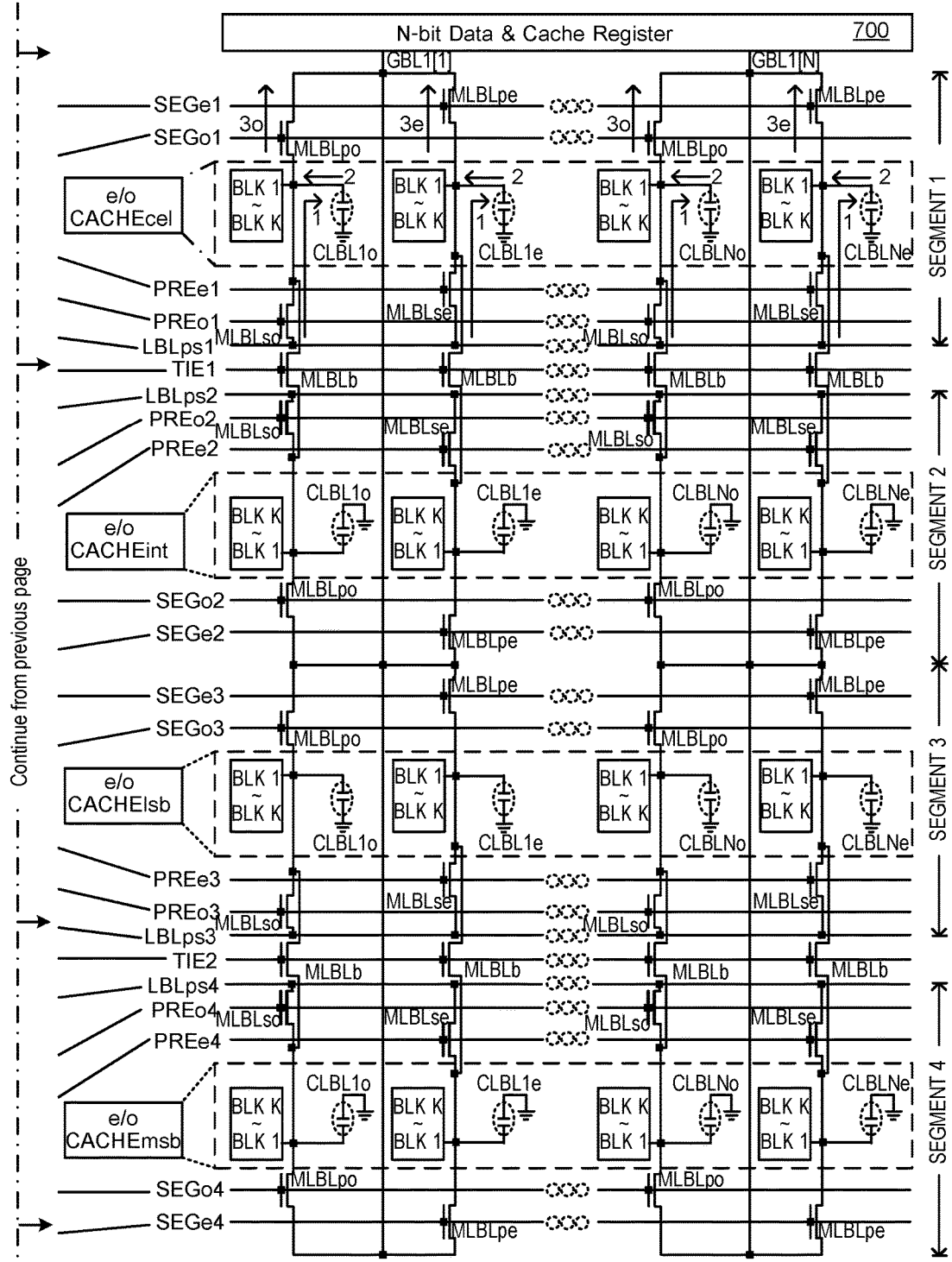
Figure 8B:
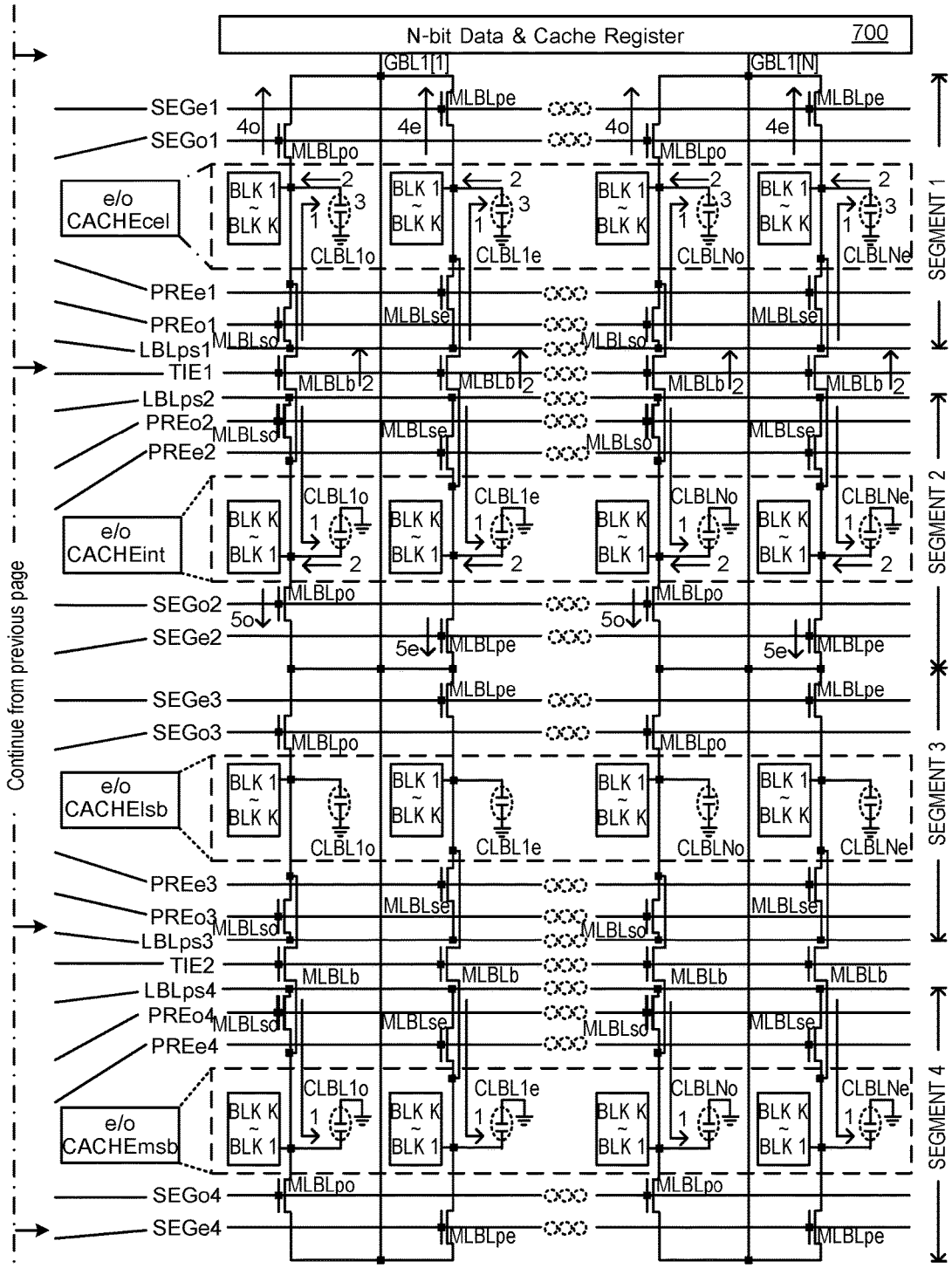
Figure 8C:
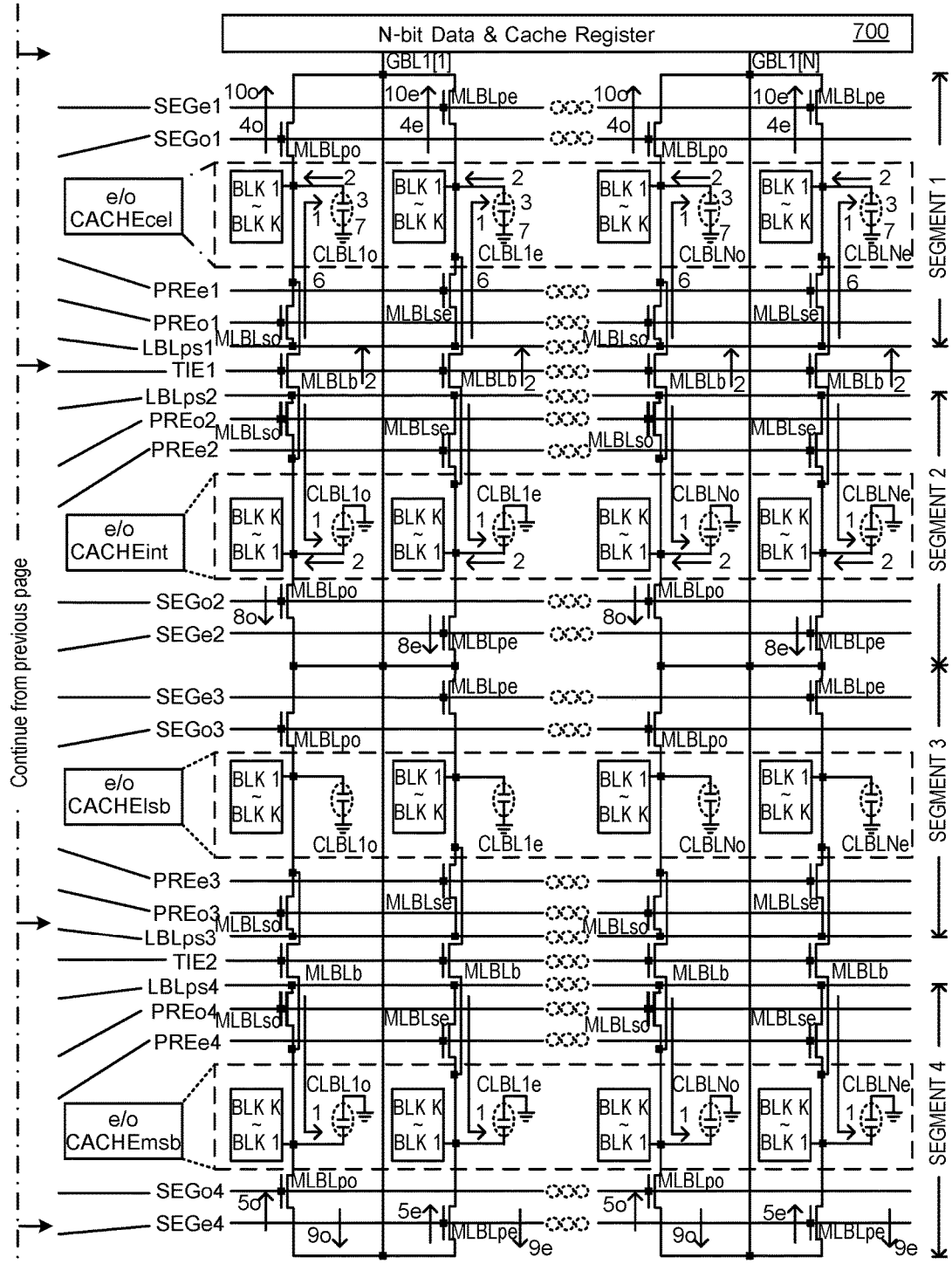

FIGS. 8A-8C are bias conditions for multi-page SLC/MLC (MSB Page) Read operations in accordance with the HiNAND2 array shown in FIG. 1A, the Block-decoder shown in FIG. 2A, the Segment-decoder shown in FIG. 2B, the Data & CACHE Register shown in FIG. 3, and the MLC cell's 4-Vt assignment shown in FIG. 4 according to embodiments of the present invention.

FIGS. 8D-8G are flow charts for multi-page SLC/MLC Read operations in accordance with the HiNAND2 array shown in FIG. 1A, the Block-decoder shown in FIG. 2A, the Segment-decoder shown in FIG. 2B, the Data & CACHE Register shown in FIG. 3, and the MLC cell's 4-Vt assignment shown in FIG. 4 according to embodiments of the present invention.

FIG. 8H is a table showing bias conditions for MLC Read of Even Page with Flag cell assigned to 0 associated with FIGS. 8A-8G according to an embodiment of the present invention.

Figure 9A:
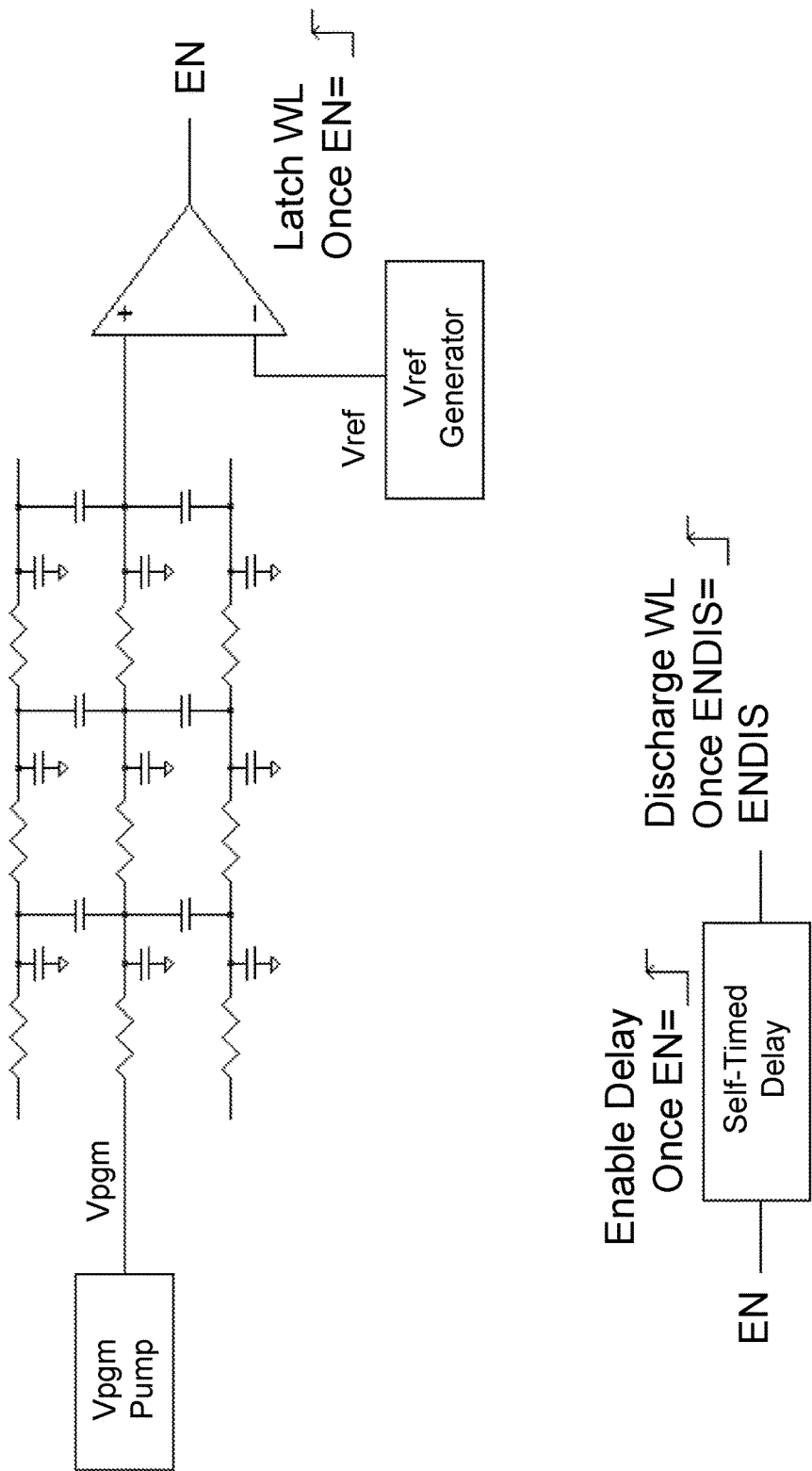

FIG. 9A is a differential amplifier (DA) circuit diagram for generating, detecting, and latching a Vpgm voltage by setting Vref=Vpgm in Comparator with a full RC-delay tracking capability for the selected WL during a self-timed concurrent/pipeline multiple-WL Program operation according to an embodiment of the present invention.

Figure 9B:
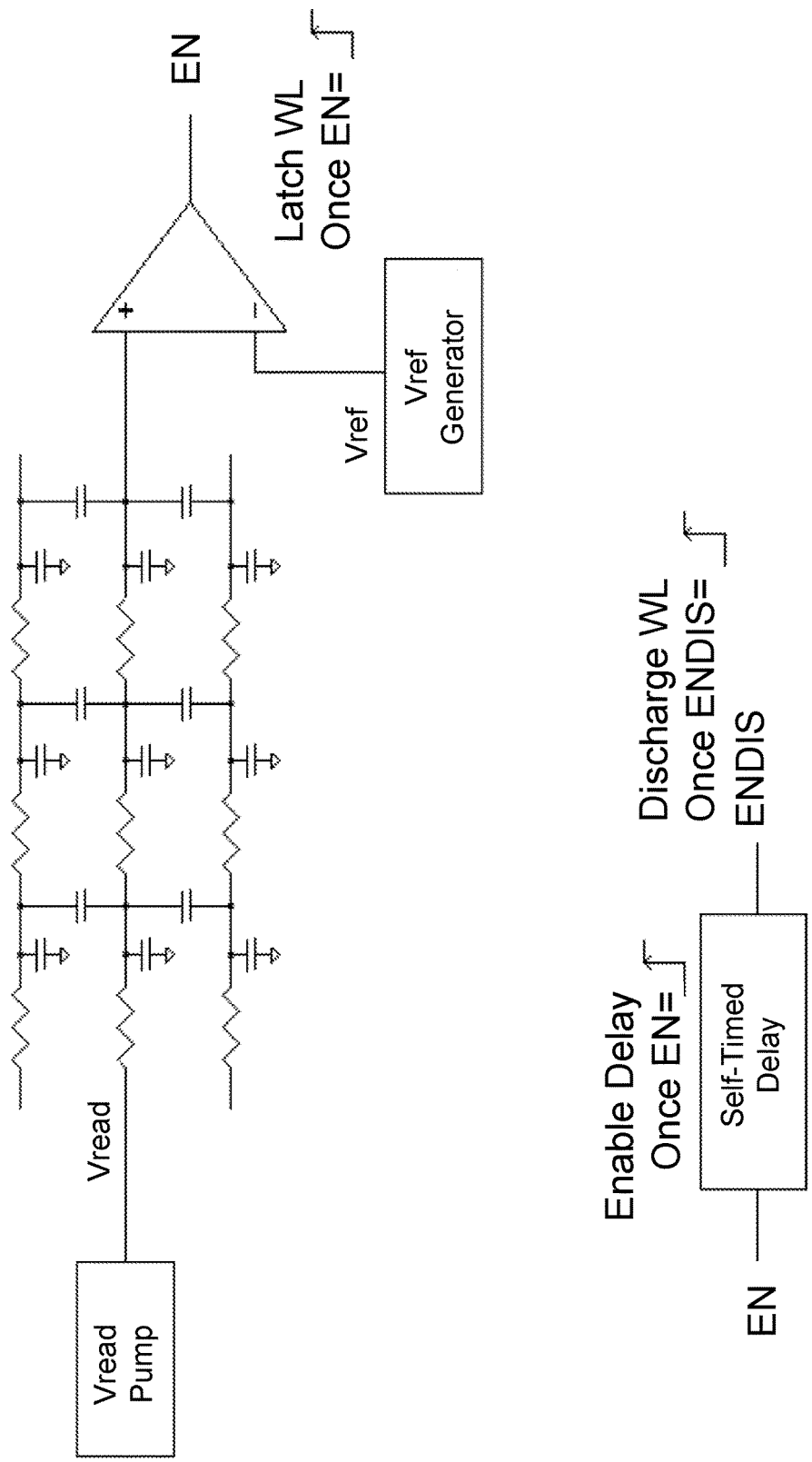

FIG. 9B is a differential amplifier (DA) circuit diagram for generating, detecting, and latching a Vpass voltage by setting Vref=Vpass in Comparator with a full RC-delay tracking capability for the selected WL during a self-timed concurrent/pipeline multiple-WL Read and Verify operations according to an embodiment of the present invention.

Figure 9C:
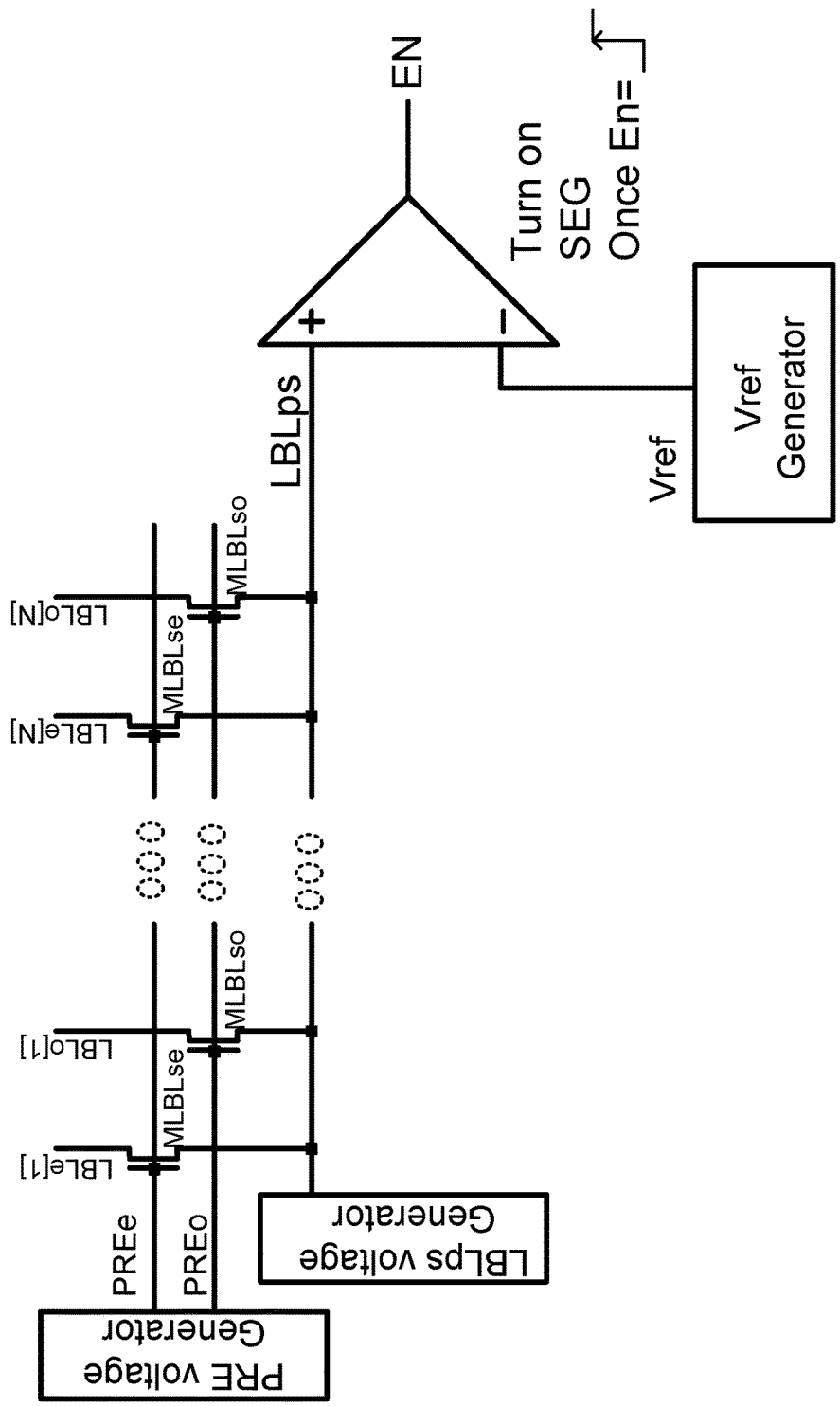

FIG. 9C is a differential amplifier (DA) circuit diagram for generating, detecting, and latching a VLBLps up to Vinh voltage for self-timed concurrent/pipeline operations according to an embodiment of the present invention.

5. DETAILED DESCRIPTION

In the following detailed description of the present embodiments, reference is made to the accompanying drawings that forms a part hereof, and in which is shown, by way of illustration, specific embodiments in which the disclosure may be practiced. In the drawings, like numerals describe substantially similar components throughout the several views. These embodiments are described in sufficient detail to enable those skilled in the art to practice the embodiments. Other embodiments may be utilized and structural, logical, and electrical changes may be made without departing from the scope of the present disclosure. The following detailed description, therefore, not to be taken in a limitation sense.

FIG. 1A shows an embodiment of a preferred 2D HiNAND2 array 200 with 2-level, 2-metal top global metal2 GBL and bottom local metal1 LBL hierarchical Even and Odd numbered cell array that comprises J divided Groups with option of equal or unequal sizes. In this example, whole HiNAND2 array is being divided into J broken vertical Groups connected by 4 KB top-level 4λ-width broken metal2 GBLs per two bottom-level 8 KB broken metal1 2λ-width LBLs per Group. Note, λ is the minimum pitch width in NAND technology node. In FIG. 1A, each LBL is not further divided for simplicity of explanation.

In an embodiment, each long metal2 GBL is divided into J broken GBLs by J−1 GBL-divided NMOS MGBL transistors such as $MGBL_1$ to $MGBL_{J-1}$ for J NAND Groups. The J−1 gates of J−1 MGBL transistors, $MGBL_1$ to $MGBL_{J-1}$, in each GBL are separately connected to J−1 signals of DIVen[1] to DIVen[J−1] from Group 1 (20l) to Group J (20j), respectively. Furthermore, the bottom-level 8 KB LBLs of each Group is further divided into L pairs of 4 KB Even LBLs and 4 KB Odd LBLs, each of them corresponds to a $C_{LBL}$ capacitor or a Segment. Here N=4 KB. All 8 KB LBLs have a line length identical to corresponding top metal2 broken GBL. Each pair of neighboring Segments are connected via a row of bridge transistors MLBLb commonly gated by a TIE signal. For total L Segments in each Group, there will be L/2 rows of such connection transistors respectively gated by TIE1 through TIEL/2 signals.

In this application, 8 KB and 2N-bit or 4 KB and N-bit are alternately used in this description and should be treated as the same. As explained later, each LBL or $C_{LBL}$ capacitor is also referred as one Segment metal1 line or Segment parasitic metal1 capacitor or each pseudo CACHE register. Each Segment is comprised of L NAND Blocks, which are vertically connected by 8 KB metal1 LBLs. In one or more embodiments, L=4 is used for illustrating purposes throughout the specification although other numbers can be used without being limited in scope.

Next, each of L pair of 4 KB metal1 Even and Odd LBLs is connected to one shared metal2 GBL via one transistor MLBLpe and MLBLpo respectively. The bridge transistor MLBLb is preferably made with a BVDS≈7~10V as String-select transistors MG and MS in each NAND String. The J−1 gates of MGBL transistors, $MGBL_1$ to $MGBL_{J-1}$, are separately connected to J−1 signals of DIVen[1] to DIVen [J−1] from Group 1 to Group J, respectively. Each row has 4 KB MGBL transistors with 2N cells in one physical WL of the HiNAND2 array. Note, each Group size can be optionally made with different metal2 GBL length, thus different $C_{GBL}$ capacitances. As a result, each metal1 $C_{LBL}$ length and capacitance will be made different accordingly. Each GBL length is identical to each LBL length in layout if each LBL is not further divided.

Each group size (or each metal2 GBL or each metal1 LBL length) can be made different for achieving a balanced Charge-sharing performance between each $C_{LBL}$ capacitor and corresponding $C_{GBL}$ capacitor in conjunction with the proper control over each GBL-divided transistor of MGBL in on and off state. For example, in order to read analog data of 4 KB cells from Group 1 to a N-bit 4 KB Data Cache & Register 700 located at top-end of the HiNAND2 array 200 with least signal degradation caused by each $C_{LBL}/J \times C_{GBL}$ charge-sharing effect, all J−1 $M_{GBL}$ transistors between Group 1 and Group J have to be shut off by setting DIVen[1] to DIVen[J−1]=Vss. Thus Ratio of $C_{LBL}/J \times C_{GBL}=1$ because J=1, which provides a strongest cell analog signal to each Multiplier (to be shown below) of each Data Cache & Register 700. Conversely, when reading analog data of 4 KB cells from Group J−1 to the N-bit 4 KB Data Cache & Register 700 located at the top-end, the cell signal suffers the largest degradation of 1/J by the largest Ratio of signal dilution of $C_{LBL}/J \times C_{GBL}$ charge-sharing effect. In this case, all J−1 MGBL transistors between Group 1 and Group J have to be turned on by setting DIVen[1] to DIVen[J−1]= Vdd to H1. In summary, more signal degradation due to more signal dilution of LBL/GBL charge-sharing effect from reading Group J than Group 1. In order to balance the Read and Verify cell signal level, Group 1 can be made with the shortest GBL/LBL length. Conversely, Group J can be made of longest GBL/LBL length.

In another approach, if Group 1 through Group J is made of a same GBL/LBL length, then each LBL precharge voltage can be made different to balance the sensed cell signal. For example, each $C_{LBL}$ capacitors in Group J can be precharged with a highest LBL voltage of Vinh and then decreased progressively from Group J−1 to Group 1 to 1V of Vdd−Vt where Vdd=1.8V.

Referring to FIG. 1A, each preferred HiNAND2 Group (201 through 20j) further comprises L Segments, and each Segment further comprises K Blocks. Each NAND Block further comprises N vertical Strings and each String has 64 NAND cells connected in series with their gates respectively connected to 64 horizontal poly2 WLs such as WL[1] to WL[64] and one top and bottom String-select NMOS transistors MS and MG with their separate gates respectively tied to SSL and GSL poly2 lines.

In addition, each bottom end of each LBLe line and each LBLo line are connected to each drain node of a paired pull-down NMOS transistors, MLBLse and MLBLso, with respective gates coupled to PREe1[1] and PREo1[1] and a common source line of LBLps1[1] in Segment 1 and PREe1 [L] and PREo1[L] in Segment L and a common source [L] coupled to LBLps1[L] in Group 1 and PREeJ[1] and PREoJ [1] and a common source line of LBLpsJ[1] in Segment 1 and PREe1[L] and PREo1[L] in Segment L and a common source coupled to LBLpsJ[L] in Group J.

Each HiNAND2 Group (201 through 20j) has L physical Segments and each Segment has 8 KB metal1 $C_{LBL}$ capacitors corresponding to 8 KB pseudo CACHE Registers. Each metal1 $C_{LBL}$ capacitor is connected to K small Blocks and each broken metal2 $C_{GBL}$ capacitor is connected L pairs of Segments.

One other major feature of Segment configuration is that $C_{LBL}$ capacitors of two adjacent Segments are made as a pair, between which a NMOS bridge transistor MLBLb with its gate coupled to a corresponding TIE signal, is used to connect this paired $C_{LBL}$ capacitors. When TIE≥Vinh+Vt to turn on MLBLb, then the charges of Vinh or Vss in both adjacent CACHE $C_{LBL}$ capacitors would be shared and a final balanced voltage will be reached. This charge-sharing operation between two adjacent Segment's $C_{LBL}$ capacitors is a very useful technique when one $C_{LBL}$ is discharged due to that the selected cell is in conduction state, then the paired $C_{LBL}$ capacitors would also be discharged to the same voltage level to save tedious steps to transfer read data between two adjacent paired CACHEs.

Referring to FIG. 1A again, on top-end of the HiNAND2 array 200, one N-bit real CACHE Register and one N-bit Data Register (D/R) are disposed there as N-bit Data Cache & Register 700. All above mentioned Median HV transistors of MGBL, MLBLse, MLBLso, MLBLpe and MLBLpo are preferably made of at least same or higher BVDS NMOS devices than the NAND String-select NMOS device of MS or MG.

Figure 1B:
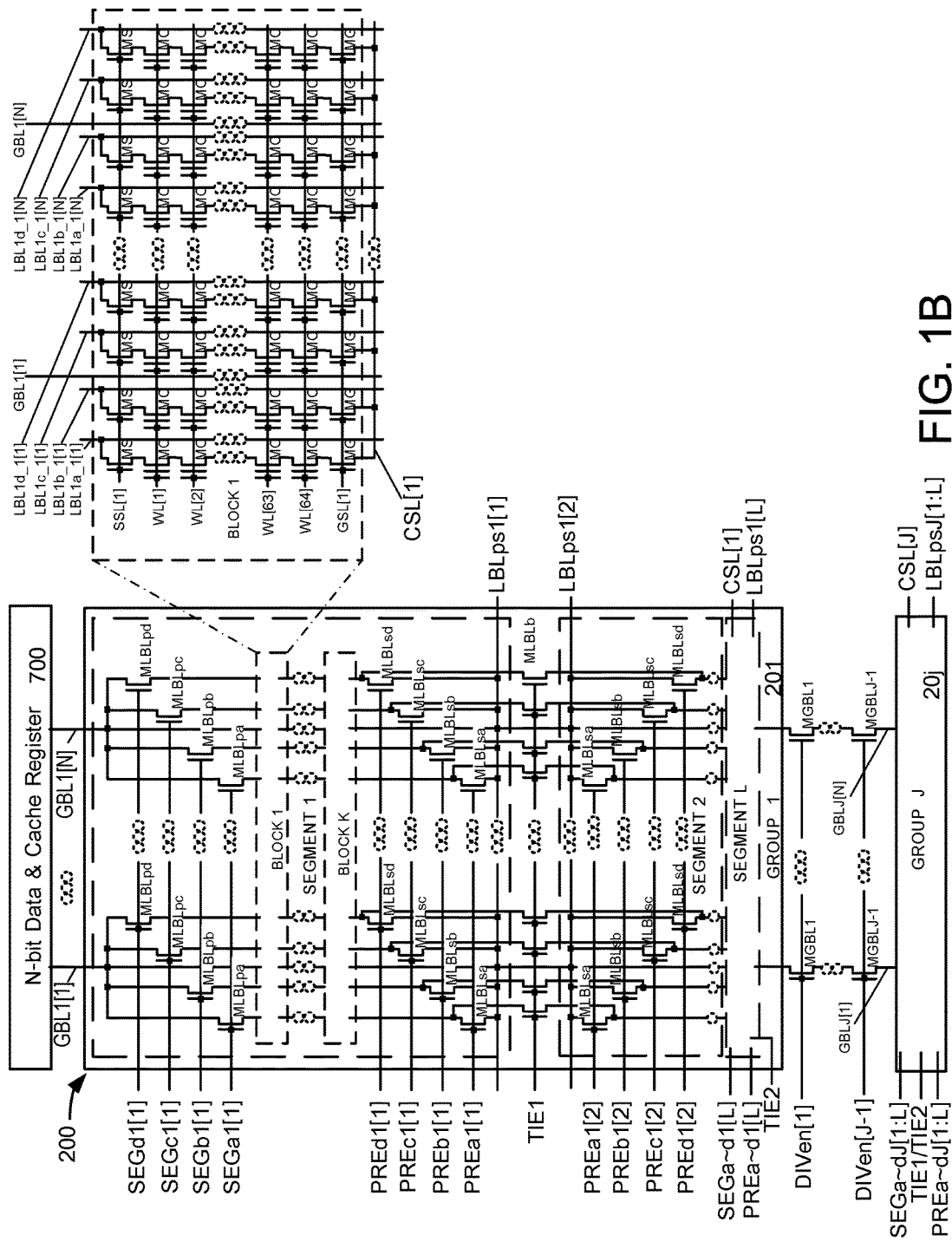
FIG. 1B is circuit diagram showing a preferred 2D HiNAND2 with 2-level BL-hierarchical cell array including 2N (8 KB) local bit lines (LBLs) pseudo CACHE capacitors connected to N/2-bit Data/Cache Register via N global bit lines (GBLs) according to an embodiment of the present invention.

FIG. 1B shows another embodiment of a 2D HiNAND2 array 200' with a preferred 2-level, 2-metal, BL-hierarchical cell array that comprises similar J isolated Groups 201' through 20F with equal or unequal sizes divided by J−1 rows of MHV MGBL transistors (~10V) as explained above in FIG. 1A. Comparing with HiNAND2 array shown in FIG. 1A, this 2D HiNAND2 array has similar 2N (8 KB) 2λ metal1 LBL lines or 2N (8 KB) $C_{LBL}$ capacitors (or termed as 8 KB pseudo CACHE capacitors) per CACHE but N/2 (4 KB) 8λ metal2 GBL lines or N/2 (4 KB) $C_{GBL}$ capacitors, one N/2-bit (4 KB) DB and one N/2-bit (4 KB) real CACHE register.

As seen in FIG. 1A, the HiNAND2 array 200 has N metal2 GBLs associated with 2N NAND physical cells in one physical WL (or page), corresponding to 2N metal1 tight 2λ LBL lines and $C_{LBL}$ capacitors and N paired transistors MLBLpo and N MLBLpe, MLBLso and MLBLse per one Group per one metal2 broken GBL. Totally, the HiNAND2 array 200 has 4 KB N metal2 broken GBLs with loose 4λ pitch size and 4 KB $C_{GBL}$ capacitors per Group and only the N metal2 broken GBLs in top Group 1 are connected directly to corresponding a N-bit Data Cache & Register (or simply Data Buffer (DB)) 700 without going through any GBL-divided device such as MGBL transistors. The rest of J−1 Groups have to go through J−1 MGBL transistors to connect to N-bit DB 700. For example, the $C_{GBL}$ capacitor in Group 2 needs to go through $MGBL_1$ transistor and then via $C_{GBL}$ capacitor in Group 1 to connect to one bit of corresponding N-bit 4 KB DB 700.

In contrast, as seen in FIG. 1B, the HiNAND2 array 200' is formed with only N/2, 2 KB, metal2 GBLs with more loose 8λ pitch size and 2 KB $C_{GBL}$ capacitors per Group in accordance with the same 2N physical NAND cells, 2N8 KB metal1 LBLs corresponding to 2N 8 KB $C_{LBL}$ capacitors in one physical page and WL. In other words, total number of the metal2 GBLs is only ¼ of total number of NAND cells per each physical page or WL. Each top-level 8λ-pitch metal2 $C_{GBL}$ associated with each GBL is connected to four bottom-level metal1 2λ-pitch $C_{LBL}$ capacitors associated with corresponding four LBLs (One top-level loose 8λ metal2 GBL is connected to four bottom-level tight 2 k metal1 LBLs). As such, N MLBLpo, N MLBLpe, N MLBLso, and N MLBLse transistors in FIG. 1A have been replaced by N/2 MLBLpa, N/2 MLBLpb, N/2 MLBLpc, and N/2 MLBLpd and N/2 MLBLsa, N/2 MLBLsb, N/2 MLBLsc, and N/2 MLBLsd.

Similarly to FIG. 1A, one major feature of Segment configuration is that two $C_{LBL}$ capacitors of adjacent Segments are made as a pair in this FIG. 1B, between which a NMOS bridge transistor, MLBLb, with gate coupled to a TIE signal is used to connect this paired $C_{LBL}$ capacitors. When TIE≥Vinh+Vt to turn on the bridge transistor MLBLb, the charges of Vinh or Vss in both adjacent capacitors would be shared and a final balanced voltage will be reached. This charge-sharing operation between two adjacent Segment's $C_{LBL}$ capacitors is a very useful technique when one $C_{LBL}$ is selected for discharging, then the paired $C_{LBL}$ capacitors would also be discharged to the same voltage level due to the conduction state of MLBLb. With the bridge transistor MLBLb is fully turned on, the data stored in this paired $C_{LBL}$ capacitors would be same. As s result, both N-bit real CACHE Register and N-bit 4 KB Data Register (DR) in DB 700 are reduced to N/2-bit 2 KB real CACHE Register and N/2-bit 2 KB DR in accordance with N/2 2 KB top-level loose 8λ-pitch metal2 GBLs. Thereby, in FIG. 1B, the sizes of CACHE and DR have been cut in half from those in FIG. 1A so that a big area saving in NAND peripheral circuit is achieved.

Figure 1C:
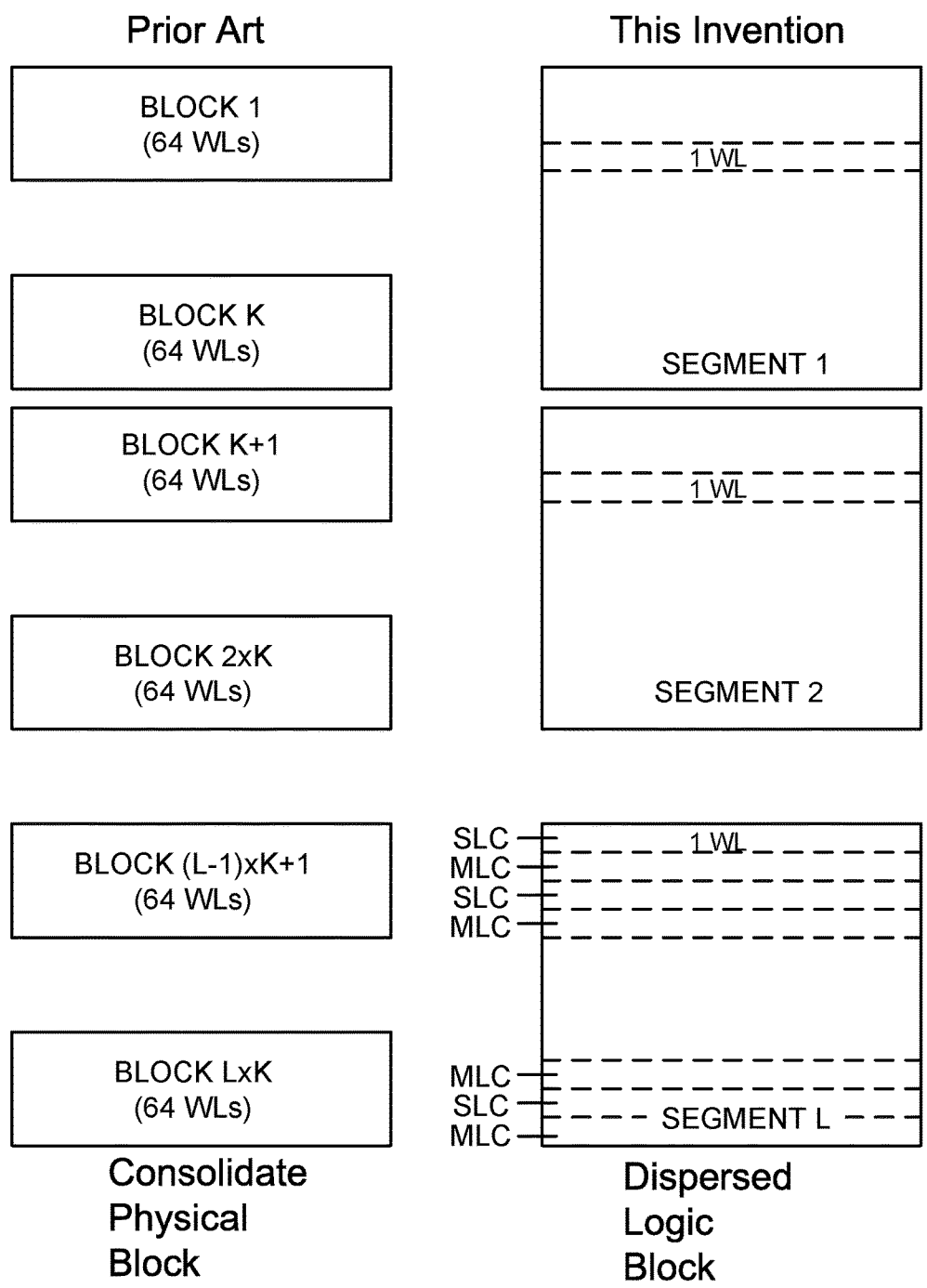
FIG. 1C is a schematic diagram comparing L×K Consolidated Physical NAND Blocks within one a conventional NAND plane with L Dispersed Logic NAND Blocks according to an embodiment of the present invention.

FIG. 1C shows a plurality of Consolidated Physical NAND Blocks in one NAND plane of prior art as compared to a plurality of Dispersed Logic NAND Blocks in one NAND plane of the present invention. In conventional NAND, one Physical Block having total 64 pages in is the minimum-unit of an Erase size, but Program is performed on page-by-page basis 64 times to complete 64-page Program and Program-Verify operation. In conventional m-page Program sequence a strict rule needs to be followed by starting from the bottom page near the bottom String-elect transistor MG to the top page near the top String-select transistor MS. In the embodiment of this invention shown in right side of FIG. 1C, the preferred HiNAND2 array scheme is comprised of 64 Dispersed physical Blocks, based on which preferred m-page concurrent operations such as Program, Program-Verify, Read and Erase-Verify operations can be performed on m random pages in m random Segments in one or more Groups. More than one Segment in each Group can be selected for concurrent m-page operations with only one restriction that one Block is selected per one selected Segment. In an embodiment, more than one pseudo 2N-bit CACHE registers are used during the whole course of the preferred m-page operations to store the temporary m-page data for both SLC and MLC operations.

Within the conventional NAND scheme the minimum erase size is one Consolidated Physical Block that contains 64 WLs or Pages. In contrast, for the HiNAND2 scheme with Dispersed Logic Blocks, the minimum erase size is defined as one random page in one Physical Block per one Segment. Total m selected pages for m-page operation are widely distributed in one or more Segments in one and more Groups. If four equal page-number Blocks per four Segments per Group are selected for m-page Program operation, then m/4 Groups are required to perform concurrent m-page Program and Program-Verify operation. In this invention, non-equal random number of Segments per Group can be selected for the m-page Program and Program-Verify operations. For example, if total 64 pages are selected for a concurrent M-page Program operation, then four Segments can be selected in Group 1, six Segments in Group 2, five Segments in Group 3, one Segment in Group 4, and four Segments are selected respectively for the rest of Group 5 through Group16 for the 64-page concurrent Program and Program-Verify operations.

The minimum size of performing Program, Erase, and Read operation is normalized in one physical page or one physical WL per one Segment. The preferred m-page Block operation of the HiNAND2 array means m-page Logic Block operations that select m dispersed WLs in m dispersed Segments in one or more Groups for concurrent operations to achieve m-fold reduction latency in m-page operation.

In an embodiment, in case some pages of total m pages fail during the Program operation, then there are two options to complete the required m-page concurrent Program operation. For example, if there are 3 pages failed in the 64-page Program, a first proposed option is that these 3 pages will be assigned with 3 newly erased pages for continuing 3-page concurrent Program and Program-Verify operations. In other words, the first 64-page Program was collectively and concurrently on 64 selected WLs. After a predetermined time, 3 pages are found with failed Program. Then these 3 failed pages will be assigned 3 newly erased WLs to continue the second 3-page concurrent Program. If the second 3-page concurrent Program is passed, then the whole 64-page Program is finished. Otherwise, the process is continued until all 64 pages are programmed successfully. A second option is to combine the 3 failed pages with 61 new pages to make total 64 pages for a new 64-page Program. In other words, each Program is always performed in 64-page unit to save m-fold latency. If there are no more new pages to be programmed, then the first option is the preferred choice.

Note, the multi-page Program size can be less than 64 pages. The 64-page Program merely gives maximum but not limited number of 64 pages that can be performed concurrently according to embodiments of the present invention. Thus any smaller pages can also be performed concurrently to save the program latency time.

In an alternative embodiment, a HiNAND1 array with one BL level is provided with nLC 2D or 3D NAND chip design. The HiNAND1 array includes a plane of NAND cells physically divided into a plurality of Groups in column direction to allow the multi-page self-timed flexible concurrent and pipeline operations. Accordingly several peripheral circuits including a data-register with at least 50% bit-reduction, Block and Group decoders with self-timed control are provided.

Specifically, the plane of NAND cells in nLC design is formed into rows of pages (WLs) and columns of bit lines (BLs). The columns are divided into a plurality of Groups by multiple rows of Group-divided devices. Each Group further comprises a plurality of Blocks and one dedicated Group's power line and each Block further comprises a plurality of Strings in column direction arranged one by one in row direction. Within each divided Group, all drain nodes of all Strings of all Blocks are connected by a BL metal line laid in the column direction and all source nodes are connected to a common SL made of another metal or non metal line laid in the row direction. All BL metal lines of each divided Group of HiNAND1 array act one row of capacitor-based CACHE register for independently storing the program and read data for the self-timed m-page concurrent and pipeline operations such as Program, Program-Verify, Erase-Verify, and Read or mixed combination of above operations. Although HiNAND1 array has less flexibility to load and read data during which all different pages of m-page data has to be loaded in and read on in a "sequential" manner, the advantage for the whole HiNAND1 array lies in the use of single metal line for all BLs to save the manufacturing cost.

FIG. 2A shows one of the preferred Block-decoder circuit that comprises an unique latch with a novel status check circuit PAS, a Pre-decoder with three inputs of Pi, Qj, and Sk and one local HV Pump circuit to enable the plurality of HV/LV connections between each Block's Pre-decoder inputs of XT1~XT64, GSLp and SSLp and the corresponding WL1~WL64, GSL and SSL outputs of m selected Blocks of HiNAND2 array and the associated circuits of DB, CACHE and I/O Control during the preferred m-page mixed SLC/MLC Program, Program-Verify, Read, Erase-Verify operations, etc. As shown, an embodiment of a preferred Block-decoder circuit 1000 that comprises a latch circuit 1010 with a status check circuit 1040 with an output PAS, a Pre-decoder circuit 1030 with three inputs of Pi, Qj, and Sk, and one Local HV Pump circuit 1020 to enable the plurality of HV/LV connections between each Block's Pre-decoder inputs of XT1 through XT64, GSLp, and SSLp and the corresponding WL1 through WL64, GSL, and SSL outputs of m selected Blocks of the HiNAND2 array (FIG. 1A) and the associated circuits of DB, CACHE, and I/O Control during the preferred m-page Program, Program-Verify, Read, Erase-Verify operations, etc. As seen, a CLWL signal coupled with a NAND4 device is used to clear or discharge HV left on all 64 WLs, SSL, and GSL in m randomly selected Segments once each Block operation is verified successfully to reduce the WL-stress on m selected Blocks. Note, all above mentioned multi-page operations require HV to be applied on selected 64 WLs, SSL, and GSL. A WLPH signal coupled to a NAND1 device is configured to dedicate a clock signal for the Block-decoder's pump circuit 1020.

When 3 input addresses of Vdd, Pi=Qj=Sk=Vdd, are provided for the selected Block-decoder 1000, then XDM is set to Vdd is to enable the status check circuit 1040 by turning on NMOS transistor MN1 to couple a ground voltage Vss. With XDM node being set to Vdd and a one-shot pulse being applied from ENS, the selected Segment latch (1010) is set to make XDB node at Vss and XD node at Vdd. The latch circuit 1010 comprises one INV3 and one INV4.

When the CLWL signal is Vdd and XD node is at Vdd, then XDP node becomes Vdd, WLPH signal at 0V and HXD node becomes Vdd because MN10 is a native NMOS device with Vt~0V. As a result, the pump circuit 1020 is stopped and HV trapped in WL1 through WL64 and Vdd trapped on SSL and GSL are discharged to Vss through the corresponding NMOS devices of MNH1 to MNH64, MNS2, and MNS3 if the selected Block passes the Program and Program-Verify to reduce the WL stress on gates of NAND cells.

During the multi-page Program operation, the selected XDP node at Vdd to enable the local pump circuit 1020 so that HXD node voltage can reach to higher than Vpgm+Vt to allow the full passage of Vpgm, and to set Vpass to the selected WLs and non-selected 63 WLs in m Blocks simultaneously.

Lastly, one more important function of this Block-decoder is the capability of immediate response to set HXD node at Vdd and stop the local pump to discharge all latched HV and LV on m selected sets of 64WLs+1SSL+1GSL when an unintended Vdd power loss is being detected. This can be easily done by setting the following conditions.

a) Setting CLWL signal to Vdd with time interval longer than 200 ns. No exact time control is necessary. The decline of Vdd will control the discharge time automatically.
b) Setting WLPH signal to 0V so that Local pump is disabled.
c) Setting XT1~XT64=SSLp=GSLp=0V
d) XD=Vdd for those selected Block decoders due to the Latch setting in the beginning of Block operations. The Latch is made of INV3 and INV4. Initially, when Pi, Qj, and Sk matched and ENS applies one-shot of Vdd, then XDB node is set to 0 but XD node is set to 1 (Vdd).
e) XDP=Vdd, thus HXD≈Vdd because MN6=NMOS Native device with Vt≈0V. As such, the trapped HV on WL are being discharged over power down time so that over-program would be eliminated. After Vdd is being restored within a reason time of seconds, then the trapped $C_{LBL}$ SLC or MLC page data patterns can be used and the unfinished of prior Program operations can be continued.

FIG. 2B shows an embodiment of a preferred Segment-decoder circuit 2000 that comprises a latch circuit 2010 with two latches and a status check circuit 2040 with a S_PAS output, a Pre-decoder circuit 2030 with 3 inputs of Ri, Tj, and Gk and one Local HV Pump circuit 2020 to enable connection of one HV or LV input of either SEGpo or SEGpe can be coupled to the corresponding gate line SEGo or SEGe output for properly operating this preferred HiNAND2 array (FIG. 1A) with even and odd number and its associated circuits of DB, CACHE and I/O Control during the preferred m-page or page-based or mixed Program, Program-Verify, Read, Erase-Verify operations, etc. With this Segment-decoder and above Block-decoder, the desired Vpgm, Vpass, Vread, and Vdd voltages of m sets of 64-WLs, 1 SSL and 1 GSL lines can be independently latched on all selected WLs Block-by-Block so that the m-page concurrent pipeline Program, Program-Verify, Erase-Verify, and Read concurrent operations can be performed with up to m-fold reduction in operation time.

The symbols of i and j may not be same value for two Pre-decoder inputs of either Block-decoder 1000 or Segment-decoder 2000. They are used herein to depict three possible Pre-decoders only. Another one output of Segment decoder 2000 is Sk that is used as the third Pre-decoder input of Block-decoder 1000 to enable the associated Block-decoder within a selected Segment.

During the charge-sharing period, the charges of Vinh stored of passed program cells in each metal1 $C_{LBL}$ capacitor will be shared with one corresponding metal2 large $C_{GBL}$ capacitor. In order to have a full passage of Vinh from each odd and even $C_{LBL}$ capacitor to each common metal2 $C_{GBL}$ capacitor, the gate voltage SEGe or SEGo is charged up to Vinh+Vt+ΔV at VHV port, where ΔV (<1V) is added to further reduce resistances of corresponding transistors MLBLpe and MLBLpo.

During $C_{LBL}$ precharge cycle from Segment power line LBLps, gate signals SEGo and SEGe have to set to shut off for preventing leakage. During the Vdd/Vss and Vinh/Vss conversion cycle, the SEGo=Vdd and SEGe=Vss or vice versa if $V_{GBL}$=Vdd/Vss in accordance with the page data. Note, odd or even number $C_{LBL}$ is precharged at the same time but Vdd/Vss and Vinh/Vss conversion is done 4 KB (½-page) each time.

FIG. 3 shows two bits of 2N-bit NAND cells in one page of HiNAND2 array 200 sharing with one bit of N-bit DR (Data Register) 100 and one-bit of real CACHE Register 101 outside HiNAND2 array (200), one NMOS Ypass circuit 300, with YAi and YBj column decoder inputs and one Byte-wide I/O Control circuit 500, to demonstrate the inventive concepts of the present invention.

In an embodiment, there are 2N-bit NAND cells connected in one physical WL or page and 2N NAND strings with 2N drain nodes connected to 2N metal1 2λ-pitch LBLs in one NAND block that contains 2N metal1 tight 2λ LBLs and $C_{LBL}$ capacitors but N metal2 loose 4λ-pitch GBLs and $C_{GBL}$ capacitors in HiNAND2 array 200 (FIG. 1A). Each bit of DR comprises 1-bit Multiplier 102, 1-bit DRAM-like Sense Amplifier (SA) 104, and 1-bit Program/Read Buffer (P/RB) 106, and 1-bit Program-Status check circuit 108 with following defined functions.

a) Multiplier (102): It is used to amplify the weak diluted cell's analog signal originated within each selected small CACHEcel $C_{LBL}$ capacitor due to charge-sharing effect that occurs along its sensed or read path by one or more large $C_{GBL}$ capacitors. The extent of cell's analog signal dilution is depending on the location of the selected Group away from each corresponding DB's SA circuit 104. This is termed as a first analog amplification stage. For example, if the selected cells of a selected physical page are in Group J's 2N-bit CACHEcel $C_{LBL}$ capacitors, then the charges of Vinh≥7V stored in each Segment's small metal1 $C_{LBL}$ capacitor and each corresponding comparable metal2 Jth $C_{GBL}$ capacitor jointly will be diluted by J $C_{GBL}$ capacitors from Group J to Group 1 with J–1 GBL-divided transistors of MGBL$_1$-MGBL$_{J-1}$ being turned on jointly by coupling J–1 DIV_EN signal to Vdd or higher to provide a signal path between the selected cell in Jth Group and a corresponding Multiplier in DR.

b) SA (104): This is a Latch-type SA circuit that can do a second digital amplification after Multiplier's first analog amplification. The amplified analog cell signal is presented at OUTP node with an original cell's weak input analog signal presented at each corresponding PBL node and is further amplified by each corresponding SA to get a set of full digital signals of Qi and QiB by switching T5 clock signal from Vss to Vdd. In addition, there are two added Capacitors 1 and 2 with different job assignments. The CAP1 is used to store the reverse polarity of last MSB data bit that was being read out from each corresponding NAND cell located in each CACHEcel and is then latched here for the subsequent LSB bit's data evaluation.

c) P/RB (106): It is like a conventional Page-buffer to store each old verified data bit for both SLC and MLC state evaluation during each iterative Program and Program-Verify and Erase-Verify operation performed in Block-mode.

d) Check circuit (108): This Page-program Check circuit is performing Page-based program check. Whenever a new 2N-bit, 8 KB, Program-Verify page data is loaded, then all N-bit of DiB=Vss, thus Di=Vdd to inhibit the corresponding N-bit cells from further iterative program and $V_{PASS}$=Vdd.

Each metal2 4λ-pitch GBL is connected to the input of each corresponding LV Multiplier circuit through a 20V NMOS buffer transistor, MN6, with its gate tied to BIAS. One data-bit input from one I/O is coupled to one bit of P/RB through Y-pass NMOS transistor. Each P/RB output is connected to each PBL node and then connected to each corresponding metal2 GBL through same MN6. Along the read path starting from a NAND cell in a selected CACHE-cel with a small metal $C_{LBL}$ capacitor through a larger metal2 $C_{GBL}$ capacitor to reach each corresponding SA, the analog cell signal is being diluted in HiNAND2 array scheme. Therefore, each diluted read analog signal has to be loaded into each corresponding Multiplier to perform the first analog amplification and then by each corresponding Latch-type SA to do second amplification that is designed to perform analog to digital conversion. The full digital paired outputs of Qi and QiB of each SA are then coupled to each corresponding P/RB inputs for distinguishing the stored states of SLC and MLC with same circuit but different steps. In other words, one preferred DB circuit for the preferred m-page Read and Program operations of a hybrid SLC/MLC HiNAND2 array.

FIG. 4 is a diagram showing two Vt distributions of a 2-Vt SLC NAND cell or a 2-Vt MLC MSB cell and a 4-Vt MLC NAND cell containing both 2-Vt MSB bit and 2-Vt LSB bit used in the preferred hybrid HiNAND2 array of FIG. 1A according to an embodiment of the present invention. Each SLC cell or MLC MSB bit has two Vt states such as E and B' with VR1 of one selected Read WL voltage, while each MLC cell has four Vt states such as E, A, B and C with three Verify voltages such as VR1, VR1 and VR3. The top graph depicts two Vt distributions of each 2-Vt SLC NAND cell used in the preferred hybrid HiNAND2 array (e.g., 200 of FIG. 1A). Each 2-Vt SLC NAND cell has two Vt states. The first one is an erased state termed as E-state that stores "1" data with a negative Vte distribution, ranging from Vtemin and Vtemax. The Vtemax value is preferably set to be –0.5V as prior-art NAND typically. The second Vt is a programmed state termed as A-state that stores "0" data with a positive Vta value, ranging from Vtamin of +0.5V to Vtamax of 1.5V typically. Both Vtamin and Vtamax can be shifted higher away from Vtemax for greater ΔVt margin between E-state and A-state.

As prior-art 2-Vt NAND, the desired SLC Program operation of HiNAND2 array is to shift Vt higher from E-state to B'-state. Conversely, the desired Erase operation is to shift Vt lower from B'-state to E-state. Since one physical SLC NAND cell stores 2 Vts, thus only one Erase E-state and one Program A-state, which is called one-pass Program.

Further, the bottom graph shows four Vt distributions of a MLC cell including E, A, B, and C states. There are three final desired Program states such as A, B, and C but one intermediate Program state of B'-state, which is generated during first MSB bit Program operation.

In an embodiment, this preferred MLC cell's program operation needs an Erase operation first to set all MLC cells' initial Vt to be E-state. The three final desired Vt distributions are E-state with Vte<Vtemax (–0.5V), A-state with Vtamin (0.5V)<Vta<Vtamax (1.0V), B-state with Vtbmin (1.5V)<Vtb<Vtbmax (2.0V) and C-state with Vtcmin (2.5V) <Vtc<Vtcmax (3.0V). The transient B'-state Vt is defined as Vtb'min<Vtb'<Vtb'max. The value of Vtb'min is less than Vtbmin (1.5V) but the Vtb'max is preferably set to be Vtb'max≤Vtbmax. One physical MLC cell stores two logic bits with four final states such as one Erase E-state and three Program states of A, B, and C with B'-state in MSB bit being transferred to eventual B-state or C-state.

For MLC cell Program, the HiNAND2 cell and array uses a 2-pass MLC Program scheme, which starts from a first-pass of MLC MSB bit Program, and then a second-pass of MLC LSB bit Program. Other MLC MSB and MLC Program schemes and Vt code assignments can also be applied here to illustrate the concept of a preferred m-page Program but are omitted herein for description simplicity.

FIG. 5 shows a preferred multi-page Read Command Timing Waveforms of a hybrid HiNAND2 array in an embodiment of the present invention. It is known that a conventional NAND's page-based Read Command begins with a start-code of a single page Read followed by few bytes of single page address with one end-code lastly. The arrangement of single page address is comprised of first few bytes of one row (for one WL) followed by few bytes of columns of NAND memory array. All these byte numbers of rows and columns of one page or WL are subject to the accessed NAND's array organization and density, regardless of 2D or 3D NAND.

In contrast, FIG. 5 provides a hybrid HiNAND2 Read Command, it also begins with a start-code but is flexibly followed by one Block address that is comprised of N flexible page addresses placed in series in command file with last one as a unique end-code, where m is set 1≤N≤M if a Block is made of M-WL Strings.

Each single-page address comprises a first few bytes of one row (for one WL) followed by few bytes of columns of NAND memory array. All these byte numbers of rows and columns of one page or WL are subject to the accessed NAND's array organization, density, and memory type, regardless of 2D or 3D NAND. In other words, the addressed pages can be either SLC or MLC types.

In certain embodiments, preferred flow charts and sets of the bias conditions for performing SLC, MLC MSB, and MLC LSB in Read, Program, and Program-Verify operations via a plurality of pseudo CACHEs are provided in accordance with the HiNAND2 array shown in FIG. 1A, the Block-decoder shown in FIG. 2A, the Segment-decoder shown in FIG. 2B, the Data Buffer shown in FIG. 3, and a MLC cell's 4-Vt assignment shown in FIG. 4. For example, in FIG. 3, each Data Register bit 100 comprises one bit Multiplier 102, one bit of SA 104, and one bit P/RB 106, and one Program-Verify circuit 108. Further, in this application, the operations of loading external SLC or MLC page data via 8 I/Os into Flash's real CACHEs (or Flash data) and outputting from 4 KB CAHE to a Flash Controller via the 8 I/Os are subject to NAND flash I/O pin configuration. In conventional parallel NAND Flash, 8 I/Os are commonly used. But in conventional SPI 8-pin Serial NAND flash, 1 to 4 I/Os are commonly used. In current or future parallel NAND Flash I/O configurations, 16 or 32 I/Os may be popularly used. Regardless of any kind of I/Os, the present invention of multi-page operations can be applied.

In the present application, a 8-I/O Parallel NAND with one physical WL of 8 KB, 2N-bit size HiNAND2 memory is used as an example to demonstrate the inventive concepts of this preferred multi-page operations without any limitation even including A/D and D/A bidirectional I/Os. In addition, embodiments of the present invention also include several new Commands to support the preferred multi-page operations such as MLC-WL and SLC-WL Read, Program, Erase, Program-Verify and Erase-Verify, etc.

FIG. 6A is a flow chart showing a method for performing SLC/MLC (MSB page) multi-page Data Loading and Program according to an embodiment of the present invention. The flow deals with 8 KB 2-Vt SLC cells in one selected SLC-WL or a 8 KB 2-Vt MLC MSB cells in one selected MLC-WL regarding 8 KB data loading into a plurality of CACHEs from 8 external I/Os and 8 KB Program operation. Basically, this is m-page, 2-Vt SLC and a 2-Vt MLC's MSB page Data Loading and Program flow. Because both cases involve either a 2-Vt SLC cell or a 2-Vt MLC cell that only stores 2-Vt MSB bit, thus each operation is treated as same and is combined here into one flow for a simpler explanation. Further, each 2-Vt SLC page or 2-Vt MLC MSB page operation is divided into two symmetrical sub-flows such as a first multi-page Even SLC or Even MSB page operation and then a second Odd SLC or Odd MSB page operation. All SLC and MSB page data are sequentially loaded into the designated 8 KB pseudo CACHE registers from 8 I/Os in unit of byte. For an 8 KB size of one physical WL (page) of the present invention, each 2-Vt SLC page or 2-Vt MLC MSB page is also defined as 8 KB logic size. Thus each Even and Odd SLC or MLC page is defined as a 4 KB physical page as well as 4 KB logic page. All SLC and MLC MSB page data are preferably loaded into 4 KB on-chip CACHE registers via 4 KB metal2 GBLs, which are shared by 4 KB Even and 4 KB Odd local metal1 LBLs to save peripheral DB size and area.

Note, since the present invention is disclosed for a SLC/MLC WL-hybrid 64-WL NAND Block of HiNAND2 array, thus when SLC and MLC page data are addressed below, it is meant in one common Block with 32 SLC-WLs and 32 MLC-WLs. As seen in FIG. 6A, the operation starts from Step 350.

Step 350: This step is to sequentially receive, load, and decode m-page 2-Vt SLC Read and m-page 2-VtMLC MSB Program Commands and their respective m-page SLC and MLC Program Addresses in unit of byte via NAND's 8 I/Os from an off-chip Flash controller to NAND's designated Command and Address Buffers (not shown). In addition, m latches of m selected Even and m selected Odd Segments and m Block-decoders are also set according to the m-page Addresses stored in m Address Buffers for concurrent m-page SLC and MLC MSB Program operation.

For example, the Command is loaded into the designated Command register so that this new SLC and MLC commands can be decoded and the associated SLC or MLC Program operations can be initiated accordingly. Similarly, m-page Addresses are loaded into m designated on-chip Address Buffers in conjunction with other control circuits to set the corresponding latches of m Even and Odd Segments as shown in FIG. 2B and m Block latches as shown in FIG. 2A of the preferred HiNAND2 array.

Moreover, m addressed 8 KB SLC or MLC MSB NAND page data are divided in m×4 KB Even-page data and m×4 KB Odd-page data. These m pages of SLC or MLC MSB data are selected concurrently by m Segment latches with m Block latches. With SLC and MLC MSB commands being proposed in NAND design, a flexible m-page Address arrangement is provided in the present invention unlike the prior-art that allows only one page address of SLC or MLC MSB in one selected NAND plane and only one SLC or MLC MSB page Address is specified in one common NAND Program commend. But with novel HiNAND2 array (e.g., see FIG. 1A), m-page SLC or MLC MSB Addresses can be addressed in every selected NAND plane. Thus a flexibility of up to m pages of Addresses can be specified in this novel SLC or MLC MSB Program command. Each page Address arrangement is like prior-art single page Address arrangement to place few bytes of column Address first followed by few bytes of row Address or vice versa. The major difference is that m pages of Addresses can be cascadedly loaded between start and end of M-page SLC and MLC MSB Program commend due to m-page Program of the present invention, rather than a single page SLC or MLC MSB Program in conventional NAND.

For example, SLC or MLC MSB first page's row Address is followed by first page's column Address and then the second page's row Address is followed by second page's column Address, and then lastly the mth page's row Address is followed by mth page's column Address, and then the end code. Note, since this preferred m-page SLC Read is still a Read operation, thus no need to load any page data from the external Flash Controller into NAND flash as Program operation.

Step 351: This decision step is to check if m newly addressed Blocks and Segments are occupied by some existing concurrent operations? If yes, then the page loading is looped to wait until they are free and available for new setting and loading of SLC or MLC MSB page data. If not, then the flow moves to Step 352.

Step 352: m latches of newly selected m Blocks in m Segments can be set selectively with a new status data in accordance with the circuits shown in FIG. 2A and FIG. 2B with the following preferred biased conditions:
a) CLWL=CLA=CLR=0V,
b) ENB=1=Vdd,
c) ENS=one-shot pulse of Vdd.

The one-shot pulse of Vdd applied to ENS will set each Block-decoder's latch node XD to Vdd when the selected Block-decoder's 3 inputs of Pi, Qj, and Sk are matched. Each latch is made of INV3 and INV4 and its output node XD is gated by CLWL signal.

After this step, then up to m pages of new 4 KB Even and Odd SLC and MLC MSB data will be sequentially loaded into on-chip 4 KB real CACHE registers from external Flash controller via NAND's 8 I/Os as indicated at Step 354 below.

Step 353: Basically, Step 353 is a preferred self-timed Precharging operation and can be done concurrently with Step 354 below.

Step 354 of both SLC and MLC MSB page loading takes a length 8K cycles per logic page and the page data transferring only happens between 8 I/Os and 4 KB real CACHE registers plus the m program page Addresses have been loaded into Addresses Buffers, thus Step 353's 8 KB Even and odd LBL precharging of these selected m pages can be started simultaneously within Step 354.

Like prior art NAND SLC or MLC MSB ABL (all-BL) 8 KB page Program, ABL global long metal1 lines are pre-charged with ≈1.0V, this preferred m-page SLC and MLC MSB Program also requires ABL precharging but with a higher Vinh up to 10V from a local common LBLps line into 8 KB short LBL lines within both CACHEcel and CACHEint pseudo registers for power saving and superior Program-Inhibit. Note, in this m-page SLC or MLC MSB Program, it needs two types of m CACHEcel and CACHEint registers of m metal1 Segment $C_{LBL}$ capacitors in one or more HiNAND2 Groups to complete the m-page Program.

The LBL precharging of Vinh can be performed like SLC Read operation that requires a BL precharging with ≈1V of Vdd-Vt on long BLs in the beginning of each single-page Read operation. But this preferred m-page SLC Read operation only needs to precharge m pages of 1/(L×J) shorter LBL lines for less power consumption.

Besides charging Vinh for above said a superior Program-Inhibit, it is also for a superior LBL sensing to get a larger analog signal of NAND cell after LBL and GBL charge-sharing during Program-Verify step. The higher Vinh voltage over Vdd=1.0V would guarantee more reliable sensing of NAND cell stored data and states.

Note, the selected 8 KB NAND cells per one physical WL are within one selected Block of one selected Segment that comprises 8 KB pseudo CACHE $C_{LBL}$ capacitors. Any pseudo CACHE register is termed as a CACHEcel when 8 KB selected cells of one selected full WL are within it.

On top of Step 353, there indicates one preferred set of bias conditions in accordance with HiNAND2 array circuit shown in FIG. 1A:
a) CSL=SEGe=SEGo=0V,
b) PREe=PREo=H1,
c) LBLps=Vinh,
d) TIE1~TIEL/2=DIV=0V (L=4):
   TIE1 through TIEL/2 being set to 0V are to shut off the corresponding MLBLb NMOS bridge transistors so that both 8 KB CACHEcel and CAHEint $C_{LBL}$ capacitors are independently precharged with Vinh from the selected LBLps=Vinh. SEGo=SEGe=0V are to prevent one paired 4 KB Odd and 4 KB Even $C_{LBL}$ from leakage to one shared corresponding 4 KB metal2 GBLs.
   CSL=0V is a regular set up for a normal NAND string Read operation.
e) PREo=PREe=H1>Vinh+Vt, this is to turn on both MLBLso and MLBLse transistors so that Segment power supply of Vinh can be fully coupled from selected LBLps lines to the selected 8 KB CACHEcel's $C_{LBL}$ capacitors without voltage drop.
f) LBLps=Vinh is supplied by a central Vinh MHV pump circuit (not shown).
   The m 8 KB CACHEcel's Odd and Even $C_{LBL}$ pre-charge-time is controlled by on-chip State-machine design.

The 8 KB CACHEcel precharge time is controlled by a self-timed LBLps Vinh Detector circuit. This is done by using one shared LBLps line as a Vinh power supply line as well as a Vinh sensing line. The Vinh supply comes from one end of the LBLps line connected to a Vinh Driver but the Vinh Detector circuit operates at another end of the LBLps line. Once the LBLps line reaching the Vinh voltage, it means that m 8 KB $C_{LBL}$ capacitors in CACHEcel are fully charged with Vinh so that Vinh Detector will issue a signal to on-chip State-machine to stop Vinh precharge operation. This Vinh precharge-time thus can be very accurately and automatically controlled by the present invention in accordance with circuit explanation shown in FIG. 9C (to be seen below).

Step 354: This step is to sequentially load either 8 KB SLC or MLC MSB page data into 4 KB real CACEH registers. Each page data is divided into 4 KB Even and 4 KB Odd pages to accommodate for 4 KB CACHEs, 101, shown in FIG. 3 and 4 KB global metal2 GBLs shown in FIG. 1A for area saving. The bias conditions for page data loading are set forth in accordance with the HiNAND2 array circuit and CACHE Register.

Step 355: This decision step is to check if the last byte of the external 8 KB SLC and MLC MSB page is completely loaded? If No, then it is looped to wait for the completion of each whole 8 KB page data loading. If Yes, then the flow moves to Step 357 to do more GBL availability check and to set RDY signal by pulling it low in a manner of one-shot pulse and informing off-chip Flash Controller that the NAND is entering a busy state. No more SLC or MLC MSB page loading from 8 I/Os to 4 KB CAHCE is allowed at this period.

Step 356: Before 4 KB GBL bus lines are released from any other concurrent operations, the GBLs are being occupied. Thus, NAND chip will generate one-shot RDY signal so that Flash Controller will not forward any new page data into the real 4 KB CACHE register because its last page data is still in the real CACHE.

Step 357: This is a decision step to check if the common 4 KB metal2 GBL bus lines occupied by some existing concurrent operations? Once 4 KB metal2 GBL bus lines are free, then the flow moves to Step 358.

Step 358: This step is to write the externally loaded 4 KB CACHE 4 KB Even data into two selected Even 4 KB CACHEcel and 4 KB Even CACHEint registers with same data polarity and same initial Vinh LBL precharged voltage. This step is to convert the digital Vdd/Vss SLC or MLC MSB page bit pattern in 4 KB real CACHE to a MHV analog Vinh/Vss bit pattern in 4 KB CACHEcel and 4 KB CACHEint pseudo Registers for superior Program-Inhibit and Program voltage for subsequent SLC or MLC MSB Program operation. Whenever each Even CACHECcel and Even CACHECint of Vinh voltage is coupled to Vss, it would be discharged to Vss. On the contrary, whenever each Even CACHECint and Even CACHECint of Vinh voltage is coupled to Vdd, Vinh would be retained when gates of MLBLso and MLBLse transistors are coupled to Vdd as seen in FIG. 1A in accordance with the following bias conditions:

a) CSL=TIE1~TIEL/2=SEGo=0V (L=4),
b) SEGe=1 for both CACHEcel and CACHEint registers,
c) DIVen=BIAS=LD=H1 one-shot pulse.

Step 359: Once above 4 KB Even SLC or MLC MSB page data is latched with a converted Vinh/Vss analog data in two designated 4 KB Even CACHEcel and 4 KB Even CACHEint, then state-machine will pull down the RDY pin to inform off-chip Controller that the 4 KB real CAHE register are available to be loaded by new Odd page data.

Steps of 360-365: These six steps for Odd page are substantially similar to above six steps of 354-359 for Even page loading in real CACHE and two pseudo CAHCEcel and CACHEint to sequentially load the remaining 4 KB Odd SLC and MLS MSB page data from 8 I/Os with the same biased condition. These steps will take another lengthy 4K cycles to complete 4 KB Odd page loading between 8 I/Os and 4 KB real CACHE registers.

After Step 365, whole 8 KB SLC or MLC MSB pages have been completely loaded into the final designated 8 KB pseudo CACHEcel and 8 KB CACHEint $C_{LBL}$ capacitors temporarily. And the off-chip Flash Controller is informed by a one-shot RDY signal of NAND for the free 4 KB real CACHE register to receive new operational Command.

Step 366: This decision step is to check if the last page of all selected m pages for a Block SLC or MLC MSB Program being fully loaded into HiNAND2 array. If Yes, then the flow moves to Step 367. If No, then the flow moves to Step 368 and Step 369 in parallel. Step 368 is looped to wait for the completion of the last 8 KB page data loading so that Host will issue next selected address and command as well as load new page data.

Step 367: This confirmation step is to recognize the receipt of this m-page Program Confirmation code so that the next Step 369 of Preferred m-page SLC or MLC MSB Program can be started immediately once whole m pages' data being loading completely to the m designated 8 KB CACHEint and CACHEcel with preferred Program-Inhibit conversion of Vinh/Vss.

Step 368: Host notices the availability of real CACHE of NAND, thus the Host will continue issuing a new page Address, Command, and Page data for next m-page SLC and MLC MSB Program and repeat operations from Step 350 again of the loading of remaining pages.

Step 369: Once all m page data being stored in m designated CACHEcel and CACHEint $C_{LBL}$ pseudo registers, then the next step is to set up and latch the right Vpgm, Vpass, and Vdd voltages for m selected sets of 64 WLs and SSL and GSL lines before the m-page SLC or MLC MSB concurrent all-BL Program.

Since each set of 64WLs+1SSL+1GSL voltages are respectively coupled from 64 XTs, a SSLp and a GSLp, thus the setup of each set of 64WLs+1SSL+1GSL have to be done on set-by-set basis. Particularly, the m-page SLC or MLC MSB Program is preferably done on m random WLs or pages for achieving highest NAND file system manipulation. Conventionally, m sets of 64WLs+1SSL+1GSL are impossible for random WLs. But under the option of m non-random page Program, then m sets of 64WLs+1SSL+1GSL can be set and latched in one-cycle. For the present invention, the m-page SLC and MLC MSB Program scheme work for two options, e.g., m random page and m non-random page SLC and MLC MSB Program.

In a specific embodiment, m random-page Program is performed. Note, the WL program voltages setup and latching on m selected parasitic poly2 capacitors are the self-timed operations for both steps. The program voltage setup means to precharge one selected WL with Vpgm (15V-25V), 63 non-selected WLs with Vpass (8V-10V), one SSL=H1≥Vinh+Vt and one GSL=Vss for one Block. The WL setup means to apply the desired WL voltages of Vpgm, Vpass, H1, and Vss to XT1-XT64, SSLp, and GSLp common shared bus lines as a first step. Then the m selected page Addresses will enable and pump each local Block-decoder to allow the full Vpgm, Vpass, H1 voltages to the designated one set of 64WLs+1SSL+1GSL. The local HXD node voltage has to be pumped up to a value more than Vpgm+Vt in accordance with the preferred circuit of Block-decoder (FIG. 2A). The Vpgm voltage and time control is automatically done by the Vpgm Detector circuit set at one end of dummy WLs. The setup conditions between 64 XTs, 1 SSLp, and 1 GSLp and 64 WLs, 1 SSL, and 1 GSL lines and HXD node are summarized below in Table 1. The HXD signal plays an important bridge role between above 64XTs+1SSLp+1GSLp and 64WLs+1SSL+1GSL for each selected Block. When HXD node is pumped to Vpgm+Vt, then Vpgm, Vpass, H1 precharging happen on the corresponding 64WLs+1SSL+1GSL by set of common bus lines 64XTs+1SSLp+1GSLp. Conversely, when HXD node is set to Vss by a Vpgm Detector with a Block-latch status circuit, then Vpgm, Vpass, H1 precharged voltage would be latched on the corresponding large parasitic poly2-capacitors of respective lines of 64WLs+1SSL+1GSL for a long time. Then the page Program starts. After one self-timed iterative ISSP Program operation of around 10 µs-20 µs, HXD node will be turned on with a Vdd again by each Vpgm time Control circuit per one Segment.

TABLE 1 one set of 64WLs + 1SSL + 1GSL Program voltage setup & latching

| | |
|---|---|
| 1 WL(sel) = Vpgm | XT(sel) = Vpgm |
| 63 WLs(un-sel) = Vpass | 63 XT (un-sel) = Vpass |
| 1 SSL = H1 | SSLp = H1 |
| 1 GSL = Vss | GSLp = Vss |
| HXD with matched Pi, Qj, Sk to enable local pump and latch | Vpgm + Vt when setting but Vss when latching |

Whenever after each iterative Program step, the HXD node is set at Vdd and 64XTs=1SSLp=1GSLp are set to Vss, then Vpgm, Vpass, and H1 will be discharged accordingly, thus 64WLs=1SSL=1GSL=Vss. After WL HV discharge, the WL HV stress is removed for longevity of cell P/E cycle. When the m sets of voltages of 64WLs+1SSL+1GSL are discharged to Vss detected by a Vpgm Detector, the operation mode is switched to iterative m-page concurrent Program-Verify operation.

The 2-Vt Program-Verify voltage for both MLC MSB and SLC is a common value of Vtb'min but for 4-Vt MLC's MSB and LSB Program-Verify Vvfy voltages require more such as Vtamin, Vtbmin, and Vtcmin. Table 2 below shows how one set of Program-Verify voltages are set up between each set of 64XTs+1SSLp+1GSLp and each corresponding set of 64WLs+1SSL+1GSL. In an embodiment of the present invention, each setup between 64XTs+1SSLp+1GSLp and 64WLs+1SSL+1GSL is done on one set by one set due to that 64XTs+1SSLp+1GSLp are shared by m random selected sets of 64WLs+1SSL+1GSL. Thus for m random pages SLC or MSB Program operation, total Program and Program-Verify steps will take m cycles respectively.

TABLE 2 one set of 64WLs + 1SSL + 1GSL Program-Verify voltage setup & latching

| | |
|---|---|
| 1 WL(sel) = Vvfy | 1 XT(sel) = Vvfy |
| 63 WLs(un-sel) = Vread | 63 XTs(un-sel) = Vread |
| 1 SSL = Vdd | 1 SSLp = Vdd |
| 1 GSL = Vread | 1 GSLp = Vread |
| HXD with matched Pi, Qj, Sk to enable local pump and latch | Vread + Vt when setting but Vss when latching |

As explained above, if each selected WL location in each corresponding Block with 64WLs+1SSL+1GSL is the same, then both Program and Program-Verify voltages setup of m selected sets of non-random 64WLs+1SSL+1GSL can be done in one cycle. This is a tremendous power and time saving by HiNAND2 array scheme and its associated m-page operations and methodologies.

The latching of above Program and Program-Verify voltages on the selected 64WLs+1SSL+1GSL in accordance with Table 1 and Table 2 is configured to set each selected HXD node at Vss after full precharge. As a result, the voltages of the common 64XTs+1SSLp+1GSLp become "Don't-care" thus 64XTs+1SSLp+1GSLp are released for other new m-page concurrent NAND operations that may be urgently interrupted by Flash Controller during this specific interval.

Step 370: This step is to latch the desired Vpgm, Vpass, and H1 voltage into the selected Block-decoders. This is done by a Vpgm Detector which is connected to a dummy WL with two adjacent dummy WLs to have same parasitic WL-WL capacitance as a regular 64-cell Block. In this manner, the true Vpgm precharge time will track the selected WL charged by the same Vpgm by tracking WL resistance and capacitance.

Once Vpgm is detected, no need to detect Vpass and H1 because Vpgm is the highest voltage and the slowest HV signal in WLs during Program. The Vpgm Detector will issue a signal to inform the selected Block to discharge the corresponding HXD node to Vss so that the fully-charged 64WLs+1SSL+1GSL can be latched without leakage during the subsequent Program operation. As a result, the m-page Program voltage and time can be accurately and automatically initiated and counted securely. The bias conditions are listed below.
a) CLWL=0V,
b) CLA=CLR=ENS=0V,
c) ENB=one-shot of negative pulse.

Note, the precharge setup and latching of one set of 64WLs+1SSL+1GSL poly lines are initiated at different time for m random page Block Program as explained above. But if each of m-page selected WLs are in the same locations in the 64-cell NAND String, then this becomes a non-random m-page Program. Therefore, 64 sets of 64WLs+1SSL+1GSL can be set at one time for m-fold saving in precharging and latching the desired Vpgm, Vpass, and H1.

Step 371: This step indicates all m random or non-random SLC or MLS MSB pages are selected for a concurrent m-page Program. For m non-random page Program case, the program time would have m-fold reduction because m Program operations are started at the same timeline. Contrary, for m random-page Program case, each random page will be initiated by each Vpgm Detector at different timeline for each selected Block. Practically, m random-page Program time may have an overtime period. Thus the Program time reduction is still realized for highest flexibility in NAND design.

Note, each SLC and MLC page program may averagely take about 250 μs for each page of SLC and MLC MSB Program. But each Program is divided into a plurality of ISPP pulse program with duration of around 15 μs-20 μs. Thus each self-timed Vpgm control time is meant each iterative ISSP program time of above said 15 μs-20 μs, rather than a whole 250 μs. Thereby, each shorter ISSP program time is easier to be implemented in the present invention with a smaller RC devices on-chip.

Step 372: This decision step is to check if all 64 XTs, 1 SSLp and 1 GSLp bus lines are free. In other words, are they being occupied now? If the response is "No", then the flow moves to Step 373. If yes, then Step 372 is looped to wait for the release of above said bus lines for next desired operation that will use these bus lines. From Step 272, the flow splits into two paths. One path moves to Step 375 and the other path moves to Step 373.

Step 373: Again, Step 373 is a preferred self-timed Precharging operation and can be done concurrently with Step 375. This step is to prepare for the subsequent Program-Verify operation after each ISSP iterative program step. As always, prior to each Program-Verify step, the selected 8 KB LBLs have to be precharged first. For this step, one of the m selected 8 KB LBLs are within one 8 KB CACHEcel and the preferred LBL voltage is Vinh for achieving a superior Program-Inhibit and a larger analog cell voltage for more reliable and efficient subsequent LBL sensing. The preferred bias conditions are explained below.
a) DIVen=0, LBLps=Vinh,
b) TIE1~TIEL/2=CSL=SEGe=SEGo=0V (L=4),
These conditions are to ensure the CACHEcel precharge would not leak to top-level GBLs and the adjacent paired CACHEint $C_{LBL}$ capacitors.
c) PREo=PREe=H1>Vinh+Vt
These conditions are to connect the LBLps line Vinh supply to 8 KB CACHEcel $C_{LBL}$ capacitors concurrently.

Step 374: Once the desired voltages being well set up in all selected 8 KB CACHEcel $C_{LBL}$ capacitors after each ISSP program step, then the Program-Verify voltage on 64WLs+1SSL+1GSL lines will be initiated in this step in accordance with the conditions indicated in Table 2 above.

This step is a self-timed operation, which is automatically controlled by a Vread Detector circuit, which uses the same circuit of Vpgm Detector but the reference voltage of Vpgm is replaced by Vread only. The Vread voltage is the highest voltage and the slowest WL signal during SLC and MLC MSB Program-Verify step.

Step 373 and Step 374 are the lengthy steps taking more than 10 μs and 3 μs respectively. Although the timeline to initiate each page Program is not overlapping, but because each ISSP steps takes longer than the WL setup time, thus it results in m-page SLC and MLC MSB Program of the present invention will have overlapping time interval. As several success ISSP steps precede, numbers of overlapping time intervals for concurrent Program and Program-Verify become high. In other words, some pages are engaging in the Program step but some other pages maybe independently engaging in the Program-Verify step concurrently or vise versa.

Under a scenario of extremely busy Program and Program-Verify with multiple tasks being executed simultaneously, embodiments of the present invention still allows additional urgently requested operations initiated by the external Flash Controller as long as no bus contention happening on the common GBL bus lines, 64 XTs bus lines, and the common 4 KB real CACHE registers.

FIG. 6B is a flow chart showing a method for performing m-page SLC/MLC (MSB Even Page) Program-Verify operations according to an embodiment of the present invention. As shown, this flow is mainly designed for the preferred m-page 2-Vt SLC or 2-Vt MSB Program-Verify step, while the method flow in FIG. 6A is mainly designed for both m-page 2-Vt SLC and 2-Vt MSB Program operation.

Step 375: This step is to restore previously latched m pages of 8 KB SLC or 8 KB MLC MSB page-bit data in 8 KB CACHEint $C_{LBL}$ capacitors back to 4 KB P/RB via 4 KB limited GBLs, then 4 KB Multiplier, and then 4 KB SA in unit of first 4 KB Even page data followed by second 4 KB Odd page data. These restored SLC and MLC MSB original page data are used for the Program-Verify step that needs to compare the newly retrieved 8 KB cells page data over 8 KB original Program page data loaded from external off-chip Flash Controller via 8 I/Os.

Now, one of m 4 KB SLC or MLC MSB Even page analog data latched in one of 4 KB Even CACHEint at Step 353 in FIG. 6A would be sequentially sensed and amplified by both 4 KB Multipliers and 4 KB SAs to perform 2-step analog amplifications and the final 4 KB fully amplified Even digital data would be stored in 4 KB SAs on 4 KB ½-page by ½-page basis due to the limitation of 4 KB metal2 GBL bus lines. Each readout of SLC or MLC MSB data bit of Qi=0/1 at each SA is set by each corresponding $C_{LBL}$=Vss/Vinh with same polarity. This step of 4 KB Even page digital data can be done in 1-cycle through LBL and GBL charge-sharing and a first amplification through a Multiplier and a second amplification through SA with the following preferred bias conditions:

a) DIVen=SEGe (in CACHEcel)=H1,
   This is to connect the broken GBL line's MGBL transistors to provide a way to connect each sensed but diluted $C_{LBL}$ voltage to each corresponding Multiplier via the charge sharing between with each corresponding GBL line;
  b) TIE1~TIEL/2=CSL=SEGo=SEGe (in CACHEcel)=0 (L=4),
   This is to shut off leakage path through MLBLb with its gate tied to TIE1 through TIEL/2 between each paired CACHEcel and CACHEint $C_{LBL}$ capacitors so that the sensed analog cell signal at CACHEint would not be diluted between paired CACHEcel's capacitors.
  c) Voutp (high/low)=Vref+/−ΔV
   This Vref set up is flexibly done by setting the reference voltage Vref between higher Vref+ΔV but moving Vref−ΔV as discharge continues over time before reaching the final value of Vss when E-cell is selected. The SA comparison does not need to wait for Vss on LBL lines for the combined Multiplier and SA operation.
  d) T5=one reverse one-shot pulse of Vdd
   T5 clock is used to do the second analog amplification of the first analog amplification done by Multiplier and finally latches the fully amplified digital cell data at SA Qi and QiB nodes.

Step 376: This step is to transfer each 4 KB restored original SLC or MSB even page bit data to 4 KB P/RB via 4 KB SA in 1-cycle with the following bias conditions in accordance with DB circuit shown in FIG. 3.
  a) ENSB1=ENSB2=0V,
  b) PGM=0, because not in program mode.
  c) IDB=IDAB=0V. This is to disconnect Transistor 8 and 6 to disable signals stored in MLSB and MLSBB.
  d) IDC=WBK=one shot of Vdd, As seen in P/RB circuit, Qi is connected to gate of Transistor 18 and QiB is connected to gate of Transistor 17. But WBK is a connected to gate of Transistor 16 only. The one shot for both IDC and WBK has to be synchronous in design. As a result, Qi=1/0 will result in Di=1/0 in same phase.
  e) T5=1 is used to enable SA.

After this step, then the bit-flipping in each iterative program and program steps by subsequently retrieved Even page data from Step 378 to 383 on original SLC or MSB page data can be performed between each paired SA and P/RB.

Steps of 378 and 379: These two steps are designed to set up and lock in the desired Program-Verify voltages for 64WLs+1SSL+1GSL lines in accordance with the preferred voltages shown in Table 2. With the following bias condition:
  a) CLWL=CLA=0V,
  b) CLR=ENS=0V,
  c) ENB=one shot of from 1→0

In order to achieve more accurate and secure Program-Verify WL voltage and time control for each independent sets of 64 WLs, SSL, and GSL, this invention uses three dummy WLs with exactly identical layout and length of a regular WL but only the middle dummy WL is used for Vread Detector's tracking purpose. The reason to have two extra adjacent un-used dummy WLs is to ensure same parasitic inter-WL capacitance are counted into the pre-charge-time calculation.

The Vread Detector is made of one 2-input Differential Amplifier (DA) as shown in FIG. 9B. One input of DA is connected to the end of this middle dummy WL and the other input is connected to Vread that is generated from Vref generator. This Vref generator circuit can generate varied Reference voltages such as Vpgm, Vpass, Vread, and VRn for respective highest WL voltages in respective Program, Program-Verify and Read operations. The highest WL voltage would take longest precharge time. Thus, once the highest WL voltage Vread being detected in dummy WL, then it is meant all other selected 64 WLs, 1 SSL, and 1 GSL have been well precharged at the desired voltage levels.

For this m-page SLC Program-Verify operation, the highest WL voltage is Vread on 63 unselected WLs per one of m selected Blocks. Thereby a Vread-ΔV is switched to connect to one end of above said Vread WL Detector. Upon the detection of a full-precharged Vread at dummy WL, Vread-ΔV, then DA's output will issue a signal to one correspondingly selected SLC page address of one of the selected Block to latch the well-precharged voltages of 64 WLs, 1 SSL and 1 GSL lines concurrently on those parasitic WL capacitors with extra 100 ns-500 ns margin delay to final WL precharged WL to reach Vread when ΔV is set to be 0.5V. The detailed B'-state Program-Verify bias conditions are shown below in Table 3.

TABLE 3 one of 64WLs + 1SSL + 1GSL for m-page concurrent B'-state Program-Verify voltage setting (HXD = Vread + Vt) and latching (HXD = 0 V)

| | |
|---|---|
| 1 WL(sel) = Vtb'min | 1 XT(sel) = Vtb'min |
| 63 WLs(un-sel) = Vread | 63 XT(un-sel) = Vread |
| 1 SSL = Vdd | 1 SSLp = Vdd |
| 1 GSL = Vread | 1 GSLp = Vread |
| HXD with matched Pi, Qj, Sk to enable local pump and latch | Vread + Vt when setting but Vss when latching |

Upon the latching moment, a novel self-timed LBL discharge operation is immediately initiated as indicated at Step 380 in accordance with the LBL Discharge Detector circuit and detailed subsequent steps would be explained later.

Step 380: This step is another self-timed operation for the preferred m-page SLC or MSB Program-Verify to perform Vinh discharging and retaining operations in accordance with one of m selected 8 KB CACHEcel's Program-Verify bit pattern.

For saving Program-Verify time and WL Vread stress, both 4 KB Even and 4 KB Odd $C_{LBL}$ capacitors and cells are selected for cell state verification in each 8 KB CACHEcel register. It is like single-page ABL Read in prior art. But this invention preferably performs m All-BL Program-Verify discharging and retaining simultaneously.

As indicated in Step 380, those E-state cells $C_{LBL}$=0V (discharging) but those B'-state cells $C_{LBL}$=Vinh (retaining) In order to control $C_{LBL}$ discharge time automatically and accurately, one VLBL Detector using one metal0 LBLps power line as a sense line per Segment is built in. It is like a conventional CAM's sense line but without taking extra array layout overhead and precharge power consumption. Therefore, this $C_{LBL}$ discharging and retaining operation is another preferred self-timed step of the present invention.

The reason to use each LBLps line as 8 KB $C_{LBL}$ discharging sense line is because lastly precharged Vinh Driver is still retained in LBLps line. Thereby no need of sense line precharged step is needed for power saving. Once all 8 KB $C_{LBL}$ capacitors are discharged, the higher lumped discharged current will pull down each common LBLps line from initial Vinh. At one extreme and rare case, only 1 or 2 E-cells in each selected WL, then the discharge current becomes very small and might affect the discharge time. In this case, one maximum allowed Program-Verify time is also built in to ensure the Program-Verify time is within the predetermined delay such as less than 5 μs. The final value of each $C_{LBL}$ bit voltage is determined by each NAND cells' state. If NAND cells are in E-state, the corresponding $C_{LBL}$'s Vinh will be discharged to Vss, otherwise $C_{LBL}$ voltage would retain the initial Vinh if those NAND cells are B'-state with Vt≥Vtb'min.

Step 381 takes a shorter time to discharge m 8 KB $C_{LBL}$ capacitors from Vinh to Vss than prior-art NAND BL discharge step from 1V to Vss due to same large serial-resistance of each NAND cell string plus a shorter but a lighter $C_{LBL}$ capacitance. In the present invention, although $C_{LBL}$ is precharged to Vinh voltage which is higher than 1.0V used in prior art, each $C_{LBL}$ discharge time is still much faster than $C_{BL}$ because the value of $C_{LBL}$=1/(L×J) $C_{BL}$, where L stands for L Segments per one Group and total J Groups per one NAND plane. The $C_{LBL}$ is one local metal1 LBL capacitor of the present invention, while $C_{BL}$ is one global metal1 BL capacitor of the prior art.

Note, although the first selected SLC or MSB Program-Verify is ½-page 4 KB Even page but the discharge of B'-state evaluation is done in one full physical WL that contains both 4 KB Even and 4 KB Odd pages concurrently because the WL sharing. In this manner, 2λ-SLC Program-Verify speed can be achieved. And this is highly beneficial for this m-page SLC and MSB Program-Verify step because one of major delay of iterative Program operation is each iterative Program-Verify time. The preferred bias conditions are listed below.

a) TIE= . . . =TIEL/2=DIVen=CSL=0V (e.g., L=4),
b) SEGe=SEGo=0V
c) PREe=PREo=0V,
d) LBLps=0 or don't care.

Step 381: This step is designed to discharge all HV in 64WLs+1SSL+1GSL lines once one iterative Program-Verify operation is finished. Since the LBL discharged time is a self-timed step, thus this discharge is initiated by the VLBL Detector automatically but stopped by the dummy WL which detects voltage from Vread dropping to Vss or near Vss. The discharge of 64WLs+1SSL+1GSL is done by setting the selected Block's HXD node at Vdd and the corresponding Local pump circuit is disabled. This step takes time less than 1 μs.

Steps 382 and 383: This step is like Step 375 and Step 376 but the difference is that the Program-Verify cells of the selected SLC or MSB WL to be sensed are located within each 8 KB CACHEcel, rather than in CACHEint. The details of steps and bias conditions can refer to Step 375 and are omitted here for the description simplicity.

Step 383: This step is to transfer 4 KB Even SLC or MSB page data stored in 4 KB SA to 4 KB P/RB but with a reversed polarity because each SLC E-state cell's analog LBL voltage=0V but the digital logic data is "1" in definition. Conversely, each SLC B'-state cell's analog voltage is Vinh but in a digital logic data, it is defined "0." Thus, the readout bit data from each SA to each P/RB has to be flipped before it is sent out to Flash Controller via 8 I/Os. The Di=0/1 in each P/RB bit if each corresponding bit Qi=1/0 in each SA in accordance with the preferred set of bias conditions below.

a) IDC=IDAB=EQ=0,
b) ENSB1=ENSB2=PGM=IDB=0V,
c) IDC=one-shot pulse of Vdd with T5=1=Vdd.

Step 384: This decision step is then to check if all the selected SLC or MSB pages passing Program-Verify operation with the selected WL voltage=Vtb'min. If yes, then Segment-decoder latches or flags have to be reset at Step 385. Thereafter, the flow moves to check if S-PAS=1 in the selected blocks within one selected Segment. If S-PAS=1, then each Block-dec's latch or flag is reset at Step 387. The flow then continues moving to Step 388 decision step.

Step 388: This decision step is then to check if all the selected SLC or MSB flags have been reset? If yes, then it is meant that the m-page SLC or MLC MSB Program-Verify is completed at Step 389. If not, then the flow continues to finish the remaining Even page for iterative SLC or MSB Program and Program-Verify operations. Thus the flow moves to Step 390 and 391. For next iterative operation, the old page data stored in 4 KB P/RB would be copied back to the designated CACHEcel and CACHEint for temporary storage for subsequent SLC and MSB iterative operations.

Steps of 390 and 391: Before transferring 4 KB Even SLC or MSB bit data from 4 KB P/RB to 4 KB CACHEcel and CACHEint, both requiring a Vinh voltage precharging first and then transferring and Vdd/Vss to Vinh/Vss conversion will be done accordingly. Next, the flow moves to Step 400.

FIG. 6C is a flow chart showing a method of performing m-page SLC/MLC (MSB Odd page) Program-Verify operation according to an embodiment of the present invention. As seen the method including Step 400 in which one of m pages old 4 KB SLC or MLC MSB Odd analog data latched in one of 4 KB Odd CACHEint at Step 380 (see FIG. 6B) would be sequentially sensed and amplified by both 4 KB corresponding Multipliers and 4 KB SAs to perform the 2-step analog amplifications as explained before. The final 4 KB fully amplified Odd digital data would be stored in 4 KB SAs with the following preferred bias conditions:
 a) DIVen=SEGo (in CACHEcel)=H1,
 b) TIE1~TIEL/2=CSL=SEGe=0V and SEGe (in CACHEcel)=0V (L=4),
 c) Voutp (high/low)=Vref+/−ΔV,
 d) T5=reverse one-shot pulse of Vdd.

Step 401: This step is to transfer each 4 KB restored original SLC or MSB Odd page bit data to 4 KB P/RB from 4 KB SA in 1-cycle but with the reversed logic as explained before in accordance with the following bias conditions in accordance with 4 KB DB circuit shown in FIG. 3.
 a) IDAB=SENB1=SENB2=EQ=0V
 b) IDC=WBK=one shot
 c) T5=1 is used to enable SA.

After this step, then the previous old 4 KB SLC or MSB Odd page data are restored in 4 KB P/RB for next comparing against with the newly Program-Verify Odd MSB page data retrieved from the selected 4 KB Odd NAND cells in the selected WLs.

Steps of 401 and 402: These two steps are to perform the same sensing and amplification as above Step 400 and Step 401 of this flow of 4 KB Odd NAND cells from one of the 4 KB Odd CACHEcel register. The final 4 KB fully amplified newly Program-Verified Odd digital data would be stored in 4 KB SAs with the similar bias conditions but omitted herein.

Step 403: With last 4 KB old Odd SLC or MSB page data stored in 4 KB P/RBs and 4 KB new readout of the Program-Verify data stored in 4 KB SAs, then the bit-flipping for Odd SLC and MSB page data will be done on 4 KB P/RB on 1-bit by 1-bit flipping basis. Each P/RB Di-bit=0 would be flipped to Di-bit=1 by each corresponding Qi-bit=1 in SA. But each P/RB Di-bit=1 would not be flipped and will remain unchanged, regardless of value each corresponding Qi-bit in SA in accordance with the bias conditions shown below.
 a) IDC=IDAB=EQ=0V,
 b) SENB1=SENB2=EQ=0V,
 c) IDC=one shot pulse,
 d) T5=1 is used to enable SA.

After this step, then one iterative Program-Verify step for one 4 KB Odd SLC or MSB page Program is finished.

Step 404: This decision step is then to check if all the selected SLC or MSB Odd pages' data passing Program-Verify operation in accordance with 4 KB loaded Odd page data under the selected WL voltage=Vtb'min. If yes, then Segment-decoder latches or flags have to be reset at Step 405. Thereafter, the flow moves to another decision Step of 406 to check if S-PAS=1 in the selected blocks within one selected Segment? If S-PAS=1, then each Block-decoder latch or flag is reset at Step 407. The flow then continues moving to Step 408 decision step to check if all latches of Block-decoders being reset? If yes, it means all selected Odd pages passing Program-Verify. That means both Even and Odd pages pass SLC and MSB Program-Verify, thus the flow ends at Step 409.

In another flow path of Step 404 is moving to Step 410 whenever one selected 4 KB Odd page cells fails B'-state Program-Verify step, then the iterative Program-Verify on the remaining Odd pages have to be continued.

Step 410 and Step 411: These two steps are to write back and lock the updated Odd SLC or MSB page data back to two designated CACHEcel and CACHEint capacitors for next iterative Program-Verify operation. Again, the reason to write back two CACHE, instead of one is because the verify step always needs one CACHEint to keep the last updated Odd page data, and CACHEcel uses the P/RB data as a new or next iterative Program and Program-Inhibit page pattern. The copy back to two CACHEcel and CACHEint can be done simultaneously as did in previous steps of 353 and 354. The details are skipped here.

Step 412: This decision step is used to check if the last 4 KB Odd page data passing the Program-Verify. If No, then the flow moves to Step 365 which continues the remaining Odd-page SLC and MSB program by setting up and latching the desired Vpgm, Vpass, H1 on the selected sets of 64WLs+1SSL+1GSL. If Yes, then the flow moves to Step 413 which is used to check if all m Odd pages (or Nmax page) data passing Program-Verify step.

Step 413: Once any single Odd page finishing one iterative Program and Program-Verify step, then the counter number N is increased to N+1, and the new N value will be compared against the predetermined Nmax iterative steps.

Step 414: If the number of the iterative steps is still less than the predetermined Nmax, then the next iterative Program and Program-Verify step would be continued by branching out to Step 369.

Step 415: If the number of the iterative steps reaches the Nmax, then the next iterative Program and Program-Verify step would be stopped and the failed pages would be reported as BAD pages.

Note, in one of the approach of the present invention is to program another erased pages whenever the failed program pages are reported. In this manner, then every time new m-page SLC and MLC-MSB Program is performed, it can always be achieved on total m exact pages without missing any page, thus the power and time consumption and reloading the page data of those failed pages can be avoided. The NAND chip performing the m-page Program and Program-Verify has to record those final physical good and bad WL addresses to allow Flash Controller to update their status in log file.

FIG. 7A is a diagram showing circuit structure and method for performing MLC (LSB page) m-page data loading and B'-adjustment according to an embodiment of the present invention. as shown, this flow shows the preferred detailed steps of m pages of LSB page data sequential loading from 8 external I/Os and the B'-state page data adjustment in accordance with LSB bit data, MSB bit data and the preferred 4 Vt assignments shown in FIG. 4 for m-page MLC LSB Program and Program-Inhibit operations of the present invention. The B'-adjustment is meant to differentiate B1'-state cells with Vtb1'<Vtbmin from B2'-state cell with Vtb2'≥Vtbmin. The B1'-state only exists in MLC MSB bit, but eventually would be programmed into B2'-state, e.g., B-state when LSB=1 or C-state when LSB=0 with MSB=0.

In an embodiment, performing B'-state data bit adjustment is mainly for doing the right MLC-LSB page Program in accordance with the preferred 2-Vt assignments of E-state and B'-state for a MSB bit and the preferred 4-Vt assignment of E, A, B, and C states for both MSB and LSB bits as set in FIG. 4. As such, the newly I/O loaded raw LSB page data cannot be directly used for MLC LSB page Program, thus each LSB page data needs to be readjusted. On the contrary, each 8 KB externally I/O loaded raw MLC-MSB page data can be used directly for 8 KB MSB Program because MSB bit Program is always performed before each LSB bit Program on same MLC cell. In other words, MSB bit Program does not care about each LSB bit data in each MLC 4-Vt assignment.

For example, each MSB's B'-state is split into B1'-state and B2'-state (or B-state) under respective verification conditions of Vtb'min and Vtbmin. The value of temporary Vtb'min is preferably set to be Vtb'min<Vtbmin for achieving tighter Vt distributions for 4 MLC states of E, A, B, and C over the lengthy duration of 4-Vt MLC Program.

From one of preferred 4-Vt logic assignment, E=11, A=01, B=10 and C=00 (The left bit is LSB bit but right bit is MSB bit). As such, If each raw LSB bit=1, it is meant to keep the Vts of E-cell or B-cell unchanged. Conversely, when each raw LSB bit=0, it is meant to program either E-cell to A-cell or B-cell to C-cell. But in MLC MSB bit Program operation, an extra B1' below B2' or B-state but above E-state is created for a tighter 4-Vt MLC Program control over time. Under this scenario, B1'-cell is not accounted as B-cell from each raw LSB bit perspective. For LSB=1, B-cell is not chosen for Program. By contrast, B'-cell has to be programmed even LSB=1. That explains why in this m-page MLC 4-Vt Program scheme, each raw LSB bit data has to be readjusted to assign "0" to B1'-cell but "1" for B2'-cell or B-cell. In order to do so, each LSB value of "1" for B-cell has to be flipped to be "0" for B1'-cell, which is differentiated from B-cell. In addition, logically, each corresponding MSB bit data to each LSB bit is required to do the right bit flipping.

In conclusion, the discrepancy between B1' and B states makes the newly I/O loaded LSB raw bit data cannot be used directly for LSB page Program of this MLC Program application. A solution of a preferred MLC (LSB page) B' loading and adjustment methodology comprising of 9 consecutive sub-steps with 5 basic functions is disclosed below. It starts from Even LSB page first and then followed by Odd LSB page, or vice versa.

Referring to FIG. 7A, the method includes precharge steps indicated by Arrow1 and Arrow8. All $C_{LBL}$ capacitors in the selected CACHEs are initially precharged with Vinh voltage for the reasons of a super Program-Inhibit scheme during Program or an enhanced charge-sharing scheme during Read or Verify operations. The method further includes discharge steps indicated by Arrow2 and Arrow3. The Vinh voltages of $C_{LBL}$ capacitors in the selected CACHEs are either discharged to Vss or retained in accordance with the loaded MSB and LSB page data during B'-adjustment and Program operation. Furthermore, the method includes load and latch (LD/LT) steps in which page data loading and latching are performed and Vdd/Vss is converted to Vinh/Vss f indicated by Arrows of 4, 6 and 9.

In a specific embodiment of the present invention, there are several major data to be temporarily latched in each corresponding 8 KB pseudo CACHE $C_{LBL}$ capacitors, including 1) precharged page data, 2) externally loaded Program page data, 3) internal readout page data, 4) write back page data, and 5) duplicate page data. The precharged page data represented by Vinh precharged voltage are locked in the selected 8 KB pseudo CACHEs. The externally loaded Program page data include MLC's MSB or LSB or SLC page data load from 8 I/Os. The internal readout page data include those read from E, A, B1', B and C-state cells. The write back page data are from SA or P/RB into pseudo CACHE which is updated for bit-flipping.

Moreover, the method includes charge-sharing steps indicated by Arrow5 and Arrow7 of FIG. 7A. This is the readout process that transfers the sensed cell analog data to be amplified by Multiplier because the signal magnitude has been reduced due to LBL and GBL charge-sharing diluted scheme.

The whole proposed methodology involves some key control signals in each selected Blocks, Segments, Groups, and Planes such as:

a) SEGo and SEGe: The paired Segment control signals that connect or disconnect one paired 4 KB Odd and 4 KB Even metal1 LBLs from one shared 4 KB metal2 GBLs.

b) PREo and PREe: The paired Segment power control signals that connect or disconnect selectively one paired 4 KB Odd and 4 KB Even metal1 4 KB metal1 LBLs and only common Segment power supply line of LBLps.

c) LBLps: This is one of Segment Vinh power supply line to be shared by one paired 8 KB CACHE registers physically on top and bottom sharing LBLps in cell array layout. If top and bottom $C_{LBL}$ capacitors are turned on simultaneously, then one LBLps line can precharge or discharge them concurrently.

d) TIE: This is a special bridge NMOS transistor inserted in-between one paired of two physically adjacent Segment $C_{LBL}$ capacitors or lines. There is advantageous to have this TIE transistor and control signal during each $C_{LBL}$ precharge and discharge selected NAND cell in each CACHEcel. For example, each readout cell's analog data in CACHEcel can be easily shared with the next paired adjacent $C_{LBL}$ capacitor in CACHEint so that easier data manipulation can be executed in SLC and MLC operations.

Referring to FIG. 7A, the LSB methodology flow starts in steps from 1 to 9 (including those for Even and Odd pages) to sequentially receive, load, and latch m pages of 8 KB data. Each 8 KB page is further divided into 4 KB page data and 4 KB Odd page data loaded from eight common I/Os in unit of byte of a typical parallel NAND flash or in unit of 4 I/Os of an 8-pin SPI Serial NAND flash configuration.

In addition, m Addresses are loaded into the respectively designated Address, Row and Column Buffers to set the corresponding flags on m selected Even and Odd Segment-decoder's latches shown in FIG. 2B and m selected Block-decoder's latches shown in FIG. 2A of the preferred HiNAND2 array shown in FIG. 1A, while the Command is loaded into on-chip Command Buffer (not shown) and m pages of external I/O data are loaded into the corresponding on-chip 4 KB real CACHE register. But Internal readout page data can be directly loaded on-chip 4 KB real CACHE register from SA or P/RB to external 8 I/Os, depending upon which are available at the moment of operation.

Note, total four pseudo CACHEs of 8 KB CACHEcel, 8 KB CACHEint, 8 KB CACHElsb, and 8 KB CACHEmsb are involved for properly operating this MLC (LSB Page) m-page data loading and B'-state adjustment. In FIG. 7A, only one partial cell array of Group 1 nears DB is shown, while other J−1 Groups are not shown due to paper space limitation. As the four kinds of CACHE definitions, the CACHE that contains one selected physical WL (or page) comprising 8 KB NAND cells is termed as CACHEcel. The rest of 3 CACHEs are arbitrarily termed for easier explanation purpose only. For example, if a newly selected WL is shifted to CACHEint, then CACHEint is re-termed as CACHEcel and CACHEcel would be re-termed as CACHEint instead. Each Group of HiNAND2 array has L Segments, where L≥4. Moreover, each CACHE register is comprised of a plurality of NAND Blocks that share one local LBL or $C_{LBL}$ capacitor per column.

There are four symbols representing different desired biased voltages such as "0"=Vss, V1=Vdd, H1≥Vinh+Vt, V2=Vinh where 5V≤Vinh≤10V. Now, the detail operations are disclosed below.

Arrow 1 or #1 is a first step of this methodology. As #1 indicates both 4 KB even CLBL1e and 4 KB CLBL1o capacitors of CACHEcel, CACHEint, CACHElsb, and CACHEmsb are selected for Vinh precharging initially. In order to do so, the following bias conditions are set up in accordance with the circuits of HiNAND2 array and its associated Block-decoder and Segment-decoder:

a) LBLps1=V2=Vinh and PREo1=PREe1=H1 are to turn on MLBLso and MLBLse concurrently to precharge both 4 KB even/odd CACHEcel $C_{LBL}$ capacitors.
b) LBLps2=V2=Vinh and PREo1=PREe1=H1 are to turn on MLBLso and MLBLse concurrently to precharge both 4 KB even/odd CACHEint $C_{LBL}$ capacitors.
c) LBLps3=V2=Vinh and PREo1=PREe1=H1 are to turn on MLBLso and MLBLse concurrently to precharge both 4 KB even/odd CACHElsb $C_{LBL}$ capacitors.
d) LBLps4=V2=Vinh and PREo1=PREe1=H1 are to turn on MLBLso and MLBLse concurrently to precharge both 4 KB even/odd CACHElsb $C_{LBL}$ capacitors.
e) TIE1=0V is to shut off MLBLp to disconnect CACHEcel from CACHEint so that CACHEcel and CACHEint can perform independent Vinh precharge. In fact, TIE can be any voltage because CACHEcel=CACHEint=Vinh.
f) TIE2=0V is to shut off MLBLp to disconnect CACHEcel from CACHEint so that CACHElsb and CACHEmsb can perform independent Vinh precharge. In fact, TIE can be any voltage because CACHEcel=CACHEint=Vinh.
g) SEGo1=SEGe1=0V are to shut off MLBLpo and MLBLpe to prevent leakage of CACHEcel to 4 KB shared GBLs.
h) SEGo2=SEGe2=0V are to shut off MLBLpo and MLBLpe to prevent leakage of CACHEint to 4 KB shared GBLs.
i) SEGo3=SEGe3=0V are to shut off MLBLpo and MLBLpe to prevent leakage of CACHElsb to 4 KB shared GBLs.
j) SEGo4=SEGe4=0V are to shut off MLBLpo and MLBLpe to prevent leakage of CACHEmsb to 4 KB shared GBLs.

Four Vinh current flows are supplied by four corresponding LBLps lines (with Drivers not shown). The Vinh precharge can be done in 1-cycle on all 4 Even/Odd CACHEs. The Vinh value can be flexibly adjusted down to Vdd if the location of CACHE nears Data Register 700 for less impact of charge-sharing.

Arrow 2 or #2 is a second step of this methodology and is performed during the Program-Verify that will result in either discharging or retaining $C_{LBL}$'s Vinh, depending on the cells' states of E or B' (MSB bit program state) because Vtamin is applied to m selected WLs. This is same as to read the MSB programmed cell done in MSB bit Program flow. Note, since Vtamin is applied to m selected WLs, thus the discharge of $C_{LBL}$'s Vinh will happen on m 8 KB cells in m full WLs that include all 4 KB Even and 4 KB Odd cells.

Since each selected WL=Vtamin and is located in each CACHEcel in m or m/4 sets only as explained above, thus Vinh discharging and retaining can happen only on those E-cells because Vte<Vtamin of the selected WL in CACHEcel $C_{LBL}$ capacitors. Those programmed B'-cells or MSB cells will retain Vinh accordingly because Vtb'min>Vtamin where Vtb'min is the Program-Verify voltage for both SLC and MSB bits.

The first #2 arrow shows the discharge path is from both 4 KB CLBL1e and 4 KB CLBL1o capacitors into the selected Block 1 cells within CACHEcel. In fact, the discharge path is through the 64-WL NAND cell string, 1 MS and 1 MG String-select transistors. The high string series resistance is same for both the present invention and prior art. But capacitance of CLBL1e and CLBL1o in the present invention is only 1/(L×J) of prior art NAND's BL. As a result, the Vinh LBL discharge of the present invention is much faster than 1V BL discharge of prior art NAND.

The second #2 arrow shows the discharge path from each bit of CACHEint to each corresponding bit of CACHEcel via each MLBLb transistor with its gate tied to TIE1. The bias conditions of #2 are explained below:

a) TIE1=H1 (or Vdd)
This is to turn on MLBLb to connect a path between CACHEcel and CACHEint only so that current flow if any can happen on these two CACHEs only. Since the selected WL's cells are in CACHEcel, thus those E-cells in CACHEcel would discharge those E-cells' corresponding $C_{LBL}$ from Vinh to Vss. But due to the connection between each CACHEcel and each CACHEint $C_{LBL}$, the discharge of CACHEcel would also discharge CACHEint $C_{LBL}$ as well with a double time. Thus, finally, CACHEcel=CACHEint=Vinh if B' cells in CACHEcel. Conversely, $C_{LBL}$s of CACHEcel=CACHEint=Vss if E cells in CACHEcel. This self-timed step is done under selected WL=Vtamin by a $V_{LBLps1}$ Detector.
b) TIEL/2=0V. (L=4)
It is because no need of the desired Vinh discharge happening in both CACHElsb and CACHEmsb.
c) Others=0V are to shut off any leakage paths to ensure Vinh discharge only happening between CACHEcel and CACHEint not affected.

In conclusion, after this step, both CACHEcel=CACHEint=MSB=Vinh/Vss bit data but not being saved yet.

Arrow 3 (#3): This is a third step to perform Vinh/Vss latching in accordance with 8 KB B'/E (MSB) state cells in one selected physical WL in CACHEcel Segment. Once Vinh discharging is completed for those E-cells, then TIE signal switches from H1 or Vdd to Vss to disconnect CACHEcel from CACHEint so that final identical Vinh/Vss analog patterns according to 8 KB cells B'/E-states can be locked in CACHEcel and CACHEint respectively and safely for subsequent bit-flipping Program-Verify operation. In conclusion, after this step, the analog Vinh/Vss voltage patterns of 8 KB $C_{LBL}$ of selected CACHEcel=CACHEint=MSB=Vinh or Vss, are latched temporarily. The preferred bias conditions include setting all signals to 0V including all TIEL/2=0V (e.g., L=4 as seen in FIG. 7A).

Arrow4e or #4e is a first part of a fourth step of this methodology. The #4e step is to apply V1=Vdd to SEGe3 signal to connect each 4 KB GBLs to the corresponding 4 KB even $C_{LBL}$ capacitors in ½ of 4 KB CACHElsb register only via the corresponding 4 KB Even MLBLpe transistors in conduction state. The remaining ½ of Odd 4 KB CACHElsb are isolated from 4 KB GBLs at this step to prevent GBL loading into non-selected pseudo CACHEs.

The #4e step is to perform 4 KB Even page data loading, latching, and Vdd/Vss to Vinh/Vss conversion in LBL lines within CACHElsb when 4 KB GBLs are loaded with the external 4 KB Even LSB raw digital page data. If LSB bit pattern=1=Vdd that makes the drain voltage of MLBLpe=Vdd, then when gate of MLBLpe=SEGe3=Vdd, the source voltage of MLBLpe=Vinh would be retained. Conversely, If LSB bit pattern=0, that makes the drain voltage of MLBLpe=Vss, then when gate of MBLpe=SEGe3=Vdd, the source voltage of MLBLpe=Vinh would be discharged to Vss as well. In an embodiment, Vdd/Vss to Vinh/Vss conversion in LBL lines is executed for any data loaded into CACHE register for super Program-Inhibit scheme. The preferred bias conditions include:
 a) SEGe3=V1, SEGo3=Vss,
 b) All other signals=0V to allow the 4 KB digital page data in 4 KB GBL bus lines to be fully loaded into the selected 4 KB Even CACHElsb CLBL capacitors, not other CACHEs.

Arrow 4o (#4o) is a second part of the fourth step of this methodology. Similarly, the #4o step is to apply V1=Vdd to SEGo3 signal to connect each 4 KB GBL to the corresponding 4 KB Odd $C_{LBL}$ capacitors in ½ of 8 KB CACHElsb register only via the corresponding 4 KB Odd MLBLpe transistors. The remaining ½ of 4 KB Even CACHElsb are isolated from 4 KB GBLs at this step. The preferred bias conditions are listed below:
 a) SEGo3=V1=Vdd, SEGe3=Vss,
 b) All other signals=0V to allow the 4 KB digital page data in 4 KB GBL bus lines to be fully loaded and latched into the selected 4 KB Odd CACHElsb $C_{LBL}$ capacitors, not other Odd CACHEs.

In conclusion, after #4e and #4o steps, whole 8 KB LSB data are locked (saved) in 8 KB CACHElsb $C_{LBL}$ capacitors for the subsequent Program and Program-Verify operations.

Arrow5e or #5e is a first part of a fifth step of this methodology, performing the analog sensing and latching by a 4 KB Multiplier and 4 KB SA from the selected 4 KB Even cells within 4 KB Even CACHEint $C_{LBL}$ capacitors. Therefore, H1 voltage is applied to SEGe2 signal to connect each 4 KB GBL to each corresponding 4 KB Even $C_{LBL}$ capacitors in ½ of 8 KB CACHElsb register only via the corresponding 4 KB Even MLBLpe transistors. The remaining ½ of 4 KB Odd CACHElsb are isolated from 4 KB GBLs at this step. The preferred bias conditions are listed below:
 a) SEGe2=H1, SEGo2=Vss,
 b) All other signals=0V to allow the 4 KB Even digital page data in 4 KB GBL bus lines to be fully loaded into the selected 4 KB Even CACHElsb $C_{LBL}$ capacitors, not other CACHEs.

Arrow5o or #5o is a second part of the fifth step of this methodology. Similarly, the #5o step is to perform the analog sensing and latching by a 4 KB Multiplier and 4 KB SA from the selected 4 KB Odd cells within 4 KB Odd CACHEint $C_{LBL}$ capacitors. Therefore, H1 voltage is applied to SEGo2 signal to connect each 4 KB GBL to each corresponding 4 KB Odd $C_{LBL}$ capacitors in ½ of 8 KB CACHElsb register only via the corresponding 4 KB Odd MLBLpe transistors. The remaining ½ of 4 KB Even CACHElsb are isolated from 4 KB GBLs at this step. The preferred bias conditions are:
 a) SEGo2=H1, SEGe2=Vss,
 b) All other signals=0V to allow the 4 KB Odd digital page data in 4 KB GBL bus lines to be fully loaded into the selected 4 KB Odd CACHElsb $C_{LBL}$ capacitors, not other CACHEs.

Arrow6e or #6e is a first part of a sixth step of this methodology. The #6e step is like #4e step to apply V1=Vdd to SEGe4 signal to connect each 4 KB GBLs to the corresponding 4 KB even $C_{LBL}$ capacitors in ½ of 8 KB CACHEmsb registers only via the corresponding 4 KB Even MLBLpe transistors. The remaining ½ of Odd 4 KB CACHElsb are isolated from 4 KB GBLs at this step.

The #6e step is to perform 4 KB Even data loading, latching and Vdd/Vss to Vinh/Vss conversion in LBLs when 4 KB GBLs are loaded with the external 4 KB Even LSB page data. If MSB bit pattern=1 that makes the drain voltage of MLBLpe=Vdd, then when gate of MLBLpe=SEGe4=Vdd, the source voltage of MLBLpe=Vinh would be retained.

Conversely, If MSB bit pattern=0 that makes the drain voltage of MLBLpe=Vss, then when gate of MLBLpe=SEGe4=Vdd, the source voltage of MLBLpe=Vinh would be discharged to Vss as well. This is a novel step of Vdd/Vss to Vinh/Vss conversion in LBLs for any data loaded into CACHE for super Program-Inhibit scheme. The preferred bias conditions are:
 a) SEGe3=V1, SEGo3=Vss,
 b) All other signals=0V to allow the 4 KB digital page data in 4 KB GBL bus lines to be fully loaded into the selected 4 KB Even CACHElsb $C_{LBL}$ capacitors, not other CACHEs.

Arrow6o or #6o is a second part of the sixth step of this methodology. Similarly, the #6o step is to apply V1=Vdd to SEGo4 signal to connect each 4 KB GBL to the corresponding 4 KB Odd $C_{LBL}$ capacitors in ½ of 8 KB CACHEmsb register only via the corresponding 4 KB Odd MLBLpe transistors. The remaining ½ of 4 KB Even CACHEmsb are isolated from 4 KB GBLs at this step. The preferred bias conditions are:
 a) SEGo4=V1, SEGe4=Vss,
 b) All other signals=0V to allow the 4 KB digital page data in 4 KB GBL bus lines to be fully loaded into the selected 4 KB Odd CACHEmsb $C_{LBL}$ capacitors, not other CACHEs.

After #6e and #6o steps, whole 8 KB MSB data are locked (saved) in 8 KB CACHEmsb $C_{LBL}$ capacitors for the subsequent Program and Program-Verify operations.

Arrow7e or #7e is a first part of a seventh step of this methodology. The #7e step is to perform the analog sensing and latching by 4 KB Multiplier and 4 KB SA from the selected 4 KB Even cells within 4 KB Even CACHEcel $C_{LBL}$ capacitors. Therefore, H1 is applied to SEGe1 signal to connect each 4 KB GBL to each corresponding 4 KB Even $C_{LBL}$ capacitors in ½ of 8 KB CACHEcel register only via the corresponding 4 KB Even MLBLpe transistors. The remaining ½ of 4 KB Odd CACHEcel are isolated from 4 KB GBLs at this step. The preferred bias conditions include:

a) SEGe1=H1, SEGo1=Vss,
b) All other signals=0V to allow the 4 KB Even digital page data in 4 KB GBL bus lines to be dedicated for 4 KB Even CACHEcel sensing and amplification, not affected by other CACHEs.

Arrow7o or #7o is a second part of the seventh step of this methodology. Similarly, the #7o step is to perform the analog sensing and latching by 4 KB Multiplier and 4 KB SA from the selected 4 KB Odd cells within 4 KB Odd CACHEcel $C_{LBL}$ capacitors. Therefore, H1 is applied to SEGo1 signal to connect each 4 KB GBL to each corresponding 4 KB Odd $C_{LBL}$ capacitors in ½ of 8 KB CACHElsb register only via the corresponding 4 KB Odd MLBLpe transistors. The remaining ½ of 4 KB Even CACHElsb are isolated from 4 KB GBLs at this step. The preferred bias conditions are:
a) SEGo1=H1, SEGe2=Vss,
b) All other signals=0V to allow only 4 KB Odd CACHEcel to be sensed and amplified by 4 KB Multipliers and 4 KB SAs.

Arrow8e or #8e and Arrow8o or #8o are respective a first and a second part of an eighth step of this methodology indicating that both 4 KB even CLBL1e and 4 KB odd CLBL1o capacitors of CACHEcel are selected for Vinh precharging initially with the preferred bias conditions below.
a) LBLps1=V2=Vinh and PREo1=PREe1=H1 are to turn on MLBLso and MLBLse concurrently to precharge both 4 KB even/odd CACHEcel LBL capacitors.
b) TIE1=0V is to shut off MLBLp to disconnect CACHEcel from CACHEint so that CACHEcel and CACHEint can perform independent Vinh precharge. In fact, TIE can be any voltage because CACHEcel=CACHEint=Vinh. TIE1~TIEL/2=0V.
c) SEGo1=SEGe1=0V are to shut off MLBLpo and MLBLpe to prevent leakage of CACHEcel to 4 KB shared GBLs.

Arrow9e or #9e is a first part of ninth step of this methodology. The #9e step is to apply V1 to SEGe1 signal to connect each 4 KB GBLs to the corresponding 4 KB even $C_{LBL}$ capacitors in ½ of 8 KB CACHEcel register only via the corresponding 4 KB Even MLBLpe transistors. The remaining ½ of Odd 4 KB CACHEcel are isolated from 4 KB GBLs at this step. The #9e step is further to perform 4 KB Even data latching and Vdd/Vss to Vinh/Vss conversion in LBLs in accordance with the 4 KB Even page data in CACHEcel. The preferred bias conditions are:
a) SEGe1=V1, SEGo1=Vss,
b) All other signals=0V to allow the 4 KB digital page data in 4 KB GBL bus lines to be fully loaded into the selected 4 KB Even CACHEcel $C_{LBL}$ capacitors, not other CACHEs.

Arrow9o or #9o is a second part of the ninth step of this methodology. Similarly, the #9o step is to apply V1 to SEGo1 signal to connect each 4 KB GBL to the corresponding 4 KB Odd $C_{LBL}$ capacitors in ½ of 8 KB CACHEcel register only via the corresponding 4 KB Odd MLBLpe transistors. The remaining ½ of 4 KB Even CACHElsb are isolated from 4 KB GBLs at this step. The preferred bias conditions are:
a) SEGo1=V1, SEGe1=Vss,
b) All other signals=0V to allow the 4 KB digital page data in 4 KB GBL bus lines to be fully loaded into the selected 4 KB Odd CACHEcel $C_{LBL}$ capacitors, not other CACHEs.

After #9e and #9o steps, whole 8 KB LSB data is latched (saved) in 8 KB CACHEcel $C_{LBL}$ capacitors for the subsequent Bit-flipping of Program and Program-Verify operations.

FIG. 7B is a diagram showing circuit structure and method for performing MLC (LSB page) multi-page A-state Program-Verify operation according to an embodiment of the present invention. As shown, this is a first flow of a preferred m-page LSB Even A-cell Program-Verify operation to program the selected E-state cells to A-state cells by using a Vtamin as a Program-Verify WL voltage in all selected m pages when the externally inputted bit data of LSB=0 and MSB=1. This methodology is used further along with flow charts shown in FIG. 7H and FIG. 7I to explain the preferred m-page MLC (LSB page) A-state Program-Verify operation. As shown, the A-state Program-Verify methodology is based on a scenario that m pages of MLC's MSB bits have been programmed successfully in all selected MLC cells in m selected MLC-WLs with a condition of Flag cell bit=0 in each selected MLC-WL. In order to provide more reliable and faster flow with less power-consumption for m-page MLC 4-Vt Program-Verify operation, this preferred methodology is designed to check 4 Vts from the lowest program Vt of A-state by Vtamin, to next higher program Vt of B-state by Vtbmin, and last to the highest program Vt of C-state by Vtcmin. Note, a 4-Vt MLC cell contains one final erased E-state (11) but 3 final program states of A (10), B (01) and C (00).

In an embodiment, this methodology is designed based on a fixed rule that each MSB bit Program has to be performed before each LSB bit Program. But Verify operation is preferred to be not limited to such sequence of starting from A-state, next B-state, and finally C-state. When m random pages are selected for a m-page LSB Program-Verify operation, then it is preferred to be performed on 4 KB-by-4 KB basis due to the limit of 4 KB GBL bus lines and 4 KB Multiplier, SA, and P/RB with area saving purpose.

Furthermore, for m random-page Program-Verify, each random page is preferably initiated and completed by each self-timed charging and discharging control of each WL by a corresponding Vread Detector and of 8 KB $C_{LBL}$ capacitors by each corresponding VLBL Detector. Conversely, for m non-random-page Program-Verify, then m non-random pages can be preferably initiated and completed at same timelines by using only one self-timed Vread Detector and one VLBL Detector.

In an embodiment, it is desired to have m-page Program, Program-Verify, and Read operations for m mixed random/non-random pages in one single HiNAND2 chip design. For this preferred m-page MLC (LSB page) A-state Program-Verify operation, as shown in FIG. 7B, it comprises 9 steps indicated by arrows named as 1, 2, 3e, 3o, 4e, 4o, 5e, 6e, 6o, 7e, 7o, 8e, 8o, 9e and 9o with several similar basic operations as explained before in FIG. 7A. The terminology of new PGM-VFY is to represent Program-Verify below and CS to represent charge-sharing.

In a specific embodiment, the methodology for performing m-page MLC (LSB page) A-state Program-Verify operation includes precharging one or more pseudo CACHE registers, discharging selective $C_{LBL}$ capacitors in accordance with the new readout MSB page data after A-state PGM-VFY operation, loading and latching 8 KB A-state page data, and charge-sharing among the selective $C_{LBL}$ capacitors with corresponding GBLs. For the precharging step, indicated by Arrows of 1, 5 and 8, it need at most two of CACHEcel and CACHEint registers to be selected for precharging with Vinh voltage for A-state PGM-VFY. In the discharging step, indicated by Arrow 2, the selective $C_{LBL}$ capacitors in the selected CACHEcel and CACHEint are either discharged to Vss or retained with the Vinh voltage in accordance with the new readout MSB page data after A-state Program-Verify operation. Additionally, in loading and latching (LD/LT) step, indicated by Arrows of 6 and 9, there are 8 KB MSB page data and 8 KB A-state data to be loaded from 4 KB P/RB or 4 KB in 2-cycle SA and temporarily latched in each corresponding 8 KB CACHEcel and 8 KB CACHEmsb $C_{LBL}$ capacitors. Furthermore, in charge-sharing step, indicated by Arrows of 3, 4 and 7, it is a readout process that transfers each sensed cell analog data to be amplified by each Multiplier because the signal magnitude has been reduced due to each LBL and each GBL CS diluted scheme.

The whole proposed methodology involves some key control signals in each selected Block, Segment, Group, and Plane such as:

a) SEGo and SEGe: The paired Segment control signals that connect or disconnect one paired 4 KB Odd and 4 KB Even metal1 LBLs from one shared 4 KB metal2 GBLs.

b) PREo and PREe: The paired Segment power control signals that connect or disconnect selectively one paired 4 KB Odd and 4 KB Even metal1 4 KB metal1 LBLs and only common Segment power supply line of LBLps.

c) LBLps: This is one of Segment Vinh power supply line to be shared by one paired 8 KB CACHE registers physically on top and bottom sharing LBLps in cell array layout. If top and bottom $C_{LBL}$ capacitors are turned on simultaneously, then one LBLps line can precharge or discharge them concurrently.

d) TIE: This is a special bridge NMOS transistor inserted in-between one paired of two physically adjacent Segment $C_{LBL}$ capacitors or lines. There is advantageous to have this TIE transistor and control signal during each $C_{LBL}$ precharge and discharge selected NAND cell in each CACHEcel. For example, each readout cell's analog data in CACHEcel can be easily shared with the next paired adjacent $C_{LBL}$ capacitor in CACHEint so that easier data manipulation can be executed in SLC and MLC operations.

Referring to FIG. 7B, the LSB methodology flow starts from step 1 to 9 to sequentially receive, load, and latch m pages of 8 KB LSB data. Each 8 KB LSB page is further divided into 4 KB Even LSB page data and 4 KB Odd LSB page data loaded from eight common I/Os in unit of byte of a typical Parallel NAND flash or in unit of 4 I/Os of an 8-pin SPI Serial NAND flash configuration.

Arrow1 or #1 is a first step of this methodology, indicating only 4 KB even LBL1e and 4 KB LBL1o capacitors of CACHEcel are selected for Vinh precharging initially. In order to do so, the following bias conditions are set up in accordance with the circuits of HiNAND2 array and its associated Block and Segment decoders.

a) LBLps1=V2=Vinh and PREo1=PREe1=H1 are to turn on MLBLso and MLBLse concurrently to precharge both 4 KB Even/Odd CACHEcel $C_{LBL}$ capacitors.

b) LBLps2=Vss, c) TIE1=0V is to shut off MLBLp to disconnect CACHEcel from CACHEint so that CACHEcel Vinh would not leak to CACHEint.

d) TIEL/2=0V (L=4 in this example) is to shut off another MLBLp because no precharge will happen to CACHElsb and CACHEmsb in this step.

e) SEGo1=SEGe1=0V are to shut off 4 KB MLBLpo and 4 KB MLBLpe to prevent leakage of 4 KB CACHEcel to 4 KB shared GBL lines.

f) All other SEGo2/3/4=SEGe2/3/4=0V are to shut off MLBLpo and MLBLpe to prevent leakage of other non CACHEcel.

The Vinh current flow is supplied by one corresponding LBLps1 line with a Vinh Driver (not shown). The Vinh precharging step can be done in 1-cycle on all 4 Even/Odd CACHEs. The Vinh value can be flexibly adjusted down to Vdd if the location of CACHE nears DR 700 for less impact of charge-sharing.

Arrow 2 (#2) indicate a second step to perform 8 KB A-state PGM-VFY that results in either $C_{LBL}$ voltage to Vss due to discharging or $C_{LBL}$ be retained at Vinh due to no discharging, depending on cells' states in CACHEcel. For example, E-cells=Vss because Vtemax<Vtamin but A-cells=B-cells=C-cells=Vinh because no cell current conduction due to Vtamin<Vtbmin<Vtcmin. In conclusion, after this step, the 8 KB MLC analog Cell voltages, E-cells=Vss are differentiated from A-cells=B-cells=C-cells=Vinh and are stored herein m 8 KB CACHEcel in m CACHEcels.

Arrow 3e (#3e): The #3e step is to directly load lastly stored 4 KB Even LSB digital Program data in 4 KB P/RBs to 4 KB pseudo Even CACHEint that is latched therein in 1-cycle.

As explained before, this step is substantially a digital (Vdd/Vss) to analog (Vinh/Vss) conversion. Therefore, a Vinh precharged has been well performed before this LD/LT step at targeted 4 KB Even CACHEint as indicated in FIG. 7A methodology. Thus the Vinh precharge is skipped here and LD/LT operation is directly performed in this #3e step along with the preferred bias conditions below:

a) SEGe2=H1, SEGo2=Vss, b) All other signals=0V to ensure that only one set of 4 KB Even CACHEe LBLs is exclusively connected to 4 KB shared GBLs for LD/LT step.

c) 4 KB GBL voltages=Vdd/Vss of 4 KB P/RB digital patterns.

After this #3e, then the flow moves to #3o step below. Once moving to #3o step, then the above 4 KB P/RB data would be latched in 4 KB Even CACHEint in the form of Vinh/Vss.

Arrow 3o (#3o): The #3o step is to directly load lastly stored 4 KB Odd LSB digital Program data in 4 KB P/RBs to 4 KB pseudo Odd CACHEint and then latched therein in 1-cycle. After #3o step, then whole 8 KB CACHEint are filled with 8 KB LSB page data in 2 cycles loaded from on-chip 4 KB real CACHE that are loaded via 8 I/Os in 8K sequential cycles. The preferred bias conditions are opposite to #3e step:

a) SEGo2=H1, SEGe2=Vss, b) All other signals=0V to ensure that only one set of 4 KB Odd CACHEo LBLs is exclusively connected to 4 KB shared GBL lines for LD/LT step.

c) 4 KB GBL voltages=Vdd/Vss of 4 KB P/RB digital patterns.

Arrow 4e (#4e): The #4e step is to perform Vinh/Vss analog sensing and amplification of lastly stored 4 KB MSB Even page data stored in 4 KB Even CACHEmsb by 4 KB Multipliers first and then 4 KB SAs. The preferred bias conditions are summarized below:

a) SEGe4=H1, SEGo4=Vss, b) All other signals=0V to ensure that only the 4 KB Even CACHEmsb is selected for performing charge-sharing.

Arrow 4o (#4o): The #4e step is to perform the similar Vinh/Vss analog sensing and amplification of lastly stored 4 KB MSB Odd page data stored in 4 KB Odd CACHEmsb by 4 KB Multipliers first and then 4 KB SAs. The preferred bias conditions are opposite to #4e step as summarized below:
  a) SEGo4=H1, SEGe4=Vss,
  b) All other signals=0V to ensure that only one 4 KB Odd CACHEmsb is selected for performing CS with 4 KB metal2 GBLs.

Arrow 5e (#5e): The #5e step is to do Vinh precharge step for writing back the last readout 4 KB Even MSB page data from 4 KB Even CACHEmsb and later stored in 4 KB SAs to 4 KB CACHEmsb again. Since A-state PGM-VFY operation is an interim step, thus the 4 KB MSB Even page data has to be stored back to 4 KB Even CACHEmsb again for the need of subsequent Even LSB PGM-VFY operation plus the last 4 KB Even CACHEmsb has been corrupted 4 KB Even MSB page due to CS. The #5e write back step is like the previous LD/LT step, a Vinh precharge on 4 KB Even CACHEmsb is required. The preferred bias conditions are listed below:
  a) PREe4=H1, PREo4=Vss and LBLps4=V2=Vinh.
  b) All other signals=0V to ensure that only one set of 4 KB Even CACHEmsb LBLs is exclusively connected to LBLps4.

Arrow 5o (#5o): The #5o step is to do similar Vinh precharge for writing back the last readout 4 KB Odd MSB page data from 4 KB Odd CACHEmsb and later stored in 4 KB SAs to 4 KB CACHEmsb again. Since A-state PGM-VFY operation is an interim step, thus the 4 KB MSB Odd page data like Even page has to be stored back to 4 KB Odd CACHEmsb again for the need of subsequent Odd LSB PGM-VFY operation plus the last 4 KB Odd CACHEmsb has been corrupted 4 KB Odd MSB page due to CS. The #5o write back step is like the previous #5e step, a Vinh precharge on 4 KB Odd CACHEmsb is required. The preferred bias conditions are also opposite to $5e step:
  a) PREo4=H1, PREe4=Vss and same LBLps4=V2=Vinh.
  b) All other signals=0V to ensure that only one set of 4 KB Odd CACHEmsb LBLs is exclusively connected to LBLps4.

Note, in some cases, both 4 KB Odd and 4 KB Even CACHEmsb can be done with Vinh precharging on the same time. But in this case, it is preferred to be performed in different time slot.

Arrow 6e (#6e): The #6e step is to write back 4 KB Even MSB page and latch from 4 KB SA to 4 KB Even CACHEmsb. The preferred bias conditions below:
  a) SEGe4=H1, PREo4=Vss and LBLps4=0V.
  b) All other signals=0V to ensure that only one set of 4 KB Even CACHEmsb LBLs is exclusively connected to 4 KB GBLs.

Arrow 6o (#6o): The #6o step is to similarly write back 4 KB Odd MSB page and latch from 4 KB SA to 4 KB Odd CACHEmsb. The preferred bias conditions are listed below:
  a) SEGo4=H1, PREe4=Vss and LBLps4=0V.
  b) All other signals=0V to ensure that only one set of 4 KB Odd CACHEmsb LBLs is exclusively connected to 4 KB GBLs.

Arrow 7e (#7e): The #4e step is to perform Vinh/Vss analog sensing and amplification of lastly stored 4 KB Even page Vtamin-read data stored in 4 KB Even CACHEcel by 4 KB Multipliers first, then next 4 KB SAs, and lastly 4 KB P/RB. The preferred bias conditions are summarized below:
  a) SEGe1=H1, SEGo1=Vss,
  b) All other signals=0V to ensure that only the 4 KB Even CACHEcel is selected for performing CS.

Arrow 7o (#7o): The #7o step is to perform the similar Vinh/Vss analog sensing and amplification of lastly stored 4 KB Odd page Vtamin-read data stored in 4 KB Odd CACHEmsb by 4 KB Multipliers first, then next 4 KB SAs and then lastly 4 KB P/RB. The preferred bias conditions are opposite to #7e step as summarized below:
  a) SEGo1=H1, SEGe1=Vss,
  b) All other signals=0V to ensure that only one 4 KB Odd CACHEcel is selected for performing CS with 4 KB metal2 GBLs.

Arrow 8e (#8e): The #8e step is to do Vinh precharge for writing back the last readout 4 KB Even Vtamin-read page data from 4 KB Even CACHEcel and later stored in 4 KB P/RB to original 4 KB CACHEcel as well as 4 KB CACHEint again. The write back of #8e step is like the previous LD/LT step, a Vinh precharge on both 4 KB Even CACHEcel and 4 KB Even CACHEint are required. The preferred bias conditions are listed below:
  a) PREe1=H1, PREo1=Vss and LBLps1=V2=Vinh,
  b) PREe2=H1, PREo2=Vss and LBLps2=V2=Vinh,
  c) All other signals=0V to ensure that only two sets of 4 KB Even CACHEcel and CACHEint LBLs are exclusively connected to LBLps1 and LBLps2 respectively.

Note, all Vinh precharge is a self-timed step using one VLBLps1 Vinh Detector and one VLBLps2 Vinh Detector. In addition, both 4 KB Even CACHEcel and 4 KB CACHEint are precharged on the same time to save time delay. In this case, both LBLps1 and LBLps2 can be combined in one and use only one VLBLps Detector.

Arrow 8o (#8o): The #8o step is similar to #8e step with the preferred bias conditions opposite to $8e step:
  a) PREo1=H1, PREe1=Vss and LBLps1=V2=Vinh,
  b) PREo2=H1, PREe2=Vss and LBLps2=V2=Vinh,
  c) All other signals=0V to ensure that only two sets of 4 KB Even CACHEcel and CACHEint LBLs are exclusively connected to LBLps1 and LBLps2 respectively.

Note, all Vinh precharge is a self-timed step using one VLBLps1 Vinh Dector and one VLBLps2 Vinh Detector.

Arrow 9e (#9e): The #9e step is to write back 4 KB Even Vtamin-read page and latch from 4 KB P/RB simultaneously on both 4 KB Even CACHEcel and 4 KB CACHEint via 4 KB GBLs to save time and ½ step. The preferred bias conditions are listed below:
  a) SEGe1=H1, PREo1=Vss and LBLps1=0V,
  b) SEGe2=H1, PREo2=Vss and LBLps2=0V,
  c) All other signals=0V to ensure that only one set of 4 KB Even CACHEcel and 4 KB
  Odd CACHEint LBLs are exclusively connected to 4 KB GBL lines for writing back Vtamin-read Even page data.

Arrow 9o (#9o): The #9O step is to similarly write back 4 KB Odd Vtamin-read page and latch from 4 KB P/RB to both 4 KB Odd CACHEcel and 4 KB CACHEint simultaneously to save time, power and ½ step. The preferred bias conditions of #9O step are opposite to #9e step:
  a) SEGo1=H1, PREe1=Vss and LBLps1=0V,
  b) SEGo2=H1, PREe2=Vss and LBLps2=0V,
  c) All other signals=0V to ensure that only one set of 4 KB Odd CACHEcel and 4 KB
  Odd CACHEint LBLs are exclusively connected to 4 KB GBLs for writing back Vtamin-read Even page data.

After above 9 steps, all 8 KB pages data of LSB, Vtamin-read (MSB-bit) are finally stored back to the corresponding CACHElsb and CACHEmsb, and the updated and old iterative A-state Program page data are stored in respective 8 KB CACHEcel and 8 KB CACHEint for continuing next iterative A-state Program and PGM-VFY operations. In other words, 8 KB CACHEcel is always used to store the most updated A-state PGM-VFY page data of current iterative step but 8 KB CACHEint is always used to store the lastly updated A-state in last iterative PGM-VFY page data.

FIG. 7C is a diagram showing circuit structure and method for m-page MLC (LSB page) B-state Program-Verify operation according to an embodiment of the present invention. As shown, this is a second flow of m-page LSB Even B-cell Program-Verify operation to program the selected B1'-state cells to B-state cells by using a Vtbmin as a m-page Program-Verify WL voltage in all selected m pages when the corresponding inputted bit data of LSB=1 but adjusted to "0" and MSB=0. Like A-state Block PGM-VFY methodology shown in FIG. 7B, this methodology is used along with the flows shown in FIG. 7J and FIG. 7K to explain the preferred m-page MLC (LSB page) B-state PGM-VFY operation.

In an embodiment, the B-state PGM-VFY methodology is also based on a scenario that m-page of MLC's MSB and LSB A-state have been programmed and verified successfully in all selected MLC cells in m selected MLC-WLs with a condition of Flag cell bit=0 in each selected MLC-WL. Note, this methodology is designed based on a fixed rule that each MSB bit Program has to be performed before each LSB bit Program and A-state is Program-Verified before B-state PGM-VFY operation so that m selected sets of 64WL+ 1SSL+1GSL-latched Vread and Vdd voltages in A-state can be used in a recyclable manner for next (a second) B-state PGM-VFY operation. Thus power and latency savings of the second B-state PGM-VFY operation over the first A-state PGM-VFY operation can be achieved. The setting from Vtamin for A-state and Vtbmin for B-state for each set of 64WL+1SSL+1GSL will be explained subsequently.

When dealing with A-state Program-Verify, 8 KB internal MSB page data under Vtamin-read are stored in 8 KB CACHEmsb as indicated in #6e and #6o steps in FIG. 7B. Conversely, when dealing with B-state Program-Verify, 8 KB LSB page data sequentially loaded from 8 I/Os are stored in 2-cycle (shown below) in 8 KB CACHElsb as indicated in #5e and #5o steps in FIG. 7C with the preferred bias conditions listed below.

a) PREe3=H1 and PREo3=Vss and LBLps3=V2=Vinh.
b) PREe3=H1 and PREo3=Vss and LBLps3=V2=Vinh.

In addition, the Vtamin used for A-state PGM-VFY in FIG. 7B is replaced by the Vtbmin used for B-state PGM-VFY operation as indicated in #2 of FIG. 7C. All other control signals and steps are same for both FIG. 7B and FIG. 7C. Thus the detailed description of FIG. 7C of B-state PGM-VFY methodology is omitted herein.

FIG. 7D is a diagram showing circuit structure and method for performing m-page MLC (LSB page) C-state Program-Verify operation according to an embodiment of the present invention. As shown, this is a third flow of m-page LSB Even C-cell Program-Verify operation to program the selected B1'-state or B2'-state cells to C-state cells by using a Vtcmin as a m-page Program-Verify WL voltage in all selected m pages when the corresponding inputted bit data of LSB=0 and MSB=0. Basically, this methodology is similar to precious methodologies of FIG. 7A and FIG. 7B but with fewer steps because this is the last check of C-state of m-page 4-Vt MLC (LSB) PGM-VFY operation. This methodology is used along with the flows shown in FIG. 7H and FIG. 7I to explain the preferred m-page MLC (LSB page) C-state PGM-VFY operation.

In an embodiment, the C-state PGM-VFY methodology is based on one scenario that m-page of MLC MSB and LSB bits have been programmed and verified successfully with A-state and B-state in all selected MLC cells in m selected MLC-WLs with a condition of Flag cell bit=0 in each selected MLC-WL. For this preferred m-page MLC (LSB page) C-state PGM-VFY operation, it comprises 6 steps indicated by arrow # such as 1, 2, 3e, 3o, 4e, 4o, 5e, 6e and 6o with several basic operations similar to those explained before.

In a specific embodiment, the C-state PGM-VFY methodology includes precharging only two of CACHEcel and CACHEint, discharging selective $C_{LBL}$ capacitors, loading and latching 8 KB updated C-state page data from 4 KB P/RB in 2-cycle into both 8 KB CACHEcel and 8 KB CACHEint, and charge-sharing the $C_{LBL}$ capacitors with corresponding GBLs. In particular, as indicated by Arrow #1 and #5, only two pseudo CACHEcel and CACHEint registers are selected for precharging at different timeline with Vinh for C-state PGM-VFY operation. In the discharging step, indicated by Arrow 2, the selective $C_{LBL}$ capacitors in the selected CACHEcel and CACHEint are either discharged to Vss or retained with Vinh in accordance with the new readout MSB page data after A-state PGM-VFY operation. Next in the loading and latching (LD/LT) step, indicated by Arrow 6, 8 KB updated C-state page data are loaded from 4 KB P/RB in 2-cycle into both 8 KB CACHEcel and 8 KB CACHEint which are temporarily latched therein. Lastly, in charge-sharing step, indicated by Arrows 3 and 4, the 8 KB CACHEcel are used to store the updated or new 8 KB C-state Program page data after each iterative PGM-VFY step but the 8 KB CACHEint are used to store the last or odd C-state Program page data after last iterative PGM-VFY step.

Arrow 1 (#1): As #1 indicates only 4 KB Even CLBL1e and 4 KB CLBL1o capacitors of CACHEcel are selected for Vinh precharging with the following preferred bias conditions.

a) PREo1=PREe1=H1 with LBLps1=V2=Vinh
   These conditions are to precharge both 4 KB Even and 4 KB Odd CACHEcel $C_{LBL}$ capacitors simultaneously within 1-cycle of a self-timed step.
b) LBLps2=LBLps3=LBLps4=0V
c) PREo2=PREe2=PREo3=PREe3=PREo4=PREe4=0V
   No other 8 KB CACHEs to be precharged.
d) TIE1= . . . =TIEL/2=0V, where L=4 This is to prevent leakage from 8 KB CACHEcel to 8 KB CACHEint.
e) SEGo1=SEGe1=0V
   This is to prevent leakage of 4 KB Even CACHEcel and 4 KB Odd CACHEcel to the common 4 KB GBL lines.
f) All other SEGo2/3/4=SEGe2/3/4=0V because not required.

Arrow 2 (#2): This #2 step performs 8 KB C-state PGM-VFY operation that results in either $C_{LBL}$ voltage dropped to Vss due to discharging or $C_{LBL}$ voltage retained Vinh due to no discharging, depending on cells' states in CACHEcel. For example, under selected WL=Vtcmin, E-cells=A-cells=B-cells=Vss because Vtemax<Vtamin<Vtbmin<Vtcmin but C-cells=Vinh because no cell current conduction Vtcmin≤Vtc. In conclusion, after this step, the 8 KB MLC analog Cell voltages, E-cells=A-cells=B-cell=Vss are differentiated from C-cells=Vinh and are stored herein m 8 KB CACHEcel.

Arrow 3e (#3e): The #3e step is to perform Vinh/Vss analog sensing and amplification of last or old 4 KB Even C-state Program data stored in 4 KB Even CACHEint by 4

KB Multipliers first and then 4 KB SAs thereafter. The preferred bias conditions are summarized below:
  a) SEGe2=H1, SEGo2=Vss,
  b) All other signals=0V to ensure that only the 4 KB Even CACHEint is selected for performing CS.

Arrow 3o (#3o): The #3o step is to perform the similar Vinh/Vss analog sensing and amplification of last or old 4 KB Odd C-state Program page data stored in 4 KB Odd CACHEint by 4 KB Multipliers first and then 4 KB SAs. The preferred bias conditions are opposite to #3e step above and are summarized below:
  a) SEGo2=H1, SEGe2=Vss,
  b) All other signals=0V to ensure that only one 4 KB Odd CACHEint is selected for performing CS with 4 KB metal2 GBLs.

Arrow 4e (#4e): The #4e step is to perform Vinh/Vss analog sensing and amplification of current or new 4 KB Even C-state Program data stored in 4 KB Even CACHEcel by 4 KB Multipliers first and then 4 KB SAs thereafter. The preferred bias conditions are summarized below:
  a) SEGe1=H1, SEGo1=Vss,
  b) All other signals=0V to ensure that only the 4 KB Even CACHEcel is selected for performing CS.

Arrow 4o (#4o): The #4o step is to perform a similar Vinh/Vss analog sensing and amplification of current or new 4 KB Odd C-state Program page data stored in 4 KB Odd CACHEcel by 4 KB Multipliers first and then 4 KB SAs. The preferred bias conditions are opposite to #4e step and are summarized below:
  a) SEGo1=H1, SEGe1=Vss,
  b) All other signals=0V to ensure only one 4 KB Odd CACHEcel are selected for performing CS with 4 KB metal2 GBLs.

Arrow 5e (#5e): The #5e step is to do Vinh precharge step for writing back the updated 4 KB Even C-state Program page data from 4 KB P/RB to both Even CACHEcel and CACHEint for next iterative Program and PGM-VFY operation if the current C-state PGM-VFY does not pass. The preferred bias conditions are summarized below:
  a) PREe1=PREe2=H1 and LBLps1=LBLps2=V2=Vinh,
    This is to precharge both 4 KB Even CACHEcel and 4 KB Even CACHEint with Vinh only.
  b) PREo1=PREo2=Vss
    This is to prevent the bus contentions from happening between 4 KB Odd CACHEcel and 4 KB Odd CACHEint and 4 KB GBLs.
  c) All other signals=0V to ensure the writing back only happens to above said 4 KB Even CACHEcel and 4 KB Even CACHEint.

Arrow 5o (#5o): The #5o step is a similar Vinh precharge step for writing back the updated 4 KB Odd C-state page data from 4 KB P/RB to both 4 KB Odd CACHEcel and 4 KB Odd CACHEint. The preferred biased conditions are also opposite to #5e step:
  a) PREo1=PREo2=H1 and LBLps1=LBLps2=V2=Vinh,
    To precharge both 4 KB Odd CACHEcel and 4 KB Odd CACHEint with Vinh only.
  b) PREe1=PREe2=Vss
    To prevent the bus contentions from happening between 4 KB Even CACHEcel and 4 KB Even CACHEint and 4 KB GBLs.
  c) All other signals=0V to ensure the writing back only happens to above said 4 KB Odd CACHEcel and 4 KB Odd CACHEint.

Arrow 6e (#6e): The #6e step is to do LD/LT step for writing back the updated C-state Even Program page data from 4 KB P/RB to both 4 KB Even CACHEcel and 4 KB Even CACHEint simultaneously in 1-cycle of a self-timed operation. The preferred bias conditions are listed below:
  a) SEGe1=SEGe2=V1=Vdd to allow the digital Vdd/Vss to analog Vinh/Vss conversion to the selected 4 KB Even CACHEcel and 4 KB Even CACHEint $C_{LBL}$ capacitors.
  b) All other signals=0V to ensure only two sets of 4 KB Even CACHEcel and 4 KB Odd CACHEint LBLs are exclusively connected to 4 KB P/RB via 4 KB GBLs.

Arrow 6o (#6o): The #6o step is similar to #6e step with the preferred bias conditions also opposite to #6e step:
  a) SEGo1=SEGo2=V1=Vdd to allow the digital Vdd/Vss to analog Vinh/Vss conversion to the selected 4 KB Odd CACHEcel and 4 KB Odd CACHEint $C_{LBL}$ capacitors.
  b) All other signals=0V to ensure only two sets of 4 KB Odd CACHEcel and 4 KB Odd CACHEint LBLs are exclusively connected to 4 KB P/RB via 4 KB GBLs.

FIG. 7E is a flow chart showing a method for performing m-page MLC (LSB Even page) Data Loading and B'-adjustment according to an embodiment of the present invention. Basically, the detailed steps of this flow are designed in accordance with the steps set by the preferred Even LSB page data loading and B'-adjustment methodology as explained in FIG. 7A as the circuits of HiNAND2 array in FIG. 1A, Block-decoder in FIG. 2A, Segment-decoder in FIG. 2B and Data Buffer in FIG. 3.

As shown, the flow in FIG. 7E starts with a first step of m Even pages of 8 KB 4-Vt MLC LSB raw data loading from 8 external I/Os followed by a second step of a preferred B'-data adjustment logic operation to obtain m newly readjusted correct Even LSB page data to be stored into m designated pseudo Even CACHE registers for the subsequent concurrent m-page MLC LSB Even page Program operation.

Like previous SLC/MLC (MSB) Page loading and Program operation, m pages of each 8 KB MLC LSB data loading have to be split into m 4 KB Even and m 4 KB Odd pages to accommodate for 4 KB GBL bus lines. This flow shows m Even LSB pages' loading and B' bit adjustment only. But the preferred Program and Program-Verify of m LSB pages will be done on both m 4 KB Even and m 4 KB Odd pages simultaneously to get m-fold reduction time by the present invention. Note, since the present invention is disclosed for a hybrid SLC-WL and MLC-WL 64-WL NAND Block of HiNAND2 array, thus MLC LSB page data loading and B'-adjustment are only performed on those m selected MLC-WLs with 4-Vt cells. The flow starts from Step 430.

Step 430: This step is to sequentially receive and load MLC LSB command and m LSB page addresses into HiNAND2 array designated Command register, and m Address Buffers (not shown), m latches of m Segments, and m latches of m Blocks via 8 I/Os respectively. For example, the LSB Command is loaded into the designated Command register so that this new Block LSB command can be decoded first and some of the initial steps of m 8 KB LSB B'-adjustment operation can be started immediately before or while m pages of lengthy 8 KB LSB page data are loaded into 4 KB real CACHE registers to save time.

Note, m random-page Addresses are loaded into m designated on-chip m Address Buffers (not shown) in conjunction with other control circuits to set the corresponding m Segment latches as shown in FIG. 2B and m Block latches as shown in FIG. 2A of the preferred HiNAND2 array.

In addition, m addressed 8 KB LSB page data are divided into m 4 KB Even LSB and m 4 KB Odd LSB page data.

These m pages of LSB page data are selected concurrently by m Segment latches with m Block latches. In an embodiment, this HiNAND2 array comprises m LSB page Addresses that can be selected concurrently in every selected NAND Plane. Thus a flexibility of up to m pages of Addresses can be specified in this novel LSB Program command.

Once LSB is commanded and addresses are loaded and decoded, then two next steps can be performed concurrently. One flow moves to Step 431 to do the desired concurrent m-page $C_{LBL}$ precharging in four CACHEs and the other flow moves to Step 435 to start sequential loading each 4 KB Even LSB page data in unit of byte from the external Flash Controller via 8 I/Os.

Step 431: Concurrent LBL Vinh precharging. This step is a one of the preferred m-page operation used to perform concurrent LBL Vinh precharge on both Even and Odd $C_{LBL}$ capacitors within four selected CACHEs such as 8 KB CACHEcel, 8 KB Even CACHEint, 8 KB Even CACHEmsb, and 8 KB CACHElsb with following preferred bias conditions:

I. Self-timed Vinh precharging on $C_{LBL}$ capacitors:
It is done by LBLps Vinh Detector circuit along with the following preferred bias conditions.
 a) PREe1=PREo1=H1 and LBLps1=Vinh for precharging CACHEcel 4 KB CLBL1e and 4 KB CLBL1o capacitors,
 b) PREe2=PREo2=H1 and LBLps2=Vinh for precharging CACHEint 4 KB CLBL1e and 4 KB CLBL1o capacitors,
 c) PREe3=PREo3=H1 and LBLps3=Vinh for precharging CACHElsb 4 KB CLBL1e and 4 KB CLBL1o capacitors,
 d) PREe4=PREo4=H1 and LBLps4=Vinh for precharging CACHEmsb 4 KB CLBL1e and 4 KB CLBL1o capacitors.

II. Preventing leakage from $C_{LBL}$ to $C_{GBL}$:
 a) DIVen=SEGo1=SEGe1=0V for preventing the leakage of 4 KB CLBL1o and 4 KB CLBL1e capacitors in CACHEcel to the common 4 KB GBLs,
 b) DIVen=SEGo2=SEGe2=0V for preventing the leakage of 4 KB CLBL1o and 4 KB CLBL1e capacitors in CACHEint to the common 4 KB GBLs,
 c) DIVen=SEGo2=SEGe2=0V for preventing the leakage of 4 KB CLBL1o and 4 KB CLBL1e capacitors in CACHElsb to the common 4 KB GBLs,
 d) DIVen=SEGo2=SEGe2=0V for preventing the leakage of 4 KB CLBL1o and 4 KB CLBL1e capacitors in CACHEmsb to the common 4 KB GBLs.

III. Independent Vinh $C_{LBL}$ precharging between the paired CACHEs.
 a) TIE1=0V for CACHEcel and CACHEint independent Vinh precharging,
 b) TIEL/2=0V (L=4) for CACHElsb and CACHEmsb independent Vinh precharging.

Step 432: XT bus checking. This decision step checks if the common bus lines of 64XTs+1SSLp+1GSLp are occupied by some existing concurrent operations after Vinh-precharging step. If No, then loading 4 KB Even LSB page data stored in 4 KB real CACHE into 4 KB Even pseudo CACHE is looped to wait until all XT bus lines are free and available. If Yes, then the flow moves to Step 433 to set the corresponding Flag-latches in selected Segment-decoder and Block-decoder without waiting to save time. Note, each XT bus line means one set of shared 64XTs+1SSLp+1GSLp metal lines.

Step 433: Flag-latch setting in selected Blocks and Segments. Once XT bus is released and free, m Flag latches of newly selected m Blocks in m Segments can be selectively set on Segment-by-Segment basis in accordance with the newly loaded m-page Addresses and the following preferred bias conditions:
 a) ENB=1=Vdd,
 b) CLWL=CLA=CLR=0V,
 c) ENS=one-shot pulse of Vdd.

The one-shot ENS will set each Block flag latch to make XD node at Vdd once each selected Block's 3 inputs of Pi, Qj, and Sk are matched. Each flag latch is made of INV3 and INV4 with its output node XD is gated by a common signal of CLWL (see FIG. 2A).

Step 434: A first self-timed Charging & Latching of one set of 64WLs+1SSL+1GSL under Vtamin-read condition. Once m random pages' flag latches are selected and set, then the selected sets of 64WLs+1SSL+1GSL will be charged with the predetermined voltages accordingly for the purpose of subsequent B'-adjustment. The whole precharge operation of each set is one self-timed automatically controlled by one corresponding Vread Detector per Segment. This Vread Detector is preferably connected to one end of a dummy WL, which is the chosen middle WL of a 3-WL IC layout to track each WL's resistance and capacitance that includes the adjacent WL-WL parasitic capacitance.

Since the desired voltages of each set of 64WLs+1SSL+1GSL are coupled from one common set of 64XTs+1SSLp+1GSLp bus lines, thus the voltages setup of each set of 64WLs+1SSL+1GSL have to be done one-set by one-set basis at a time. As a result, setting voltages of m random sets of 64WLs+1SSL+1GSL is impossible to be done in 1-cycle of this m-page Program for both m random and non-random WLs. In a specific embodiment, a two-step method for setting voltages of m random sets of 64WLs+1SSL+1GSL is proposed for m random-page Block Program and Program-Verify operations. It is merely an example for illustrative purpose and should not be limited for the scope of claims. In the first step, each set of 64XTs+1SSLp+1GSLp with varied voltages is set. In the second step, the set of 64XTs+1SSLp+1GSLp bus lines is connected to each set of 64WLs+1SSL+1GSL for charging. The varied voltages of each set of 64WLs+1SSL+1GSL mean to charge 1 selected WL with a Vtamin, 63 non-selected WLs with a same Vread set to 4V-6V, 1 SSL set to Vdd, and 1 GSL set to Vread for whole 8 KB selected 64-cell-String Blocks in accordance with the same voltages setting of one parent set of 64XTs+1SSLp+1GSLp bus lines with HXD node at a voltage equal or greater than Vread+Vt due to that a local pump is enabled by the selected Flag latches.

The voltage of each HXD signal plays an important bridge role between above set of 64XTs+1SSLp+1GSLp metal lines and set of 64WLs+1SSL+1GSL poly lines for each selected Block of each selected Segment. During Step 434, when the common gate HXD signal is pumped to Vread+Vt, then the voltages of Vread, Vtamin and Vdd in each set of 64XTs+1SSLp+1GSLp can be fully coupled to 64WLs+1SSL+1GSL lines without any voltage drop because Vread is the highest voltage of WL, SSL, and GSL during this Vtamin Read step. Note, Vtamin Read is to retrieve the MSB bit data that are programmed in MLC cell during m-page MSB-bit Program.

Conversely, when HXD node is set to be Vss, a Vread Detector detects Vread at the end of dummy WL, then the desired B'-state read voltages of Vread, Vdd, and Vtamin would be latched on the corresponding large parasitic poly2 capacitors of respective lines corresponding to one set of 64WLs+1SSL+1GSL for a long time. Thus the subsequent m-page LSB page B'-adjustment step can be executed concurrently. Thus this flow is designed to read out one 4 KB Even MSB page data first and then another 4 KB Odd MSB page data thereafter.

Step 435: A first self-timed $C_{LBL}$ Vinh-discharging-or-retaining step. This step is another self-timed operation to discharge LBL to Vss or retain LBL Vinh voltages by setting Vtamin for each selected WL in accordance with m-page 8 KB MSB page data stored one WL of the selected 8 KB WLs in one of 8 KB CACHEcel. Again, this is another operation of the present invention to be performed like ABL (All-BL) scheme on both Even and Odd MSB bits Read operation per one physical MLC-WL.

The final value of each $C_{LBL}$ bit voltage is determined by each NAND cell's state in CACHEcel. If each NAND cell is in E-state, then each corresponding $C_{LBL}$'s Vinh voltage will be discharged to Vss, otherwise each $C_{LBL}$ precharged voltage would retain its initial Vinh value if those NAND cells are B'-state with Vtb'min>Vtamin as summarized below.
  a) E-cell=0V in CACHEcel=CACHEint because Vtamin>Vtemax>−0.5V and TIE1=Vdd.
  b) B'-cell=Vinh in CACHEcel=CACHEint because Vtb'min>Vtemax.

The preferred bias conditions are listed below:
  a) CSL=PREe=PREo=LBLps=0V
     It means all 4 KB PREe1=4 KB REPe2=4 KB PREo1=4 KB PREo2=Vss. This is to prevent $C_{LBL}$ leakage of both CACHEcel and CACHEint to the common LBLps lines.
  b) SEGo=SEGe=0V
     This is to prevent metal1 $C_{LBL}$ leakage of both CACHEcel and CACHEint to the common metal2 4 KB GBLs.
  c) DIVen=CSL=0V,
  d) TIE1=Vdd,
     Since the selected E-cells are in CACHEcel only, thus CACHEcel discharges Vinh to Vss. But by setting TIE1=Vdd to connect CACHEcel and CACHEint, then Vinh in CACHEint will be discharged to Vss according to E-cells in each corresponding bit of CACHEcel.
  e) TIE2=0 because no cells of CACHElsb and CACHEmsb are selected for MSB-evaluation. Thus no Vinh discharging will happen to CACHEmsb and CACHElsb and no need to turn on TIE2.

Step 436: XT-free decision check. Right after the desired voltages of 64WLs+1SSL+1GSL being latched on the parasitic capacitors of 64WLs+1SSL+1GSL, then XT bus is freed by the setting of above B'-adjustment operation temporarily and now is open for any interrupted calls from other operation with higher priority. If no such new urgent quest, then the flow moves to Step 438 to continue the next Vtbmin read step of B'-bit adjustment of same Even LSB page.

Step 438: A second self-timed setting & latching of 64WLs+1SSL+1GSL voltages under Vtbmin-Read condition. Unlike Step 434, the first self-timed Charging & Latching of one set of 64WLs+1SSL+1GSL under Vtamin-Read condition, to differentiate E-state cells of B'-state cells under Vtamin second verify voltage, this Step 438 continues to further differentiate cells of E-state and B1'-state cells from B2'-state cells under new Vtbmin. Since only the voltage of one selected WL=Vtamin is changed to Vtbmin with the rest of other 63WLs+1SSL+1GSL voltages being retained, thus the second setting of one set of 64WLs+1SSL+1GSL is different from the first setting because no more 63 HV Vread charging operations are required. Only one LV change from Vtamin to Vtbmin needs to be done. Thus the second WL precharging can be performed much faster with less power consumption. That is why the latched voltages of the last selected group of 64WLs+1SSL+1GSL lines are kept under Vtamin. The reason for saving lastly precharged voltages of m sets of 64WLs+1SSL+1GSL is to save power because there is no need to supply the required Vread and H1 voltages again within the short interval between Step 434 and Step 438. In first Vtamin charging process, the pump clock of WLPH is enabled so that m selected HXD nodes can be pumped higher than Vread+Vt with VHV>Vread in accordance with Segment decoder circuit shown in FIG. 2B.

Setting the second voltages for m sets of 64WLs+1SSL+1GSL is performed, as the first step, to set 64XTs+1SSLp+1GSLp bus lines first with one selected XT=Vtbmin but the rest of 63 XTs=Vread, SSLp=Vdd, and GSLp=Vread with WLPH clock signal being enabled. Then, when HXD≥Vread+Vt, the voltages of a set of 64WLs+1SSL+1GSL correspondingly equal to voltages of 64XTs+1SSLp+1GSLp bus lines. Since the voltages of 63 unselected WLs and 1SSL+1GSL are retained, thus there is only one current flow in one selected WL to charge up from Vtamin to Vtbmin. In a case of Vtamin=0.5V and Vtbmin=1.5V, then 1.8V Vdd is strong enough to complete this setting within 100 μs. For m randomly selected WLs, then it takes m cycles to complete all second WL charging. Note, since Vread is already there for this second charging step, thus there is no need of Vread detection but Vtbmin detection at end of dummy WL for a second self-timed WL charging control.

Step 439: A second self-timed $C_{LBL}$ Vinh Discharging and Retaining. This step is like Step 435 as a second self-timed $C_{LBL}$ Vinh discharging or retaining operation after Step 438 latches Vtbmin and Vread in the corresponding WLs, SSL, and GSL lines. Again, each final $C_{LBL}$ bit voltage is determined by each NAND cell's state in each CACHEcel as summarized below:
  a) B2'-cell=N-cell=Vinh in CACHEcel only because Vtb'2 min>Vtb'min and TIE1=0V
  b) E-cell=A-cell=B1'-cell=0V and TIE2=0V because Vtb'2 min>Vtb'min>Vtamin.

Other preferred bias conditions are identical to the ones in Step 435, thus omitted here for description simplicity.

After Step 435 and Step 439, the both Even and Odd A-state of MSB page data under Vtamin are stored in 8 KB CACHEint and both Even and Odd B-state page data are stored in 8 KB CACHEcel, preparing for subsequent LSB B'-bit adjustment.

Step 440: This is a self-timed step to fully discharge the latched HV or LV on m selected sets of 64WLs+1SSL+1GSL of m selected Blocks after Step 439 to reduce Vread WL HV-stress on the m selected Blocks. The self-timed control is done by the VLBLps Detector when the selected 4 KB $C_{LBL}$ voltage dropping below a preset value is detected. The HXD nodes of corresponding m selected Block decoders would be set to Vdd from Vss by setting CLWL signal to Vdd and XD node to Vdd by each selected Flag bit. As a result, the 64WLs+1SSL+1GSL=Vss when 64XTs+1SSLp+1GSLp are set to 0V. The preferred bias conditions are listed below:
  a) CLA=CLR=ENS=LBLps=0V,
  b) SSLp=GSLp=XT1-XT64=0V,
  c) TIE1~TIEL/2=0V (L=4) and ENB=1,
  d) CLWL=One-shot pulse of Vdd.

Note, this Step 440 can be performed concurrently with Step 438 because there is no WL and BL bus contention issue.

Step 441: This step is to sequentially load the external one Even 4 KB raw LSB page data into on-chip one 4 KB real CACHE register on 1-byte by 1-byte basis if 8 I/Os are used in accordance with the bias conditions shown below. Note, each raw LSB bit data is not associated with a B'-bit adjustment. The raw LSB bit is just loaded from 8 I/O directly.

a) EQ=0V
        No need of pre-equalization of each real CACHE bit in advance.
    b) RD=LD=0V
        To isolate each real CACHE bit from each Multiplier, each SA and each P/RB for safer loading in accordance with the circuit shown in FIG. 3.

Note, this step can be performed simultaneously with Step 430 because there is no 64XTs+1SSLp+1GSLp and 4 KB GBL bus contention issue. The loading of 4 KB LSB data only happens between 4 KB real CACHE and 8 I/Os, while Vinh discharging or retaining happens in m selected local LBLs and $C_{LBL}$ capacitors. As a consequence, the bus lines of 4 KB GBLs and 64XTs+1SSLp+1GSLp are free and available for other concurrent m-page operations with priority.

Step 442: This decision step is to check if the last byte of each 4 KB Even LSB page are loaded completely into 4 KB real CACHE. If No, then Step 442 is looped to wait for the completion. If Yes, then the flow moves to next two steps of either 443 or 444.

Step 443: Thus step is to inform an off-chip Flash Controller or Host, by setting RDY=Vss, the on-chip 4 KB real CACHE register is temporarily full at this moment with the following preferred conditions to isolate 4 KB real CACHE from I/Os:

a) LAT=0V
    b) All Ypass=0V.

As a result, the HiNAND2 array cannot take any new command, data, address from 8 I/Os. The busy state can be reset by setting RDY=Vdd when the current B'-adjustment step is completed or a 4 KB Even page data in 4 KB real CACHE register is loaded and latched in the designated pseudo CACHEs.

Step 444: Before loading and latching (LD/LT) of 4 KB Even LSB page data stored in 4 KB real CACHE into on-chip 4 KB pseudo CACHElsb first and then to 4 KB SAs second, this decision step checks to wait for the release of 4 KB metal2 GBLs that might be currently occupied by one of concurrent Block operation with the preferred biased conditions. If 4 KB GBLs are temporarily not being occupied at this moment, then the flow moves to Step 445.

Step 445: This step is to load and latch 4 KB Even raw LSB page data in 4 Kb real CACHE to one designated 4 KB Even CACHElsb that has been precharged with Vinh voltages in previous Step 431 of this flow. The preferred bias conditions are summarized below with reference to FIG. 1B.

a) LAT=0V, SEGe1=0V in 4 KB CACHEcel, SEGe2=0V in 4 KB CACHEint, SEGe3=1=Vdd in 4 KB CACHElsb, SEGe4=0V in 4 KB CACHEmsb, SEGo1=SEGo2=SEGo3=SEGo4=0V,
        The above conditions are because only 4 KB Even CACHElsb pseudo registers are selected to load and latch 4 KB Even LSB raw page data.
    b) CSL=TIE1~TIEL/2=0V (L=4)
        To prevent the load and latch leakage from the selected 4 KB Even CACHElsb to the paired Even 4 KB CACHEmsb.
    c) DIVen=BIAS=LD=H1
        This allows the full Vdd passage of 4 KB P/RB digital voltages to the designated 4 KB even CACHElsb $C_{LBL}$ capacitors via 4 KB bus lines.

Note, this LD/LT step also executes a Vdd/Vss-to-Vinh/Vss conversion. The Vss in each CACHE bit will pull the corresponding Vinh bit to Vss. But the Vdd in each CACHE bit will retain the corresponding Vinh bit to Vinh voltage because SEGe=Vdd that forms a diode circuit to shut off the leakage in accordance with the circuit of FIG. 1A. Note, the 4 KB LSB data is latched in 4 KB CACHElsb in same polarity but Vdd digital bit data is replaced with HV analog bit data stored temporarily in 4 KB Even CACHElsb.

Step 446: This step is to transfer each DIOi bit of each 4 KB real CACHE that stores each of 4 KB Even LSB bit to each corresponding 4 KB SAs via NMOS transistor 15 (with a gate tied to LD) and NMOS transistor 20 (with a gate tied to signal WRT) as shown in FIG. 3 along with the following preferred biased conditions.

a) BIAS=0V,
        This condition is to isolate the signal of DIOi on the common node of PBL from each corresponding GBL.
    b) T3=0V is to disable one input of VRef to SA and equalization.
    c) T4=0V,
        This condition is to disconnect Qi node of SA from OUTP node of Multiplier so that each DIOi bit losing into each SA would not be affected by each Multiplier.
    d) T5=0V,
        This is to disable SA during DIOi loading.
    e) WRT=LD=H1 One-shot pulse.

Step 447: This step is to reset RDY=1 to inform Off-chip Flash Controller, HINAND2 status now is not busy and is free to take new command and operations because the common 64XTs+1SSLp+1GSLp bus lines, common 4 KB GBL bus lines and even 4 KB real CACHE registers are free and available to take any new data or concurrent operations.

Step 448: This step is to set each P/RB bit data in accordance with each corresponding LSB bit data stored in each SA with same bit polarity with the following preferred bias conditions:

a) INV=IDAB=IDB=0V,
    b) ENSB1=ENSB2
        These conditions are to ensure Qi and QiB nodes of each SA are connected to the gates of MN18 and MN17 of two pull-down legs of SA made INV1 and INV2 of each P/RB.
    c) PGM=0V
        This step is not in Program mode.
    d) WBK=IDC=one shot of Vdd
        These two signals are working as a complementary input gate signals to MN16 and MN19 respectively for this operation. If Qi=1 (LSB bit=1) and QiB=0, then Di=1 and DiB=0.
    e) T5=1
        This is to enable SA.

After this step, the final bit data stored in each P/RB bit is the duplication of each Even raw LSB bit with same polarity in both SA and P/RB.

Step 449: After loading Even LSB raw page data into SA and PR/B and CACHElsb, then the desired B'-bit adjustment starts. In order to do so, two lastly stored A-state MSB data in 4 KB Even CACHEint and B-state data stored in 4 KB Even CACHEcel have to be read back into 4 KB DB for 4 KB Even B'-bit logic adjustment in accordance with the table of B'-bit Adjustment in Even Page shown in FIG. 7G of the present invention.

This step is to read out the 4 KB Even A-state (Vtamin-read) page analog Vinh/Vss data stored in 4 KB Even CACHEint into 4 KB SA through an analog cell data sensing that suffers CS effect. Each final A-state bit data is fully amplified into a digital data with a same polarity stored in each corresponding SA. In other words, Each Qi=0/1 of its corresponding but data in each CACHEint=Vss/Vinh. The following are the preferred bias conditions:
 a) TIE1~TIEL/2=CSL=SEGe3 (CACHElsb)=0V (L=4),
 b) DIVen=SEGe2=SEGe4 (CACHEint and CACHEmsb)=0V,
 c) Voutp=Vref+/−ΔV,
 d) T5=one shot of Vdd,
  This is to do the second analog amplification for the first analog amplification done by each Multiplier.

After this step, 4 KB SA store 4 KB Even page data of E-state and B'-state cells under Vtamin condition in the selected WL. In other words, the 4 KB data in 4 KB SA are the 4 KB Even MSB page data that are stored in 4 KB Even CACHEint $C_{LBL}$ capacitors by Step 437 of this flow.

Step 450: This step is to write back 4 KB MSB Even page data at 4 KB SA to 4 KB Even CACHEmsb $C_{LBL}$ capacitors. The reason to do this step is to continue storing the 4 KB Even MSB data in 4 KB Even CACHEmsb for subsequent MLC iterative Program and Program-Verify operations. The 4 KB Even MSB page data stored in 4 KB CACHEint are corrupted after being readout to 4 KB SA due to the CS degradation effect between each LBL and each or up to J GBLs. This step is like Step 445, thus is omitted here for description simplicity. The biased conditions are summarized below.
 a) SEGe (CACHEcel and CACHEint)=0V
  Both above two CACHEs are not selected for storing 4 KB Even MSB data.
 b) SEGe (Even CACHEmsb)=Vdd
  Because 4 KB Even CACHEmsb are selected to store 4 KB MSB Even age data.
 c) SEGe (Even CACHElsb)=0V
  CACHElsb is not selected for storing 4 KB Even MSB data.
 d) TIE1~TIEL/2=SEGo=0V (L=4),
 e) DIVen=BIAS=WRT2=H1 on shot pulse.

The above conditions are to connect QiB node of each SA to each CACHEmsb $C_{LBL}$ capacitor with a full Vdd passage but a reversed bit polarity.

Step 451: This step is to do bit-flipping for each B'-bit adjustment for each Even LSB 4 Kb page data in 4 KB P/RB in accordance with the following bias conditions and Table in FIG. 7G:
 a) IDC=IDB=WBK=0V,
  IDC=0V is to turn off NMOS transistor 19, IDB=0 is to turn off NMOS transistor 8, WBK=0 is to turn off NMOS transistor 16. These combined efforts are to enable single current path from P/RB Di node to Vss via NMOS transistor 26 and NMOS transistor 27 only (see FIG. 3).
 b) ENSB1=ENSB2=IDAB=PGM=0V,
  To disconnect NMOS transistors 12 and 11 from SA's Qi and QiB outputs.
 c) INV=One shot of Vdd,
  This condition is to turn on NMOS transistor 26 to connect Di current path to Vss through NMOS transistor 27 gated by Qi of SA.
 d) T5=1 to enable SA.

As a result of this flipping step, B1'=B2'=0=Di, in each P/RB when Qi=1=MSB in each SA as indicated the flipping step of adjusting LSB of B1'=B2'=0 in the table of FIG. 7G.

Step 452: Like Step 449, this step continues to read out the 4 KB Even B-state (Vtbmin-Read) page analog Vinh/Vss data stored in 4 KB Even CACHEcel into 4 KB SA through an analog cell data sensing that suffers CS effect. Each final B-state bit data is fully amplified into a digital data with a same polarity stored in each corresponding SA. In other words, Each Qi=0/1 of its corresponding but data in each CACHEint=Vss/Vinh. The following are the preferred biased conditions.
 a) TIE1~TIEL/2=CSL=0V (L=4),
 b) SEGe3 (CACHElsb)=SEGe4 (CACHEmsb)=0V,
  to isolate above two CACHEs to 4 KB GBLs.
 c) DIVen=SEGe1 (CACHEcel)=H1,
  to connect 4 KB Even ACHEce1 to 4 KB GBLs.
 d) Voutp=Vref+/−ΔV,
 e) T5=one-shot pulse of Vss.

After this step, 4 KB SAs store 4 KB Even B-state page data of 8 KB cells under Vtbmin condition in the selected WL.

Step 453: This step is to use newly readout 4 KB Even B-state page data in 4 KB SAs to set last B2'-bit data with reversed bit polarity. For example, Di=0 in each P/RB bit is flipped to "1" if each corresponding Qi=1 in each SA bit in accordance with the following bias conditions:
 a) IDAB=IDB=INV=0V,
 b) ENSB1=ENSB2=WBK=PGM+0V,
 c) IDC=one Shot of Vdd and T5=1.

After this step, then the final LSB B'-adjustment bit data in P/RB is E=1, A=0, B1'=0, B2'=1, C=0, where "0" means program but "1" means Program-Inhibit.

Step 454: This is the self-timed step to precharge both 4 KB Even CACHEcel and 4 KB Even CACHEint to prepare for loading and latching 4 KB Even LSB page data after final B'-bit adjustment back to both 4 KB Even CACHEcel and 4 KB Even CACHEint concurrently for B' adjustment to clean up 4 KB P/RB for next 4 KB Odd LSB page of B' adjustment at 4 KB P/RB and 4 KB SA in accordance with the following conditions:
 a) CSL=DIVen=TIE1~TIEL/2=0V (L=4),
 b) PREo=SEGe=SEGo=0V,
 c) PREe=H1, LBLps=Vinh.

Step 455: This step is to do loading and latching of 4 KB Even LSB page data after final B'-bit adjustment from 4 KB P/RB to both 4 KB Even CACHEcel and 4 KB Even CACHEint in 1-cycle concurrently in accordance with the following bias conditions:
 a) SEGe1 (CACHEcel)=Vdd,
 b) SEGe2 (CACHEint)=Vdd,
 c) SEGe3 (CACHElsb)=0V,
 d) SEGe4 (CACHElsb)=0V,
 e) DIVen=BIAS=PGM=H1 one shot,
  Connect a path from each bit of P/RB to CACHEcel and CACHEint.

FIG. 7F is a flow chart showing a method for performing m-page MLC (LSB Odd page) Data Loading and B' Adjustment according to an embodiment of the present invention. This method follows Step 447 to sequentially load external one 4 KB raw LSB Odd page data into on-chip 4 KB real CACHE registers on byte-by-byte basis in accordance with the bias conditions shown below. Note, each raw LSB Odd page data is directly loaded into 4 KB real CACHE register from I/O directly.
 a) Y-pass=1=Vdd
 b) RD=LD=EQ=0V To isolate each real CACHE bit from each Multiplier, each SA, and each P/RB for safe loading in accordance with the circuit shown in FIG. 3.

Step 461: It is like Step 442. This decision step is to check if the last byte of each 4 KB Odd LSB page is loaded completely into 4 KB real CACHE. If No, then Step 461 is looped to wait for the completion. If Yes, then the flow moves to next two concurrent steps of either 462 or 463.

Step 463: It is like 443. Thus step is to inform an off-chip Flash Controller or Host, by setting a RDY signal to Vss, the on-chip 4 KB real CACHE register is temporarily full at this moment with the following preferred conditions to isolate 4 KB real CACHE from I/Os with details being omitted here.
 a) LAT=0V
 b) All Ypass=0V.

Step 462: it is like Step 444. Before loading and latching of 4 KB Odd LSB page data stored in 4 KB real CACHE into on-chip 4 KB pseudo CACHElsb first and then to 4 KB SAs second, this decision step checks to wait for the release of 4 KB metal2 GBL bus lines that might be currently occupied by one of concurrent m-page operation with the preferred biased conditions. If 4 KB GBL bus lines are temporarily not occupied at this moment, then the flow moves to Step 464.

This step is to load and latch 4 KB raw Odd LSB page data in 4 KB real CACHE to one designated 4 KB Odd pseudo CACHElsb that has been precharged with Vinh in previous Step 431 of this flow. The preferred bias conditions are summarized below with reference to HiNAND2 array in FIG. 1A.
 a) LAT=0V, SEGo1=0V in 4 KB CACHEcel, SEGo2=0V in 4 KB CACHEint, SEGo3=1=Vdd in 4 KB CACHElsb, SEGo4=0V in 4 KB CACHEmsb, SEGe1=SEGe2=SEGe3=SEGe4=0V,
  The above conditions are because only 4 KB Odd CACHElsb pseudo registers are selected to Ld/Lt 4 KB raw Odd LSB page data.
 b) CSL=TIE1=TIE2=0V,
  To prevent the Ld/Lt leakage from the selected 4 KB Odd CACHElsb to the paired Odd 4 KB CACHEmsb.
 c) DIVen=BIAS=LD=H1.

Note, the 4 KB Odd LSB data is latched in 4 KB Odd CACHElsb in same polarity but Vdd digital bit data is replaced with HV analog bit data stored temporarily in 4 KB Odd CACHElsb.

Step 465: It is like Step 446. This step is to transfer each DIOi bit of each 4 KB real CACHE that stores each of 4 KB Odd LSB bit to each corresponding 4 KB SAs with the following preferred bias conditions:
 a) BIAS=0V,
  This condition is to isolate the signal of DIOi on the common node of PRL from each corresponding GBL.
 b) T3=0V is to disable one input of Ref to SA and equalization.
 c) T4=0V,
 d) T5=0V.

Step 466: It is like Step 447. This step is to reset RDY=1 to inform Off-chip Flash Controller, HINAND2 array status now is temporarily not busy now and is free to take new command and operations as Step 446.

Step 467: It is like Step 448. This step is to set each P/RB bit data in accordance with each corresponding LSB bit data stored in each SA with same bit polarity with the same preferred bias conditions. Thus the details can refer to Step 448. After this step, the final bit data stored in each P/RB bit is the duplication of each Odd raw LSB bit with same polarity in both SA and P/RB.

Step 468: It is like Step 449. After loading Odd LSB raw page data into SA and PR/B and CACHElsb, then the desired B'-bit adjustment will be started. The details can refer to Step 449. After this step, 4 KB SA store 4 KB Odd page data of E-state and B'-state cells under Vtamin condition in the selected WL.

Step 469: It is like Step 450. This step is to write back 4 KB MSB Odd page data at 4 KB SA to 4 KB Odd CACHEmsb $C_{LBL}$ capacitors. The details can refer to Step 450.

The above conditions are to connect QiB node of each SA to each Odd CACHEmsb $C_{LBL}$ capacitor with a full Vdd passage but a reversed bit polarity.

Step 471: It is like Step 451. This step is to do bit-flipping for each B'-bit adjustment for each Odd LSB 4 KB page data in 4 KB P/RB in accordance with what are displayed in Table of FIG. 7G. The details can refer to Step 451.

Step 472: it is like Step 452. As Step 449, this step continues to read out the 4 KB odd B-state (Vtbmin-Read) page analog Vinh/Vss data stored in 4 KB Odd CACHEcel into 4 KB SA through an analog cell data sensing that suffers CS effect. Each final B-state bit data is fully amplified into a digital data with a same polarity stored in each corresponding SA. The details can refer to Step 452 and are omitted here. After this step, 4 KB SAs store 4 KB Odd B-state page data of 8 KB cells under Vtbmin condition in the selected WL.

Step 473: It is like Step 453. This step is to use newly readout 4 KB Odd B-state page data in 4 KB SAs to set last B2'-bit data with reversed bit polarity. The details can refer to Step 453. After this step, then the final Odd LSB B'-adjustment bit data in P/RB is E=1, A=0, B1'=0, B2'=1, C=0, where "0" means Program but "1" means Program-Inhibit.

Step 474: It is like Step 454. This is the self-timed step to precharge both 8 KB CACHEcel and CACHEint to prepare for loading and latching 4 KB Odd LSB page data after final B'-bit adjustment back to both 4 KB Odd CACHEcel and 4 KB Odd CACHEint concurrently for B' adjustment to clean up 4 KB P/RB for next operation. The details can refer to Step 454.

Step 475: It is like Step 455. This step is to do loading and latching of 4 KB Odd LSB page data after final B'-bit adjustment from 4 KB P/RB to both 4 KB Odd CACHEcel and 4 KB Odd CACHEint in 1-cycle. The details can refer to Step 455.

Step 477: This is the decision step to check if last LSB page is programmed. If yes, then moves to Step 479 to receive the Program confirmation code and then moves to Step 480. If No, then flow moves to Step 478.

Step 478: Host can issue a new command, a next LSB page address, and data into 4 KB real CACHE for next B'-bit adjustment.

Step 480: It is like Step 434 but with different higher voltages of Vpgm and Vpass. This is a self-timed step is to set up (or charge up) several preferred voltages of each iterative Program operation for m randomly selected sets of 64WLs+1SSL+1GSL lines like Step 434. The desired WL voltages are summarized below:

a) One selected WL=Vpgm (15V to 25V)
   An ISSP scheme will be used with 0.2V-0.4V per ΔVpgm starting from 15V.
b) 63 unselected WL=Vpass (8-10V)
   Vpass has to be high enough to turn on 63 unselected WLs' cells even store highest C-state cells.
c) SSL=H1≥Vin+Vt
d) GSL=0V to prevent Program-inhibit Vinh leakage in CACHEcel through NAND string.

The voltage setup of each set of 64WLs+1SSL+1GSL needs to set up the desired voltages of each set of 64XTs+1SSLp+1GSLp lines first with the same voltages but also set HXD≥Vpgm+Vt to make 64WLs+1SSL+1GSL=64XTs+1SSLp+1GSLp correspondingly.

Since the WL Vpgm voltage of LSB Program operation is higher than the Vread of B'-adjustment, the Vpgm Detector is used to replace Vread Detector for MLC (MSB or LSB) or SLC Program operation. Except voltage difference, other steps of WL setup are similar. Thus, the details of Program WL setup can refer to Step 434.

Step 481: This is the self-timed step to latch the pre-charged 64WLs+1SSL+1GSL in their respective Poly parasitic capacitors. This is done automatically by using Vpgm Detector at one end of a dummy WL as explained previously. Once Vpgm is detected, then the Program operation is started and self-timed Program period is counted. The program time is also controlled by LBLPs Detector as explained previously. The flow then moves to Step 482.

Step 482: The HiNAND2 array also uses FN-tunneling scheme for m-page Program operation. It is preferred to have an All-BL Program, i.e., 8 KB NAND cells in one physical WL are selected for concurrent Program operations. For each ISSP, each iterative program time is about 10-20 μs. The program time is controlled by another self-timed control circuit, which can be made in varied ways.

Step 483: This step is to discharge HV on all selected sets of 64WLs+1SSL+1GSL to Vss by setting 64XTs+1SSLp+1GSLp lines to Vss and set HXD node to Vdd in accordance with the following preferred bias conditions.
a) CLA=CLR=ENS=0B,
b) ENB=1=Vdd,
c) SSLp=GSLp=XT1~XT64=0V,
d) CLWL=One-shot pulse of Vdd.

Next the flow moves to Step 496, which is a first step that is similar to the Vinh precharge step for next Block A-state PGM-VFY operation shown in FIG. 7H with explanations to be seen below.

FIG. 7G is a Table listing operation conditions for B'-adjustment in Even Page according to an embodiment of the present invention. The table shows the detailed operation sequences of bit flipping sub-steps during this preferred B'-bit adjustment of 4 KB Even LSB Page data. The same Table of operation conditions can also be used as a guideline for B'-bit adjustment of 4 KB Odd LSB Page data.

As seen in FIG. 7G, the bit-flipping of LSB B'-adjustment is preferably performed between the 4 KB SAs and the corresponding 4 KB P/RBs with same or different sizes in accordance with the circuit of FIG. 3. But in certain embodiments of the present invention, same size of 4 KB is used for both SAs and P/RBs for simpler illustration purpose without any limiting of the scope of claims herein. The following terminology explanations are used in the Table shown in FIG. 7G.

I. @SA: At each SA.
   It indicates what is each MLC cell's interim and final LSB logic data for respective states of E, A, B1', B2' and C stored at each SA.
II. @P/RB: At each P/RB.
   It indicates what is each MLC cell's interim and final LSB logic data for respective states of E, A, B1', B2' and C stored at each P/RB.
III. "X": It means "Don't-care" initial state that can store either "1" or "0".
IV. The Vt distribution of four final states of E, A, B and C or 5 interim states of E, A, B1', B2' and C are defined in FIG. 4.
V. Multiplier, SA and P/RB circuits are shown in FIG. 3.
VI. The HiNAND2 array circuit is FIG. 1A.
VII. Odd LSB and Even LSB share the same B'-adjustment scheme.
VIII. The 4 KB raw LSB page data loaded from I/Os is stored in 4 KB P/RB initially with Bit assignment before B'-adjustment as shown below.
   E=1, A=0, B1'=1, B2'=1, and C=0 IX. 4 KB MSB data of E=0, A=0, B1'=1, B2'=1, and C=1 under the Read condition of Vtbmin=Selected WL.
X. Later, 4 KB MSB data is logically reversed in SA's Qi and QiB outputs so that E=1, A=1, B1'=0, B2'=0, and C=0. This step is to selectively flip B1'=B2'=1 in each P/RB to B1'=B2'=0 when SA's Qi=0.

Load LSB state from I/O to CR (Step 441): This is a first step to sequentially load 4 KB Even LSB raw page data in 4K cycles from 8 I/Os to on-chip 4 KB real CACHE. The SA and P/RB are not loaded yet, thus data stored in both SA and P/RB are at X-state.

Load and latch LSB state from CR to CACHElsb (Step 445): This is a second step to load in parallel in 1-cycle from 4 KB real CACHE to on-chip 4 KB pseudo Even CACHElsb $C_{LBL}$ capacitors with same polarity. Later, the same 4 KB Even raw LSB page data is loaded in parallel in 1-cycle from 4 KB P/RB into 4 KB SAs with same polarity. Thus, @SA=10110=E,A,B1',B2',C. At this step, 4 KB P/RB is not loaded yet. As a result, @P/RB=X.

Load LSB state from CR to P/RB via SA (Steps: 446~448): This is a step to copy 4 KB SAs' data into 4 KB P/RB directly with same polarity. As a result, @4 KB SA=@4 KB P/RB=10110=E,A,B1',B2', C.

Read MSB state from cell into 4 KB SAs (Steps: 434~435 & 449): This step is like a MSB Read with the selected WL=Vtb'min. As a result, @4 KB SA=00111=E,A,B1',B2', C, because Vtb'min>Vtamax; but @4 KB P/RB=10110=E, A,B1',B2',C because not affected by MSB Read.

Ld/Lt LSB MSB from SA to CACHEmsb (Step: 450): This step loads and latches Even 4 KB MSB page data back to 4 KB Even CACHEmsb with same polarity but not affect 4 KB P/RB. As a result, @SA=00111=E,A,B1',B2',C, but @4 KB P/RB=10110=E,A,B1',B2',C.

Adjust LSB of B1'/B2' to 0 (Step 451): This step starts adjusting B1' and B2' bit data in accordance with the 4 Vt assignment in FIG. 4 and SA and P/RB circuits shown in FIG. 3 with MSB data stored in SA and LSB raw data stored in P/RB. As a result, after the bit flipping logic operation, the P/RB bit data are changed to a new value of @4 KB P/RB=10000=E,A,B1',B2',C.

Final LSB adjusted data Ld/Lt to CACHEcel and CACHEint (Steps: 452~455): Finally, the desired 4 KB Even LSB B'-adjustment page data of @4 KB P/RB=10010=E,A,B1',B2',C to replace the @P/RB=10110=E,A,B1',B2',C of 4 KB raw LSB Even data is obtained. Note, the steps of 4 KB Odd LSB B'-adjustment page data are identical to 4 KB Even B'-adjustment steps and are omitted hereby for description simplicity.

Now, the following figures of FIGS. 7H, 7I, 7J, 7K, 7L, and 7M are three Program-Verify (PGM-VFY) flows such as A-state PGM-VFY, B-state PGM-VFY and C-state PGM-VFY. All three PGM-VFY flows are performed only after the completions of m pages of 8 KB MLC LSB page Program at Step 483 and m pages of 8 KB MLC MSB page program at Step 371 previously.

Three PGM-VFY operations are preferably performed in an order, starting from the lowest Vt of A-state, then next B-state, and lastly C-state to save power consumption and to reduce the PGM-VFY overall latency. Due to the preferred size reduction of 4 KB GBLs, 4 KB DB and 4 KB real CACHE, the double size of 8 KB LBLs or 8 KB cells in one physical WL, each full-page PGM-VFY step of A, B, and C states is divided into 2 half-pages of 4 KB Even ½-page and 4 KB Odd PGM-VFY ½-page.

Figure 7H:
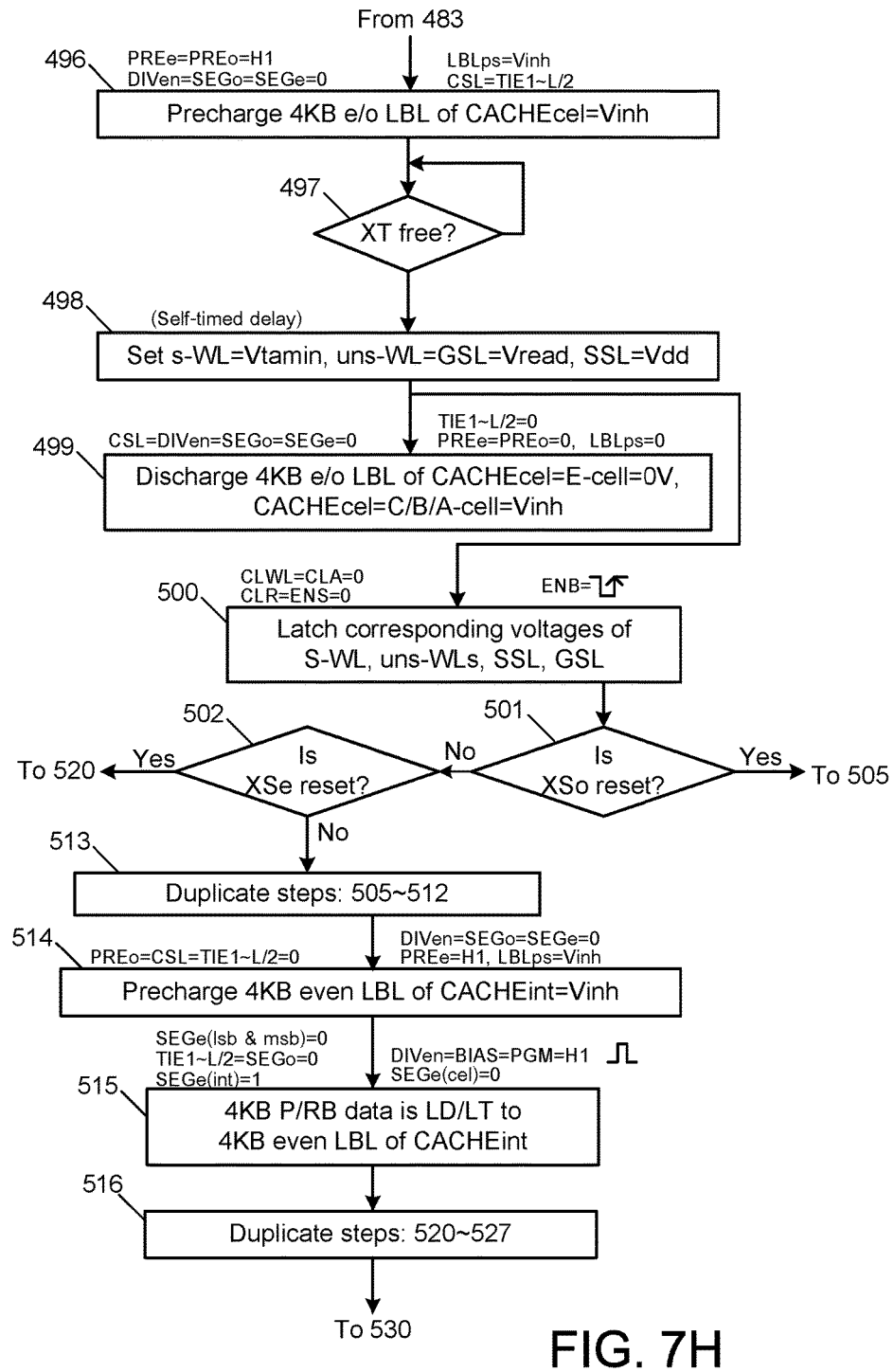
Figure 71:
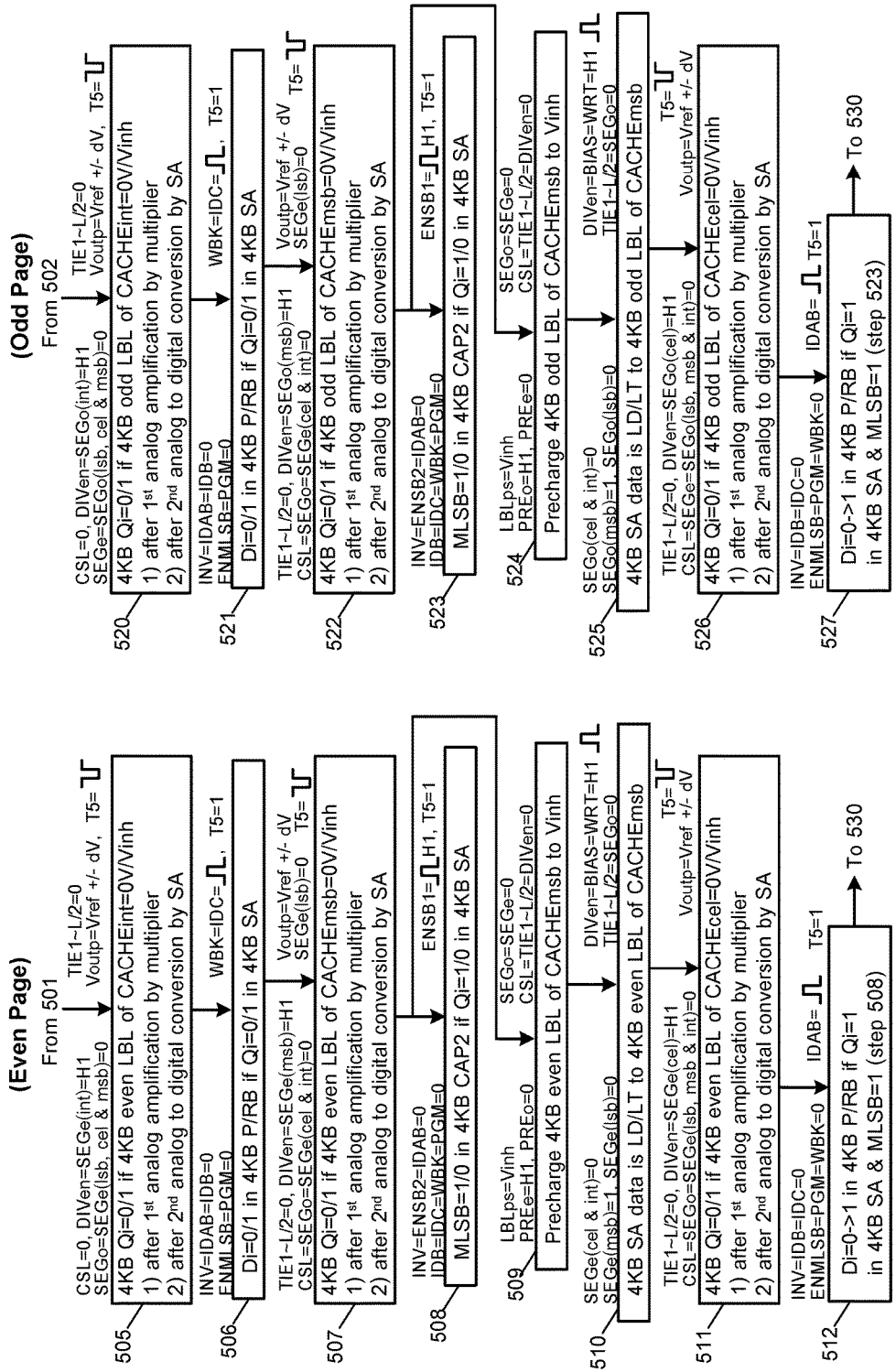

FIG. 7H is a flow chart showing a method for performing m-page MLC (LSB page) A-state Program-Verify operation according to an embodiment of the present invention. The method includes sequential and looped steps from Step 496 to Step 516.

Step 496: Concurrent 8 KB LBL Vinh precharging. This step continues from Step 483 and is a self-timed step used to perform 1-cycle 8 KB concurrent LBL Vinh precharging on both 4 KB Even and 4 KB Odd $C_{LBL}$ capacitors in one selected CACHEcel. The self-timed control is achieved by a LBLps Differential Amplifier (DA) shown in FIG. 9C with detailed explanation in later sections of the specification.

As seen in the HiNAND2 array FIG. 1A, each Segment has incorporated with one LBLps-DA, which is preferably enabled by Segment Flag latch when it is selected for precharging so that the LBLps-DA power consumption can be cut off when it is not selected. During the precharging period, each LBLps power line would be charged up from Vss to Vinh by a Vinh-Driver (not shown). One end of LBLps line is connected to one input of LBLps-DA. Another input of LBLps-DA is connected to at least one reference Vref such as Vinh in each LBLps precharging cycle and 1.0V in each LBLps discharging cycle.

The LBLps precharge cycle is initiated automatically by a preferred Vread-DA, which detects a voltage of a Dummy Vread-WL as shown in FIG. 9B. During LBLo[N] and LBLe[N] precharging step, Vread-DA's anode node of Vref=Vread. When each selected LBLps voltage reaching Vinh, then the EN output of Vread-DA switches from Vss to Vdd to lower voltage of PREe and PREo=1V+Vt≈1.6V from a voltage≥Vinh+Vt during the precharging cycle. The Vinh voltage at each precharging LBLps line of the selected Segment would be retained as the initial HV for next LBLps discharging cycle to save power consumption. The precharging time is around 1-2 μs, depending on total 8 KB or 4 KB $C_{LBL}$ capacitance (C) and the resistance (R) of each MLBLse or MLBLso and strength of LBLps Driver. The preferred bias conditions are summarized below:
  a) PREe1=PREo1=H1 and LBLps1=Vinh for precharging both 4 KB Even CACHEcel and 4 KB Odd $C_{LBL}$ capacitors in 1-cycle.
  b) TIE1=0V to prevent leakage from CACHEcel to other CACHEint.
  c) DIVen=SEGo1=SEGe1=0V for preventing the leakage of 4 KB CLBL1o and 4 KB CLBL1e capacitors in CACHEcel to the common 4 KB GBLs,
  d) TIEL/2=CSL=0V (L=4) because no use.

Step 497: XT bus checking. This decision step checks if the common bus lines of 64XTs+1SSLp+1GSLp are occupied by other existing concurrent operations after Vinh-precharging step. If No, then the flow is looped to wait until XT bus lines are free and available. If Yes, then the flow moves to Step 498 to charge m selected sets of 64WLs+1SSL+1GSL poly lines.

Step 498: Self-timed Charging & Latching of 64WLs+1SSL+1GSL with Selected WL=Vtamin condition. For performing this preferred m-page MLC (LSB page) A-state Program-Verify operation, the m selected 64WLs+1SSL+1GSL poly lines have to be charged with the predetermined voltages. As explained before, the desired voltages of each set of 64WLs+1SSL+1GSL are coupled from one common set of 64XTs+1SSLp+1GSLp with the similarly desired voltages as indicated in the Table 4 below.

TABLE 4 one set of 64WLs + 1SSL + 1GSL voltages for m-page concurrent MLC (LSB) A-state PGM-VFY setting (HXD = Vread + Vt) and latching (HXD = 0 V)

| | |
|---|---|
| 1 WL(sel) = Vtamin | 1 XT(sel) = Vtamin |
| 63 WLs(un-sel) = Vread | 63 XTs(un-sel) = Vread |
| 1 SSL = Vdd | 1 SSLp = Vdd |
| 1 GSL = Vread | 1 GSLp = Vread |
| HXD with matched Pi, Qj, Sk to enable local pump and latch | Vread + Vt when setting but Vss when latching |

Again, this is another self-timed WL Vread charging step and is controlled by one Vread-DA, which is preferably to be independent from the Vpgm-DA and LBLps-DA because M-page Program and Program-Verify operations in different Segments of HiNAND2 array can happen at the same time. As a consequence, Vread-DA and Vpgm-DA are preferred not to be combined into one DA. The Vread-DA circuit shown in FIG. 9B is similar to Vpgm-DA with only one difference in Vref voltage only. During this PGM-VFY step, one reference input of this Vread DA is connect to Vread but when the same circuit is also used for Vread discharging detecting, then Vref switches from Vread to 1.0V.

Note, the dummy WL of Vread discharging does not need to set to Vss because for a normal DA operation at 1.8V Vdd, 1.0V still keeps the DA in proper operation. Vss=0V would disable the DA and cannot be used. But detecting the $C_{LBL}$ capacitor discharging from Vinh (≥7V) to 1V, the whole discharging time has realized about 90% journey. Thus the ΔV=6V has generated a big margin for Multiplier operation. In other words, at 1V detected for $C_{LBL}$ voltage, the final voltage of $C_{LBL}$ would be smaller than 1V for E-cells and retained at Vinh for A-cells, B-cells, and C-cells.

Step 499: Self-timed $C_{LBL}$ Vinh discharging or retaining step. Like Step 435, this is a self-timed operation to perform LBL Vinh discharging and retaining by setting Vtamin for each selected WL in accordance with the stored states of m 8 KB MLC cells in m 8 KB selected CACHEcel. Again, this is like ABL (All-BL) Program-Verify scheme for both 4 KB Even and 4 KB Odd LSB page per one 8 KB physical MLC-WL.

The final value of each LSB $C_{LBL}$ bit voltage is determined by each MLC cell's state in each corresponding CACHEcel. If each MLC cell is in E-state, then each corresponding LSB $C_{LBL}$'s Vinh voltage will be discharged to Vss, otherwise each $C_{LBL}$ voltage would retain its initial precharged Vinh voltage with E-cell=0V in CACHEcel because Vtamin>Vtemax≥−0.5V and TIE1=0V, and A-cell=B-cell=C-cell=Vinh in CACHEcel because Vtamin<Vta<Vtb<Vtc. The preferred bias conditions are listed below:

a) CSL=PREe1=PREo1=LBLps1=0V
   All 4 KB PREe1=4 KB REPe2=4 KB PREo1=4 KB PREo2=Vss. This is to prevent $C_{LBL}$ leakage of both 4 KB Even and 4 KB Odd CACHEcel to one common LBLps1 line.
b) SEGo1=SEGe1=0V
   This is to prevent metal1 $C_{LBL}$ leakage of both CACHEcel to the common metal2 4 KB GBLs
c) DIVen=CSL=0V,
d) TIE1=0V
   E-cells in CACHEcel only would discharge Vinh below 1.0V or Vss but other cells would retain Vinh. Note, the $C_{LBL}$ discharge is automatically detected by LBLps-DA with its Vref=1.0V.

Step 500A: As explained above, the voltages of each set of 64WLs+1SSL+1GSL are preferably latched on respective WL poly parasitic capacitors simultaneously when the corresponding 8 KB $C_{LBL}$ are performing discharging and retaining step of 499. The reason for keeping the voltages for each set of 64WLs+1SSL+1GSL is to save power for next B-state or C-state Program-Verify operations performed on the same set of 64WLs+1SSL+1GSL without recharging again. As explained above, the bias conditions of WL latching are summarized below in accordance with Segment circuit shown in FIG. 2A.
a) CLWL=CLA=0,
b) CLR=ENS=0,
c) ENB=One-shot pulse of Vss.

Step 501: This decision step checks if the selected Odd Segment's flag latch is reset in last iterative PGM-VFY step. If Yes, then the flow moves to Step 505 in FIG. 7I to perform Even Page PGm-VFY. If No, then the flow moves to Step 502 to check if Even Segment's flag latch is reset in last iterative PGM-VFY step. If Yes, then the flow moves to Step 520 to do Odd-page PGM-VFY in FIG. 7I. If No, then flow moves to Step 513 to perform next B-state PGM-VFY in FIG. 7J below. The reason to check Segment latch is to save PGM-VFY steps. The details would be explained below.

Step 513: This step includes 8 steps of LSB Even page of A-state PGM-VFY operations as shown in FIG. 7I below. After this step, the following data are stored in respective circuits:
a) 4 KB Even A-state LSB page data are stored in 4 KB P/RB,
b) 4 KB Even MSB page data are stored in 4 KB CAP2,
c) 4 KB Even C-state LSB page data are stored in 4 KB SA,
d) 4 KB Even MSB page data are loaded and latched back to 4 KB Even CACHEmsb.

Step 514: This is a self-timed Vinh precharge operation on 4 KB Even CACHEint step with the following bias conditions:
a) PREe2=H1 and LBLps=Vinh,
b) PREo2=CSL=TIE1~TIEL/2=0V (L=4),
c) DIVen=SEGo2=SEGe2=0V,
d) Others=0V.

Step 515: This is a step to load and latch 4 KB P/RB's updated LSB A-state PGM-VFY page data to 4 KB Even CACHEint with the following bias conditions:
a) SEGe3=SEGe4=0V (For CACHElsb and CACHEmsb)
b) TIE1~TIEL/2=SEGo=0V (L=4),
c) SEGe2=Vdd=1,
d) SEGe1=0V (for CACHEcel),
e) DIVen=BIAS=PGM=H1.

After this step, 4 KB Even LSB A-state PGM-VFY operation is completed, then next the flow moves to Step 516 to repeat the same steps for 4 KB Odd LSB A-state PGM-VFY step that comprises sub-steps from 520 to 527 with details shown in FIG. 7I below. When 4 KB LSB Odd page of PGM-VFY operation is completed, then the flow moves to Step 530.

FIG. 7I is a flow chart showing a method for performing m-page MLC (LSB page) A-state Program-Verify (PGM-VFY) operation according to an embodiment of the present invention. This flow is divided into two sub-flows: I) 4 KB Even LSB Page A-state PGM-VFY flow from Step 505 to Step 512 and II) 4 KB Odd LSB Page A-state PGM-VFY flow from Step 520 to Step 527.

Step 505: This step is to sense and amplify the last (old) iterative 4 KB A-state analog Even page data under Vtamin condition stored in Even CACHEint to 4 KB SA via 4 KB metal2 GBLs as explained before with the following conditions:
a) DIVen=SEGe2=H1 (in CACHEint),
b) SEGe1=SEGe3=SEGe4=0V (in CACHElsb, CACHEmsb, and CACHEcel),
c) CSL=0V,
d) TIE1~TIEL/2=SEGo=0V (L=4),
e) SEGo2=0V (for CACHEcel),
f) DIVen=BIAS=PGM=H1.

Step 506: This step is to transfer the 4 KB SA Even LSB A-state PGM-VFY data to 4 KB P/RB with same polarity with the following conditions:
a) INV=IDB=IDAB=0V,
b) ENMLSB=PGM=0V,
c) IDC=WBK=One-shot pulse of Vdd,
d) T5=1.

Step 507: This step is to sense and amplify the stored 4 KB MSB analog page data in Even CACHEmsb to 4 KB SA via 4 KB metal2 GBLs as explained before with the following conditions:
a) TIE1~TIEL/2=0V (L=4),
b) DIVen=SEGe4=H1 (in CACHEmsb),
c) SEGe1=SEGe2=SEGe3=0V (in CACHEcel, CACHEint, and CACHElsb),
d) CSL=0V,
e) SEGo4=0V,
f) T5=1, Voutp=Vref+/−AV.

Step 508: This step is to transfer the 4 KB SA Even LSB B-state MSB data to 4 KB CAP2 with same polarity. The values of 4 KB MLSB=1/0 in 4 KB CAP2 if Qi=1/0 in 4 KB SAs. The preferred bias conditions are listed below:
a) INV=ENSB2=0V,
b) IDAB=0V,
c) PGM=IDB=IDC=WBK=0V,
d) ENSB1=One shot H1,
   This condition connects and latches SA's Qi to CAP2 (see FIG. 3) when the NMOS transistor 12 is fully turned on by ENSB1=H1. MSB bit data is stored in CAP2 temporarily.
e) T5=1.

Step 509: It is like Step 514. This is a similar self-timed Vinh precharge operation on 4 KB Even CACHEmsb step with the following bias conditions:
a) PREe4=H1 and LBLps4=Vinh
b) PREe1=PREe2=PREe3=CSL=TIE1~TIEL/2=0V (L=4),
c) DIVen=SEGo=SEGe=0V.

Step 510: This is a step to load and latch 4 KB P/RB's LSB B-state (MSB data) PGM-VFY page data to 4 KB Even CACHEmsb with the following bias conditions:
a) SEGe1=SEGe2=SEGe3=0V (For CACHElsb, CACHEcel, CACHEint)
b) TIE1~TIEL/2=SEGo=0V (L=4), c) SEGe4=Vdd=1,
d) DIVen=BIAS=WRT=One-shot of H1.

Step 511: This step is to sense and amplify the updated (new) iterative 4 KB A-state Even analog page data under Vtamin condition in Even CACHEcel to 4 KB SA via 4 KB metal2 GBLs as explained before with the following conditions:
  a) SEGe2=SEGe3=SEGe4=0V (in CACHEint, CACHElsb, and CACHEmsb),
  b) CSL=0V,
  c) TIE1~TIEL/2=SEGo=0V (L=4),
  d) SEGo1=0V (for CACHEcel),
  e) DIVen=SEGe1=H1 (CACHEcel).

Step 512: This step is to do A-state bit flipping for 4 KB Even LSB iterative A-state PGM-VFY operation in accordance with 4 KB last (old) Even A-state page data in 4 KB P/RB, 4 KB Even MSB page data temporarily stored in 4 KB CAP2, and updated (new) 4 KB Even A-state page data stored in 4 KB SAs. As a results, each P/RB Di=0 will be flipped to "1" when SA Qi=1 and CAP2=1=MLSB as performed in Step 508. The preferred bias conditions are listed below:
  a) INV=IDB=IDC=0V,
  b) ENMLSB=PGM=WBK=0V,
  c) IDAB=One shot Vdd,
  d) T5=1.

After this step, a 4 KB Even LSB page of A-state iterative PGM-VFY operation is completed and the flow moves to 530.

Step 520 to Step 527: Another sub-flow of 4 KB Odd LSB Page A-state PGM-VFY operation. Basically, these steps similar to those Steps 505-512 for 4 KB Even LSB A-state iterative PGM-VFY flow. Thus the details are identical and omitted hereby for the description simplicity for those are skilled in the art.

Figure 7J:
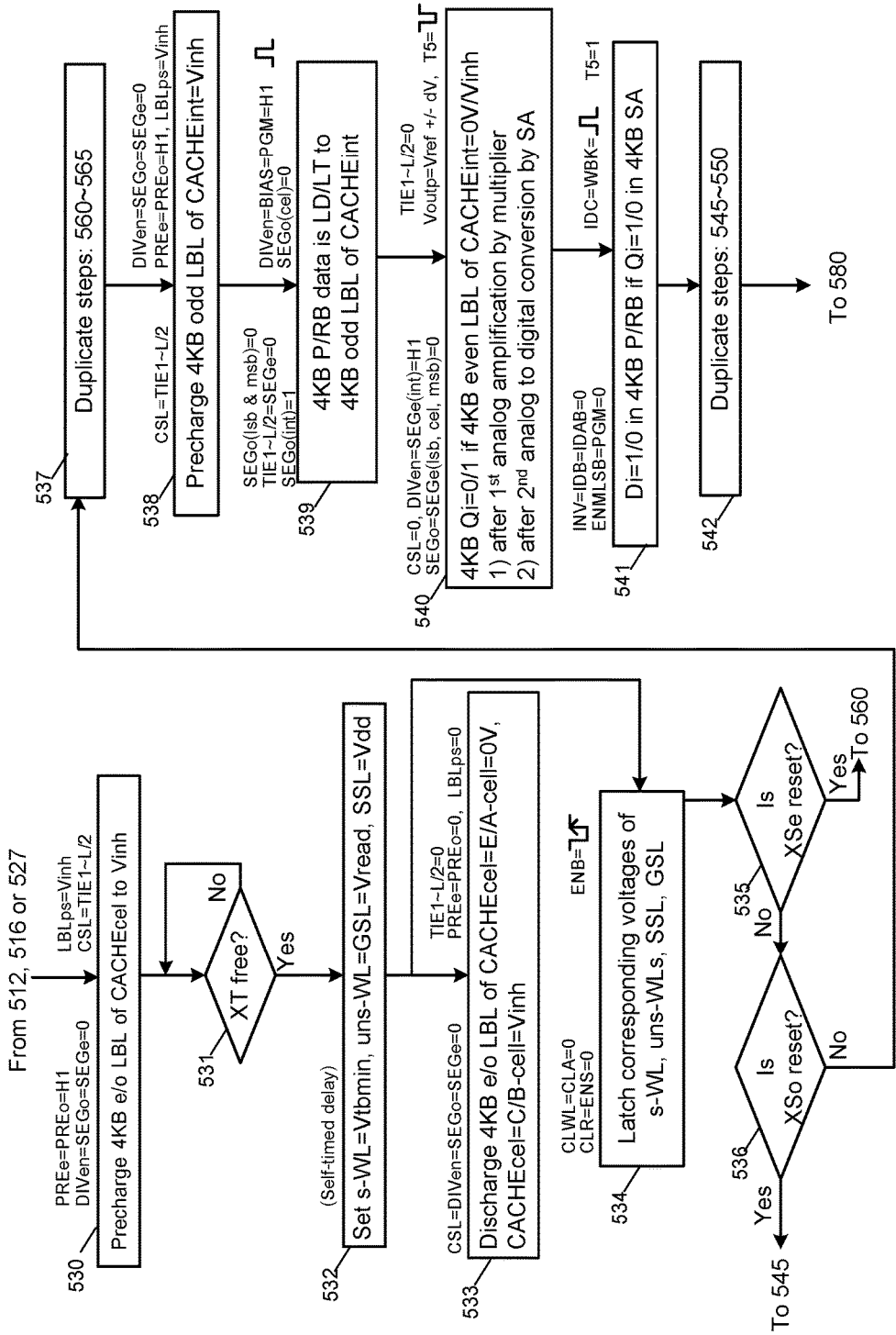

FIG. 7J is a flow chart showing a method for performing m-page MLC (LSB page) B-state Program-Verify operation according to an embodiment of the present invention. The method includes several steps from Step 530 to Step 542.

Step 530: Concurrent 8 KB LBL Vinh precharging. This step is like Step 496 a Self-timed step for performing 1-cycle 8 KB concurrent LBL Vinh precharge on both 4 KB Even and 4 KB Odd $C_{LBL}$ capacitors in one selected CACHEcel with identical bias condition repeated below:
  a) PREe1=PREo1=H1 and LBLps1=Vinh for precharging both 4 KB Even CACHEcel and 4 KB Odd $C_{LBL}$ capacitors in 1-cycle,
  b) TIE1=0V to prevent leakage from CACHEcel to other CACHEint,
  c) DIVen=SEGo1=SEGe1=0V for preventing the leakage of 4 KB $C_{LBL}$1e and 4 KB $C_{LBL}$1e capacitors in CACHEcel to the common 4 KB GBLs,
  d) TIEL/2=CSL=0V (L=4) because no use.

Step 531: XT bus checking. This decision step is like Step 497 to check if the common bus lines of 64XTs+1SSLp+1GSLp are occupied by other existing concurrent operations after Vinh-precharging step. If No, then the flow is looped to wait until XT bus lines are free and available. If Yes, then the flow moves to Step 532 to charge m selected sets of 64WLs+1SSL+1GSL poly lines.

Step 532: Self-timed Charging & Latching of 64WLs+1SSL+1GSL with selected WL=Vtamin condition. This step is like Step 498, a self-timed WL Vread charging step and is controlled by the same Vread-DA used for Step 498. The only difference between Step 532 and Step 498 is that the selected WL voltage is changed from Vtamin to Vtbmin. The rest of voltages of other poly lines are kept unchanged as shown below in Table 5.

Table 5: one set of 64WLs+1SSL+1GSL voltages for m-page concurrent MLC (LSB) B-state PGM-VFY setting (HXD=Vread+Vt) and latching (HXD=0V)

TABLE 5

| one set of 64 WLs + 1SSL + 1GSL voltages for m-page concurrent MLC (LSB) B-state PGM-VFY setting (HXD = Vread + Vt) and latching (HXD = 0V) | |
|---|---|
| 1 WL (sel) =Vtbmin | 1 XT (sel) = Vtbmin |
| 63 WLs (un-sel) = Vread | 63 XTs (un-sel) = Vread |
| 1 SSL = Vdd | 1 SSLp = Vdd |
| 1 GSL = Vread | 1 GSLp = Vread |
| HXD with matched Pi, Qj, Sk to enable local pump and latch | Vread + Vt when setting but Vss when latching |

Step 533: Self-timed $C_{LBL}$ Vinh discharging or retaining step. Like Step 499, this is a self-timed operation to perform $C_{LBL}$ Vinh discharging and retaining by setting Vtbmin for each selected WL in accordance with the stored states of m 8 KB MLC cells in m 8 KB selected CACHEcel. Again, this is like ABL (All-BL) Program-Verify scheme for both 4 KB Even and 4 KB Odd LSB page per one 8 KB physical MLC-WL. The final value of each LSB $C_{LBL}$ bit voltage under Vtbmin for selected WL is determined by each MLC cell's state in each corresponding CACHEcel. If each MLC cell is in E-state, then each corresponding LSB $C_{LBL}$'s Vinh voltage will be discharged to Vss, otherwise each $C_{LBL}$ voltage would retain its initial Vinh value with following conditions: 1) E-cell=A-cell=0V in CACHEcel, because Vtbmin>Vtamax>Vtemax≥−0.5V and TIE1=0V; 2) B-cell=C-cell=Vinh in CACHEcel, because Vtemax<Vtamax<Vtbmin<Vtbmin. The preferred bias conditions are identical to Step 499 as repeated below.
  a) CSL=PREe1=PREo1=LBLps1=0V
    It means all 4 KB PREe1=4 KB REPe2=4 KB PREo1=4 KB PREo2=Vss. This is to prevent $C_{LBL}$ leakage of both 4 KB Even and 4 KB Odd CACHEcel to one common LBLps1 line.
  b) SEGo1=SEGe1=0V
    This is to prevent metal1 $C_{LBL}$ leakage of both CACHEcel to the common 4 KB metal2 GBLs.
  c) DIVen=CSL=0V,
  d) TIE1=0V
    E-cells in CACHEcel only would discharge Vinh below 1.0V or Vss but other cells would retain Vinh. Note, the $C_{LBL}$ discharge is automatically detected by a LBLps-DA with its Vref=1.0V.

Step 534: Like Step 500A, the voltages of each set of 64WLs+1SSL+1GSL are preferably latched on respective WL parasitic poly line capacitors simultaneously when the corresponding 8 KB $C_{LBL}$ capacitors perform discharging and retaining step of 533.

As explained above, the bias conditions of WL latching are summarized below as Step 500A in accordance with Segment circuit shown in FIG. 2A.
  a) CLWL=CLA=0,
  b) CLR=ENS=0,
  c) ENB=One shot of Vss.

Step 535: Is Xso reset? This decision step checks if the selected Odd Segment's flag latch is reset in last iterative PGM-VFY step. If yes, then the flow moves to Step 560 in FIG. 7K below to perform 4 KB Odd Page PGM-VFY operation. If No, then the flow moves to Step 536 to check if Even Segment's flag latch is reset in last iterative PGM-VFY step. If yes, then the flow moves to Step 543 to do Even-page PGM-VFY operation in FIG. 7K. If No, then flow moves to Step 573.

The reason to in Step 560 to perform Odd, rather than Even page PGM-VFY step is to save steps. For example, if the last iterative PGM-VFY step is to perform on Even page first and Odd page later, then for next iterative PGM-VFY step, it is preferably to start Odd page first and then Even page. In this manner, then the steps of page data transferring between pseudo CACHE, SA and P/RB can be reduced.

Figure 7K:
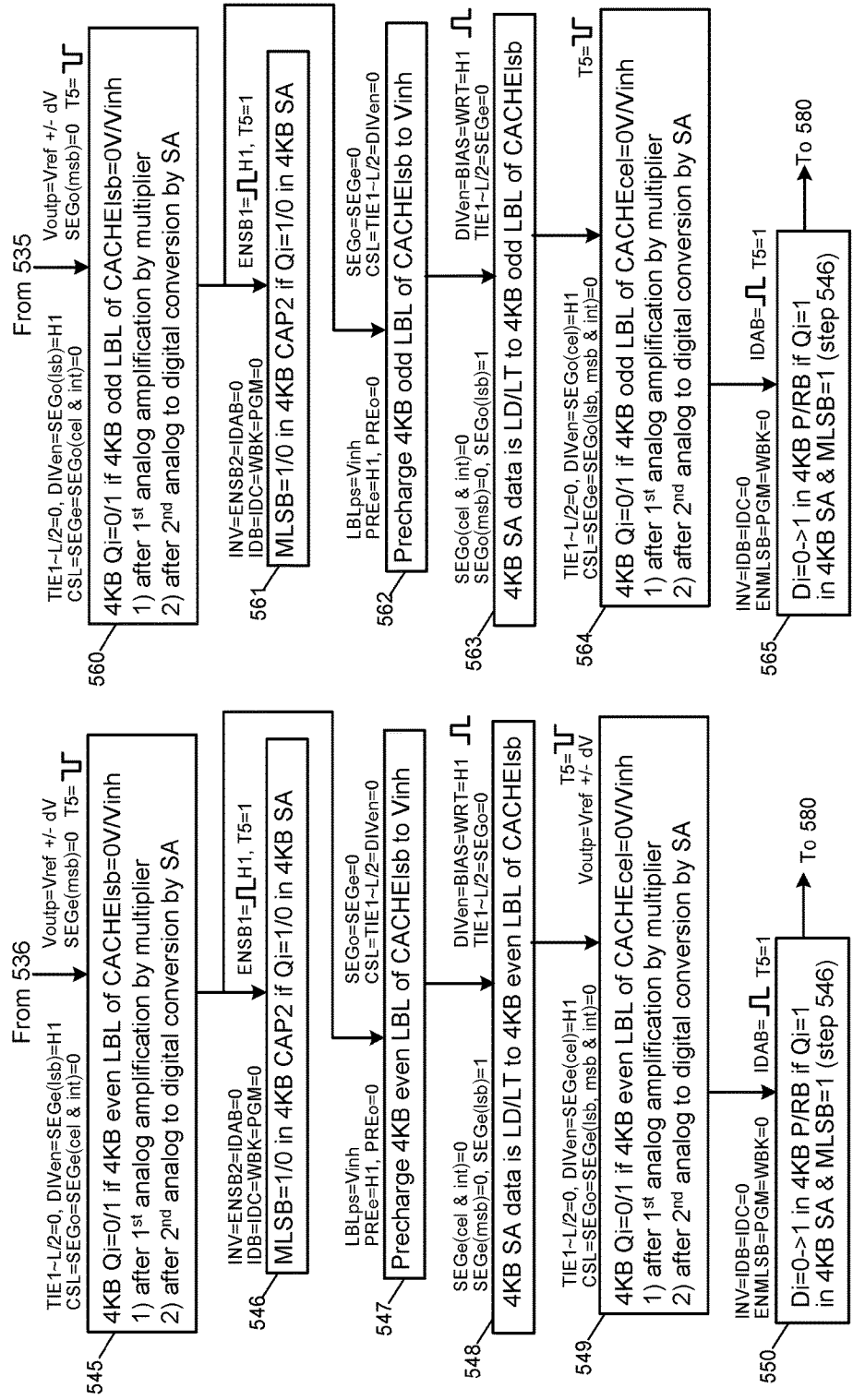

Step 537: This step includes several 6 sub-steps (560-565) of LSB Odd page of B-state PGM-VFY operation as shown in FIG. 7K below. After this step, the following data are stored in respective circuits:
  a) CAP2: To store 4 KB LSB raw page data (step 561)
     4 KB Odd LSB raw page data are stored in 4 KB CAP2 from 4 KB Odd CACHElsb. After CAP3 latching, then same 4 KB Odd LSB raw page data are loaded and latched back to the original 4 KB Odd CACHElsb (step 563).
  b) SA: To store 4 KB updated (new) B-state Odd PGM-VFY page data (step 564)
     This step is to read back 4 KB B-state Odd PGM-VFY page data from 4 KB Odd CACHEcel under Selected WL=Vtbmin.
  c) P/RB: Store last (old) page data and updated (new) 4 KB Odd LSB PGM-VFY page data.

Step 538: This is a self-timed Vinh precharge operation on 4 KB Odd CACHEint step with the following bias conditions:
  a) PREe2=PREo2=H1 and LBLps1=Vinh,
  b) CSL=TIE1~TIEL/2=0V (L=4),
  c) DIVen=SEGo2=SEGe2=0V,
  d) Others=0V.

Step 539: This is a step to load and latch 4 KB P/RB's updated LSB B-state PGM_VFY page data to 4 KB Odd CACHEint with the following bias conditions:
  a) SEGe3=SEGe4=0V (For CACHElsb and CACHEmsb),
  b) TIE1~TIEL/2=SEGo=0V (L=4),
  c) SEGo2=Vdd=1,
  d) SEGo1=0V (for CACHEcel),
  e) DIVen=BIAS=PGM=H1 one shot pulse.

Step 540: This step switches from lastly completed Odd LSB page to start the 4 KB Even LSB B-state PGM-VFY operation. Like Step 505 to read Even LSB page, this step is to read out 4 KB Even LSB B-state results from 4 KB Even CACHEint to 4 KB SAs with same polarity but under Vtbmin on each selected WL: a) SA Qi=0 if CACHEint=Vss for both E-cell and A-cell, b) SA Qi=1, if CACHEint=Vinh for both B-cell and C-cell.

Step 541: This step is like Step 506 but switches to transfer the 4 KB SA Even LSB A-state PGM-VFY data to 4 KB P/RB with same polarity with the following conditions:
  a) INV=IDB=IDAB=0V,
  b) ENMLSB=PGM=0V,
  c) IDC=WBK=One-shot pulse of Vdd and T5=1.

Step 542: This step is to perform the duplicated 6 sub-steps of 545-550, which jointly perform the 4 KB Even LSB B-state PGM-VFYsteps. The details are explained below in FIG. 7K.

FIG. 7K is a flow chart showing a method for performing m-page MLC (LSB page) B-state Program-Verify operation according to an embodiment of the present invention. Since this is a B-state PGM-VFY operation, the total number of steps for Even and Odd pages are less than the steps for A-state PGM-VFY operation because no need to Read A-state again. As opposite to A-state LSB PGM-VFY, this B-state PGM-VFY operation preferably starts from the 4 KB LSB Odd page first because last step of A-state PGM-VFY operation just ends with LSB Odd page. As such, thus a few steps can be saved if B-state iterative PGM-VFY operation starts from 4 KB LSB Odd page.

From Step 545 to Step 550, a 4 KB LSB Even Page B-state PGM-VFY operation is performed. Step 545: Like Step 505, this step is to sense and amplify each 4 KB raw LSB Even-page data stored in Even CACHElsb to 4 KB SA via 4 KB metal2 GBLs as explained before with the following conditions:
  a) DIVen=SEGe3=H1 (in CACHElsb),
  b) SEGe1=SEGe2=SEGe4=0V (in CACHEcel, CACHEint, and CACHEmsb),
  c) CSL=SEGo3=0V,
  d) TIE1~TIEL/2=SEGo=0V (L=4),
  e) Voutp=Vref+/−ΔV,
  f) T5=One-shot pulse of Vss.

Step 546: This step is to transfer the 4 KB SA Even LSB raw data to 4 KB CAP2 with same polarity such as MLSB=1/0 if Qi=1/0. The preferred bias conditions are summarized below:
  a) INV=0V,
  b) IDAB=IDB=IDC=WBK=0V,
  c) ENSB2=PGM=0V,
  d) ENSB1=One shot pulse of Vdd,
  e) T5=1.

Step 547: This is a similar self-timed Vinh precharge operation on 4 KB Even CACHElsb step. The reason to do this step is to prepare the saving of the 4 KB Even raw LSB page data back to 4 KB Even CACHElsb because after Step 545, the stored 4 KB LSB raw data is corrupted due to charge sharing between each LBL and each GBL. The preferred bias conditions are summarized below:
  a) PREe4=H1 and LBLps4=Vinh,
  b) PREe1=PREe2=PREe3=CSL=TIE1~TIEL/2=0V (L=4),
  c) DIVen=SEGo=SEGe=0V.

Step 548: This is a step to load and latch 4 KB Even LSB raw page data to 4 KB Even CACHElsb with the following bias conditions:
  a) SEGe1=SEGe2=SEGe4=0V (For CACHElsb, CACHEcel, CACHEint),
  b) TIE1~TIEL/2=SEGo=0V (L=4),
  c) SEGe3=Vdd=1,
  d) DIVen=BIAS=WRT=One-shot pulse of H1.

Step 549: This step is to sense and amplify the updated (new) iterative 4 KB B-state Even analog page data under Vtbmin condition in Even CACHEcel to 4 KB SA via 4 KB metal2 GBLs as explained before with the following conditions:
  a) SEGe2=SEGe3=SEGe4=0V (in CACHEint, CACHElsb and CACHEmsb),
  b) CSL=0V,
  c) TIE1~TIEL/2=SEGo1=0V (for CACHEcel) (L=4),
  d) DIVen=SEGe1=H1 (CACHEcel).

Step 550: This step is to do B-state bit flipping for 4 KB Even LSB page of iterative B-state PGM-VFY operation in accordance with 4 KB last (old) Even B-state page data in 4 KB P/RB, 4 KB Even LSB page data temporarily stored in 4 KB CAP2, and updated (new) 4 KB Even A-state page data stored in 4 KB SAs. As a results, each P/RB Di=0 will be flipped to "1" when SA Qi=1 and CAP2=1=MLSB. The preferred bias conditions are listed below:

a) INV=IDB=IDC=0V,
b) ENMLSB=PGM=WBK=0V,
c) IDAB=One shot Vdd and T5=1.

After this step, then an updated 4 KB Even LSB page data of B-state iterative PGM-VFY operation is completed and the flow moves to 580.

From Step 560 to Step 565, a 4 KB Odd LSB Page B-state PGM-VFY operation is performed. Basically, these steps are repeated for 4 KB Odd LSB B-state iterative PGM-VFY flow which is similar to Step 505 to Step 512 for 4 KB Odd LSB B-state iterative PGM-VFY flow. Thus the details are identical and omitted hereby for the description simplicity for those are skilled in the art.

Figure 7L:
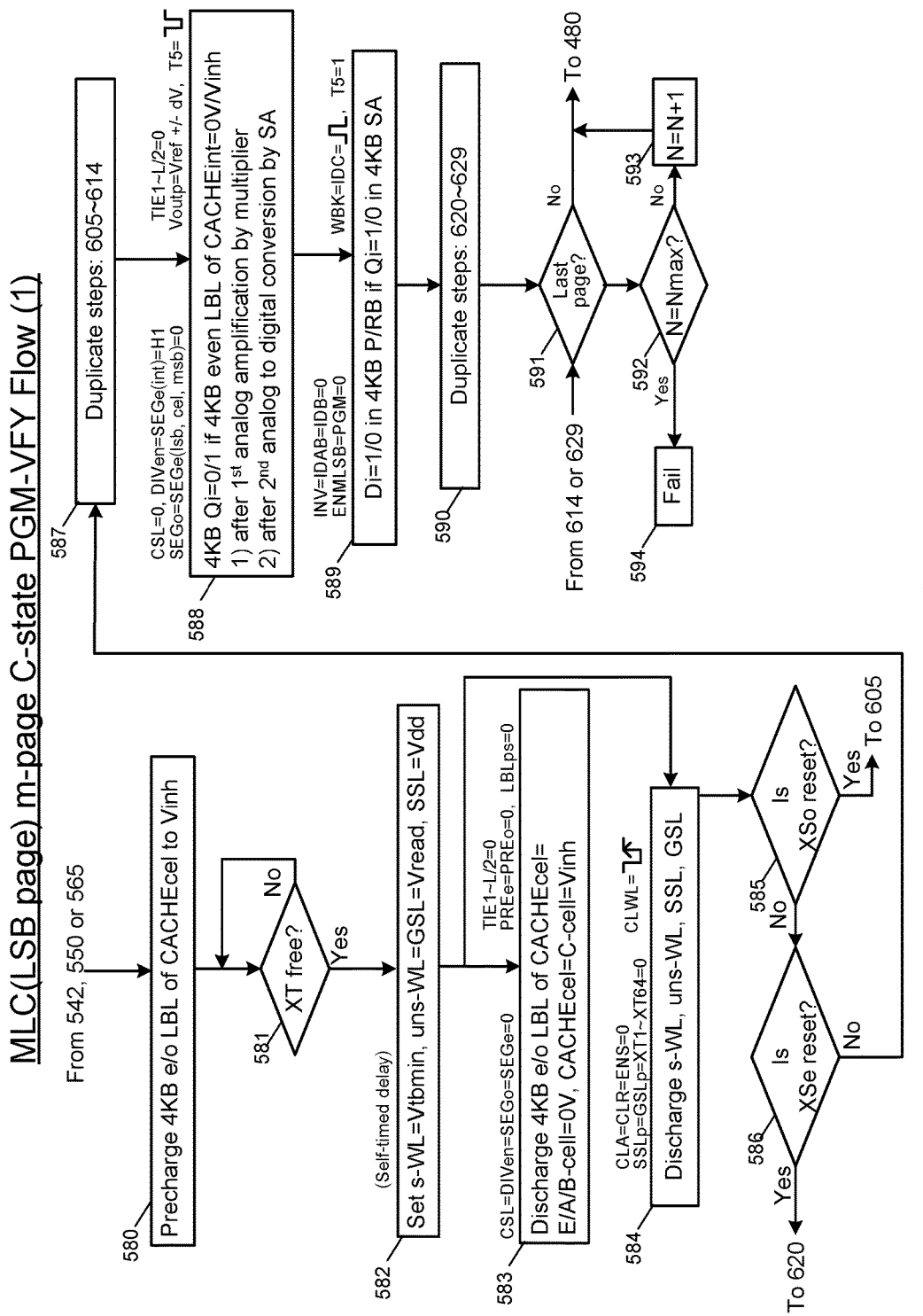

FIG. 7L is a flow chart of a method for performing m-page MLC (LSB page) C-state Program-Verify operation according to an embodiment of the present invention. Since this is a C-state PGM-VFY operation, the total number of steps of Even and Odd pages are further reduced as compared to A-state and B-state PGM-VFY operations because no need to Read A-state and B-state again. As opposite to B-state LSB PGM-VFY operation, this C-state PGM-VFY operation preferably starts from the 4 KB Even LSB page first because last step of B-state PGM VFY just ends with an Even LSB page. As such, thus a few steps can be saved if C-state iterative PGM-VFY operation continues from the B-state PGM-VFY flow.

Step 580: Concurrent 8 KB $C_{LBL}$ Vinh precharging. This step is like Step 496 a self-timed step for performing 1-cycle 8 KB concurrent $C_{LBL}$ Vinh precharge on both 4 KB Even and 4 KB Odd $C_{LBL}$ capacitors in one selected CACHEcel with identical bias condition repeated below:
a) PREe1=PREo1=H1 and LBLps1=Vinh for precharging both 4 KB Even CACHEcel and 4 KB Odd $C_{LBL}$ capacitors in 1-cycle,
b) TIE1=0V to prevent leakage from CACHEcel to other CACHEint.
c) DIVen=SEGo1=SEGe1=0V for preventing the leakage to 4 KB GBLs.
d) TIEL/2=CSL=0V (L=4) because no use.

Step 581: XT bus checking. This decision step is like Step 531 to check if the common bus lines of 64XTs+1SSLp+ 1GSLp are occupied by other existing concurrent operations after Vinh-precharging step. If No, then the flow is looped to wait until XT bus lines are free and available. If Yes, then the flow moves to Step 582 to charge m selected sets of 64WLs+1SSL+1GSL poly lines.

Step 582: Self-timed Charging & Latching of 64WLs+ 1SSL+1GSL with selected WL=Vtcmin condition. This step is like Step 532, a self-timed WL Vread charging step and is controlled by the same Vread-DA used for Step 532. The only difference between Step 582 and Step 498 is that the selected WL voltage is changed from Vtbmin to Vtcmin. The rest of voltages of other poly lines are kept unchanged as shown below in Table 6.

TABLE 6 one set of 64WLs + 1SSL + 1GSL voltages for m-page concurrent MLC (LSB) C-state PGM-VFY setting (HXD = Vread + Vt) and latching (HXD = 0 V)

| | |
|---|---|
| 1 WL(sel) = Vtcmin | 1 XT(sel) = Vtcmin |
| 63 WLs(un-sel) = Vread | 63 XTs(un-sel) = Vread |
| 1 SSL = Vdd | 1 SSLp = Vdd |
| 1 GSL = Vread | 1 GSLp = Vread |
| HXD with matched Pi, Qj, Sk to enable local pump and latch | Vread + Vt when setting but Vss when latching |

Step 583: Self-timed $C_{LBL}$ Vinh discharging or retaining step. Like Step 499, this is a self-timed operation to perform $C_{LBL}$ Vinh discharging and retaining by setting Vtcmin for each selected WL in accordance with the stored states of m 8 KB MLC cells in m 8 KB selected CACHEcel. Again, this is like ABL (All-BL) Program-Verify scheme for both 4 KB Even and 4 KB Odd LSB page per one 8 KB physical MLC-WL. The final value of each LSB $C_{LBL}$ bit voltage under Vtcmin for selected WL is determined by each MLC cell's state in each corresponding CACHEcel. If each MLC cell is in E-state, then each corresponding LSB $C_{LBL}$'s Vinh voltage will be discharged to Vss, otherwise each $C_{LBL}$ voltage would retain its initial Vinh value with following conditions: 1) E-cell=A-cell=B-cell=0V in CACHEcel, because Vtcmin>Vtbmin>Vtamax>Vtemax≥−0.5V and TIE1=0V; 2) C-cell=Vinh in CACHEcel, because Vtemax<Vtamax<Vtbmin<Vtcmin. The preferred bias conditions are listed below:
a) CSL=PREe1=PREo1=LBLps1=0V
  It means all 4 KB PREe1=4 KB REPe2=4 KB PREo1=4 KB PREo2=Vss. This is to prevent $C_{LBL}$ leakage of both 4 KB Even and 4 KB Odd CACHEcel to one common LBLps1 line.
b) SEGo1=SEGe1=0V
  This is to prevent metal1 $C_{LBL}$ leakage of both CACHEcel to the common metal2 4 KB GBLs.
c) DIVen=CSL=0V,
d) TIE1=0V.
  E-cells in CACHEcel will discharge Vinh below 1.0V or Vss but other cells would retain Vinh. Note, the $C_{LBL}$ discharge is automatically detected by a LBLps-DA with its Vref=1.0V.

Step 584: Unlike previous A-state and B-state PGM-VFY steps, the voltages of each set of 64WLs+1SSL+1GSL are preferably latched on respective WL parasitic poly line capacitors. Since C-state PGM-VFY operation is a last MLC PGM-VFY step, thus no need to save them. Thereby, after Step 583, this Step 584 performs the discharging of 64WLs+ 1SSL+1GSL to reduce Vread HV stress on cells for longevity of P/E cycles in accordance with the following bias conditions.
a) LA=CLR=ENS=0V,
b) ENB=1=Vdd,
c) XT1-XT64=SSLp=GSLp=0V,
d) CLWL=one-shot pulse of Vdd.

Step 585: Is XSo reset? This decision step checks if the selected Odd Segment's flag latch is reset in last iterative PGM-VFY step. If yes, then the flow moves to Step 605 in FIG. 7M below to perform 4 KB Odd Page PGM-VFY operation. If No, then the flow moves to Step 586 to check if Even Segment's flag latch is reset in last iterative PGm-VFY step. If Yes, then the flow moves to Step 620 to do Odd-page PGM-VFY operation in FIG. 7K above. If No, then flow moves to next Step 587.

Step 587: This step duplicates several sub-steps of 605 to 614 to perform 4 KB Even LSB page of C-state PGM-VFY operation. The details will be explained in FIG. 7M below.

Step 588: This step is to sense and amplify 4 KB last C-state Even analog page data under Vtcmin condition in Even CACHEint to 4 KB SA via 4 KB metal2 GBLs as explained before with the following condition:
a) SEGe1=SEGe3=SEGe4=0V (in CACHEcel, CACHElsb and CACHEmsb),
b) CSL=0V,
c) TIE1~TIEL/2=SEGo1=0V (for CACHEcel) (L=4),
d) DIVen=SEGe2=H1 (CACHEint).

Step 589: This step is to transfer 4 KB SAs to 4 KB P/RB with the same polarity such as each P/RB Di=1/0 in accordance with each SA Qi=1/0. The preferred bias conditions are listed below:
   a) INV=IDB=IDAB=0V,
   b) ENMLSB=PGM=0V,
   c) IDC=WBK=One shot Vdd and T5=1.

Step 590: As opposite to Step 587, this step duplicates several sub-steps of 620 to 629 to perform 4 KB Old LSB page of C-state PGM-VFY operation. The details will be explained in FIG. 7M below.

Step 591: This is a decision step to check if the last page of iterative MLC LSB of C-state PGM-VFY operation is completed. If Yes, then Step 592 of Nmax increases by N=N+1 at Step 593 and moves to Step 480 if Nmax not being reached yet. If Nmax is reached, then flow moves to Step 594 reporting a defective page to end next MLC Program and Program-Verify. If No to Step 591, it means some LSB pages are not finished program yet. Then the flow moves to Step 480 in FIG. 7F to continue the MLC LSB Program and Program-Verify operation.

Figure 7M:
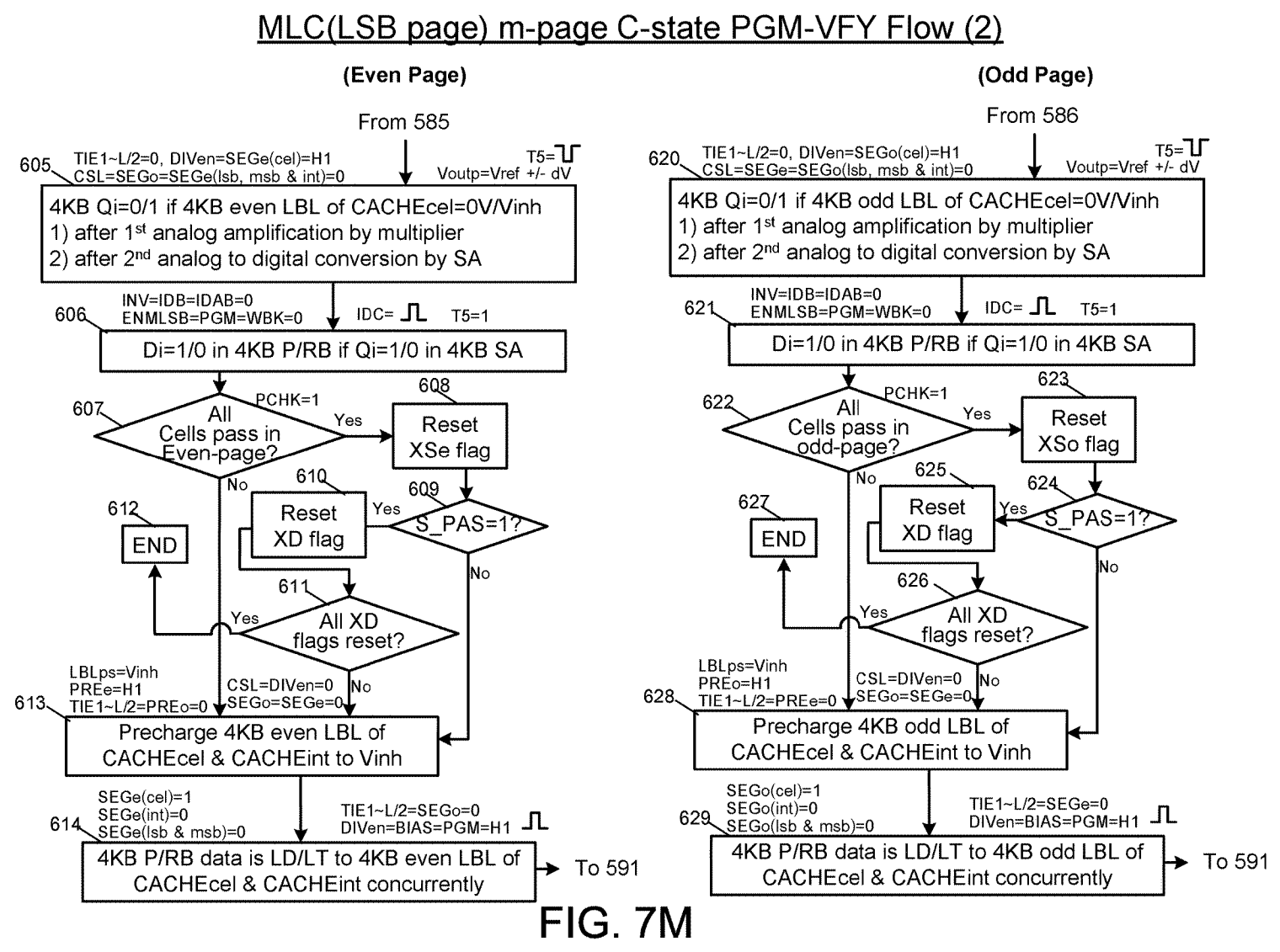

FIG. 7M is a flow chart showing a method for performing m-page MLC (LSB page) C-state Program-Verify operation according to an embodiment of the present invention. Since this is a C-state PGM-VFY operation, the total number of steps of Even and Odd pages is less than the steps of B-state PGM-VFY because no need to Read A- and B-states again. As opposite to B-state LSB PGM-VFY, this C-state PGM-VFY operation preferably starts from the 4 KB Even LSB page first because last step of B-state PGM-VFY operation just ends with an Even LSB page. Thus a few steps can be saved if C-state iterative PGM-VFY operation starts from 4 KB Even LSB page.

Steps 605-614 are for performing 4 KB Even LSB Page C-state PGM-VFY operation. Step 605: Like Step 505, this step is to sense and amplify each 4 KB raw LSB Even-page data stored in Even CACHEcel to 4 KB SA via 4 KB metal2 GBLs as explained before with the following conditions:
   a) DIVen=SEGe1=H1 (in CACHEcel),
   b) SEGe2=SEGe3=SEGe4=0V (in CACHEint, CACHE1 as and CACHEmsb),
   c) CSL=SEGo1=0V,
   d) TIE1~TIEL/2=0V (L=4),
   e) Voutp=Vref+/−ΔV,
   f) T5=One-shot pulse of Vss.

Step 606: This step mainly is to flip the 4 KB PR/B bit value by 4 KB SAs that stores the 4 KB updated (new) C-state PGM-VFY data in accordance with the DB circuit shown in FIG. 3. The preferred bias conditions are summarized below:
   a) INV=IDB=IDAB=0V,
   b) ENMLSB=PGM=WBK=0V,
   c) IDC=One shot Vdd and T5=1,
   As a results, each P/RB bit of Di=0 will be flipped to "1" when each corresponding bit of SA Qi=1.
Thus after this step, the bit flipping for C-state PGM-VFY updated data is obtained.

Step 607: This is a decision step used to check if all m selected random Even LSB pages pass MLC PGM-VFY of all A, B and C states. This can be done automatically by the PGM-VFY Check circuit of 108 as shown in FIG. 3. As explained before, when A-state, B-state and C-state PGm-CFY pass, then all 4 KB P/RB DiB=0V under PCHK=Vdd condition. Then the OR-line of PASS will become Vdd because ENB=0V. That will increase PASS counter by one. If Yes, then flows moves to Step 608 to reset XSe (Even Segment Latch) flag latches.

Step 609: This decision step checks if XSe flag latch is reset due the pass of PGM-VFY operations of the selected pages. If yes, then the next step is to reset the XD flag latches.

Step 611: This decision step checks if all XD flag latches of selected Segments are being reset due the pass of all PGM-CFY of the selected pages. If Yes, then m-page MLC Program and PGM-VFY operations are finished successfully and end at Step 612. If No, then the m-page MLC Program and PGM-CFY operations have to be continued for the unfinished pages. The flow moves to Step 613.

Step 613: Concurrent 4 KB LBL Vinh precharging. Like Step 496 this step is a self-timed step for performing 1-cycle 4 KB concurrent LBL Vinh precharge only on both selected 4 KB Even CACHEcel and 4 KB Even CACHEint with identical bias condition repeated below:
   a) PREe1=H1 and LBLps1=Vinh but PREo1=Vss for precharging 4 KB Even CACHEcel in 1-cycle,
   b) PREe2=H1 and LBLps2=Vinh but PREo2=Vss for precharging 4 KB Even
   CACHEint in 1-cycle,
   c) TIE1~TIEL/2=0V (L=4) to prevent leakage from CACHEcel to other CACHEint.
   d) DIVen=SEGo1=SEGe1=0V for preventing the leakage to 4 KB GBL.
   e) Others=0V because no use.
The reason not to precharge the 4 KB Odd CACHEcel is for keeping 4 KB Odd $C_{LBL}$ capacitors unchanged and independent from 4 KB Even $C_{LBL}$ capacitors. In some case, either Even or Odd LSB pages may not be all passed. Performing the Even $C_{LBL}$ precharge only would not destroy the last stored Odd data or vice versa.

Step 614: Concurrent 4 KB LBL Vinh precharging. This is a step to load and latch 4 KB Even C-state PGM-VFY page data from 4 KB P/RB to 4 KB even CACHEcel and CACHEint simultaneously in 1-cycle in accordance with the following bias conditions:
   a) SEGe1=Vdd (CACHEcel),
   b) SEGe2=Vdd (CACHEint),
   c) SEGe3=0V (CACHElsb),
   d) SEGe4=0V (CACHEmsb),
   e) TIE1~TIEL/2=0V (L=4),
   f) DIVen=BIAS=PGM=One-shot H1.
Then the flow moves to Step 591 to check if all 4 KB Even LSB pages of C-state PGM-VFY operations are completed as seen in FIG. 7L.

Steps 620-629 are for performing 4 KB Odd LSB Page C-state PGM-VFY operation. This flow is substantially similar as the Even LSB page PGM-VFY operation. Thus the details are omitted herein for description simplicity.

As Even LSB pages, then the flow moves to Step 591 to check if all 4 KB Odd LSB pages of C-state PGM-VFY operations are independently completed as seen in FIG. 7L.

FIG. 8A is a diagram showing NAND circuit structures and a method for performing m-page SLC Read operation according to an embodiment of the present invention. Basically, when a MLC cell stores only 2-state (E and B'-state) or 2 Vts per one physical MLC cell, it is like a SLC cell which also stores 2 states and 2 Vts such as E-state and B'-state. The plurality of MLC cells is stored in each MLC-WL, while the plurality of SLC cells is stored in SLC-WL as defined in previous pages. In each MLC-WL, there is one extra bit of NAND cell called as a Flag cell that stores either "1" the erased bit data or "0" the programmed bit data in a separate BL physically. As defined earlier, when Flag cell=1, it means only 2-state of MSB bit is stored in each MLC physical cell. When Flag cell=0, it means a full 4-state of both MSB and LSB bits are stored in each MLC physical cell.

Therefore, when Flag=1, both SLC Read operation and MLC's MSB Read operation are to deal with the same storage of 2-Vt or 2-state per one physical NAND cell Read. Thus the m-page Read methodology of SLC and MLC (MSB-bit only) are treated as same below. In an embodiment, this preferred methodology includes four consecutive steps denoted as 1, 2, 3e, 3o in FIG. 8A and three basic operations as explained below.

1): Vinh precharge on 8 KB CACHEcel $C_{LBL}$ capacitors. Since this is a simple 2-Vt Read operation, no need of any bit-flipping logic operation is required. Thus no need of any extra 8 KB CACHEs for storing the temporary page data. As a result, only one 8 KB pseudo CACHEcel is required.

2): Vinh discharging and retaining on 8 KB CACHEcel $C_{LBL}$ capacitors. The step is each SLC cell's state development stage of m selected SLC-WLs during m-page SLC Read operation, regardless of a single random page or m pages of a selected Block. In a SLC Read, the Vinh discharge in CACHEcel happens to those SLC cells storing E-state (Bit data=0) with Vtemax<Vtamin. Those B'-state (Bit-data=1) would retain Vinh precharged voltage because Vtb'min>Vtamin on m selected WLs.

3): Charge-sharing (CS). The sensing or readout of each SLC cell, it is meant to read each NAND cell's analog voltage data stored in each corresponding $C_{LBL}$ capacitor that stores Vinh for a B'-state cell or Vss for a E-state cell with Vinh precharging. When reading one cell in each CACHEcel's metal1 LBL to each SA through each metal2 GBL line, a charge-sharing between each $C_{LBL}$ capacitor and each $C_{GBL}$ capacitor will happen. As a result, the readout cell voltage in each $C_{LBL}$ signal will be diluted and thus reduced. And that is why a Multiplier is incorporated in each GBL to do a first analog cell signal amplification like a DRAM-cell and then a second analog amplification at SA next. Now, the steps of m-page SLC Read methodology will be explained below by referring to FIG. 8A.

Arrow1: This is referred to a first step for performing the m-page SLC Read operation. In prior-art 1-level BL NAND array scheme, a 1.0V precharge voltage on all selected long metal1 GBLs from DB is required before starting any one full-page or one partial-page SLC Read operation. Unlike prior art 1-level BL NAND array scheme using higher power-consuming GBL for precharging, the present 2-level BL-Hierarchical HiNAND2 array uses short metal1 LBL line with less-power for precharging Vinh voltage from selected LBLps lines with the preferred bias conditions set below with reference to FIG. 1A for one 8 KB CACHEcel only:
  a) PREo1=PREe1=H1 along with LBLps1=V2=Vinh to precharge both 4 KB Even and Odd CACHEcel $C_{LBL}$ capacitors,
  b) TIE1=Vss: To shut off MLBLb transistor.
    This condition is to disconnect CACHEcel from CACHEint to prevent Vinh leakage.
  c) SEGo1=SEGe1=Vss:
    These conditions are to shut off both 4 KB Even MLBLpe and 4 KB Odd MLBLpo GBL-divided transistors of 8 KB CACHEcel registers so that no leakage would happen from 8 KB CACHEcel to the common 4 KB metal2 GBLs.
  d) Other SEGo2=SEGe2=SEGo3=SEGe3=SEGo4= SEGe4=0V and TIE2=0V, PREo2=PREe2=PREo3= PREe3=PREo4=PREe4 because CACHEint, CACHElsb and CACHEmsb are not selected for this SLC Read operation.

Arrow2: This is referred to a second step to read out m pages of 8 KB 2-Vt SLC data stored in 8 KB cells in m CACHEcels. Basically, a SLC Read is a VR1 discharging step, i.e., each selected WL in each CACHEcel Segment is coupled with VR1=Vtamin along with the remaining 63 WLs=Vread and 1SSL=Vdd and 1GSL=Vread.

When a SLC cell's Vt<Vtamin, then $C_{LBL}$=Vinh=0V, i.e., Vinh is discharged. This is an E-state cell with Logic bit=1. When a SLC cell's Vt>Vtamin, then $C_{LBL}$=Vinh, i.e., Vinh voltage is retained. This is a B'-state cell with Logic bit=0.

Note, this is a self-timed step by using a LBLps Detector DA connected to one end of LBLps1 (not shown). In a real design, the LBL's Vinh Detector is not necessary to detect Vinh being dropped to Vss. Instead, it is designed to detect LBLps=Vinh≈2.0V with a quick response so that Vinh Detector can be disabled earlier to prevent the leakage between Vinh-retaining $C_{LBL}$ capacitors and discharging $C_{LBL}$ capacitors by shutting off both MLBLso and MLBLse transistors before $C_{LBL}$ line voltage dropped to Vss. In conclusion, after the step (indicated by Arrow2), two $C_{LBL}$ analog voltages are temporarily stored in each $C_{LBL}$ capacitor such as CACHEcel=Vinh (B'-cells) and CACHEcel=Vss (E-cells). For m-page Block SLC concurrent Read, total m 8 KB CACHEcel $C_{LBL}$ capacitors would store m 8 KB SLC Read page data with a voltage patterns of Vinh or Vss in accordance with m SLC cells' stored states, B'-state or E-state.

Arrow3 (3e and 3o): The 3e Step is to perform 2 cycles of $C_{LBL}$ analog voltage sensing and amplification from 4 KB Even CACHEcel by one 4 KB Multiplier and one 4 KB SA. The first cycle is to sense, transfer, and amplify the 4 KB Even SLC analog data by the Multiplier (102 of FIG. 3), and then the second cycle is to perform further amplification to a full digital bit data by the SA (104 of FIG. 3). The sensing and transferring operation is performed between each metal1 LBL and each metal2 GBL. Therefore, the 4 KB divided GBL paired transistors of 4 KB MLBLpe and 4 KB MLBLPo of 8 KB selected CACHEcel and CACHEint have to be turned on one by one basis in accordance the location of selected Group due to the limitation of 4 KB GBLs for area saving.

Referring to FIG. 8A, the flow shows 4 KB Even $C_{LBL}$ capacitors are connected to 4 KB GBLs via 4 KB transistors MLBLpe with the following preferred bias conditions:
  a) 4 KB SEGe1=H1 but 4 KB SEGo1=0V,
  b) 4 KB PREe1=4 KB PREo1=0V.
After this step, the 4 KB Even analog cell data are turned into 4 KB Even digital data with same polarity stored in 4 KB SA/s Qi and QiB node as seen in SA circuit of 104 in FIG. 3. In other words, Qi=Vdd when $C_{LBL}$=Vinh and Qi=Vss when $C_{LBL}$=Vss.

Arrow3o: This step is like 3e Step but to sense and readout 4 KB Odd SLC page data stored in 4 KB corresponding Odd CACHE $C_{LBL}$ capacitors in accordance with the following bias conditions:
  a) 4 KB SEGo1=H1 but 4 KB SEGe1=0V,
  b) 4 KB PREo1=4 KB PREe1=0V.
After this step, the 4 KB Odd analog cell data being turned into 4 KB Odd digital data with same polarity stored in 4 KB SA/s Qi and QiB node as seen in SA circuit of 104 in FIG. 3. In other words, Qi=Vdd when $C_{LBL}$=Vinh and Qi=Vss when $C_{LBL}$=Vss.

FIG. 8B is a diagram showing NAND circuit structures and a method for performing m-page MLC (MSB-page) Read operation with a Flag cell=1 according to an embodiment of the present invention. Basically, the m-page SLC and MLC (MSB-bit only) Read operation is m-page Read operation of 2-Vt SLC cell or the first MSB-bit Read operation of a MLC cell without a LSB-bit Read operation because no LSB bit data is stored in one MLC physical cell in accordance with the control signals and circuits of HiNAND2 array shown in FIG. 1A, Data Buffer shown in FIG. 3 and Block-decoder and Segment-decoder shown in FIG. 2A and FIG. 2B.

It is the simplest m-page random-WL Read operation to distinguish E from B'-state cells of the present invention by applying VR1 to m selected WLs concurrently. It just needs one 8 KB pseudo CACHEcel $C_{LBL}$ capacitors to temporarily store each 8 KB Read page data in one of m Segment's CACHEcel capacitors in one or more Groups in a Plane of HiNAND2 array.

In an embodiment, this method deals with a 4-Vt MLC cell that stores both MSB bit and LSB bits with a Flag cell=1 and under VR3 Read conditions. The VR1 and VR2 Reads have been done in previous operations shown in FIG. 8A. Therefore, when Flag cell=1, this MLC Read operation will need a 3-Read step with a preferred sequence from VR1, VR2, and VR3 as the voltage on one selected WL is gradually increased per page. For m-page 4-stage MLC Read operation, then it will take m 3-Read steps for completing whole m 8 KB MSB page and m 8 KB LSB page Read operation.

Referring to FIG. 8B, the method includes five consecutive steps denoted by 1, 2, 3e, 3o, 4e, 4o, 5e, and 5o for performing the following three basic operations: 1) Vinh precharging, 2) LBL discharging, and 3) Charge-sharing. Note, in the m-page LSB Read operation, totally four pseudo CACHE registers such as 8 KB CACHEcel, 8 KB CACHEint, 8 KB CACHElsb, and 8 KB CACHEmsb are required to properly flip the bit data in accordance with the accessed four states of each MLC cell.

step1: This is to perform the first operation, i.e., Vinh precharge. Only 8 KB $C_{LBL}$ capacitors of 8 KB CACHEcel registers would be selected for implementing the Vinh precharge step as arrow1 indicates. The other CACHEs or Segments are disabled with the following bias condition:
  I. 4 KB PREo1=H1 and 4 KB PREe1=H1:
    This is to precharge both 4 KB Odd and 4 KB Even $C_{LBL}$ capacitors within one 8 KB CACHEcel register at same time in 1-cycle time.
  II. LBLps1=Vinh,
  III. 4 KB PREo2=Vss and 4 KB PREe2=Vss,
  IV. 4 KB PREo3=Vss and 4 KB PREe3=Vss,
  V. 4 KB PREo4=Vss and 4 KB PREe4=Vss,
  VI. 4 KB SEGe1=SEGe2=SEGe3=SEGe4=Vss,
  VII. 4 KB SEGo1=SEGo2=SEGo3=SEGo4=Vss,
  VIII. TIE1~TIEL/2=Vss (L=4).

step2: This is to perform a second operation of $C_{LBL}$ discharging under VR3 Read in accordance with each MLC storage states within one selected 8 KB CACHEcel registers and following bias conditions:
  a) 4 KB PREo1=PREo2=PREo3=PREo4=Vss
  b) 4 KB PREe1=PREe2=PREe3=PREe4=Vss
  c) 4 KB SEGe1=SEGe2=SEGe3=SEGe4=Vss,
  d) 4 KB SEGo1=SEGo2=SEGo3=SEGo4=Vss,
  e) TIE1~TIEL/2=Vss (L=4),
  f) LBLPs1=LBLPs2=LBLps3=LBLps4=Vss.

The reason to set all above control signals to Vss is because only one CACHEcel is selected for VR3 discharge operation. As a result, E-cell=A-cell=B-cell=0V but C-cell=Vinh. The discharge operation only happens within 8 KB local CACHE $C_{LBL}$ capacitors without any need of GBLs and LBLps Vinh power line at all.

step3e: This 3e Step is to perform $C_{LBL}$ analog voltage sensing under VR1 from one 8 KB CACHEint registers only by one 4 KB Multiplier and one 4 KB SA divided into 2 cycles for each 8 KB LSB. The first cycle is to sense, amplify, and transfer the 4 KB Even LSB data, and the second cycle is to repeat steps on 4 KB Odd LSB data. The sensing cycle would be performed between LBLs and GBLs. Therefore, the 4 KB divided GBL paired transistors MLBLpe and MLBLPo of the 8 KB selected CACHEint have to be turned on one by one basis due to the limitation of 4 KB GBLs for area saving. Referring to FIG. 8B, the flow starts from an Even LSB page first and then an Odd LSB page subsequently with 4 KB SEGe2=H1=Vinh+Vtn but 4 KB SEGo2=Vss.

step3o: This step is to follow above step3e on the remaining 4 KB Odd CACHEcel $C_{LBL}$ capacitors with the opposite bias condition of 4 KB SEGe2=Vss but 4 KB SEGo2=H1=Vinh+Vtn. Basically, step2 and step3 is to perform LBL discharging due to E and B' state evaluation under VR1 on m selected WLs.

step4e: This step is to sense and amplify the VR2 operation on 4 KB Even CACHEmsb $C_{LBL}$ capacitors with the following bias condition: 4 KB SEGe4=H1 but 4 KB SEGo4=Vss.

step4o: This step is to repeat above step4e for sensing and amplifying the remaining 4 KB Odd CACHEcel $C_{LBL}$ capacitors with the opposite bias condition: 4 KB SEGe4=Vss but 4 KB SEGo4=H1. Basically, step4 is to perform charge-sharing (CS) between each metal1 shorter $C_{LBL}$ and each longer metal2 $C_{GBL}$ lines.

step5e: This step is to perform Even cell's $C_{LBL}$ analog voltage sensing at 4 KB CACHEcel registers with the following bias condition: 4 KB SEGe1=H1 but 4 KB SEGo1=Vss.

step5o: This step is to repeat above step5e for sensing the remaining 4 KB Odd CACHEcel $C_{LBL}$ capacitors with the opposite bias condition: 4 KB SEGe1=Vss but 4 KB SEGo1=H1. Note, all SEGe2=SEGo2=SEGe3=SEGo3=SEGe4=SEGo4=Vss because CACHEint, CACHElsb, and CACHEmsb registers are not selected in this step. In step5, it is to perform Sample and Hold (S/H) operation, which means a local $C_{LBL}$ data are sensed and retained for each final 4 KB Even and 4 KB Odd page of SLC or MLC's MSB page data.

FIG. 8C is a diagram of NAND circuit structures and a method for performing m-page MLC (MSB/LSB page) Read operation with Flag cell=0 according to an embodiment of the present invention. Basically, the m-page MLC Read operation is to read each 4-Vt MLC cell stored with both MSB-bit and LSB-bit in accordance with the control signals and circuits of HiNAND2 array shown in FIG. 1A, Data Buffer shown in FIG. 3 and Decoders shown in FIG. 2A and FIG. 2B.

The MLC LSB Read is the most complicate m-page random-WL MLC Read operation to distinguish four stored states of E, A, B, and C of each MLC cell to determine LSB bit data. Totally three 8 KB pseudo CACHEs such as CACHEcel, CACHEint, and CACHElsb are involved in several logic operations before obtaining the accurately reading of each logic LSB page data from each 4-Vt MLC-WL. In an embodiment, this method deals with a 4-Vt MLC cell that stores both MSB bit and LSB bit with a Flag cell=0 and under VR3 Read conditions. The VR1 and VR2 Reads are done in previous methodology shown in FIG. 8A.

Therefore, when Flag cell=0, this MLC Read operation needs 3 Read steps with a preferred sequence from VR1, VR2, and VR3 as voltage of one selected WL is gradually increased per page. For m-page 4-stage MLC Read operation, then it will take m×3 Read steps for completing whole m 8 KB MSB page Read operation and m 8 KB LSB page Read operation.

Referring to FIG. 8C, this preferred method includes 10 consecutive steps denoted as 1, 2, 3e, 3o, 4e, 4o, 5e, 5o, 6, 7, 8e, 8o, 9e, 9o, 10e, and 10o while involving several basic operations such as Vinh precharging, LBL discharging and retaining, WL charging and discharging, LBL/GBL CS (Charge-sharing), and $C_{LBL}$ LD/LT ($C_{LBL}$ Loading/Latching). Note, in this m-page MLC MSB/LSB Read operation, totally three 8 KB pseudo CACHEs such as 8 KB CACHEcel, 8 KB CACHEint, and 8 KB CACHEmsb are required to properly flip bit data in accordance with the accessed the 4-Vt MLC cell.

step1: This is a first step for implementing Vinh precharge, in which three 8 KB $C_{LBL}$ capacitors of 8 KB CACHEcel, CACHEint, and CACHEmsb are selected and other CACHEs or Segments are disabled because no usage with the preferred bias conditions:
  I. 4 KB PREo1=H1 and 4 KB PREe1=H1 and LBLps1=V2=Vinh,
    This is to precharge both 4 KB Odd and 4 KB Even CACHEcel $C_{LBL}$ capacitors with Vinh concurrently in 1-cycle time.
  II. 4 KB SEGo1=4 KB SEGe1=Vss,
  II. TIE1=0V,
    To isolate CACHEcel from CACHEint to allow independent Vinh precharging.
  IV 4 KB PREo2=H1 and 4 KB PREe2=H1 and LBLps2=V2=Vinh,
  V. 4 KB SEGo2=4 KB SEGe2=Vss,
    This is to precharge both 4 KB Odd and 4 KB Even CACHEint $C_{LBL}$ capacitors with Vinh concurrently in 1-cycle time.
  VI. 4 KB PREo4=H1 and 4 KB PREe4=H1 and LBLps2=V2=Vinh,
  VII. 4 KB SEGo4=4 KB SEGe4=Vss,
    This is to precharge both 4 KB Odd and 4 KB Even CACHEmsb $C_{LBL}$ capacitors with Vinh concurrently in 1-cycle time.

Again, the step is a self-timed one controlled by a VLBL Detector connected to one end of LBLps1 power line. Note, the Vinh precharging on three CACHEcel, CACHEint, and CACHEmsb registers can be done in 1-cycle or in three consecutive cycles to reduce the peak current if necessary.

step2: This is a second step to perform LBL's Vinh discharging or retaining under VR1 Read in accordance with each MLC cell's storage states within three CACHEs said above and following bias conditions:
  I. 4 KB PREo1=PREo2=PREo3=PREo4=Vss,
  II. 4 KB PREe1=PREe2=PREe3=PREe4=Vss,
  III. 4 KB SEGe1=SEGe2=SEGe3=SEGe4=Vss,
  IV. 4 KB SEGo1=SEGo2=SEGo3=SEGo4=Vss,
  V. TIE1=H1 but TIE2=Vss,
  VI. LBLPs1=LBLPs2=LBLps3=LBLps4=Vss.

The reason to set all above control signals to Vss is to ensure all $C_{LBL}$ discharges can be done exclusively within each paired of CACHEcel and CACHEint and CACHEmsb. After VR1 Read, E-cell=0, while A-cell=B-cell=C-cell=Vinh. The Vinh discharge operation happens on all three CACHEs' $C_{LBL}$ capacitors. The 4 KB GBL bus lines are not involved, thus 4 KB GBL bus lines become available for any new operations at this time interval. Note, since TIE1=H1, thus final $C_{LBL}$ voltages will be reflected in bother CACHEcel and CACHEint and are identical. In other words, 8 KB CACHEcel=8 KB CACHEint=VR1 page data.

step3: This step is to do VR2 Read with TIE1=Vss as well as all other control signals to isolate 8 KB CACHEcel from 8 KB CACHEint. As a result, CACHEcel exclusively stores the VR2 Read MLC data but CACHEint still holds VR1 Read MLC data due to the isolation under TIE1=Vss.

step4e: This step is to perform a first 4 KB Even cell's $C_{LBL}$ analog voltage sensing from each 4 KB $C_{LBL}$ capacitors by the Multiplier (102 of FIG. 3) and SA (104 of FIG. 3) via LBL/GBL charge-sharing with following bias conditions:
  I. 4 KB SEGe1=H1 but 4 KB SEGo1=Vss
    To connect 4 KB Even CACHEcel to 4 KB GBLs only for sensing. This step has to be performed on 4 KB by 4 KB basis.
  II. All SEGe2=SEGo2=SEGe3=SEGo3=SEGe4=SEGe4=Vss Because CACHEint, CACHElsb and CACHEmsb registers are not selected.
  III. TIE1~TIEL/2=Vss (L=4).
After this step, the 4 KB Even MLC cell analog data under VR2 is fully amplified to a full digital bit data and stored at 4 KB SAs. Note, VR2 page data is the MSB page data under VR2=Selected WL, because VR2>Vtamax.

step4o: This step is to repeat above step4e but on 4 KB Odd CACHEcel. In an embodiment, this step waits for the completion of 4 KB Even MLC data being written back to 4 KB Even CACHEcel so that both SA and P/RB are not occupied by 4 KB Even MLC bit data. The details are omitted here for description simplicity.

step5e: This step is to load and latch the prior 4 KB Even MLC MSB page digital data in 4 KB SAs back to 4 KB CACHEmsb $C_{LBL}$ capacitors in accordance with the with following bias conditions:
  I. SEGe4=Vdd but SEGo4=0V and PREe4=Vss and TIE2=0V
    Using SEGe4=Vdd, and if MSN=Vdd in SA, then the precharged Vinh inside each corresponding $C_{LBL}$ capacitor will be retained. For example, during Write back, if each MSB in SA=1=Vdd=GBL. Thus, each drain node of each MLBLpe=Vdd with gate=SEGe4=Vdd, then the source node of CLBL1e=Vinh will not leak to GBL due to MLBLpe transistor is biased into a back-diode condition.
    Conversely, if each MSB in SA=0=Vss=GBL. Thus, each drain node of each MLBLpe=Vss with gate=SEGe4=Vdd, then the source node of CLBL1e=Vinh will be discharged to Vss to GBL due to MLBLpe transistor is biased into a conduction condition. This is referred as BL voltage conversion between each Vdd/Vss GBL to each Vinh/Vss LBL.
  II. All SEGe2=SEGo2=SEGe3=SEGo3=SEGe4=SEGe4=Vss
    Because CACHEint and CACHElsb are excluded when CACHEmsb registers are selected by SA to avoid GBL bus contention.
    After this step, the 4 KB Even MLC cell analog data is being fully amplified to a full digital bit data and stored at 4 KB SAs.
  III. After LD/LT, then the gate of SEGe4=Vss to latch the new 4 KB Even MSB page data into 4 KB Even CACHEmsb.

step5o: This step is to repeat above step5e but load and latch 4 KB Odd MSB page data into 4 KB Odd CACHEmsb with opposite control logic such as SEGo4=Vdd but SEGe4=0V and PREo4=Vss and TIE2=0V. The details are omitted here for description simplicity. Basically, step3, 4, 5 are to perform charge-sharing (CS) between each metal1 shorter LBLs and each longer metal2 GBLs.

step6: Only one 8 KB CACHEcel is selected for implementing 2nd Vinh precharge under VR3 Read as indicated by Arrow1 for VR1 and VR2 Reads in prior steps. Again, this Arrow6 step is also a self-timed one controlled by each VLBL Detector connected to one end of LBLps1 line with the same bias conditions as in step1. Thus the details are omitted here.

step7: This is a step to perform m pages of 8 KB LBL's Vinh discharging or retaining under VR3 Read in accordance with each MLC cell's storage states within m 8 KB CACHEcel $C_{LBL}$ capacitors. The bias conditions are kept identical to those for Arrow1 step. Thus the details are omitted here for description simplicity. Note, after the Arrow6 step above, MLC page data bit patterns of each 8 KB CACHEcel capacitor is referred as C-state. It is meant that E=A=B=0V but C=1=Vinh stored in m 8 KB CACHE $C_{LBL}$ capacitors. After the step7, three CACHEs store three different MLC page data as summarized below.

I. 8 KB CACHEcel=C-state under VR3 Read,
II. 8 KB CACHEint=A-state under VR1 Read,
III. 8 KB CACHEmsb=B-state under VR2 Read.

The next steps referred to Arrows 8e, 8o, 9e, 9o, 10e, and 10o in FIG. 8C are to sense and amplify all above stored Analog MLC page data from three respective CACHEcl, CACHEint, and CACHEmsb to SA, P/RB, and CAP1 and CAP2 in DB for MLC MSB and LSB bit-flipping logic operations. These 3 Read operations are performed on 4 KB by 4 KB basis, the same as previously described step4e and step4o. More details will be described in subsequent flows shown in FIGS. 8D through 8G below.

The subsequent m-page SLC and MLC Read flows are basically designed in accordance with above m-page MLC Read Methodologies. Since HiNAND2 array structure and the above Methodologies are highly flexible, the following flows are merely examples for the illustrative purpose without limiting the scope of claims.

Figure 8D:
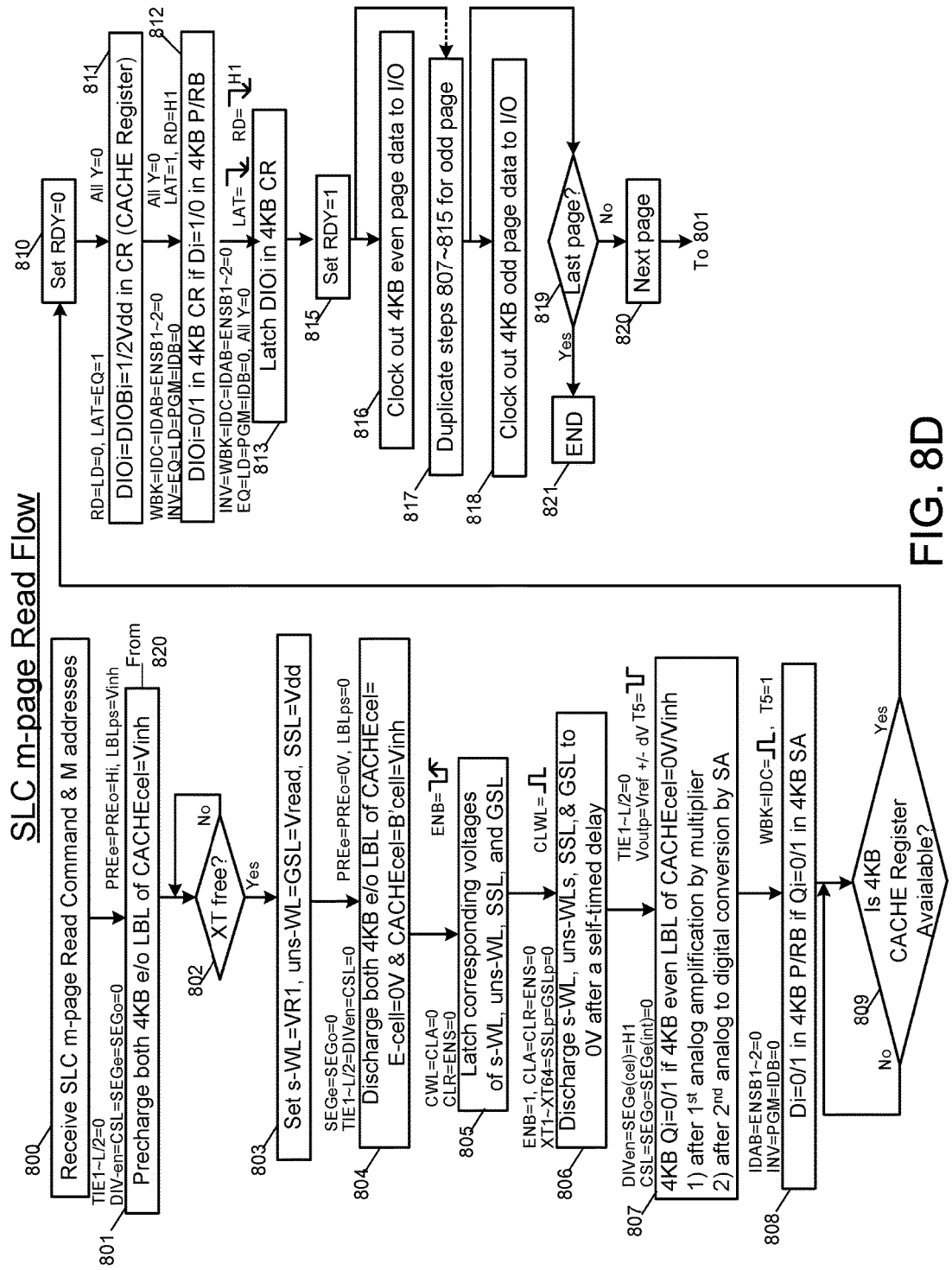

FIG. 8D is a flow chart of a method for performing m-page SLC Read operation according to an embodiment of the present invention. The flow starts from receiving a SLC m-page command and m selected page Addresses and ends with outputting m 4 KB SLC Even and m 4 KB SLC Odd page data sequentially to 8 I/Os on 1-byte by 1-byte basis. Each 8 KB SLC page in each selected physical 8 KB SLC-WL stores 8 KB 2-Vt cells storing either E-state=1 or A-state=0 when a preferred VR1 is coupled to m selected SLC WLs during the concurrent m-page SLC Read operation of the present invention. As shown, the m-page 2-Vt SLC Read flow is divided into two sub-flows including a first m-page Even 2-Vt SLC Read and I/O output flow and a second m-page Odd 2-Vt SLC Read and I/O output flow.

Step 800: This step is to sequentially receive, load and decode the m-page SLC Read Command and its associated m pages' of Read Addresses in unit of byte via NAND's 8 I/Os from off-chip Flash Controller into NAND's designated Command and Address Buffers (not shown). In addition, m latches of m selected Even Segments and m selected Odd Segments and m Block-decoders are also set according to the m-page Addresses stored in m Address Buffers for concurrent m-page SLC Read operation.

For example, the new SLC Command is loaded into the designated Command register so that it can be decoded and the associated SLC Read flows can be initiated immediately. Similarly, m-page Addresses are loaded into m designated on-chip Address Buffers conjunction with other control circuits (not shown) to set the corresponding m Even and Odd Segments' latches as shown in FIG. 2B and m Block latches as shown in FIG. 2A of the preferred HiNAND2 array (FIG. 1A).

Moreover, m addressed 8 KB SLC NAND page data are divided in m 4 KB Even-page SLC data and m 4 KB Odd-page SLC data. These m pages of SLC data are selected concurrently by m Segment latches with m Block latches. Other than that a SLC Command is newly proposed in NAND design, m-page Address arrangement is also introduced in the present invention. In prior-art, usually only one page address in one selected NAND plane is allowed, thus only one SLC page is specified in common NAND Read commend. But in this HiNAND2 array, m page Addresses in every selected NAND plane are allowed to provide flexibility of specifying up to m pages of Addresses in this SLC Read command. Each of m page Address arrangement is like prior-art single page address arrangement to place few bytes of column address first and then followed by few bytes of row address or vice versa. The major difference is that m pages of Addresses can be cascadedly loaded between start and end of m-page SLC Read Commend due to m-page Read operations according to embodiments of the present invention, rather than single page SLC Read in prior-art NAND.

For example, m pages of addresses are loaded such that the first page's row Address is followed by first page's column Address, then the second page's row Address is followed by second page's column Address, and then lastly the mth page's row address is followed by mth page's column address and the end code. Note, since this preferred m-page SLC Read is still a Read operation, thus there is no need to load any page data from the external Flash Controller into NAND flash as a Program operation.

Step 801: This step is to perform the preferred a plurality of LBL precharging of m selected 8 KB pseudo CACHEcel registers made of m 4 KB metal1 Even and 4 KB metal1 Odd $C_{LBL}$ capacitors with a preferred MHV (Medium-High-Voltage) Vinh (≥7V to 10V). Note, in this SLC Block Read, it just needs one type of m pseudo CACHEcel registers of m metal1 Segment $C_{LBL}$ capacitors in one or more HiNAND2 Groups.

The LBL precharging of Vinh voltage is like NAND's SLC Read operation that requires a BL precharging with ≈1V of Vdd-Vt on long BLs in the beginning of each single-page Read operation. But this preferred m-page SLC Read operation only needs to precharge m pages of 1/(L×J) shorter LBLs with less power consumption.

In an embodiment, following a 2-step sensing and amplification of the analog cell signal by a preferred Multiplier and Latch-type SA, a subsequent operation involves a step for charge-sharing between $C_{LBL}$ and $C_{GBL}$ capacitors. The higher Vinh voltage over conventional 1.0V would guarantee a reliable sensing of NAND stored data and states. Note, Vinh voltage of about 7 to 10V here is not used as a Program-Inhibit voltage as for SLC and MLC Program BL's voltage. The selected 8 KB NAND cells per one physical WL are within one selected Block of one selected Segment that comprises 8 KB pseudo CACHE $C_{LBL}$ capacitors. Any pseudo CACHE register is termed as a CACHEcel when 8 KB selected cells of one selected full WL are within it.

Associated with the Step 801, a preferred set of bias conditions in accordance with HiNAND2 array circuit 200 shown in FIG. 1A is listed below:

a) TIE=DIVen=CSL=SEGo=SEGe=0V:
  TIE=0V is to shut off NMOS transistor MLBLb so that only one 8 KB CACHEcel out of two jointed CACHEs is selected for LBL precharging to save power.
  SEGo=SEGe=0V are to prevent one paired 4 KB Odd and 4 KB Even $C_{LBL}$ from leakage to one shared corresponding 4 KB metal2 GBLs.
  CSL=0V is a regular setup for a normal NAND string Read operation.
b) PREo=PREe=H1:
  This is to turn on both MLBLso and MLBLse transistors so that Segment power supply of Vinh can be coupled from selected LBLps lines to the selected 8 KB CACHEcel's $C_{LBL}$ capacitors.
c) LBLps=Vinh is supplied by a central Vinh MHV pump circuit (not shown).
  The m 8 KB CACHEcel's Odd and Even $C_{LBL}$ precharge-time is controlled by on-chip State-machine design.
  The m 8 KB CACHEcel precharge-time is controlled by a self-timed LBLps Vinh Detector circuit. This is done by using one shared LBLps line as a Vinh supply line as well as a Vinh sensing line. The Vinh supply line comes from one end of LBLps line connected to Vinh Driver but Vinh Detector operates at another end of LBLps line. Once the LBLps line reaching Vinh, it means m 8 KB $C_{LBL}$ capacitors in CACHEcel are full with Vinh so that the Vinh Detector will issue a signal to on-chip State-machine to stop Vinh precharge operation. This Vinh precharge time thus can be very accurately and automatically controlled.

Step 802: this step is to determine if the 64XTs+1SSLp+1GSLp bus lines are free from being occupied for any concurrent NAND operation. If No, the flow will be idle and wait their status change. If Yes, the flow moves to next step 803.

Step 803: In addition to m 8 KB CACHE $C_{LBL}$ concurrent precharging, each selected Block's WL precharging of one selected WL, 63 unselected WLs, one SSL, and one GSL can be executed at the same time respectively with Vtamin, Vread, Vdd, and Vss. One self-timed Vread Detector (FIG. 9B) at end of one dummy WL automatically and accurately controls each WL-precharge period. The reason to detect Vread only for one NAND Block comprising one set of outputs of 64 WLs, one SSL, and one GSL is because Vread is the highest and slowest-charged WL voltage during Read operation. Once the Vread voltage reaches to the set level with some margin time in dummy WL, then it indicates all selected set of 64 WLs, one SSL, and one GSL in each of m selected Blocks have reached to the desired Vread, Vtamin, and Vdd voltages respectively. The dummy-WL Detector will generate a signal to initiate a 2-step WL, SSL, and GSL voltage-latching process once the Vread is detected. Right after a self-timed CACHEL $C_{LBL}$ discharging step automatic control is started to reduce string stress.

For the precharging of m sets of one selected WLs, 63 unselected WLs, 1 SSL, and 1 GSL lines in Block-mode SLC Read, it can be performed on block-by-block basis at a same or different timelines to save the WL precharge time after receiving confirmation of no usage of targeted XTs specified in the Step 802. The WLs and $C_{LBL}$ precharging operations can be carried out almost simultaneously in Steps of 801 and 803. The desired WL-related bias voltages are listed below:
a) Selected-WL (m selected WLs in m selected Blocks): $V_{s-SL}$=Vtamin=0V.

b) The reason to use Vtamin for a SLC Read WL Verify-voltage is because 2-Vt SLC has a wide ΔVt gap between Vtamax and Vtbmin. Actually, any SLC Read voltage on m selected WLs can be any value between Vtamin to Vtamax. But Vtamin value is more preferred due to the consideration of balanced ΔVt margin between E-state and B'-state of a 2-Vt SLC cell.
c) Unselected-WL (m unselected 63-WLs in m selected blocks): $V_{uns-WL}$=Vread=6V.
d) SSL (m unselected SSL lines in m selected Blocks): $V_{SSL}$=Vdd.
e) GSL (m unselected GSL lines in m selected Blocks): $V_{GSL}$=0V.

Note, Step 803 is carried out only after receiving confirmation in Step 802 that the targeted Read Block has not been selected for other m-page concurrent operation. In addition, each initiation of precharging 64 WLs, 1 SSL, and 1 GSL of any one of m selected Blocks is carried by pre-designed command but the precharging time is accurately controlled by dummy-WL Detector. Note, precharging of 64WLs+1SSL+1GSL of m random Blocks is carried out on block-by-block basis. If all m Blocks have same locations of the selected WL in m NAND Blocks, then the precharging of m-page WLs can be performed in 1-cycle. Otherwise, m random page Read operations need m precharging cycles to set m separate sets of 64WLs+1SS+1GSL to the desired voltage levels. In conclusion, in Step 803, only one selected Block's 64WLs+1SSL+1GSL are precharged.

Step 804: This step discloses a self-timed WL voltage latching operation for one of m selected sets of 64 WLs, 1 SSL, and 1 GSL of m selected NAND Blocks during the predetermined interval of cell-state evaluation stage in m-page SLC Read operation according to an embodiment of the present invention.

In conventional NAND spec, there is no such spec of WL-precharge time. The precharge time is included in total SLC Read time spec of 25 µs that covers several sub-steps including initial 1.0V BL precharge, then 6V Vread and VR WL precharge and lastly the BL discharge during cell-state evaluation. In other words, there is no need of any accurate control method over one single-WL precharge time because there is only single-WL SLC Read operation. All the single-page Read operation of one simple task can be easily controlled by an on-chip State-machine design.

But when it comes to the m-page SLC Read, m independent SLC page Read operations are started and ended at m different timelines with same time duration for each page of SLC Read operation, it is preferred to have a more accurate, self-timed control of a more efficient Read cycle time for each independent WL or page. Once each WL is started the precharging operation at a different timeline, the dummy WL Vread Detector will automatically end the precharging of a selected WL in each of m selected pages at a different timeline.

In order to achieve more accurate and secure WL precharged voltage and time control for each independent sets of 64 WLs, SSL, and GSL, this invention uses three dummy WLs with exactly identical layout and length of a regular WL but only the middle dummy WL is used for this WL-precharge delay tracking purpose. The reason to have two extra adjacent un-used dummy WLs is to ensure same parasitic inter-WL capacitance are counted into the precharge-time calculation.

In an embodiment, the Vread Detector is made of one 2-input Differential Amplifier (DA), to be shown in FIG. 9B. One input of DA is connected to the end of this middle dummy WL and the other input is connected to Vread that is generated from Vref generator. This novel Vref circuit can generate varied reference voltages such as Vpgm, Vpass, Vread, and VRn for respective highest WL voltages in respective Program, Program-Verify, and Read operations. The highest WL voltage would be take longest precharge time. Thus, once the highest WL voltage for a particular WL operation is precharged, it is meant all other selected 63 WLs, 1 SSL, and 1 GSL have been well precharged at the desired voltage level.

For this m-page SLC Read operation, the highest WL voltage is Vread applied on 63 unselected WLs per one of m selected Blocks. Thereby, a Vread-$\Delta$V voltage is switched on to connect to one end of above said Vread WL Detector. Upon the detection of a full-precharged WL voltage of Vread that is higher than the Vread-$\Delta$V voltage, then DA's output will issue a signal to one correspondingly selected SLC page Address of one of the m selected Blocks to latch the well-precharged voltages of 64 WLs, 1 SSL, and 1 GSL lines concurrently on those parasitic WL capacitors with extra 100 ns-500 ns margin delay to final precharged WL to reach Vread when $\Delta$V is set to be 0.5V. Upon the latching moment, a self-timed LBL-discharge operation is immediately initiated in accordance with the LBL-discharge Detector circuit.

Step 805: This step is another self-timed operation of this preferred m-page SLC Read to perform Vinh discharging or retaining operations in accordance with one of m selected 8 KB CACHEcel $C_{LBL}$ cell patterns as well as Step 801 for all BL precharging. For saving Read time and WL Vread stress, one 4 KB Even and 4 KB Odd $C_{LBL}$ capacitors and cells are selected in each 8 KB CACHEcel register. It is like single-page All-BL Read operation. But in certain embodiments of the present invention, m All-BL Read operations will be eventually performed in a pipeline manner. One WL by one WL per Block is sequentially selected for SLC Read at different time line, thus one WL by one WL discharging and retaining of Vinh are performed here.

In order to control $C_{LBL}$ discharge time automatically and accurately, one VLBL Detector per one 8 KB CACHEcel capacitors is using one metal0 LBLps power line. It is like a conventional CAM's sense line but without taking extra array layout overhead and precharge power consumption, because each LBLps line has to be coupled to a Vinh Driver initially when it is selected for $C_{LBL}$ precharging in Step 801. In this VLBL Detector, we keep the precharged Vinh voltage after precharging for subsequent VLBL Detector operation without an extra precharge step again. Thus, the power consumption of VLBL detection can be saved.

The actual $C_{LBL}$ discharging operation of each selected Block starts whenever VR1, Vread, Vdd, and H1 precharge voltages are respectively higher than Vtemax and Vtamax of selected NAND cells and the Vts of string-select NMOS transistors MS and MG in one selected NAND string. Once the $V_{LBL}$ is detected at desired level such as 2.0V, then the VLBL Detector is responded to shut off the Detector function with some predetermined $\Delta$t delay to prevent the LBL leakage of Vinh-retained $C_{LBL}$ capacitors from $C_{LBL}$-discharged capacitors in same CACHEcel register as well as to ensure the discharged $C_{LBL}$ voltage nears 0V.

The final value of each $C_{LBL}$ bit voltage is determined by each NAND cells' state. If NAND cells are in E-state, then the corresponding $C_{LBL}$ Vinh voltage will be discharged to Vss, otherwise $C_{LBL}$ voltage would retain the initial Vinh voltage if those NAND cells are B'-state with Vtb'min>Vtamin. The desired bias WL voltages are listed below:

a) S-WL (m selected WLs in m selected Blocks): $V_{s\_WL}$=Vtamin b) Uns-WL (m unselected 63 WLs in m selected Blocks): $V_{uns\_WL}$=Vread=6V c) SSL (m unselected SSL line in m selected Blocks): $V_{SSL}$=Vdd d) GSL (m unselected GSL lines in m selected Blocks): $V_{GSL}$=H1 or Vdd.

A preferred set of bias conditions in J Groups is the same as shown below: a) TIE=DIVen=CSL=SEGe=SEGo=0V; b) PREe=PREo=0V and LBLps=0V. Note, $V_{GSL}$=Vread is to turn on NAND string to allow NAND cell current flow if E-state cells are detected.

Step 805 takes a shorter time to discharge m 8 KB $C_{LBL}$ capacitors from Vinh voltage to Vss=0 than conventional NAND BL discharge step due to same large resistance of each NAND cell string plus a long but a lighter $C_{LBL}$ capacitance. In certain embodiments of the present invention, although $C_{LBL}$ capacitor is precharged to a Vinh voltage higher than 1.0V used in prior art, each $C_{LBL}$ discharge time is still much faster than conventional $C_{BL}$ because the value of $C_{LBL}$=1/(L×J) $C_{BL}$, where L stands for L Segments per one Group and total J Groups per one plane. The $C_{LBL}$ is one local metal1 LBL capacitor, while $C_{BL}$ is one global metal1 conventional BL capacitor.

Note, although the first selected SLC Read operation is performed at ½-page 4 KB Even page but the discharge of B'-state evaluation is done in one full physical WL that contains both 4 KB Even page and 4 KB Odd page concurrently because of the WL sharing. In this manner, 2× faster SLC Read operation can be achieved because one of the key SLC Read bottleneck is the LBL discharge time.

Step 806: This step is to perform a self-timed 64-WLs concurrent discharge once the 8 KB $C_{LBL}$ discharge operation per one selected CACHEcel is complete in Step 805. The purpose of this step is to reduce m 63-WLs gates' Vread disturbance issue once m 8 KB SLC Read data are well developed and available at m 8 KB CACHE $C_{LBL}$ capacitors for sensing and amplification by each Multiplier and each SA. The preferred sets of bias conditions are listed below:

a) ENB=1, CLA=CLR=ENS=0, b) XT1~XT64=SSLp=GSLp=0V c) CLWL=one-shot pulse of Vdd.

The reason to set bias condition b) is because the discharges of WLs, SSL, and GSL have to go through XT1 to XT64, SSLp, and GSLp common vertical bus lines in accordance with the Block-decoder circuit shown in FIG. 2A with HXD node set to Vdd by the status of Block-decoder latch made of INV3 and INV4 in conjunction with the selected address stored in an Address Buffer and a self-timed control circuit (not shown).

In an embodiment, right after $C_{LBL}$ discharge step, HV Vread voltage is immediately discharged for non-selected 63 WLs in the selected Blocks for reducing Vinh WL stress in each SLC Read operation because there is no more Read for that selected SLC page. But in the subsequent MLC Read operation, right after the first MSB bit Read, no WL discharge is performed because there are two more subsequent Read operation of VR2 and VR3 are required to complete 3-Read MLC Read operation for saving WL charging power.

Step 807: Now, one of m 4 KB Even SLC page analog data developed in accordance with one of 4 KB Even NAND cells within one 4 KB Even CACHEcel $C_{LBL}$ capacitor would be sequentially sensed and amplified by both 4 KB corresponding Multipliers and SAs to perform 2-step analog amplifications and the final 4 KB Even SLC digital data would be stored in 4 KB SAs on 4 KB ½-page by ½-page basis due to the limitation of 4 KB metal2 GBL bus lines. Each readout SLC data bit of Qi=0/1 and QiB=1/0 at each SA is used to set each corresponding P/RB bit with same polarity if each corresponding stored charge voltage in CACHEcel=0V/Vinh in accordance with the DB circuit shown in FIG. 3 and the set of the following bias conditions:
  a) DIVen=SEGe (in CACHEcel)=H1,
    This is to connect the broken-GBL transistors MGBL to provide a way to connect each sensed but diluted $C_{LBL}$ voltage to each corresponding Multiplier via the charge sharing between with each corresponding GBL.
  b) TIE=CSL=SEGo=SEGe (in CACHEint)=0
    This is to shut off the leakage path through MLBLb with its gate tied to TIE between each paired CACHEcel and CACHEint $C_{LBL}$ capacitors so that the sensed analog cell signal at CACHEcel would not be diluted between paired CACHE $C_{LBL}$ capacitors.
  c) Voutp (high/low)=Vref+/−ΔV,
  d) T5=one reverse pulse of Vdd,
    T5 clock is used to do a second analog amplification after a first analog amplification done by Multiple and finally to latch the fully amplified digital cell data at SA.

Step 808: This step is to transfer 4 KB Even SLC page data stored in SA to 4 KB P/RB with a reversed polarity because each SLC E-state cell's analog LBL voltage is 0V but the digital logic data is "1" in definition. Conversely, each SLC B'-state cell's analog voltage is Vdd but in logic data is "0." Thus, the readout bit data from SA to P/RB has to be flipped before it is sent out to a Flash Controller via 8 I/Os.

The Di=0/1 in each P/RB if each corresponding Qi=1/0 in each SA. The preferred sets of bias conditions are listed below:
  a) IDAB=ENMLSB=0V, Above conditions because it is in SLC Read mode, not MLC mode.
  b) PGM=IDB=0V
    PGM=0V is because this is a Read mode, not Program-mode.
  c) IDC=WBK=one-shot pulse of Vdd with T5=1=Vdd.
The above conditions are to turn on paired NMOS transistor 19 gated by IDC and NMOS transistor 16 gated by WBK along with the NMOS transistor 18 gated by Qi and NMOS transistor 17 gated by QiB so that node of DiB=0 and Di=1.

Step 809: This step is then to check if 4 KB real CACHE registers are not occupied and available for receiving one 4 KB SLC Even page data in 4 KB P/RB. If the check result is Yes, then the transferring of 4 KB Even SLC page data from P/RB to CACHE in 1-cycle would be executed immediately and then RDY pin would, at Step 810, set to a Low value temporarily to inform off-chip Flash Controller. If the check result is No, then 4 KB Even SLC page data is looped to wait for the release of 4 KB real CACHE engaging in other operations.

Step 811: Before transferring 4 KB Even SLC bit data from 4 KB P/RB to 4 KB real CACHE, each CACHE latch bit has to be equalized first to be ½Vdd for each paired nodes of DIOi and DIOiB by a bias condition b) below. In other words, DIOi=DIOiB=½ Vdd with following bias conditions:
  a) RD=LD=0V,
  b) LAT=EQ=1=Vdd,
  c) All gates of Y-pass=0V to prevent the leakage to I/O pad.

Step 812: After equalizing, then the transferring can be executed on 4 KB basis in 1-cycle. If DIOi=0/1, then Di=1/0 with a reverse polarity as explained before with following biased conditions.
  a) WBK=IDC=IDAB=ENMLSB=0V,
  b) EQ=LD=PGM=IDB=0V,
  c) All Y-pass gate=0V,
  d) LAT=1 and RD=H1.

Step 813: This step is to latch 4 KB Even SLC page data in 4 KB P/RB data into 4 KB CACHE register (CR) with following bias conditions:
  a) WBK=IDC=IDAB=ENMLSB=0V,
  b) EQ=LD=PGM=IDB=0V,
  c) All Y-pass gate=0V,
  d) LAT=Falling edge and RD=H1 falling edge to latch the data in 4 KB CACHE.

Step 815: Upon the completion of each 4 KB SLC Even page data transferring from 4 KB P/RB to 4 KB CACHE, then 4 KB CACHE data is ready to be sequentially sent out to Flash controller via NAND's 8 I/Os. At this stage, the RDY pin is then reset to high (=1) to report the 4 KB Even SLC page data transferring is done.

Step 816: This step is to clock out each 4 KB SLC Even page data stored in 4 KB CACHE registers to Flash controller via 8 I/Os in unit of byte. Thus, 4 KB SLC Even page data would take 4K cycles.

Steps of 817 and 818: These two steps are to repeat the sensing, amplifications and transferring steps of 807 to 815 for the remaining 4 KB SLC Odd-page Read as above 4 KB Even SLC page data. As seen in Step 805, the 4 KB Odd SLC page data and 4 KB Even SLC page data are available on the same time of when same SLC-WL is coupled to the desired voltage level as explained above. Therefore, the 4 KB Odd SLC stored in 4 KB Odd CACHEcel $C_{LBL}$ capacitors can be sensed, then amplified and outputted through I/O sequentially from Step 805. Note, the arrows of flows show the steps of 816 and 817 can be executed on the same time and the steps of 818 and 819 can also be done concurrently.

At Step 819, if all m 8 KB pages of 4 KB Even and 4 KB Odd SLC data being sensed and sent out successfully, then the m-page concurrent SLC Read operation is completed at Step 821. Otherwise, the SLC Read operation is continued to next one of m selected pages at Step 820 and is jumped to Step 801, which is the initial step of this m-page SLC Read flow.

Subsequently, MLC MSB page data and LSB page data Read flows are provided according to certain embodiments of the present invention. Unlike m-page SLC Read flow where each physical page is to read only one logic page of SLC data from each physical SLC-WL, each physical page of MLC Read is to read two logic pages of MLC data such as MSB page and LSB page from each physical MLC-WL. For m-page 8 KB MLC Read operation, each page is divided into 8 KB MSB Block Read and 8 KB LSB Block Read. And each full 8 KB MLC MSB logic page is then further divided into two 4 KB sub-logic pages such as one 4 KB MLC Even MSB logic page and one 4 KB MLC Odd MSB logic page. In other words, each MLC physical NAND cell stored two logic bits such as MSB bit and LSB bit.

During this preferred m-page MLC MSB-bit Read operation, there are two cases to make each MSB Read bit data different. The first case, a) Flag cell=1. In this case, it means each accessed MLC cell only stores 2-Vt MSB bits. The LSB bit data is not programmed yet. Therefore, in this case, a m-page 2-Vt MLC MSB Read is identical to a m-page 2-Vt SLC Read as explained in FIG. 8C.

For example, each 2-Vt SLC Read is to distinguish the programmed B-state cell from the erased E-state cell in one 2-Vt physical SLC NAND cell. Similarly, each MLC MSB Read with Flag cell=1 is also to distinguish one programmed B'-state cell from one erased E-state cell in one 2-Vt physical pseudo-SLC NAND cell. In other words, each MLC physical cell is supposed to store 4 distinct states of one negative-Vt erase E-state, and three positive-Vt programmed A-state, B-state, and C-state but upon the time of MLC MSB Read, only 2-state is stored within each MLC physical cell. Thus, this 2-Vt MLC cell is termed as a pseudo-SLC cell. Each MLC MSB bit data divides each MLC cell into 2 Vt states such as E-state="1" and B'-state="0." It is like each SLC bit data divides each SLC cell into 2 Vt states such as E-state="1" and B-state="0." As a result, when Flag cell=1, MLC MSB Read=SLC Read. The only one difference is the Verify WL voltage.

Thereby, the m-page MLC MSB Read with Flag cell=1, in principle, the flows are same as last SLC Read flow shown in FIG. 8C except for the WL-Verify voltage. In SLC Block Read, a Vtamin on selected WL is used to differentiate B-state from E-state, while MLC MSB (pseudo SLC) Read, a preferred VR1 on selected WL is used instead to differentiate B'-state from E-state. The value of VR1 is less than Vtamin as specified in previous 4-Vt distribution chart shown in FIG. 4B for better noise margin because the ΔVt gap between E-state and B'-state in MLC MSB Vt distribution scheme is larger than the SLC Vt distribution scheme.

The second case, b) Flag cell=0. In this case, it means the accessed MLC cells in the selected MLC WLs have already stored both MSB bit ad LSB bit. Under this scenario, each MLC MSB bit Read with Flag=0 will be different from each MLC MSB bit Read with Flag=1. The former one with Flag=0 is to read one MLC MSB bit out from a real 4-Vt MLC cell that stores 2 bits. The latter one with Flag=1 is still to read out one MLC MSB bit and one MLC LSB bit from a pseudo 2-Vt MLC physical cell. The 8 KB MLC MSB bit has data either "0" or "1" but the second 8 KB MLC LSB bit data is all "fixed" to be "1."

In an embodiment of the present invention, 8 KB MLC MSB Read operation is divided into a Read of 4 KB Even MLC MSB logic page and a Read of 4 KB Odd MLC MSB logic page. Each 4 KB MLC MSB Read takes 4K cycles to be sequentially clocked out to Flash Controller via real CACHE and then 8 I/Os, regardless of Odd or Even MLC MSB logic page.

Conversely, each 4 KB MLC LSB Read cycle is subject to Flag cell data. Whenever Flag=1, all 4 KB MLC LSB Read clock cycle is "1", not "4K" cycles to save the time. It is done by issuing a one-shot RDY signal from Vdd to Vss to inform off-chip Flash controller. Once Flash controller sensed RDY one-shot signal, then the Flash Controller will encode which NAND chip issues the RDY signal. Each RDY signal is logically assigned with a different address in some Flash control system design. Then it is proposed that the Flash Controller will find out the NAND flash address and then to find out the instruction from a Flash Status Register. If the Status Register indicates that the current addressed MLC has no LSB data, then the Flash Controller will be aware of no need of further 4K−1 cycles to read out the remaining all "1" LSB data to save power and to free I/O interface bus lines. One cycle of MLC LSB of all "1" is good enough. The following flows of MLC MSB and SLB Read follow above predetermined schemes.

Note, the reason to use a lower value of VR1 to replace Vtamin for MLC MSB Read is because for a faster MLC Read that may need to do Read cycles using 3 different WL's voltages of VR1, VR2 and VR3 to distinguish a 4-Vt MLC cell if subsequent check with Flag=0. It is faster with fewer BL precharge steps if the selected WL voltage is gradually increased from the lowest VR1, then VR2, and VR3. Therefore, only one BL precharge step is required for 3 BL discharges at 3 Read WL voltages of VR1, VR2, and VR3.

As SLC-WL and MLC-WL defined previously, whenever a MLC cell is read, Flash Controller does not know whether the addressed MLC WL contains only MSB bit or both MSB and LSB bits. It relies on checking out the Flag cell physically located in the same MLC WL as 8 KB MSB bits. Therefore, it is better to start from VR1 Read to read a MLC cell as a first trial. At the same time, each Flag cell data is also read out from separate Flag cell's SA, P/RB, and real CACHE register in conjunction with 8 KB MSB bits. If Flag=1, it means that the addressed MLC WL has no LSB data but only MSB data being programmed. In that case, then the Read flow of MLC MSB (2-Vt only)=SLC (2-Vt) with Flag cell=1. Therefore this m-page MLC MSB Read follows the steps in accordance with m-page SLC/MLC MSB Read Methodology and flows with a condition of Flag cell=1 as shown in FIG. 8A.

On the contrary, if Flag cell=0, then it means the addressed MLC cell has already stored both MSB and LSB bits, e.g., 4-state. As a result, the Read MSB bit data has to be readjusted to get the accurate MSB data in accordance with the flow shown in FIG. 8B for m-page MLC MSB/LSB Page Read Methodology with a condition of Flag cell=0.

Figure 8E:
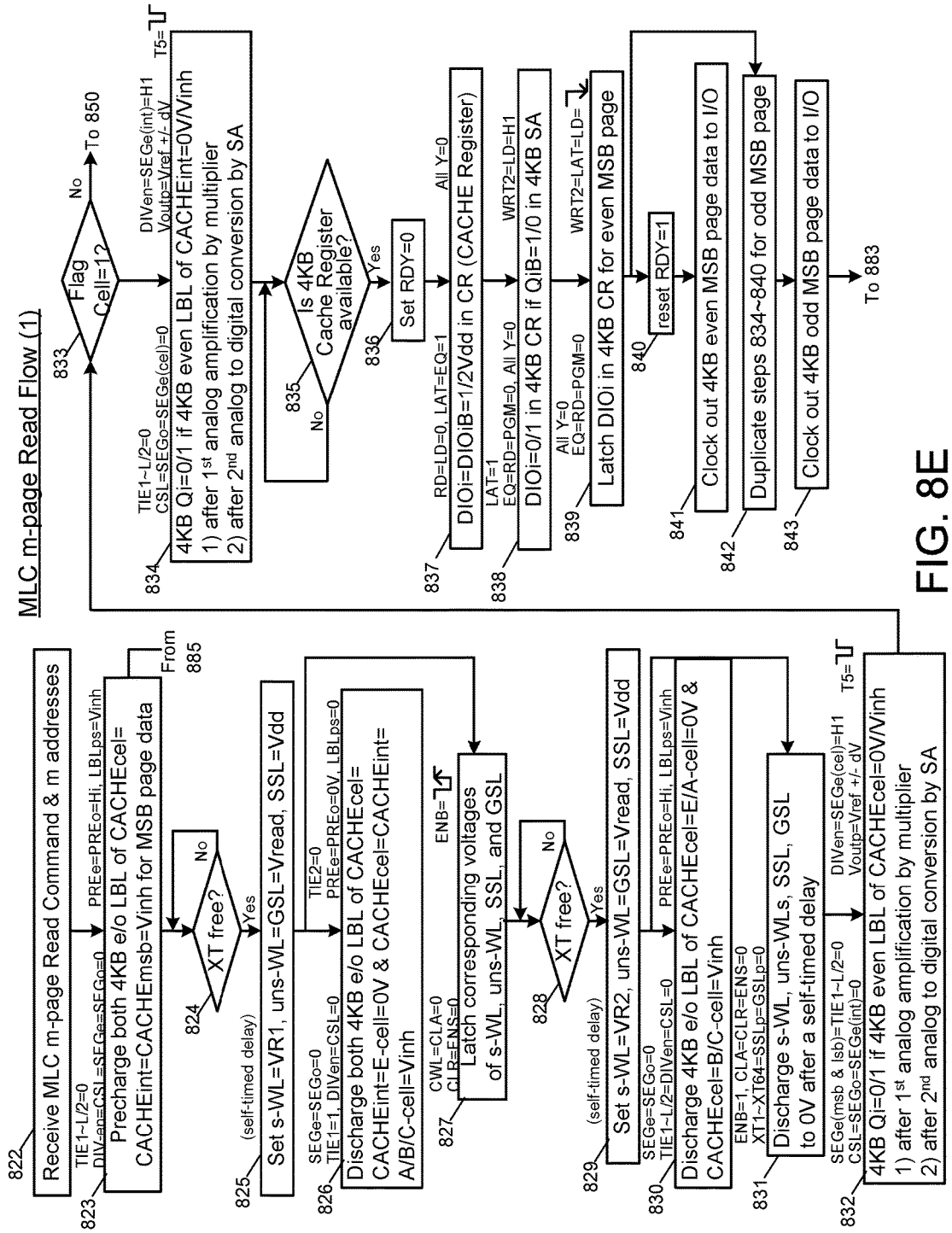

FIG. 8E is a flow chart showing a method for performing m-page MLC Read operation according to an embodiment of the present invention. The flow starts from receiving a MLC m-page Command and m selected page Addresses and ends with outputting m 4 KB MLC Even MSB and m 4 KB MLC Odd MSB page data to 8 I/Os on one-4 KB by one-4 KB basis per 1-cycle if a Flag cell=1 in each selected MLC-WL that indicates each MLC physical cell storing only LSB bit.

When a Flag cell=0 in each selected MLC-WL, then this flow shows the reading and outputting of both 8 KB logic MSB page data and 8 KB logic LSB page data that are stored in each of m selected MLC physical WLs or pages via reading, sensing and charge-sharing, sample- and hold and amplification in 8 KB $C_{LBL}$ lines and 4 KB $C_{GBL}$ lines.

In a specific embodiment, this is a first sub-flow of a preferred m-page MLC MSB Read flow that is based on Flag=1 status as explained above. Thereby, no LSB bit but only MSB bit is stored in the addressed MLC-WLs. Therefore, this sub-flow basically is identical to the m-page SLC Read operation for this m-page MLC MSB (pseudo-SLC) 2-Vt Read operation.

There are two differences in flow design between the previously shown 2-Vt SLC Read and the current 2-Vt MLC MSB Read. Firstly, the MSB Read involves up to two reads such as a first VR1 Read and a second VR2 Read if Flag=1 that indicates no SLB is programmed in the addressed MLC-WL. But prior SLC Read needs only one Vtamin read. Thus, only CACHEcel register is sufficient to store the page data. Secondly, both VR1 and VR2 data have to be kept in two 8 KB CACHE $C_{LBL}$ capacitors for subsequent MLC LSB bit-flipping operation throughout a whole MLC Read cycle. In prior 2-Vt SLC Read, only one 8 KB CACHEcel register is sufficient because no bit flipping steps are required to get accurate SLC page data. In contrast, this MLC Read cycle, three reads such as VR1, VR2, and VR3 are required. Thus 3× of temporary data have to be kept for bit-flipping operations. Thus more pseudo 8 KB CACHE registers are required. For this 4-Vt MLC Block Read, two CACHE registers such as CACHEcel and CACHEint are required. The MLC MSB 2-Vt Read uses VR1 but SLC 2-Vt Read uses Vtamin to distinguish E-state from others.

Referring to FIG. 8E, as SLC Read, this MLC MSB Read flow starts from Step 822 to sequentially receive, load, and decode a MLC Read Command and its associated m pages of Read Addresses in unit of byte via NAND's 8 I/Os from an off-chip Flash Controller into NAND's designated Command and Address Buffers (not shown). In addition, m latches of m selected Even and m selected Odd Segments and m Block-decoders are also set according to the m-page Addresses stored in m Address Buffers for concurrent m-page MLC MSB-only Read operation.

For example, the m-page MLC Read Command is loaded into the designated Command register so that this new MLC Command can be decoded and the associated MLC Read flows can be initiated immediately. Note, as defined previously, once the MSB Block Read Command is decoded, it always starts first from regular MLC MSB bit Read along with a Flag bit to second LSB Read. If Flag=1, the m-page MLC Read will only do the 8 KB MSB Read but no 8 KB LSB byte Read in array but 8 I/Os would be fixed with one byte of "FF" data to end one page of MLC Read operation. If Flag=0, then the m-page MLC Read will do both 8 KB MSB Read as well as 8 KB LSB Read.

Similarly, m-page Addresses are loaded into m designated on-chip Address Buffers in conjunction with other control circuits (not shown) to set the corresponding m Even and Odd Segment latches as shown in FIG. 2B and m Block latches as shown in FIG. 2A of the preferred HiNAND2 array (FIG. 1A).

Moreover, m addressed 8 KB MLC MSB page data are also divided into m 4 KB Even-page MLC MSB data and m 4 KB Odd-page MLC MSB data. These m pages of MLC data are selected concurrently by m Segment latches with m Block latches. Conventionally, only one MSB page Address in one selected NAND plane is allowed at a time, thus only one MLC page is specified in common NAND Read commend with no difference of SLC and MLC commands. But in embodiments of the present invention, the HiNAND2 array provides that m pages of MLC MSB addresses in every selected NAND plane are allowed. Thus a flexibility of up to m pages of addresses can be specified in this MLC MSB Read Command. Each of m MSB page Address arrangement is like single page address arrangement to begin with a unique start-code and followed by few bytes of column address first followed by few bytes of row address or vice versa. In an embodiment of the present invention, m MSB pages of Addresses can be loaded between start and end of m-page MLC MSB Read Commend due to that this is a m-page Read in HiNAND2 rather than a single page MLC MSB Read in conventional NAND.

Step 823: Similarly, this step is to perform a plurality of $C_{LBL}$ precharging operations. But unlike the SLC Block Read Step 801 which only precharge m 8 KB CACHEcel $C_{LBL}$ capacitors for one Read, this m-page MLC MSB Read needs to precharge m 8 KB pseudo CACHEcel $C_{LBL}$ capacitors and m 8 KB CACHEint $C_{LBL}$ capacitors with Vinh voltage (7V up to 10V) to separately store two different MSB page data at different temporary registers because each MLC MSB Read requires 2 Reads for more efficient operation. The reason of precharging to Vinh voltage was explained before and is omitted here. Note, each 8 KB $C_{LBL}$ precharging, it means both 4 KB Even and 4 KB Odd $C_{LBL}$ pseudo capacitors in one physical WL are concurrently precharged.

Due to more CACHEcel and CACHEint selections for m-page MLC MSB Read, the bias conditions are set different from m-page SLC Read operation. Associated with Step 823, a set of bias conditions in accordance with HiNAND2 array circuit shown in FIG. 1A such as:
   a) TIE=H1, DIVen=0V, CSL=0V, SEGo=SEGe=0V (two sets for two CACHEs) TIE=H1≥Vinh+Vt is to turn on MLBLb NMOS transistor between CACHEcel and CACHEint so that CACHEcel and CACHEint can be jointly precharged with Vinh via two different PREo and PREe transistors.
      SEGo=SEGe=0V of two Segments are to prevent two sets of one paired 4 KB Odd and 4 KB Even $C_{LBL}$ in CACHEcel and CACHEint from leakage to one commonly shared corresponding 4 KB metal2 GBLs.
      CSL=0V is a regular set up for a normal NAND string Read operation.
   b) PREo=PREe=H1 (two sets):
      Two sets of PREo and PREe are to turn on both two sets of MLBLso and MLBLse transistors so that Vinh can be coupled from one common selected LBLps line to two selected 8 KB $C_{LBL}$ capacitors of CACHEcel and CACHEint.
   c) LBLps=Vinh is supplied by a central Vinh MHV pump circuit.

The m 8 KB CACHEcel and m 8 KB CACHEint $C_{LBL}$ precharge-time is controlled by a self-timed LBLps Vinh Detector circuit. This is done by using one shared LBLps line as a Vinh supply line as well as a Vinh sensing line. The Vinh supply comes from one end LBLps connected to a Vinh Driver but Vinh Detector operates at another end of LBLps line. Once the LBLps line reaches Vinh, it means 2m 8 KB $C_{LBL}$ capacitors in both CACHEcel and CACHEint are full with Vinh so that Vinh Detector will issue a signal to on-chip State-machine to stop Vinh precharge operation. This Vinh precharge time thus can be very accurately and automatically controlled even for two CACHE precharging.

Step 824: Similarly, this decision step is to check if XT bus line is free for the remaining unfinished MLC MSB Read Segments. If these Segments are occupied by other concurrent operations, then this MSB Read will loop to wait. If not, then the unfinished Segment's pages are selected for next WL precharge step.

Step 825: Note, although two pseudo CAHCEs, CACHEcel and CACHEint, are selected for precharging and latching but only one set of 64WLs+1SSL+1GSL lines in CACHEcel are selected for concurrent precharging and latching with VR1 (1 selected WL), Vread (63 unselected WLs), Vdd (1 SSL) and Vss (1 GSL). The 64WLs+1SSL+1GSL lines in CACHEint are disabled by coupling to Vss.

The self-timed Vread Detector as previously explained in a SLC Read is also used to automatically and accurately control each WL-precharging and latching period with same reason explained before. Similarly, the dummy-WL Vread Detector will generate a signal to initiate a 2-step WLs, SSL, and GSL voltage latching process once Vread is detected. The desired WL related bias voltages are identical SLC's ones, thus it is omitted here for the description simplicity.

After latching VR1 and Vread, the common bus lines of 64 XTs and 1 SSLp and 1 GSLp are released for other possible concurrent m-page operations before next VR2 read. During the interval between VR1 and VR2 reads, there is about 5-10 μs available time to do other newly added concurrent reads or programs with a need to separately and independently precharge newly addressed WLs and BLs at different Segment Addresses. Note, the availability of 64 XT bus lines can be provided by XT Vpass or Vread Detector. It just need two XT Detectors as Vread Detector made of 2-input DA.

Step 826: This step again is also a self-timed $C_{LBL}$'s Vinh discharging and retaining operation in accordance with one of m selected 8 KB MLC MSB bit patterns within CACHEcel register as explained in previous Step 805 of m-page SLC Read operation.

For saving MSB Read time and WL stress at Vread, one 4 KB Even and 4 KB Odd cells within 8 KB CACHEcel are selected in accordance with that only one set of 64WLs+1SSL+1GSL lines is selected for precharging in CACHEcel. It is intended to perform similar single-page All-BL Read as in conventional NAND. But due to the preparation of two VR1 and VR2 reads for this MSB Read, both CACHEcel and CACHEint are either discharging or retaining Vinh at the same time by using TIE=H1 to connect them. In other words, the discharging operation only happens on CACHEcel capacitors but due to the full connection between CACHEcel and CACHEint via the selected MLBLb transistor in conduction state, the final voltage of each bit of CACHEint $C_{LBL}$ capacitors is equal to each corresponding bit of CACHEcel $C_{LBL}$ voltages.

Eventually this m-page MLC MSB Read will perform m All-BL Read in the manner of pipeline manner. One MLC-WL by one MLC-WL is sequentially selected for m-page MLC MSB Read at different time line, thus discharging and retaining of Vinh is done one MLC-WL by one MLC-WL here. In order to control $C_{LBL}$ discharge time of m-page MSB Read for both CACHEcel and CACHEint automatically and accurately, only one VLBL Detector is required with a similar bias conditions and final desired WL voltages: 64 WLs=SSL=GSL=0V after discharge. The preferred set of bias conditions is:

a) TIE=H1, This condition is to equalize the final $C_{LBL}$ voltages in both CACHEcel=CACHEint.

b) DIVen=CSL=SEGe=SEGo=0V to prevent no leakage to common GBLs.

c) PREe=PREo=0V and LBLps=0V. Since it is discharging step, the precharge transistors and Vinh power line of MLBLe and MLBLo have to be disconnected.

Again, Step 825 takes a shorter time to discharge m 8 KB $C_{LBL}$ capacitors from Vinh to Vss than prior-art due to the Segment $C_{LBL}$ of both CACHEcel and CACHEint are identical and short with a lighter value of $C_{LBL}$, which is $C_{LBL}=2/(L\times J) C_{BL}$, of the conventional long BL. Note, factor 2 is due to that two $C_{LBL}$ capacitance needs to be discharged which is 2-fold of SLC Read discharge because only one $C_{LBL}$ capacitance needs to be discharged.

Note, although the first selected MLC MSB Read is ½-page 4 KB Even MSB page but the discharge of LBLs is done in one full physical MLC-WL that contains both 4 KB Even and 4 KB Odd pages concurrently because sharing the same MCL-WL. In this manner, 2× MSB Read can be achieved because one of the key MSB Read bottleneck is the LBL discharge time.

In conclusion, after this step, both CACHEcel and CACHEint storing the same 4 KB Even and 4 KB Odd Vinh/Vss analog pattern in accordance with 8 KB stored MSB data in each physical MLC-WL. After VR1 first Read, the voltages of all selected 64WLs+1SSL+1GSL lines are kept without being discharged so that the next VR2 Read becomes quicker and less power consumption without a need to precharge same 64 WLs and 1 SSL and 1 GSL again as explained in Step 827 below.

Step 827: This step is to perform a LSB VR2 Read (equivalent to MSB Read) following the LSB VR1 Read for the same m selected MLC-WLs. But because no discharge on those selected 64 WLs and SSL and GSL lines in VR1 Read, thus precharge only needs to do one selected WL per one 64-WL Block. Each selected WL VR1 voltage stored in VR1 Read is replaced by VR2 voltage in this LSB VR2 Read operation. This step has to do one 64-WL Block by one 64-WL Block basis. For m-page MLC LSB VR2 Read, then totally, it needs to do m times of VR2. The VR2 precharge step comprises four sub-steps as listed in the following Table 7.

TABLE 7

VR2 precharge for m-page MLC LSB Read

| WLs, SSL and GSL Trapped voltages under HXD = 0 V & VR1 Read | Keep HXD = 0 V But new set of voltages are applied to 64 XTs, 1SSLp & 1GSLp | Voltages setting under HXD ≥ Vread + Vt to connect 64WLs, 1SSL and 1GSL to 64XTs, 1SSLp & 1GSLp | 64 WLs, 1SSL and 1GSL voltages latching under HXD = 0 V |
|---|---|---|---|
| WL(sel) = VR1 63 WLs(un-sel) = Vread SSL = Vdd Vread | XT(sel) = VR2 63 XT(un-sel) = Vread SSLp = Vdd GSLp = Vread | WL(sel) = VR2 63 WLs(un-sel) = Vread SSL = Vdd GSL = Vread | WL(sel) = VR2 63 WLs(un-sel) = Vread SSL = Vdd GSL = Vread |

The above voltage latching is done by a self-timed Vread Detector's instruction.

Step 828: Similarly, this decision step is to check if XT bus line is free for the remaining unfinished MLC MSB Read Segments. If these Segments are occupied by other concurrent operations, then this MSB Read will be idle to wait. If not, then the unfinished Segment's pages are selected for next WL precharge step.

Step 829: Note, although two pseudo CAHCEs, CACHEcel and CACHEint, are selected for precharging and latching but only one set of 64WLs+1SSL+1GSL lines in CACHEcel are selected for concurrent precharging and latching with VR2 (1 selected WL), Vread (63 unselected WLs), Vdd (1 SSL) and Vss (1 GSL). The 64WLs+1SSL+1GSL lines in CACHEint are disabled by coupling to Vss.

Step 830: This is the second self-timed $C_{LBL}$'s Vinh discharging and retaining operations under VR2 setting of MSB Read in accordance with one of m selected 8 KB MLC MSB bit patterns within CACHEcel register as explained in previous Step 826 of same flow of m-page MLC MSB Read under different biased condition to ensure the previous 8 KB VR1 MSB page data stored in 8 KB CACHEint are not destroyed by this second VR2 Read. This is done by applying the new set of bias conditions shown below:

a) TIE=0V.

This condition is to disconnect CACHEcel from CACHEint. As a result, the last 8 KB VR1 bit values are stored in 8 KB CACHEint but the new 8 KB VR2 bit values are separately stored in CACHEcel.
b) DIVen=CSL=SEGe=SEGo=0V to prevent no leakage to common GBLs.
c) PREe=PREo=0V and LBLps=0V.
Since it is discharging step, the precharge transistors and Vinh power line of MLBLe and MLBLo of both CACHEcel and CACHEint have to be shut off.

Again, VR2 Read Step 830 takes one-half time to discharge m 8 KB $C_{LBL}$ from Vinh to Vss in CACHEcel of VR1 Read in Step 826 because only one $C_{LBL}$ capacitance in CACHEcel to be discharged. In other words, the VR2 discharge time is 2-fold faster of VR1 discharge time. Similarly, a VLBL Detector in LBLps line can also be used to automatically and accurately control the VR2 discharge time as explained in VR1 Read. Thus the detailed VR2 time control is omitted here for description brevity.

In conclusion, after this step, the following voltages are latched by a self-timed VLBL Detector's instruction:
a) CACHEcel=MSB data under VR2 in accordance with E/A-cell=0B, but B/C-cell=Vinh,
b) CACHEint=MSB data under VR1 in accordance with E-cell=0B, but A/B/C-cell=Vinh,
c) All 64 WLs=SSL=GSL=0V.

Step 831: This step is to discharge the set of voltages of selected WLs, unselected WLs, SSLs and GSLs of m selected blocks after the completion of VR2 concurrent MSB read operation by a self-timed duration by setting the following bias conditions.
a) ENB=1=Vdd,
b) CLA=CLR=ENS=0V,
c) XT1 to XT64=SSLp=GSLp=0V Step 832: This step uses the 4 KB Multiplier perform a first analog amplification of 4 KB Even LBL sensed voltages read from the corresponding 4 KB Even CACHEcel and uses 4 KB corresponding SA to perform a second analog to digital amplification. The resultant 4 KB amplified data are stored in 4 KB SAs in accordance with the sensed data via GBL/LBL charge-sharing operation. For example, the amplified bit data is Qi=0/1, when the corresponding sensed voltages is 0V/Vinh before GBL/LBL charge-sharing solution.

Step 833: This step is the decision step to check the status of Flag cell. If Flag cell data is "0" not "1", which means the MLC-WL stores both LSB and MSB pages data. Then the step moves to Step 850. If Flag data is "0", which means MLC-WL only stores one MSB page data stored in 4 KB CACHEint under previous concurrent VR1 read. Then, it moves to Step 834.

Step 834: This step is like Step 832 but to read the SLC data from 4 KB CACHEint storing the VR1 read analog data in the voltage form of Vss/Vinh. Similarly, it also uses the 4 KB Multiplier perform the first analog amplification of 4 KB Even LBL sensed voltages read from the corresponding 4 KB Even CACHEcel and uses 4 KB corresponding SAs to perform the second analog to digital amplification. The resultant 4 KB amplified data are stored in 4 KB SAs in accordance with the sensed data via GBL/LBL charge-sharing operation. For example, the amplified bit data is Qi=0/1, when the corresponding sensed voltages is 0V/Vinh before GBL/LBL charge-sharing dilution.

Step 835: It is a decision step to check if 4 KB CACHE register is available to receive new data without data contention? If "No" is detected, then the flow waits. If "Yes" is detected, then the flow moves to Step 836 to set RDY=0V to inform off-chip Flash controller or Host the NAND is currently entering into a busy state which means any new data cannot be loaded into NAND's real CACHE register temporarily.

Step 837: The DIOi and DIOiB of each bit of CACHE register are pre-equalized to ½ VDD first before receiving the bit data from each corresponding SA bit by setting the following conditions:
a) RD=LD=Vss, but EQ=1=Vdd. As a result, DIOi=DIOiB=1/2Vdd for safer data transferring between each P/RB and CACHE bit.
b) All Y-pass gates=Vss to isolate all 4 KB CACHE from I/Os.

Step 838: The 4 KB SLC data in 4 KB SAs are then transferred to 4 KB corresponding CACHE simultaneously in 1-cycle by setting the following conditions to connect 4 KB SAs to 4 KB CACHEs via 4 KB NMOS devices of transistor 21.
a) LAT=1,
b) EQ=RD=PGM=Vss,
c) but WRT2=LAT=LD=H1,
d) All Y-pass gates=Vss to isolate all 4 KB CACHE from I/Os.
For example, CACHS's DIOi=0/1 when the corresponding SA's QiB=1/0.

Step 839: It is to shut off the connections between 4 KB SAs and 4 KB CACHE and latch the data in 4 KB CACHE by setting the following conditions:
a) EQ=RD=PGM=Vss,
b) WRT2=LAT=LD=Switching to Vss,
c) All Y-pass gates=Vss to isolate all 4 KB CACHE from I/Os.

Step 840: Before moving to Step 841 to start outputting 4 KB even MSB page data to I/Os, this step resets RDY=1 to inform the off-chip Flash Controller.

Step 841: This step starts to output 4 KB Even MSB page data to byte-wide I/O in unit of byte sequentially.

Step 842: While 4 KB Even MSG data being outputted at Step 841, the 4 KB Odd MSB data should be read out from 4 KB Odd CACHEint to 4 KB CACHE again via the identical steps of 834 to 840.

Step 843: This step starts to output 4 KB Odd MSB page data to byte-wide I/Os in unit of byte sequentially and then moves to Step 883 to check the next MSB page.

In another embodiment, m-page MLC Read operation includes an alternative flow as shown below. This is based on Flag=0 status that indicates the addressed MLC-WL cells do store 4-Vt with both MSB and LSB bits. Therefore, FIG. 8E flow continues to do a third VR3 Read with Even and Odd MSB data under VR2 read stored in the 8 KB CACHEmsb pseudo registers.

In order to read a 4-Vt MLC cell from MLC-WLs, total three reads of VR1, VR2, and VR3 are required to obtain both MSB bit and LSB bit whenever Flag=0 is detected. Once these three sets of 8 KB MLC data are obtained, then both MSB and LSB bit flipping operations can be done accordingly. After that, the 4 KB MLC Even and 4 KB Odd MSB and LSB data should be sequentially clocked out to the off-chip Flash microcontroller via HiNAND2's on-chip real 4 KB CACHE. Again, 4K cycles are needed to clock out respective Odd and Even LSB bits.

Figure 8F:
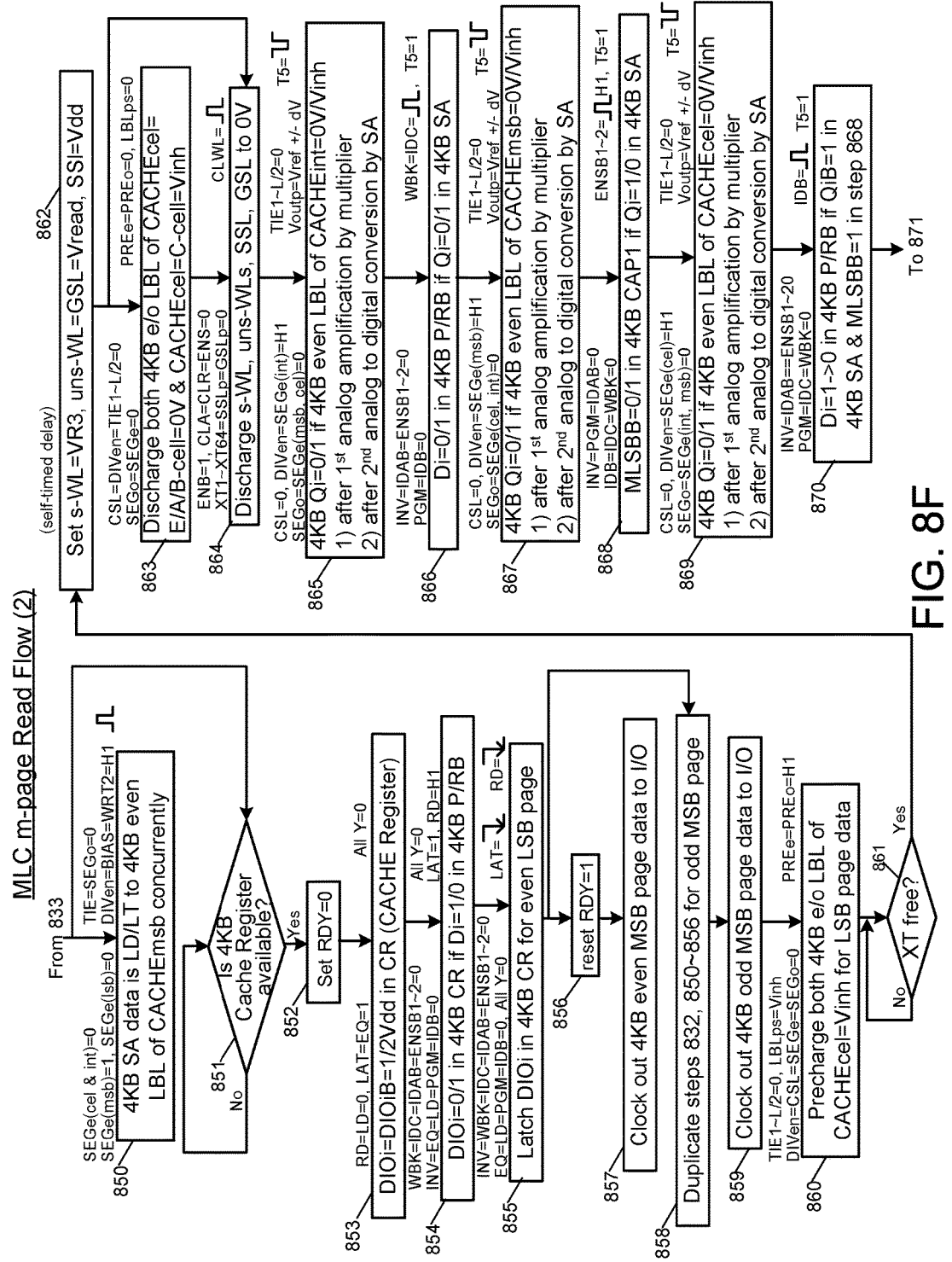
Figure 8G:
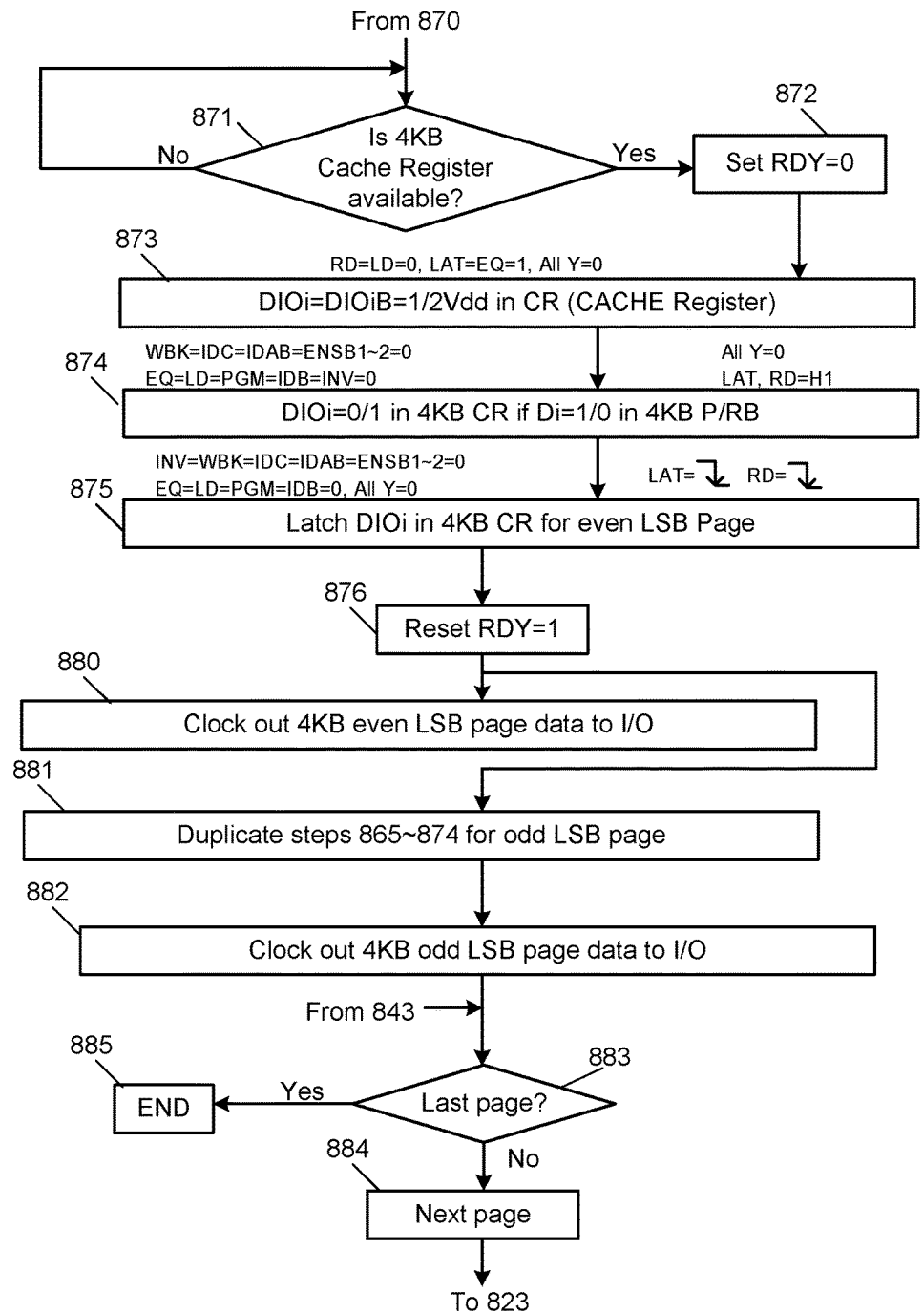

FIG. 8F is a flow chart showing a method for performing m-page MLC Read operation according to an alternative embodiment of the present invention. The steps of this flow mainly are to demonstrate how to read, sense and amplify the analog signals of m pages of Even and Odd 4-Vt MLC cells that store both MSB and LSB bits when a Flag cell=0 is detected and confirmed. Both MSB and LSB bit data of all m 8 KB pages are finally transferred from m selected 8 KB physical WLs in m 8 KB pseudo CACHEcel registers via 4 KB metal2 GBLs, then one 4 KB Multiplier, then one 4 KB SA, then lastly 4 KB real CACHE registers waiting for I/Os availability in next flow (FIG. 8G).

As shown in FIG. 8F, the method starts with Step 850 which continues Step 833 after finding Flag cell=0, thus it confirms each read physical MLC cell in MLC-WL indeed stores 4 Vts of both MSB bit and LSB bit. Thus, the concurrent MLC read has to be continued and the 4 KB Even MSB data is still needed for the subsequent logic operation for LSB concurrent read to obtain the correct data of B and C states before being sequentially clocked out to I/Os. As a result, the 4 KB Even MSB data stored in 4 KB SAs is loaded and latched back to the designated CACHEmsb at this step. This is something like DRAM's write-back operation. One difference is that before 4 KB even MSB writeback, the 4 KB even CACHEmsh has to be precharged with Vinh so that the next iterative MLC read, the signal is strong enough to sustain the CS effect.

The writeback bias conditions are summarized below:
a) SEGe (msb)=1=Vdd but SEGo (msb)=0V for CACHEmsb Segment only,
b) TIE=SEGo=0V,
c) DIVen=BIAS=WRT2=H1 one shot pulse.
  BIAS=H1 to turn on MN61,
  WRT2=H1 to turn on MN22,
  DIVen[1] to DIVen[J−1]=H1 to turn on all broken 4 KB metal2 J−1 MGBL transistors along the path of selected one of m 8 KB CACHEmsb to DB when m pages are distributed in J Groups.

These H1 conditions are to connect each SA's QiB digital Vdd/Vss data directly to each corresponding even CACHEmsb $C_{LBL}$ capacitor via each GBL with a reversed polarity without a voltage drop in accordance with the SA circuit shown in FIG. 3. The reason of reversing bit data is because the MSB bit data is readout from MSB cells that have an opposite polarity to MSB page data loaded from 8 I/Os.

Step 851: This decision step is to check if the on-chip 4 KB real CACHE are occupied by any other on-going concurrent operation? Note, this step can be performed simultaneously with Step 850 because no bus contention exists between SAs to CACHEmsb and real CACHE. If the Step 851 yields No, then Step 851 is looped to wait for the availability of 4 KB real CACHE. If the Step 851 yields Yes, then flows moves to Step 852 and one of 4 KB Even MSB page data are ready to be sequentially clocked out to I/Os from 4 KB P/RB via 4 KB real CACHE.

Step 852: HiNAND2 will issue a busy notice by pulling down RDY pin=Vss to allow the off-chip Host or Flash Controller to sequentially clock out each 4 KB Even MSB page data stored in 4 KB P/RB done in previous steps.

Step 853: Before taking 4 KB Even MSB data from 4 KB P/RB, m 4 KB real CACHE bit data are equalized first so that DIOi=DIOiB=½ Vdd in accordance with the following bias conditions:
a) RD=LD=0V and All Ypass=0V.
  This condition ensures the equalization of each pair of DIOi and DIOiB would not be affected by outputs of each P/RB and I/Os.
b) LAT=EQ=1=Vdd.
  To start performing DIOi and DIOiB equalization.

Step 854: This step is to transfer 4 KB Even MSB page digital data to 4 KB corresponding real CACHE registers by keeping the same polarity such as each DIOi=0/1 of each real CACHE if Di=1/0 in each corresponding P/RB bit with the following conditions:
a) WBK=IDAB=IDB=IDC=ENSB1=ENSB2=INV=RD=0V,
  To prevent each P/RB bit being wrongly set by four pull-down current paths below (referring to FIG. 3):
  Path1 at Di node: Transistor 16 (gate=WBK=0V) and Transistor 17,
  Path2 at Di node: Transistor 8 (gate=IDB=0V) and Transistor 9,
  Path3 at Di node: Transistor 26 (gate=INV=0V) and Transistor 27,
  Path4 at DiB node: Transistor 19 (gate=IDC=0V) and Transistor 18,
b) PGM=0V,
  To prevent each P/RB output node from each corresponding GBL because this is not a program step.
c) RDRD=LD=0V and All Ypass=0V
  Ypass=0V is to ensure the data transferring between each P/RB is not affected by 8 I/Os.

Step 855: This step is to latch and isolate 4 KB Even MSB page digital data in 4 KB real CACHE from 4 KB P/RB in accordance with the following added conditions: LAT=RD=Falling edge pulse.

Step 856: Once 4 KB Even MSB Data is ready at 4 KB real CACHE, then set RDY=1 to indicate 4 KB even MSB page data ready to be clocked out.

Step 857: The step shows the 4 KB Even MSB Data in 4 KB real CACHE is being sequentially clocked out via 8 I/Os by Flash Controller or Host. It will take 4K cycles, which a long lengthy time of around 40 μs if one-edge clock scheme is used with a 10 ns clock rate. During this step, the 4 KB Even MSB data clocking out only happens between 4 KB real CACHE and I/Os. All other internal buses such as GBL bus, XT bus, and DB are not affected so that they can be used for other concurrent operations.

Step 858: While sequentially clocking out the 4 KB Even MSB page data at 8 I/Os, this step is also concurrently conducting another 4 KB Odd MSB sensing, flipping and transferring to 4 KB P/RB via 4 KB GBLs lines because no bus contention issue. This can be done by repeating the steps of 832, 850-856.

Step 859: The step is to sequentially clock out the remaining 4 KB Odd MSB Data in 4 KB real CACHE to Flash Controller or Host via 8 I/Os. It will take same 4K cycles, which another long lengthy time of around 40 μs.

Now, after completion 8 KB MSB whole page read and outputting, the flow moves to Step 860 to repeat the same process of reading m MLC's LSB pages.

Step 860: After finishing the clocking out both 4 KB Even MSB and 4 KB Odd MSB page data to I/Os plus loading and latching back to 4 KB Even and 4 KB Odd MSB page to 8 KB CACHEmsb, this step continues to perform a preferred self-timed Vinh precharging only on m 8 KB CACHEcel $C_{LBL}$ capacitors preparing for the next 8 KB LSB B-state read and logic operations of 8 KB MLC cells. The preferred bias conditions are summarized below:
a) TIE1~TIEL/2=0V (L=4),
b) LBLps1=Vinh and PREe1=PREo1=H1 (for CACHEcel),
c) DIVen=CSL=0V, SEGe1=SEGo1=0V,
d) Other LBLps=PRE=PRE=0V (for CACHEint, CACHElsb, CACHEmsb).

This step is like the previous precharging steps, thus the details are omitted herein for description simplicity.

Step 861: Similarly, this decision step is to check if the common XT bus lines of 64WLs+1SSLp+1GSLp are occupied by any concurrent m-page operation. If XT bus lines are not free, it means XT bus lines are occupied. Then this check step is looped to wait for the completion. If XT bus lines are found free, then the next new 4 KB Even B-state LSB page Read can be started by moving to Step 862.

Step 862: One set of 64WLs+1SSL+1GSL lines in CACHEcel are selected for concurrent similar precharging and latching with VR3 (1 selected WL), Vread (63 unselected WLs), Vdd (1 SSL) and Vss (1 GSL). A self-timed Vread Detector as explained in a SLC Read is also used to automatically and accurately control each WL-precharging and latching period with same reason explained beforehand. Similarly, the dummy-WL Vread Detector will generate a signal to initiate a 2-step WL, SSL, and GSL voltage latching process once Vread is detected. The desired WL related bias voltages are identical to SLC's ones, thus it is omitted here for the description simplicity.

After latching the corresponding VR3 and Vread, then the common bus lines of 64XTs+1SSLp+1GSLp are released for other possible concurrent m-page operations and eliminate WL Vread stress for longevity of NAND cells.

Step 863: This novel step again is also a self-timed 8 KB $C_{LBL}$'s Vinh discharging and retaining operations in accordance with one of m selected 8 KB MLC cell's stored states. With selected WL=VR3, CACHEcel at Vinh is for C-cell, because Vtc>VR3, and CACHEcel at Vss for E-cell, A-cell, and B-cell, because Vtemax<Vtamax<Vtbmax<VR3. In this step, a LBLps Differential Amplifier is used and is connected to LBLps1 with Vref=1.0V per one Segment. The preferred bias conditions are listed below:
  a) CSL=DIVen=TIE1=TIE2=0V,
  b) SEGo1=SEGe1=0V,
  c) PREe1=PREo1=0V,
  d) LBLps1=0V,
  e) Others=0V.

Step 864: The self-timed concurrent discharge operation of m sets of 64WLs+1SSL+1GSL lines is initiated once one or more CACHEcel $C_{LBL}$ capacitors are fully discharged to 1.0V or retaining Vinh in accordance with 8 KB MLC cells' states. As explained before, the discharge detection voltage is set to be 1.0V by one LBLps DA per one Segment. The purpose of this step is to reduce m 64-WL gate Vread disturbance on m 8 KB MLC cells. The preferred sets of bias conditions are listed below:
  a) ENB=1, CLR=ENS=CLA=0,
  b) XT1~XT64=SSLp=GSLp=0V,
  c) CLWL=one-shot pulse of Vdd.

The reason to set condition b) above for XT bus lines is because the discharge of 64WLs+1SSL+1GSL lines have to go through the discharge of 64XTs+1SSLp+1GSLp common vertical bus lines in accordance with the Latch Flag status of Block-decoder circuit shown in FIG. 2A to set HXD node to Vdd. Each Flag latch includes two inverters INV3 and INV4 to work with the selected address stored in Address Buffer and self-timed control circuit (not shown).

Step 865: This step is to sense and amplify the 4 KB Even LSB C-state page data from 4 KB Even CACHEint to 4 KB SA via 4 KB Multipliers under Selected-WL=Vtamin with same polarity. In other words, SA's digital Qi=0/1 when each analog $C_{LBL}$=Vss/Vinh in CACHEint. As a result, Qi=0,1,1,1 for the corresponding states of E,A,B,C per each SA. The preferred bias conditions are listed below:
  a) CSL=0V,
  b) DIVen=SEGe2=H1 (CACHEint), SEGo2=0V,
  c) SEGe1=SEGe4=0V (CACHEcel and CACHEmsb),
  d) TIE1~TIEL/2=0V (L=4), T5=one shot Vdd,
  e) Voutp=Vref+/−AV.

Step 866: This step is to transfer the 4 KB Even LSB C-state page data from 4 KB SAs to 4 KB P/RB with the same polarity. In other words, each P/RB's digital Di=0/1 when each SA's digital Qi=0/1. As a result, each P/RB's Di=0,1,1,1 for the corresponding states of E,A,B,C as each SA. The preferred bias conditions are listed below:
  a) INV=IDB=IDAB=0V,
     INV=0V to block Di path to Vss via Transistor 26 (referring to FIG. 3),
     IDB=0V to block Di path to Vss via Transistor 8,
     IDAB=0V to block Di path to Vss via Transistor 6.
  b) IDC=WBK=One shot Vdd
     This is to enable one paired paths to Vss from Di and DiB when Qi=1.
  c) ENSB1=ENSB2=0V,
     Due to MLSB=MLSBB=X.
  d) PGM=0V,
     To ensure the output or P/RB at PBLP would not affect GBL.
  e) T5=1 to enable SA.

Step 867: This step is to sense and amplify the 4 KB Even MSB page data from 4 KB Even CACHEmsb to 4 KB SA via 4 KB Multipliers under Selected-WL=Vtbmin with same polarity. In other words, SA's digital Qi=0/1 when each analog $C_{LBL}$=Vss/Vinh in CACHEint. As a result, Qi=0,0,1,1 for the corresponding states of E,A,B,C per each SA. The preferred bias conditions are listed below:
  a) CSL=0V,
  b) DIVen=SEGe4=H1 (CACHEmsb), SEGo4=0V,
  c) SEGe1=SEGe2=0V (CACHEcel and CACHEint),
  d) TIE1~TIEL/2=0V (L=4), T5=one shot Vss,
  e) Voutp=Vref+/−AV.

Step 868: This step is to transfer the 4 KB Even MSB page data from 4 KB SAs to 4 KB CAP1 with same polarity. In other words, each P/RB's digital Di=0/1 when each SA's digital Qi=0/1. As a result, each P/RB's Di=0,1,1,1 for the corresponding states of E,A,B,C as each SA. The preferred bias conditions are listed below:
  a) INV=IDB=IDAB=0V,
     INV=0V to block Di path to Vss via Transistor 26,
     IDB=0V to block Di path to Vss via Transistor 8,
     IDAB=0V to block Di path to Vss via Transistor 6.
  b) IDC=WBK=One shot Vdd
     This is to enable one paired paths to Vss from Di and DiB when Qi=1.
  c) ENSB1=ENSB2=0V,
     Due to MLSB=MLSBB=X.
  d) PGM=0V,
     To ensure the output or P/RB at PBLP would not affect GBL.
  e) T5=1 to enable SA.

Step 869: This step is to sense and amplify the 4 KB Even C-state page data from 4 KB Even CACHEcel to 4 KB SA via 4 KB Multipliers under Selected-WL=Vtcmin with same polarity. In other words, SA's digital Qi=0/1 when each analog $C_{LBL}$=Vss/Vinh in CACHEint. As a result, Qi=0,0,0,1 for the corresponding states of E,A,B,C per each SA. The preferred bias conditions are listed below:
  a) CSL=0V,
  b) DIVen=SEGe1=H1 (CACHEcel), SEGo1=0V,
  c) SEGe2=SEGe4=0V (CACHEint and CACHEmsb),
  d) TIE1~TIEL/2=0V (L=4), T5=one shot Vss,
  e) Voutp=Vref+/−AV.

Step 870: This step is to do the bit flipping in accordance with the table shown in FIG. 8H and DB circuit shown in FIG. 3 and the following preferred bias conditions:
  a) INV=IDAB=0V,
    INV=0V to block Di path to Vss via Transistor 26,
    IDB=One shot to enable Di path to Vss via Transistor 8,
    IDAB=0V to block Di path to Vss via Transistor 6.
  b) IDC=WBK=One shot Vdd,
    This is to enable one paired paths to Vss from Di and DiB when Qi=1.
  c) ENSB1=ENSB2=0V, Due to MLSB=MLSBB=X.
  d) PGM=0V,
    To ensure the output or P/RB at PBLP would not affect GBL.
  e) T5=1 to enable SA.

More details of the bit flipping are given as: SA=C-state, thus Qi=0,0,0,1, thus QiB=1,1,1,0 respectively for E,A,B,C-states; CAP1=B-state, thus CAP1=0,0,1,1 for E,A,B,C-states; P/RB=A-state, thus Di=0,1,1,1 for E,A,B,C-states. When QiB AND CAP1=0,0,1,0 to flip P/RB, then only the third bit=1 from left to flip P/RB. As a result, P/RB=0,1,1,1 is converted to 0,1,0,1 as seen in FIG. 8H. In conclusion, after this step, whole three A, B, and C-state Block Reads of 4 KB MLC LSB page data operations are done and ready to be transferred to 4 KB real CACHE, and then 8 I/Os. The Read operation flow moves to Step 871 in FIG. 8G below.

FIG. 8G is a flow chart showing a method for performing m-page MLC Read operation according to an alternative embodiment of the present invention. As shown, this flow continues from the previous m-page 4-Vt MLC Read operation flow at Step 870. The top part shows the steps of synchronous outputting both 4 KB Even 4-Vt MLC LSB page data in 4K clock cycles and 4 KB Odd MLC LSB page data in another 4 KB clock cycles from 4 KB shared on-chip real CACHE to off-chip Flash controller via 8 I/Os under a condition of Flag cell=0. The bottom flow shows only 1-byte of 8 LSB bits of 1-byte 2-Vt MLC cells are set to be 1, e.g., LSB=1 representing all 4 KB LSB bits=1 because no LSB bit data is programmed into each MLC Even physical cell. In other words, each MLC cell has 2 Vts of MSB logic bit only, rather than 4 Vts containing both MSB and LSB logic bits.

Step 871: In previous Step 870, the desired 4 KB MLC LSB Even page data after A, B, and C-state Read and bit-flipping are stored at 4 KB P/RB and ready to be shifted to on-chip 4 KB real CACHE. As explained before, step 871 checks to see if 4 KB real CACHE is occupied and not freed by other existing operations besides this m-page MLC Read. If the check shows "Not free", then this step is looped to wait for the cleanup of 4 KB real CACHE. If the check shows "Yes it is free", then the flow moves to Step 872.

Step 872: As explained before, HiNAND2 will set RDY=0 to indicate it becomes BUSY to do the sequential transferring of 4 KB Even LSB page data from 4 KB P/RB to 4 KB real CACHE. The 4 KB real CACHE is now temporarily occupied.

Steps of 873, 874, 875, 876, and 880: These 5 steps are like previous Steps of 837, 838, 839, 840, and 841 depict the data transferring starts by equalizing each paired DIOi and DIOiB of each real CACHE bit by using LAT=EQ=1=Vdd, and then transferring is done by setting LAT=1=Vdd and RD=H1 and latching in CACHE is done by using the falling edge of signals of one-shot of both LAT and RD. Lastly, at Step 880, the 4 KB Even MLC LSB page data are clocked out sequentially in 4K cycles.

Next, Steps 881 and 882 are like Steps 842 and 843 to repeat the transferring and clocking out of the remaining 4 KB Odd MLC LSB pages. The details of these steps are omitted hereby for description brevity without limiting the scope of claims.

Step 883: There are two inputs into the Step 883. The first input is from Step 882. In this case, this decision step 883 checks if the last page of 8 KB MLC LSB being clocked out. If "Yes", then this preferred m-page 8 KB MLC LSB Read flow is ended at Step 885. Otherwise, the flow continues to repeat the remaining MLC LSB page Read as indicated by Step 884. The second input is from Step 843. In this case, this decision step 883 also checks if the last page of 8 KB MLC MSB Read is clocked out. If "Yes", then this preferred m-page 8 KB MLC MSB Read flow is ended at Step 885. Otherwise, the flow continues to repeat the remaining MLC MSB page Read.

Step 843: This step concludes as long as at least one page of MLC MSB or MLC LSB page data is not clocked out yet to I/Os, then this m-page MLC Read operation will be continued. Then, the flow moves to Step 823 which is to perform LBL precharge as to repeat the whole Even and Odd page LSB Read operations again for next remaining pages of this preferred m-page MLC Read. Later, the flow will come to Step 883 again until no more pages left for this preferred m-page MLC Read. Eventually, the flow will end at Step 885.

FIG. 8H is a table of MLC cell logic states for MLC Read operation of Even Page with Flag cell=0 according to an embodiment of the present invention. This table shows the detailed steps of a B'-state bit data adjustment. The each B'-cell adjustment is done in each corresponding P/RB by each the stored MSB and LSB logic values in each corresponding SA. Totally, 10 sub-steps of the logic values of "1" and "0" at SA and P/RB assigned for four interim MLC Vt states of E, A, B and C cells are summarized for a 4-Vt MLC program from beginning to the end. Specifically, the detailed sequences of bit-flipping steps are shown during this preferred m-page MLC Read operation of 4 KB Even Page. The same table can also be used as a guideline for MLC Read of 4 KB LSB Odd Page data.

As seen on top of Table, the bit-flipping of m-page MLC Read (regardless of Even and Odd LSB page) is preferably performed between the 4 KB SAs output pairs of Qi and QiB, the temporarily pseudo registers of CAP1, CAP2, and the corresponding 4 KB P/RBs with same or different sizes in accordance with the circuit shown in FIG. 3. Throughout the specification, we use same size of 4 KB SAs, CAP1, CAP2, and SAs and P/RBs for illustration purpose without any limiting of the scope of the claims.

All terminologies used for this Table and features of the m-page MLC Read operation are explained below:
  I. @SA: At each SA.
    It indicates what is each MLC cell's interim and final Read data for respective states of E, A, B1', B2' and C stored at each SA bit.
  II. @P/RB: At each P/RB.
    It indicates what is each MLC Read's interim and final bit data for respective states of E, A, B1', B2' and C stored at each P/RB.
  III. "X":
    It means "Don't-care" initial state that can store either "1" or "0".
  IV. The Vt distribution of four final states of E, A, B and C or 5 interim states of E,
    A, B1', B2' and C are defined in FIG. 4.
  V. Multiplier, SA and P/RB circuits are shown in FIG. 3.

VI. The HiNAND2 array circuit is shown in FIG. 1A.
VII. The scheme of MLC Even and Odd Block Read are same.
VIII. The bit flipping and logic operations are performed at each P/RB but controlled by each final data bit at SA and CAP1 and CAP2 (see FIG. 3).

Referring to FIG. 8H, a) Discharge E-state cell in each CACHEint (steps of 825 and 826 of FIG. 8E): This is a first step to sequentially read MLC cell's state from the lowest selected WL level of Vtamin within 4 KB pseudo CACHEcel. Only E-sate Vt at Vss, but A, B, C-state Vt at Vinh. This is referred as A-state Read. Then using TIE1=H1 to pass the discharge result from each CACHEcel to each CACHEint. After that, setting TIE1=Vss to latch A-state data at CACHEint. At this moment, the SA and P/RB are not loaded yet, thus data stored in both SA and P/RB are 'X' state.

b) Discharge E/A-state cell in each CACHEcel (steps of 829 and 830 of FIG. 8E): This is a second step to sequentially read MLC cell state from A-state to B-state by raising the selected WL voltage from Vtamin to Vtbmin within 4 KB pseudo CACHEcel only under TIE1=0V. As a result, only E=A=Vss, but B=C=Vinh. This is referred as B-state Read. At this moment, the SA and P/RB are still not being loaded yet, thus data stored in both SA and P/RB are 'X' state. The B-state read is same as MSB bit read. After this step, 4 KB MLC page data is loaded into 4 KB SA with same bit polarity.

c) Read (or restore) 4 KB Even MSB data from 4 KB SAs to I/Os via 4 KB real CACHE (steps of 832 of FIG. 8E and 851-856 of FIG. 8F): As a result, @4 KB SA=0011=E,A,B,C because Vtbmin>Vtamax>Vtemax but @4 KB P/RB=X because P/RB is not loaded with any new MLC page data yet. At this step, the 4 KB Even MSB page data can be clocked out sequentially by Flash Controller or Host.

d) Load and latch 4 KB MLC Even page from 4 KB SAs to 4 KB CACHEmsb (step 850 of FIG. 8F): This step loads and latches 4 KB MSB Even page data back to 4 KB Even CACHEmsb with same polarity but 4 KB P/RB are not affected yet. As a result, @SA=0011=E,A,B,C. but @4 KB P/RB=X=E,A,B,C.

e) Discharge E/A/B cell in each CACHEcel (steps of 863 and 864 of FIG. 8F): This is a third step to sequentially read MLC cell state from B-state to C-state by raising the selected WL voltage from Vtbmin to Vtcmin within 4 KB pseudo CACHEcel only under TIE1=0V. As a result, only E=A=B=Vss, but C=Vinh. This is referred as C-state Read. At this moment, the 4 KB C-state is temporarily stored in 4 KB Even CACHEcel. Both SA and P/RB are not affected by C-state read yet. As a result, thus data stored SA=B-state=0011=EABC and P/RB is still 'X' state.

f) Read (or restore) 4 KB A-state read data from 4 KB Even CACHEint to P/RB (steps of 865 and 866 of FIG. 8F): This step also transfers 4 KB SAs to 4 KB P/RB, i.e., 4 KB SA are duplicated to 4 KB P/RB. As a result, @4 KB SA=0111=E,A,B,C and @4 KB P/RB=0111.

g) Read (or restore) 4 KB B-state read data from 4 KB Even CACHEmsb to 4 KB SAs (steps of 865 and 866 of FIG. 8F): This step also transfers 4 KB reversed Even MSB page data to 4 KB SAs. As a result, @4 KB SA=1100=E, A,B,C but keeping @4 KB P/RB=0111.

f) Latch 4 KB Even B-state read data at 4 KB SAs to 4 KB CAP1 and CAP2 (Step 868 of FIG. 8F): This step is done by setting both ENSB1=ENSB2=Vdd to connect each SA's output Qi to each P/RB DiB input node=MLSB and another output QiB to another P/RB Di input node=MLSBB. This step does not affect the contents of both SA and PRB. As a result, @4 KB SA=1100=E,A,B,C but @4 KB P/RB=0111.

g) Flip B state cell in P/RB (Step 870 of FIG. 8F): As a result, @4 KB SA=0001=E,A,B,C but @4 KB P/RB=0101.

h) Read LSB data from P/RB to I/O via real CACHE (Step 870-876 & 880 of FIG. 8F): As a result, @4 KB SA=0001=E,A,B,C but @4 KB P/RB=0101. Because transferring 4 KB P/RB Even LSB page data to 8 I/Os does not affect the contents of both SAs and P/RBs at all. This 4 KB output clocking will take 4K lengthy cycles and after that the whole m-page MLC MSB and LSB Read are done.

FIG. 9A is a differential amplifier (DA) circuit diagram for generating, detecting, and latching a Vpgm voltage by setting Vref=Vpgm in Comparator with a full RC-delay tracking capability for the selected WL during a self-timed concurrent/pipeline multi-page Program operation according to an embodiment of the present invention. As shown, it is a Vpgm-DA (DA1) circuit comprised of 4 parts. The DA1 circuit has two inputs. One is connected to a dummy WL in the middle of 3-WL layout. The DA1 circuit further includes a Vref Generator for generating at least two voltages such as Vpgm for programming WL and Vpgm=1.0V for discharging WL voltages. Additionally, the DA1 circuit includes a 3-WL layout, wherein a middle WL is selected as a dummy WL for self-timed WL precharge-time control with an identical and tracking-distributed R and C of selected WL. In worst-case, each selected WL has one R which is one Poly resistor with a length of 8 KB cells and the C is one WL physical capacitance overlapping substrate associated with two adjacent WLs' parasitic capacitors. And that is why 3-WL layout in same length and the middle WL is preferably selected for a dummy WL that would track the worst-case RC delay of selected WL in real HiNAND2 array. Furthermore, the DA1 circuit includes a dummy-WL Vpgm generator (pump) circuit.

Referring to FIG. 9A, the DA1 circuit provides WL precharging when Program operation starts. During SLC Program operation, then Vpgm-DA would be enabled. Other operations such as Read and all Verify operations that require no Vpgm voltage. Thus Vpgm-DA is disabled.

Initially, the dummy WL is set to Vss. When Program is started, Vpgm-DA is enabled and "−" input node is set to Vpgm-ΔV, where ΔV<0.5V as a voltage margin. In some embodiments, ΔV can be 0V. Once program starts, then dummy WL is increased by Vpgm Pump circuit. Upon reaching above Vpgm, the Vpgm-DA would generate a voltage rising from Vss to Vdd to indicate that the Vpgm on the selected WLs are detected and established. The enabling EN signal is used to latch the voltages of 64WLs+1SSL+1GSL lines on parasitic capacitors of corresponding poly lines.

Further, the DA1 circuit provides WL discharging when Program is finished. The same Vpgm-DA can be used to perform automatic self-timed WL discharge control by setting Vref=1.0V. Typically, Vpgm is about 15V to 25V that takes long time up to a few μs to charge up. But for the WL discharging, the tracking of discharge time by detecting 1.0V on the selected WL is safe because it is a LV and it is approximately equal to the whole discharge time from 15V-25V to Vss.

Furthermore, the DA1 circuit provides initiation of each Iterative Program time, i.e., Tpgm for In-System Serial Programming (ISSP). Once the Vpgm voltage is reached and detected, then the formal Program starts. But usually, the whole averaged 1-state program time is around 250 μs. If it is split into 10 ISSP steps, each iterative Tpgm=25 μs. The Tpgm time can be made by an on-chip RC delay circuit using a MOS transistor for R (resistance) and using a HV MOS gate for C (capacitance). Tpgm=RC and is initiated when Vpgm is detected. A circuit of self-timed delay control with an EN input and an ENDIS output is just shown for illustration purpose only. There can be many different ways to make for those skilled in the art of IC design.

FIG. 9B is a differential amplifier (DA) circuit diagram for generating, detecting, and latching a Vpass voltage by setting Vref=Vpass in Comparator with a full RC-delay tracking capability for the selected WL during a self-timed concurrent/pipeline multi-page Read and Verify operations according to an embodiment of the present invention. As shown, it is a Vread-DA (DA2) circuit. This circuit is similar to Vpgm-DA circuit comprising four similar parts. The only difference between DA2 and DA1 is a Precharging detection voltage. For all Verify operations, the highest and slowest-charged voltage on each set of 64WLs+1SSL+1GSL lines is Vread, regardless of Read, Program-Verify or Erase-Verify operations. Thus Vread-DA can be used for all non-Program operations.

The reason to have this independently generated Vread voltage from Vpgm voltage is because embodiments of the present invention allow M-page concurrent operations. This means some selected pages can be in Program mode while some other selected pages may be in Program-Verify mode, becoming a scenario often existed for this HiNAND2 memory system with substantially high flexibility. Thus one Vpgm-DA cannot be shared by many concurrent operations and one independent Vpgm-DA and another independent Vread-DA are preferred, although the layouts of both circuits are identical. The details of Vread generation are similar to those for Vpgm generation.

FIG. 9C is a differential amplifier (DA) circuit diagram for generating, detecting, and latching a VLBLps up to Vinh voltage for self-timed concurrent/pipeline operations according to an embodiment of the present invention. As shown, it is a VLBL-DA or LBLps-DA (DA3) circuit. Unlike that Vpgm-DA and Vread-DA are used to detect a worst-case voltage of the selected WL charging and discharging, this VLBL-DA circuit is used to detect $C_{LBL}$ voltage charging and discharging in either 4 KB Odd $C_{LBL}$ capacitors, or 4 KB Even $C_{LBL}$ capacitors or both 8 KB metal $C_{LBL}$ capacitors as pseudo CACHEs. Note, N=4 KB in the descriptions within present specification. Since the $C_{LBL}$ charging or discharging is performed through each corresponding common LBLps line, thus two names of VLBL-DA or LBLps-DA are alternately used in the specification.

In an embodiment, the VLBL-DA circuit includes a differential amplifier (DA) circuit, a Vref generator circuit, and a sensing line gate array. The DA circuit is same as that in Vpgm-DA and Vread-DA circuit shown in FIG. 9A and FIG. 9B. The Vref generator circuit is also same as the corresponding part of the Vpgm-DA and Vread-DA circuit. The sensing line uses the existing LBLps line made by a metal0 layer in the HiNAND2 array. Thus there is no layout-overhead like above 3-WL Vpgm-DA and Vread-DA. Further, the sensing gate array also uses the existing Segment LBLps NMOS transistors MLBLse for respectively connecting Even LBLs and NMOS transistors MBLso for respectively connecting Odd LBLs as seen in FIG. 9C.

In a specific embodiment, the VLBL-DA provides a LBL precharging feature. Referring to FIG. 9C. During the pre-charging on 4 KB Odd or 4 KB $C_{LBL}$ lines, such as LBLe[1] to LBLe[N] and LBLo[1] to LBLo[N], Vref is set to Vinh. In an alternative embodiment, Vref=1.0V during the discharging of 4 KB Odd or 4 KB Even $C_{LBL}$ lines that will be reflected on LBLps line. In a worst-case scenario, there may be just one or a few $C_{LBL}$ capacitors discharged during m-page Read, Program-Verify, and Erase-Verify operations. Therefore, one setup of maximum allowed discharge time should be incorporated. The discharge time can be set less than 3 μs for this shorter metal1 LBL line.

During the precharging step, initially LBLps line is at 0V. When the precharging is initiated, the voltage of each selected LBLps line rises to Vinh (≥7V) in accordance with the following bias conditions: LBLps=Vinh while PREe≥Vinh+Vt if 4 KB Even $C_{LBL}$s are selected or PREo≥Vinh+Vt if 4 KB Odd $C_{LBL}$s are selected. The Vinh precharging current will flow from a LBLps voltage generator to the selected 4 KB $C_{LBL}$ capacitors through 4 KB MLBLse or MLBLso transistors. All nodes of LBL[1] to LBL[N] (regardless of odd or even LBLs) will be charged up as well as one common LBLps supply line or the sensing line. When all $C_{LBL}$ capacitors are charged to Vinh, that will make LBLps=Vinh as well. Thus, once VLBL-DA detects LBLps=Vinh, it means all 8 KB $C_{LBL}$s=Vinh. That is so-called $C_{LBL}$ detection voltage which is reflected in each common LBLps line.

During the discharging step, initially LBLps is at Vinh. When the discharging is initiated by one of VR1 to VR3 or Vtamin, Vtbmin or Vtcmin or Verase=0V, the dropping voltage of each selected $C_{LBL}$ will be decreased and reflected on corresponding LBLps line. In order to prevent that the leakage of discharging $C_{LBL}$ pulls down the un-selected $C_{LBL}$s, the VLBL-DA sensing line detection has to be designed in high-speed so that once LBLps line is pulled down to about 2V, the VLBL-DA can respond it to shut off the conductions of all transistors MLBLse and MLBLso to prevent further leakage between any adjacent LBL lines. This can be done by setting PREe=PREo=Vss once the dropping to 1.0V of $C_{LBL}$ is detected.

In an alternative embodiment, the present invention provides a method for randomly erasing one or more pages selected from multiple Blocks of the HiNAND2 memory array. Table 8 shows a preferred set of bias voltage conditions and selected WL number per Block for Erase. The bias voltage conditions are kept the same for selected WL and TPW and deep N-well as the prior-art NAND because same cell structure and channel FN-tunneling scheme are used.

TABLE 8

| Selected Block | Voltage | Number |
|---|---|---|
| WLs (randomly selected) | 0 V | X |
| WLs (randomly unelected) | Floating | Y |
| SSL | Floating | 1 |
| GSL | Floating | 1 |
| Triple P-well | 20 V | 1 |
| Deep N-well | 20 V | 1 |
| P-sub | 0 V | 1 | where X+Y=64 and X≥1, Y≥0 for a 64-cell String. X=number of selected WLs and Y=number of non-selected WLs. For example, only 10 random WLs in first selected Block and 8 random selected WLs in second selected Block are selected for the preferred Dispersed Block Erase, as seen in Table 9. A simple description of the inventive concept is shown below.

TABLE 9

An example with 18 random pages from two random Blocks selected for Erase

| Selected Block | Voltage | Number |
|---|---|---|
| WL1, WL5, WL7, WL8, WL9, WL15, WL20, WL31, WL40, WL60 (10 selected WLs in selected Block 1) | 0 V | X = 10 |
| WL2-4, WL6, WL10-14, WL16-19, WL21-30, WL41-59, WL61-64 (54 unselected WLs in selected Block 1) | Floating | Y = 54 |

TABLE 9-continued

An example with 18 random pages from two random Blocks selected for Erase

| Selected Block | Voltage | Number |
|---|---|---|
| SSL1 and GSL1 (In selected Block 1) | Floating | 2 |
| WL10, WL15, WL29, WL30, WL43, WL48, WL50, WL64 (8 selected WLs in selected Block 2) | 0 V | X = 8 |
| WL1-9, WL11-14, WL16-28, WL31-42, WL44-47, WL51-63 (56 unselected WLs in selected Block 2) | Floating | Y = 56 |
| SSL2 and GSL2 (Block 2) | Floating | 2 |
| WL1-WL64, and SSL and GSL (In other unselected erased Blocks) | Floating | X = 0, Y = 64 |
| Triple P-well | 20 V | 1 |
| Deep N-well | 20 V | 1 |
| P-sub | 0 V | 1 |

Where X + Y = 64 and X ≥ 1, Y ≥ 0 for a 64-cell String.

The above bias conditions are set and addressed in accordance with the circuit of Block-decoder shown in FIG. 2A and the corresponding row Addresses stored within on-chip Address Buffers which are omitted for simpler description. The set of each Block-Erase conditions are done on block-by-block basis. Once all Erase conditions are set and latched, then the Erase can be started as long as no other array operations are ongoing. Then, a 20V can be applied to the selected P-well and N-well of selected NAND planes. Then those cells in selected WLs=Vss will get erased but for those cells in the unselected WLs=Vdd-Vt (floating) would be also coupled up to 20V+Vdd-Vt=21V. Thus as prior art NAND, the unselected NAND cells' channel and gate voltage drop is only 1V, no Erase FN tunneling would happen. No Vt of those unselected NAND cells will be changed at all. The erase time of each iterative erase time pulse can be applied and then verified with a spec limit of total 2-5 ms will be automatically controlled by an on-chip timer as well known to those are skilled in NAND art.

In summary, the definition of a random page Erase of the present invention means one or more random pages or WLs in one or more NAND Blocks are simultaneously erased. Here, each physical Block is assumed to include 8 KB physical NAND cells in one physical WL or page.

In prior-art NAND, the minimum erase size is one Block that contains 8 KB BLs and 64 WLs provided a 64-cell NAND String. When a Block is selected for erasing, all 8 KB BLs, SSL and GSL lines are left floating but the selected 64 WLs are coupled to Vss and the common P-well is coupled to a HV Erase voltage of 20V. As a result, all 8 KB×64 cells in one selected Block would get erased simultaneously and their Vt would become lower≤−0.5V typically within 2-5 ms. The unselected WLs, SSL, and GSL lines in the unselected Blocks sharing the same P-well and N-well are left floating to avoid to be erased. Conversely, the Erase operation according to an embodiment of the present invention is to allow any arbitrary number of WLs or Pages to be selected for erasing. The selected number can be 1 to 64 per selected Block without any restriction of WL locations in each selected Block. Multiple random WLs in multiple Blocks can be selected for a concurrent Erase within the same erase time of 2-5 ms. This preferred Erase scheme is termed as Dispersed Logic Block-Erase. A novel 2-step Erase scheme of Dispersed Block-Erase to lock the erased gate voltages for multiple selected WL and non-selected WL is disclosed. This random Block-Erase scheme can be applied to any 2D and 3D NAND flash memory.

Lastly, the preferred Dispersed Erase size varies from the smallest size of one single physical WL to the biggest size of several Blocks, depending on the capability of on-chip Erase pump and erase-time spec. Even some random pages mixed some full Blocks can be selected for this preferred Dispersed Block-Erase operation. But for the best benefit in subsequent m-page concurrent SLC and MLC Program operation in saving highest Program time, one WL per one Block and one Block in one Segment in one or more Groups in one or more NAND planes is preferred. In above example of two Blocks with total 18 WLs selected for erasing, the subsequent m-page SLC and MLC Program can only be performed on two WLs for one selected WL in Block 1 and one selected WL in Block 2. Total 18 erased WLs cannot be performed a multi-page Program on 18 WLs simultaneously because these 18 WLs are not equally distributed in 18 dispersed Blocks in 18 dispersed Segments. Embodiments of the present invention disclose a Dispersed Block-Erase scheme with much improved flexibility in terms of erase size and erase WL number. It has almost no restriction at all. But for the seek of m-page concurrent SLC and MLC Program design benefit, a restriction to arrange m dispersed WLs in dispersed Segments for erase is needed.

In another embodiment, the present invention provides a method for performing random page(s) concurrent Erase-Verify operation. As mentioned previously, unlike prior-art NAND's Physical Erase-Verify, the random m page(s) concurrent Erase-Verify operation is an Erase-Verify operation conducted in dispersed logic Blocks, which is like a m-page concurrent SLC and MLC Read scheme described earlier. The major difference is that an Erase-Verify voltage for multiple selected WLs is 0V and bias voltages for unselected WLs are set to Vread, SSL set to Vdd and GSL set to Vread, where Vread>Vtcmax with 1.0V margin as explained in FIG. 4. All m erased pages are preferably performed Erase-Verify operation after a lengthy erase time collectively and concurrently to reduce the Erase-Verify time. In addition, an iterative Dispersed M-page Erase-Verify operation can be performed the same as the m-page Read and Program-Verify operation.

In above two selected Erase Blocks (see Table 9), the Erase-Verify conditions are set below:
1) Block 1:
 a) Selected WLs:
  WL1=WL5=WL7=WL8=WL9=WL15=WL20= WL31=WL40=WL60=Vss.
 b) Unselected WLs:
  WL2-4=WL6=WL10-14=WL16-19=WL21- 30=WL41-59=WL61-64=Vread=6V.
 c) $C_{LBL}$=Vinh (Precharged LBL voltage).
 d) SSL=Vdd but GSL=Vread.
2) Block 2:
 a) Selected WLs:
  WL10=WL15=WL29=WL30=WL43=WL48= WL50=WL64=Vss.
 b) Unselected WLs:
  WL1-9=WL11-14=WL16-28=WL31-42=WL44- 47=WL51-63=Vread=6V.
 c) $C_{LBL}$=Vinh (Precharged LBL voltage).
 d) SSL=Vdd but GSL=Vread When a $C_{LBL}$ capacitor voltage corresponding to the selected page is discharged from initial Vinh to 0V, it means all selected WL cells' Vte<−0.5V and Erase-Verify is passed with success. Otherwise, if the $C_{LBL}$ capacitor voltage remains at Vinh. Thus Erase-Verify fails and further Erase iteration is required. The Erase step will be continued and will only be stopped until the corresponding $C_{LBL}$ capacitor voltage drops to 0V. The above selected erase Blocks of Block 1 and Block 2 can be performed Erase-Verify on the same time.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A HiNAND2 memory chip with two-level bit line (BL) hierarchy array structure for random concurrent and pipeline NAND operations, the HiNAND2 memory chip comprising:

a plane of NAND cells formed on a common Triple-Pwell (TPW) region over a deep-Nwell region on a P-substrate, the plane comprising a first plurality of Groups arranged in column direction, each Group being associated with a first number of global bit lines (GBLs) arranged in the column direction as top-level metal lines and being separated from adjacent Groups by a row of Group-divided devices, each Group comprising a second plurality of Segments arranged in the column direction, each Segment being associated with a second number of local bit lines (LBLs) disposed as lower-level metal lines in parallel to the GBLs and being separated from adjacent Segments by a row of Segment-divided devices, each GBL being coupled to one or more LBLs respectively by one or more Segment-select transistors gated respectively with one or more segment-control SEG signals, the second number of LBLs being coupled to a common power line respectively through a row of Precharge/Discharge (P/D) transistors commonly gated by corresponding one of precharge-control PRE signals, each Segment comprising a third plurality of Blocks wherein each Block comprises the second number of Strings one-to-one parallelly coupled to the second number of LBLs and each String comprising M cells connected in series and capped by a top String-select transistor and a bottom String-select transistor, the top String-select transistor connecting its drain to one corresponding LBL, the bottom String-select transistor connecting its source to a common source line disposed in parallel to but not connected to the common power line, the second number of Strings in a Block forming M pages of cells respectively gated by M word lines (WLs) and all corresponding top String-select transistors are gated by a SSL line and all corresponding bottom String-select transistors are gated by a GSL line;

a data buffer configured to store the first number of bits of partial page SLC or MLC data received from external I/Os which are transferred and stored in selected second number of LBLs precharged locally with an inhibit voltage Vinh from the corresponding common power line in one more sequential cycles through the first number of GBLs;

a Segment-decoder configured with a latch to control one or more SEG signals for controlling connection between each GBL and one or more corresponding LBLs;

a Block-decoder configured with a latch to connect or disconnect a set of M+2 bus lines shared to m sets of M WLs, 1 SSL line, and 1 GSL line on one-set-per-Block basis, m being an integer equal to 1 or greater;

wherein m pages of cells being selected on one-page-per-Block basis from m Blocks selected on one-Block-per-Segment basis from the second plurality of Segments of one or more of the first plurality of Groups in the plane are configured to perform m-page all-BL concurrent operations of Erase, Program, Verify, or Read of mixed SLC and MLC data by executing LBL-precharge/discharge, WL-precharge/discharge in concurrent and pipeline manner with self-timed controls of transferring and latching an inhibit voltage Vinh precharged through the common power line per Segment to the LBLs and m sets of M WL voltages, 1 SSL voltage, and 1 GSL voltage through the set of M+2.

2. The HiNAND2 memory chip of claim 1 wherein the m-page all-BL concurrent operations includes concurrent Erase operation of arbitrary number m pages selected from arbitrary Blocks in one or more Segments in one or more Groups in the plane, mixed concurrent SLC and MLC all-BL Program operation of m pages selected from m Blocks in m Segments of one or more Groups, mixed concurrent SLC and MLC all-BL Program-Verify operation of m pages selected from m Blocks in m Segments of one or more Groups, concurrent all-BL Erase-Verify operation of m pages selected from m Blocks in m Segments of one or more Groups, and mixed concurrent SLC and MLC all-BL Read operation of m pages selected from m Blocks in m Segments of one or more Groups, mixed combination of concurrent SLC/MLC all-BL Program, Read, Program-Verify, Erase-Verify operations of m pages selected from m Blocks in m Segments of one or more Groups, in concurrent and pipeline manner.

3. The HiNAND2 memory chip of claim 1 wherein the WL voltages include a program voltage Vpgm of 15~25V, a pass voltage Vpass of 9~11V, and a read voltage $V_{READ}$ of 6-8V for various NAND operations.

4. The HiNAND2 memory chip of claim 3 wherein the m sets of M WL voltages, 1 SSL voltage, and 1 GSL voltage are subjected to self-timed controls on detection, precharge, discharge, and latching of specific voltage levels for performing m-page all-BL Program, Program-Verify, Erase-Verify, and Read operations in concurrent and pipeline manner.

5. The HiNAND2 memory chip of claim 1 wherein the second number is twice of the first number so that each GBL per Group is associated with two LBLs per Segment respectively coupled by a first Segment-select transistor gated by a segment-control SEGo signal for an odd-numbered LBL and a second Segment-select transistor gated by a segment-control SEGe signal for an even-numbered LBL.

6. The HiNAND2 memory chip of claim 5 wherein the SEGe signal and SEGo signal are independently set with bias conditions of setting the SEGe signal greater than the Vinh and the SEGo signal Vss to select the even-numbered LBLs of one selected Segment only for respectively charge-sharing with the corresponding first number of GBLs; setting the SEGo signal greater than the Vinh and the SEGe signal to Vss to select the odd-numbered LBLs of one selected Segment only for respectively charge-sharing with the corresponding first number of GBLs; setting both the SEGe signal and the SEGo signal to Vss for preventing any LBL-GBL charge-sharing operation.

7. The HiNAND2 memory chip of claim 1 wherein the second number is four times of the first number so that each GBL per Group is associated with four LBLs per Segment respectively coupled by a first Segment-select transistor gated by a segment-control SEGa signal for a first LBL, a second Segment-select transistor gated by a segment-control SEGb signal for a second LBL, a third Segment-select transistor gated by a segment-control SEGc signal for a third LBL, and a fourth Segment-select transistor gated by a segment-control SEGd signal for a fourth LBL, wherein each only one of the SEGa, SEGb, SEGc, and SEGd signals is set to be greater than Vinh for allow corresponding ¼ number of LBLs of one selected Segment to perform LBL-GBL charge-sharing with the corresponding first number of GBLs.

8. The HiNAND2 memory chip of claim 1 wherein each Group-divided device, each Segment-divided device, each Segment-select transistor, each P/D transistor, each top String-select device, and each bottom String-select device is a same type NMOS 1-poly medium-high-voltage (MHV) transistor.

9. The HiNAND2 memory chip of claim 1 wherein M is selected from 8, 16, 32, 64, 128 or other integer numbers depending on NAND design density.

10. The HiNAND2 memory chip of claim 1 wherein the second number is 65,536 for 8 KB Page size and configured to couple with the data buffer scaled down to 4 KB size or 2 KB size.

11. The HiNAND2 memory chip of claim 1 wherein the data buffer comprises three circuits with same bit length, including a Multiplier circuit per bit for a first amplification of a small analog cell signal to an multiplied analog signal, a latch-type Sense Amplifier (SA) circuit per bit for a second analog amplification of the multiplied analog signal and convert to a full digital signal, and a Program/Read buffer (P/RB) circuit per bit for temporarily storing 1-bit data.

12. The HiNAND2 memory chip of claim 11 wherein the data buffer comprises total number of bits equal to the first number of GBLs, the total number of bits in the data buffer being reduced by half if the second number of LBLs represented to a number of NAND cells in a page is twice of the first number of GBLs, the total number of bits being further scaled down to ¼ if the second number of LBLs is four times of the first number of GBLs.

13. The HiNAND2 memory chip of claim 11 wherein the P/RB circuit is configured to set "0" bit data to pass Vss voltage to channel of a program cell through each corresponding GBL and LBL and to set "1" bit data to pass Vdd voltage to channel of a program-inhibit cell through each corresponding GBL and LBL.

14. The HiNAND2 memory chip of claim 11 wherein the P/RB circuit comprises a pair of latch nodes as a first pair of storage nodes and a pair of gated capacitors as a second storage nodes so that an extra temporary storage bits are created to allow more flexible m-page all-BL concurrent MLC MSB and LSB Program-Verify and bit flipping logic operations.

15. The HiNAND2 memory chip of claim 11 wherein the Multiplier circuit comprises an input port receiving a first analog voltage coupled to every drain node of N+1 first transistors and an output port outputting a second analog voltage from a drain node of a first one of the N+1 first transistors, the Multiplier circuit further comprises N capacitors being respectively inserted between two drain nodes of two adjacent first transistors, the Multiplier circuit further comprises N second transistors being respectively coupled drain nodes of last N first transistors and ground, thereby outputting the second analog voltage equal to N-fold of the first analog voltage, where N is an integer $\geq 1$.

16. The HiNAND2 memory chip of claim 1 wherein the Segment-decoder comprises a three-input pre-decoder and n number of latch circuits and a local HV pump circuit with n SEGp inputs, a VHH input, and corresponding n outputs of n SEG signals respectively for selecting partial section of a Segment, and further comprises a plurality of control signals to respectively set and clear the n latch circuits and enable and disable the local HV pump circuit to determine a HXS node voltage for controlling voltage charging, latching, and discharging between the n SEGp inputs and corresponding n outputs connected to the n SEG signals per Segment for performing multi-page all-BL Program, Program-Verify, Erase-Verify, and Read operation.

17. The HiNAND2 memory chip of claim 16 wherein the Segment-decoder comprises a function to instantly set the HXS node to Vss by setting one ESB signal of the plurality control signals with one-shot pulse of Vdd for a preset duration when an unintentional Vdd power lose is detected, allowing the n SEG signals to be set to Vss so that inhibit voltage Vinh precharged to the LBLs can be immediately saved after unexpected power-down but can be reused to continue the operations after power back within a certain idle time.

18. The HiNAND2 memory chip of claim 1 wherein the Block-decoder comprises a latch circuit coupled with one pre-decoder with three address inputs and a local HV pump circuit with a set of M+2 bus lines, a VHH input, and corresponding M+2 outputs coupled to one set of M WLs, SSL, and GSL lines per Block, and further comprises a plurality of control signals to set and clear the latch circuit and enable and disable the local HV pump circuit to determine a HXD node voltage for controlling voltage charging, latching, and discharging between the M+2 bus lines and M+2 outputs connected to a set of M WLs, SSL, and GSL lines of a selected Block for m-page all-BL Program, Program-Verify, Erase-Verify, and Read operation.

19. The HiNAND2 memory chip of claim 18 wherein the HXD node is controlled to be a program voltage Vpgm ramped to 15~25V plus a cell threshold Vt margin during a SLC or MLC Program operation, or to be a read voltage of Vread of 6-8V plus a Vt margin during a SLC or MLC Read operation or a SLC or MLC Program-Verify operation or a SLC or MLC random-page Erase-Verify operation, or to be Vss for latching voltages for a set of M WLs, SSL, and GSL lines of a selected Block.

20. The HiNAND2 memory chip of claim 18 wherein the Block-decoder further comprises a function to immediately set the HXD node to Vss by setting an ENB signal of the plurality of control signals with one-shot pulse of Vdd for a preset duration when an unintentional Vdd power lose is detected, allowing the voltages of one set of M WLs, SSL, and GSL lines of the selected Block to be locked to continue last operation.

21. The HiNAND2 memory chip of claim 1 further comprising a physical CACHE Register made of a glue logic circuit associated with the data buffer for storing inputted page data of the first number bit length for performing m-page all-BL concurrent and pipeline operation.

22. The HiNAND2 memory chip of claim 1 wherein the second number of LBLs associated with a first/second/third/fourth Segment comprise the second number of metal parasitic capacitors serving as a first/second/third/fourth pseudo CACHE register with the second number of bits, the second Segment being paired with the first Segment by connecting a row of Segment-divided devices and the fourth Segment being paired with the third Segment by connecting another row of Segment-divided devices.

23. The HiNAND2 memory chip of claim 22 wherein either one of the first, the second, the third, and the fourth pseudo CACHE register is termed a CACHEcel using corresponding the second number of metal parasitic capacitors to temporarily store and latch current new SLC page data of the second number of bits whenever a selected page of a selected Block is in the corresponding one of the first, the second, the third, and the fourth Segment, another one of the four pseudo CACHE registers associated with another Segment paired with the Segment having the selected page is termed a CACHEint to temporarily store and latch last one or more partial page transient SLC data of the first number of bits for performing m-page concurrent and pipeline operation, one of remaining two pseudo CACHE registers is termed a CACHEmsb to temporarily store and latch last one or more partial page MLC MSB page data of the first number of bits, and last pseudo CACHE register is termed a CACHElsb to temporarily store and latch last one or more partial page MLC LSB data of the first number of bits for performing m-page all-BL concurrent and pipeline operation.

24. The HiNAND2 memory chip of claim 23 wherein the CACHEint is configured to be paired with the CACHEcel by residing respectively in a pair of Segments having each corresponding LBL connected by a Segment-divided device gated by a common TIE signal, wherein the TIE signal is set to be greater than Vinh for concurrently precharging the metal parasitic capacitors associated with the corresponding LBLs and is set to Vss for isolating each other to allow one pseudo CACHE to retain and latch the charges therein while the paired pseudo CACHE to discharge or perform LBL-GBL charge-sharing for m-page concurrent operation.

25. The HiNAND2 memory chip of claim 22 wherein each of the first/second/third/fourth pseudo CACHE register is configured to store and latch externally-loaded SLC, MLC MSB, and MLC LSB page data converted to Vinh/Vss pattern, internally-generated transient page data in Vinh/Vss pattern during MLC B'-adjustment before All-BL Program, internally-generated transient page data in Vinh/Vss pattern during MLC Program-Verify, internally-generated page data precharged Vinh; and internally-generated in Vinh/Vss pattern by Read operation.

26. The HiNAND2 memory chip of claim 1 wherein each GBL of a selected Group controllably connects one LBL of a selected Segment in the selected Group via one Segment-select transistor and further optionally connects to other GBLs depending on location of the selected Group relative to the data buffer by turning on corresponding Group-divided devices to provide a controllable DRAM-like charge-sharing scheme between a lower-level metal parasitic capacitor associated with the one LBL in the selected Segment of the selected Group and one or more top-level metal parasitic capacitors respectively associated with the selected Group and other connected Groups for performing each SLC or MLC random page Read or Program-Verify operation.

27. The HiNAND2 memory chip of claim 26 wherein each lower-level metal parasitic capacitor is charged up to the inhibit voltage Vinh locally from the common power line per Segment by turning on a corresponding P/D transistor and all the second number of LBLs are configured to have the corresponding lower-level metal parasitic capacitors being charged concurrently in one cycle from the common power line or partial number of the second number of LBLs are configured to have the corresponding lower-level metal parasitic capacitors being charged in multiple cycles from the common power line.

28. The HiNAND2 memory chip of claim 26 wherein the charge-sharing scheme includes ½ or ¼ of the second number of LBLs in one selected Segment connected with the corresponding the first number of GBLs by turning on corresponding one row of Segment-select transistors, depending on whether the second number is twice or four times of the first number, while rest of ½ or ¾ of the second number of LBLs being disconnected with the corresponding GBLs by turning off the remain one or three rows of Segment-select transistors to retain the inhibit voltage Vinh without charge-sharing but ready for subsequent charge-sharing operation.

29. The HiNAND2 memory chip of claim 26 wherein the inhibit voltage Vinh comprises a variable value ranging from Vdd for the selected Segment in a selected Group nearest to the data buffer to 10V for the selected Segment in a selected Group farthest to the data buffer to save LBL precharge power consumption, wherein the Vinh value is one between Vdd and 10V for the selected Segment in a selected Group between the nearest one and farthest one depending on how many number of Groups are connected from the selected Group to the data buffer.

30. The HiNAND2 memory chip of claim 1 wherein the plane comprises at least one hybrid Block having inter-leavely mixed pages for respectively storing SLC and MLC data for reducing MLC WL-WL coupling effect.

31. The HiNAND2 memory chip of claim 30 wherein the hybrid Block is configured to place all SLC WLs in odd-numbered WLs thereof and all MLC WLs in even-numbered WLs thereof.

32. The HiNAND2 memory chip of claim 1 wherein the first number of GBLs are top-level metal lines in parallel to the column direction characterized by a pitch size of 4 or 8 base units and a length of one Group size and the second number of LBLs are lower-level metal lines below the GBLs in parallel to the column direction characterized by a pitch size of 2 base units and a length of one Segment.

33. The HiNAND2 memory chip of claim 1 wherein each common power line per Segment and each common source line per Block are conductive lines made of metal or conductive polymer formed below the LBLs and perpendicular to the column direction.

34. The HiNAND2 memory chip of claim 5 wherein the common power line associated with a selected Segment is configured to receive the inhibit voltage Vinh up to 10V from an off-chip voltage generator and connect to the first number of odd-numbered LBLs respectively via a row of P/D transistors gated by a precharge-control PREo signal and the first number of even-numbered LBLs respectively via another row of P/D transistors gated by a precharge-control PREe signal, wherein the PREo signal and PREe signal are set for controlling precharge of the inhibit voltage Vinh to corresponding LBLs associated with the selected Segment with at least one page selected for performing m-page concurrent and pipeline operation.

35. The HiNAND2 memory chip of claim 34 wherein the inhibit voltage Vinh up to 10V precharged to LBLs of selected Segment provides a program-inhibit voltage larger than Vdd for Program operation in super self-boosting Program-Inhibit (SSBPI) scheme with reduced channel voltage boosting.

36. The HiNAND2 memory chip of claim 34 wherein the LBLs with the precharged Vinh in a selected Segment are configured to partially discharge the Vinh from some LBLs to Vss and partially retain the precharged Vinh for other LBLs by controlling one or more rows of Segment-select transistors to open connection between the LBLs and corresponding GBLs and also controlling one or more rows of P/D transistors to close connection the LBLs to the common power line to convert a partial page data with a Vdd/Vss pattern stored in the data buffer to a corresponding partial page data with a Vinh/Vss pattern stored in the LBLs of the selected Segment for m-page all-BL concurrent and pipeline operation.

37. The HiNAND2 memory chip of claim 7 wherein the common power line associated with a selected Segment is configured to receive an inhibit voltage Vinh up to 10V from an off-chip voltage generator and connect to the first number of first LBLs respectively via a first row of P/D transistors gated by a precharge-control PREa signal, to the first number of second LBLs respectively via a second row of P/D transistors gated by a precharge-control PREb signal, to the first number of third LBLs respectively via a third row of P/D transistors gated by a precharge-control PREc signal, and to the first number of fourth LBLs respectively via a fourth row of P/D transistors gated by a precharge-control PREd signal, wherein the PREa, PREb, PREc, and PREd signals are for controlling precharge of the inhibit voltage Vinh to corresponding LBLs associated with the selected Segment with at least one page selected for performing m-page all-BL concurrent and pipeline operation.

38. The HiNAND2 memory chip of claim 1 wherein random number of pages of NAND cells selected from one or more Blocks of one or more Segments in one or more Groups in the plane are subjected to a concurrent Erase operation by setting WLs of all selected pages to 0V and floating all unselected WLs, SSL lines, GSL lines in any selected and unselected Blocks, and subsequently ramping voltages of the TPW and deep N-well of the plane to about 16-20V.

39. The HiNAND2 memory chip of claim 38 wherein the random number of pages comprise m pages selected on one-page-per-Block basis from m Blocks selected on one-Block-per-Segment from m Segments basis in one or more Groups in the plane so that the m-page concurrent SLC and MLC Program operation can be performed after the concurrent Erase operation.

40. The HiNAND2 memory chip of claim 1 wherein the m pages selected from one or more Blocks in one or more Segments of one or more Groups are subjected to m-page Erase-Verify operation by setting WLs of all selected m pages to 0V, setting unselected WLs in each selected Block to Vread of 6V, setting SSL lines and GSL lines of all selected Blocks to Vdd or Vread, setting unselected WLs, SSL lines and GSL lines of unselected Blocks to 0V, precharging and latching all LBLs associated with the selected Segments to Vinh, enabling a Multiplier, a Sense Amplifier and a Program/Read Buffer in the data buffer, and setting the TPW to 0V and deep N-well to Vdd in the plane.

41. The HiNAND2 memory chip of claim 40 wherein the m-page Erase-Verify operation comprises iterative operation steps of utilizing the Multiplier, the Sense Amplifier and the Program/Read Buffer through a LBL-GBL charge-sharing scheme to determine if the precharged inhibit voltage Vinh on the LBLs in a selected Segment containing one or more pages for Erase-Verify drops to Vss, then floating the WLs corresponding to the one or more pages in the selected Segment to be erase-inhibited; else if the precharged inhibit voltage Vinh on the LBLs in a selected Segment does not drop to Vss, further performing Erase operation on the corresponding one or more pages.

42. The HiNAND2 memory chip of claim 22 wherein the m pages of NAND cells are selected on one-page-per-Block basis from m Blocks selected on one-Block-per-Segment basis from m Segments in one or more Groups in the plane for respectively loading and latching either SLC or MLC (MSB) page data from external Ms to m pseudo CACHEs in 2 m cycles in pipeline manner if the second number of LBLs is twice of the first number of GBLs per page, then the m pages of NAND cells are programmed by performing m-page all-BL SLC or MLC (MSB) Program operation concurrently with full overlapping operation time intervals if all m pages have a same WL address or with partial overlapping operation time intervals if the m pages have random WL addresses.

43. The HiNAND2 memory chip of claim 42 wherein the all-BL SLC or MLC (MSB) Program operation per cell is configured to increase a number of cell logic state from one initial erase state to two logic states including an erase state E-state with a threshold level Vt<0V and an initial program state B'-state with a predetermined minimum Vt value set to be no smaller than a maximum Vt value set for a final lowest program logic state A-state generated in a MLC (LSB) Program operation.

44. The HiNAND2 memory chip of claim 43 wherein the initial program state B'-state comprises a Vt distribution divided to two sections of B1'-state and B2'-state by a Vtbmin value preset for a minimum Vt value of a second program state of a programmed MLC cell, wherein the B1'-state and B2'-state are subjected to a B'-adjustment bit-flipping operation upon loading of MLC (LSB) data to generate a final second program logic state B-state and a final third program logic state C-state in the MLC (LSB) Program operation.

45. The HiNAND2 memory chip of claim 42 wherein the m pages of NAND cells are selected on one-page-per-Block basis from m Blocks selected on one-Block-per-Segment basis from m Segments in one or more Groups in the plane for performing m-page All-BL Program-Verify operation including precharging Vinh to the second number of LBLs associated with respective m pages of the m Segments simultaneously in one cycle, sharing charges associated with the precharged Vinh of each LBL with corresponding connected long GBLs on half-page-by-half-page basis in two cycles, if the second number of LBLs is twice of the first number of GBLs per page.

46. The HiNAND2 memory chip of claim 23 wherein the m pages of NAND cells are selected on one-page-per-Block basis from m Blocks selected on one-Block-per-Segment basis from m Segments in one or more Groups in the plane for sequentially loading and latching the m-page MLC (LSB page) data from external I/Os to m sets of 4 pseudo CACHEs in 2m cycles in pipeline manner if the second number of LBLs is twice of the first number of GBLs per page, each set of 4 pseudo CACHEs including a CACHEcel, a CACHEint, a CACHElsb, and a CACHEmsb.

47. The HiNAND2 memory chip of claim 23 wherein the m pages of NAND cells are selected on one-page-per-Block basis from m Blocks selected on one-Block-per-Segment basis from m Segments in one or more Groups in the plane for performing m-page all-BL MLC Program-Verify operation using a predetermined Vtamin verify voltage to firstly verify an A-state of a final MLC lowest program state by transferring last updated data from the CACHEint per bit to two first storage nodes of Program/Read Buffer in the data buffer, transferring MLC MSB page data from the CACHEmsb per bit to a Sense Amplifier in the data buffer through a Multiplier for amplification and then writing back to the CACHEmsb in same data polarity and transferring into one second storage node of the Program/Read Buffer, and verifying currently updated data from the CACHEcel in the Sense Amplifier per bit against data in both the first storage nodes and a second storage node of the Program/Read Buffer per bit based on Vt distribution of the A-state.

48. The HiNAND2 memory chip of claim 47 wherein the m-page all-BL MLC Program-Verify operation further comprises using a predetermined Vtbmin verify voltage to verify a B-state of a second MLC program state by transferring MLC LSB page data from the CACHElsb per bit to the Sense Amplifier through a Multiplier for amplification and then writing back to the CACHElsb in same data polarity and transferring into one second storage node of the Program/Read Buffer per bit, verifying currently updated data from the CACHEcel per bit in the Sense Amplifier against data in the first storage nodes transferred from the CACHEint and data in second storage node of the Program/Read Buffer per bit based on Vt distribution of the B-state.

49. The HiNAND2 memory chip of claim 47 wherein the m-page all-BL MLC Program-Verify operation further comprises using a predetermined Vtcmin verify voltage to verify a C-state of a third MLC program state by verifying currently updated data from CACHEcel per bit in the Sense Amplifier against only data in the first store nodes transferred from the CACHEint based on Vt distribution of the C-state, updating verified data in the CACHEcel and the CACHEint, and continuously performing next iterative All-BL MLC LSB Program operation based on the updated data in the CACHEcel until the MLC Program-Verify operation is passed.

50. The HiNAND2 memory chip of claim 47 wherein the m-page all-BL MLC Program-Verify operation comprises performing m pages Even-numbered half-page Program-Verify operations and Odd-numbered half-page Program-Verify operations with partially overlapping time intervals on page-by-page basis in a concurrent/pipeline manner and optionally with a reversed sequence of the Even-numbered half-page Program-Verify operation and the Odd-numbered half-page Program-Verify operation once per iterative verify step.

51. The HiNAND2 memory chip of claim 23 wherein the m pages of NAND cells are selected on one-page-per-Block basis from m Blocks selected on one-Block-per-Segment basis from m Segments in one or more Groups in the plane for performing m-page All-BL SLC Read operation by using one pseudo CACHE for storing and latching precharged Vinh data in Even-numbered half page and Odd-numbered half-page of the LBLs in two cycles with partially overlapping time interval in a concurrent/pipeline manner regardless of m random pages or m non-random pages.

52. The HiNAND2 memory chip of claim 23 wherein the m pages of NAND cells are selected on one-page-per-Block basis from m Blocks selected on one-Block-per-Segment basis from m Segments in one or more Groups in the plane for performing m-page all-BL MLC (MSB page) Read operation by using one pseudo CACHE for storing temporary read data for distinguishing an initial program state B'-state from an erase state E-state per cell via Even-numbered half-page and Odd-numbered half-page in two cycles with partially overlapping time intervals in a concurrent/pipeline manner regardless of m random pages or m non-random pages with a condition that each page includes a Flag cell assigned to 1 to indicate each addressed MLC-WL storing 2-Vt of MSB page data.

53. The HiNAND2 memory chip of claim 23 wherein the m pages of NAND cells are selected on one-page-per-Block basis from m Blocks selected on one-Block-per-Segment basis from m Segments in one or more Groups in the plane for performing m-page all-BL MLC (LSB page) Read operation by using three pseudo CACHEs including CACHEcel, CACHEint, and CACHEmsb to distinguish four logic states per cell including an erase state E-state, a first program state A-state, a second program state B-state, and a third program state C-state with partially overlapping time intervals on page-by-page basis in a concurrent/pipeline manner regardless of m random pages or m non-random pages with a condition that each page includes a Flag cell assigned to 0 to indicate each addressed MLC-WL storing 4-Vt of both MSB and LSB page data.

54. The HiNAND2 memory chip of claim 53 wherein the m-page all-BL MLC (LSB page) Read operation comprises page-based operation steps of,
utilizing the CACHEcel and the CACHEint tied as a pair by a row of Segment-divided devices gated by a common TIE signal to simultaneously store and latch temporary read page data via a first predetermined read voltage for distinguishing the E-state from the A-state, the B-state, and the C-state;
setting a common gate signal of the row of Segment-divided devices to Vss to isolate the CACHEint from the CACHEcel;
utilizing the CACHEcel for storing and latching temporary read page data via a second predetermined read voltage for distinguishing the E-state and the A-state from the B-state and the C-state, the page data in the CACHEcel being latched with a MSB page data;
transferring the MSB page data to a Sense Amplifier of the data buffer per bit and writing a page data having same polarities back and latch to the CACHEmsb;
utilizing the CACHEcel for storing and latching temporary read page data via a third predetermined read voltage for distinguishing the E-state, the A-state, and the B-state from the C-state;
restoring the page data in the CACHEint to two first storage nodes of a Program/Read Buffer in the data buffer per bit;
restoring the page data in the CACHEmsb to the Sense Amplifier per bit and transferring to two second storage nodes of the Program/Read Buffer per bit;
restoring the page data in the CACHEcel to the Sense Amplifier per bit;
flipping bit polarity of each B-state bit per cell in the Program/Read Buffer; and
reading out data from the P/RB per bit for to obtain MLC LSB page data.

55. The HiNAND2 memory chip of claim 1 wherein each NAND cell comprises threshold voltage Vt assignments including 2 Vts for storing each SLC bit, 2 Vts for storing each MLC MSB-bit, and 4 Vts for storing both MLC MSB and MLC LSB bits, wherein both 2-Vt SLC bit and 2-Vt MSB bit include two logic states of an erase state and a common transient program state B'-state and two 4-Vt MLC bits include four logic states of an erase state, a first program state, a second program state, and a third program state, the B'-state being initially set to have its Vt minimum value no smaller than Vt maximum of the first program state.

56. The HiNAND2 memory chip of claim 1 wherein the m-page concurrent and pipeline operations are performed by executing a preferred Command sets issued from a Host, the Command sets comprising a Start code followed by m consecutive page Addresses followed by m SLC page data or 2m MLC page data and an End code, wherein m≥1.

57. The HiNAND2 memory chip of claim 1 further comprising a WL HV voltage detector including a dummy WL coupled to a WL HV pump circuit, a differential amplifier circuit having a first input coupled to the dummy WL to receive a WL HV voltage and a second input coupled to a reference voltage generator to receive a reference voltage, the dummy WL being configured to be a middle one of a three-WL layout for simulating a worst-case resistance (R) and capacitance (C) of a real word lines having two neighbors, the differential amplifier circuit detecting the WL HV voltage to reach the reference voltage to trigger a generation of an output EN signal of an one-shot pulse of Vdd.

58. The HiNAND2 memory chip of claim 57 wherein the WL HV voltage comprises a WL program voltage independently generated for tracking voltage of a selected page for initiating a self-timed control during m-page concurrent and pipeline Program operation or separately a WL read voltage independently generated for initiating a self-timed control during m-page concurrent and pipeline Read, Program-Verify, or Erase-Verify operation.

59. The HiNAND2 memory chip of claim 57 wherein the dummy WL is initially set to Vss and is increased as the WL is associated with one of the Program, Read, Program-Verify, and Erase-Verify operation, wherein once the voltage of a selected page is reached the reference voltage, the EN signal of one-shot pulse of Vdd is sent to the Block-decoder for latching voltages for a corresponding set of M WLs, 1 SSL line, and 1 GSL line.

60. The HiNAND2 memory chip of claim 57 wherein the WL HV voltage detector further comprises a function of using a 1V as a reference voltage for tracking discharge of a WL from an initial HV voltage.

61. The HiNAND2 memory chip of claim 1 further comprising a LBL voltage detector including a differential amplifier, a reference voltage generator, and a sense line coupled directly to each common power line per Segment to detect voltages charged in or discharged from either partial or total of the second number of LBLs, the voltages being temporarily charged and latched in corresponding lower-level metal lines as metal parasitic capacitors served as pseudo CACHEs for performing m-page concurrent and pipeline Program, Read, Program-Verify, and Erase-Verify operations.

62. The HiNAND2 memory chip of claim 1 wherein each NAND cell in the plane comprises a high-voltage 2-poly floating-gate NMOS transistor, or an 1-poly charge-trapping MONOS or SONOS transistor, or 2-poly floating-gate or 1-poly charge trapping Nitride layer 3D transistor, or Vertical-gate or Vertical channel 3D NAND transistor.

63. The HiNAND2 memory chip of claim 1 wherein the second number is zero with the LBLs and corresponding Segment-select transistor being removed to form a HiNAND1 array with 1-level BL structure for performing m-page concurrent Program, Read, and Verify operation.

64. A method for operating a HiNAND2 memory chip with two-level bit line (BL) hierarchy array structure during multi-page concurrent SLC or MLC (MSB) Program and Program-Verify operation, the method comprising:
  providing a HiNAND2 memory chip in connection with a host and a flash controller via I/Os circuit, the HiNAND2 memory chip comprising:
    a plane of NAND cells formed on a common Triple-Pwell (TPW) region over a deep-Nwell region on a P-substrate, the plane comprising a first plurality of Groups arranged in column direction, each Group being associated with a first number of global bit lines (GBLs) arranged in the column direction as top-level metal lines and being separated from adjacent Groups by a row of Group-divided devices, each Group comprising a second plurality of Segments arranged in the column direction, each Segment being associated with a second number of local bit lines (LBLs) disposed as lower-level metal lines in parallel to the GBLs and being separated from adjacent Segments by a row of Segment-divided devices, each GBL being coupled to one or more LBLs respectively by one or more Segment-select transistors gated respectively with one or more segment-control SEG signals, the second number of LBLs being coupled to a common power line respectively through a row of precharge/discharge (P/D) transistors commonly gated by corresponding one of precharge-control PRE signals, each Segment comprising a third plurality of Blocks wherein each Block comprises the second number of Strings one-to-one parallelly coupled to the second number of LBLs and each String comprising M cells connected in series and capped by a top String-select transistor and a bottom String-select transistor, the top String-select transistor connecting its drain to one corresponding LBL, the bottom String-select transistor connecting its source to a common source line disposed in parallel to but not connected to the common power line, the second number of Strings in a Block forming M pages of cells respectively gated by M word lines (WLs) and all corresponding top String-select transistors are gated by a SSL line and all corresponding bottom String-select transistors are gated by a GSL line;
  a data buffer configured to store the first number of bits of partial page SLC or MLC data received from external I/Os which are transferred and stored in selected second number of LBLs precharged locally with an inhibit voltage Vinh from the corresponding common power line in one more sequential cycles through the first number of GBLs;
  a Segment-decoder configured with a latch to control one or more SEG signals for controlling connection between each GBL and one or more corresponding LBLs;
  a Block-decoder configured with a latch to connect or disconnect a set of M+2 bus lines shared to m sets of M WLs, 1 SSL line, and 1 GSL line on one-set-per-Block basis, m being an integer equal to 1 or greater;
precharging the inhibit voltage Vinh up to 10V simultaneously in one cycle from the common power line per Segment to the second number of LBLs associated with m pages selected on one-page-per-Block basis from m Blocks selected on one-Block-per-Segment basis from m Segments in one or more Groups in the plane from the common power line per selected Segment, m being an integer greater than one;
loading and latching SLC or MCL (MSB) page data from the data buffer in pipeline manner up to m pages into selected precharged LBLs in 2 or 4 cycles depending on if the second number of LBLs is twice or four times of the first number of GBLs per page, m being an integer greater than 1, each of the m pages being selected on one-page-per-Block basis from m Blocks selected on one-Block-per-Segment basis from m Segments in one or more Groups in the plane;
setting and latching corresponding voltages to m sets of M WLs, 1 SSL line, and 1 GSL line for the m selected Blocks each with one selected page;
selectively discharging-and-retaining the precharged inhibit voltage Vinh in the second number of LBLs on page-by-page basis simultaneously in one cycle;
performing m-page Program concurrently for increasing each cell logic state from one initial erase state to two logic states including an erase state E-state with a threshold level Vt<0V and an initial program state B'-state with a predetermined minimum Vt value set to be no smaller than a maximum Vt value set for a final lowest program logic state A-state to be generated in a MLC (LSB) Program operation;

precharging the Vinh to two sets of the second number of LBLs of two paired Segments and simultaneously in one cycle and latching the precharged Vinh to one set of the second number of LBLs;

sharing charges associated with the precharged Vinh of the other sets of the second number of LBLs respectively with the first number of GBLs in two or four cycles; and using a minimum value of Vt distribution of the B'-state to confirm successful Program.

65. The method of claim 64 wherein performing m-page Program concurrently comprises programming the m pages concurrently with full overlapping operation time intervals if all the m pages have a same WL address or programming the m pages with partial overlapping operation time intervals if the m pages have random WL addresses.

66. The method of claim 64 wherein the second number of LBLs associated with a first/second/third/fourth Segment comprise the second number of metal parasitic capacitors serving as a first/second/third/fourth pseudo CACHE register with the second number of bits, the second Segment being paired with the first Segment by connecting a row of Segment-divided devices and the fourth Segment being paired with the third Segment by connecting another row of Segment-divided devices.

67. The method of claim 66 further comprising using the Segment-decoder per Segment configured to latch the precharged inhibit voltage Vinh in the second number of LBLs associated with the m pages to corresponding m pseudo CACHEs in 2m cycles in pipeline manner.

68. The method of claim 66 wherein either one of the first, the second, the third, and the fourth pseudo CACHE register is termed a CACHEcel using corresponding the second number of metal parasitic capacitors to temporarily store and latch current new SLC page data of the second number of bits whenever a selected page of a selected Block is in the corresponding one of the first, the second, the third, and the fourth Segment, another one of the four pseudo CACHE registers associated with another Segment paired with the Segment having the selected page is termed a CACHEint to temporarily store and latch last one or more partial page transient SLC data of the first number of bits for performing m-page concurrent and pipeline operation, one of remaining two pseudo CACHE registers is termed a CACHEmsb to temporarily store and latch last one or more partial page MLC MSB page data of the first number of bits, and last pseudo CACHE register is termed a CACHElsb to temporarily store and latch last one or more partial page MLC LSB data of the first number of bits for performing m-page all-BL concurrent and pipeline operation.

69. The method of claim 68 wherein the CACHEint is configured to be paired with the CACHEcel by residing respectively in a pair of Segments having each corresponding LBL connected by a Segment-divided device gated by a common TIE signal, wherein the TIE signal is set to be greater than Vinh for concurrently precharging the metal parasitic capacitors associated with the corresponding LBLs and is set to Vss for isolating each other to allow one pseudo CACHE to retain and latch the charges therein while the paired pseudo CACHE to discharge or perform LBL-GBL charge-sharing for m-page concurrent operation.

70. The method of claim 66 wherein each of the first/second/third/fourth pseudo CACHE register is configured to store externally-loaded SLC, MLC MSB, and MLC LSB page data converted to Vinh/Vss pattern, internally-generated transient page data in Vinh/Vss pattern during MLC B'-adjustment before All-BL Program, internally-generated transient page data in Vinh/Vss pattern during MLC Program-Verify, internally-generated page data precharged Vinh; and internally-generated in Vinh/Vss pattern by Read operation.

71. The method of claim 64 wherein the initial program state B'-state comprises a Vt distribution divided to two sections of B1'-state and B2'-state by a Vtbmin value preset for a minimum Vt value of a second program state of a programmed MLC cell, wherein the B1'-state and B2'-state are subjected to a B'-adjustment bit-flipping operation upon loading of MLC (LSB) data to generate a final second program logic state B-state and a final third program logic state C-state in the MLC (LSB) Program operation.

72. The method of claim 64 wherein the second number is twice of the first number so that each GBL per Group is associated with two LBLs per Segment respectively coupled by a first Segment-select transistor gated by a segment-control SEGo signal for an odd-numbered LBL and a second Segment-select transistor gated by a segment-control SEGe signal for an even-numbered LBL.

73. The method of claim 72 wherein the SEGe signal and SEGo signal are independently set with bias conditions of setting the SEGe signal greater than the Vinh and the SEGo signal Vss to select the even-numbered LBLs of one selected Segment only for respectively charge-sharing with the corresponding first number of GBLs; setting the SEGo signal greater than the Vinh and the SEGe signal to Vss to select the odd-numbered LBLs of one selected Segment only for respectively charge-sharing with the corresponding first number of GBLs; setting both the SEGe signal and the SEGo signal to Vss for preventing any LBL-GBL charge-sharing operation.

74. The method of claim 64 wherein the second number is four times of the first number so that each GBL per Group is associated with four LBLs per Segment respectively coupled by a first Segment-select transistor gated by a segment-control SEGa signal for a first LBL, a second Segment-select transistor gated by a segment-control SEGb signal for a second LBL, a third Segment-select transistor gated by a segment-control SEGc signal for a third LBL, and a fourth Segment-select transistor gated by a segment-control SEGd signal for a fourth LBL, wherein each only one of the SEGa, SEGb, SEGc, and SEGd signals is set to be greater than Vinh for allow corresponding ¼ number of LBLs of one selected Segment to perform LBL-GBL charge-sharing with the corresponding first number of GBLs.

75. The method of claim 64 wherein each Group-divided device, each Segment-selected device, each Segment-divided device, each P/D transistor, each top String-select device, and each bottom String-select device is a same type NMOS 1-poly medium-high-voltage (MHV) transistor.

76. The method of claim 64 wherein M is selected from 8, 16, 32, 64, 128 or other integer numbers depending on NAND design density.

77. The method of claim 64 wherein the second number is 65,536 for 8 KB Page size and configured to couple with the data buffer scaled down to 4 KB size or 2 KB size.

78. The method of claim 64 wherein the data buffer comprises three circuits with same bit length, including a Multiplier circuit per bit for a first amplification of a small analog cell signal to an multiplied analog signal, a latch-type Sense Amplifier (SA) circuit per bit for a second analog amplification of the multiplied analog signal and convert to a full digital signal, and a Program/Read buffer (P/RB) circuit per bit for temporarily storing 1-bit data.

79. The method of claim 78 wherein the data buffer comprises total number of bits equal to the first number of GBLs, the total number of bits in the data buffer being reduced by half if the second number of LBLs represented to a number of NAND cells in a page is twice of the first number of GBLs, the total number of bits being further scaled down to ¼ if the second number of LBLs is four times of the first number of GBLs.

80. The method of claim 78 wherein the P/RB circuit is configured to set "0" bit data to pass Vss voltage to channel of a program cell through each corresponding GBL and LBL and to set "1" bit data to pass Vdd voltage to channel of a program-inhibit cell through each corresponding GBL and LBL.

81. The method of claim 78 wherein the P/RB circuit comprises a pair of latch nodes as a first pair of storage nodes and a pair of gated capacitors as a second storage nodes so that an extra temporary storage bits are created to allow more flexible m-page all-BL concurrent MLC MSB and LSB Program-Verify and bit flipping logic operations.

82. The method of claim 78 wherein the Multiplier circuit comprises an input port receiving a first analog voltage coupled to every drain node of N+1 first transistors and an output port outputting a second analog voltage from a drain node of a first one of the N+1 first transistors, the Multiplier circuit further comprises N capacitors being respectively inserted between two drain nodes of two adjacent first transistors, the Multiplier circuit further comprises N second transistors being respectively coupled drain nodes of last N first transistors and ground, thereby outputting the second analog voltage equal to N-fold of the first analog voltage, where N is an integer ≥1.

83. The method of claim 64 wherein the Segment-decoder comprises a three-input pre-decoder and n number of latch circuits and a local HV pump circuit with n SEGp inputs, a VHH input, and corresponding n outputs of n SEG signals respectively for selecting partial section of a Segment, and further comprises a plurality of control signals to respectively set and clear the n latch circuits and enable and disable the local HV pump circuit to determine a HXS node voltage for controlling voltage charging, latching, and discharging between the n SEGp inputs and corresponding n outputs connected to the n SEG signals per Segment for performing multi-page all-BL Program, Program-Verify, Erase-Verify, and Read operation.

84. The method of claim 83 wherein the Segment-decoder comprises a function to instantly set the HXS node to Vss by setting one ESB signal of the plurality control signals with one-shot pulse of Vdd for a preset duration when an unintentional Vdd power lose is detected, allowing the n SEG signals to be set to Vss so that inhibit voltage Vinh precharged to the LBLs can be immediately saved after unexpected power-down but can be reused to continue the operations after power back within a certain idle time.

85. The method of claim 64 wherein the Block-decoder comprises a latch circuit coupled with one pre-decoder with three address inputs and a local HV pump circuit with a set of M+2 bus lines inputs, a VHH input, and corresponding M+2 outputs coupled to one set of M WLs, SSL, and GSL lines per Block, and further comprises a plurality of control signals to set and clear the latch circuit and enable and disable the local HV pump circuit to determine a HXD node voltage for controlling voltage charging, latching, and discharging between the M+2 bus lines inputs and M+2 outputs connected to a set of M WLs, SSL, and GSL lines of a selected Block for m-page all-BL Program, Program-Verify, Erase-Verify, and Read operation.

86. The method of claim 85 wherein the HXD node is controlled to be a program voltage Vpgm ramped to 15~25V plus a cell threshold Vt margin during a SLC or MLC Program operation, or to be a read voltage of Vread of 6-8V plus a Vt margin during a SLC or MLC Read operation or a SLC or MLC Program-Verify operation or a SLC or MLC random-page Erase-Verify operation, or to be Vss for latching voltages for a set of M WLs, SSL, and GSL lines of a selected Block.

87. The method of claim 85 wherein the Block-decoder further comprises a function to immediately set the HXD node to Vss by setting an ENB signal of the plurality of control signals with one-shot pulse of Vdd for a preset duration when an unintentional Vdd power lose is detected, allowing the voltages of one set of M WLs, SSL, and GSL lines of the selected Block to be locked to continue last operation.

88. The method of claim 64 wherein sharing charges comprises connecting each of the first number of GBLs of a selected Group to one of the second number of LBLs of a selected Segment in the selected Group via one Segment-select transistor and further optionally connecting the GBL to other GBLs associated with other Groups by turning on corresponding Group-divided devices so that charges in a lower-level metal parasitic capacitor associated with the one LBL in the selected Segment are shared with one or more top-level metal parasitic capacitors respectively associated with one or more connected GBLs of the selected Groups and connected other Groups.

89. The method of claim 64 wherein precharging the inhibit voltage Vinh comprises charging each lower-level metal parasitic capacitor associated with one of the second number of LBLs from the common power line per Segment by turning on a corresponding P/D transistor, the inhibit voltage Vinh being larger than Vdd up to 10V for using a super self-boosting Program-Inhibit (SSBPI) scheme in NAND cell Program operation with reduced channel voltage boosting.

90. The method of claim 88 wherein sharing charges further comprises connecting ½ or ¼ of the second number of LBLs in one selected Segment with the corresponding the first number of GBLs by turning on corresponding one row of Segment-select transistors, depending on whether the second number is twice or four times of the first number, while disconnecting rest of ½ or ¾ of the second number of LBLs with the corresponding GBLs by turning off the remain one or three rows of Segment-select transistors to retain the inhibit voltage Vinh therein without charge-sharing but ready for subsequent charge-sharing operation.

91. The method of claim 89 wherein the inhibit voltage Vinh comprises a variable value ranging from Vdd for the selected Segment in a selected Group nearest to the data buffer to 10V for the selected Segment in a selected Group farthest to the data buffer to save LBL precharge power consumption, wherein the Vinh value is one between Vdd and 10V for the selected Segment in a selected Group between the nearest one and farthest one depending on how many number of Groups are connected from the selected Group to the data buffer.

92. The method of claim 64 wherein the plane comprises at least one hybrid Block having interleavely mixed pages for respectively storing SLC and MLC data for reducing MLC WL-WL coupling effect.

93. The method of claim 92 wherein the hybrid Block is configured to place all SLC WLs in odd-numbered WLs thereof and all MLC WLs in even-numbered WLs thereof.

94. The method of claim 64 wherein the first number of GBLs are top-level metal lines in parallel to the column direction characterized by a pitch size of 4 or 8 base units and a length of one Group size and the second number of LBLs are lower-level metal lines below the GBLs in parallel to the column direction characterized by a pitch size of 2 base units and a length of one Segment.

95. The method of claim 64 wherein each common power line per Segment and each common source line per Block are conductive lines made of metal or conductive polymer formed below the LBLs and perpendicular to the column direction.

96. The method of claim 64 wherein selectively discharging-and-retaining precharged inhibit voltage comprises controlling one or more rows of Segment-select transistors to open connection between the LBLs and corresponding GBLs and also controlling one or more rows of P/D transistors to close connection the LBLs to the common power line to partially discharge the Vinh from some LBLs to Vss and partially retain the precharged Vinh for rest LBLs to convert ½ or ¼ page data with a Vdd/Vss pattern stored in the data buffer to a corresponding ½ or ¼ page data with a Vinh/Vss pattern latched in the corresponding LBLs of the selected Segment for m-page all-BL concurrent and pipeline operation.

97. A method for operating a HiNAND2 memory chip with two-level bit line (BL) hierarchy array structure during multi-page concurrent MLC (LSB) Program and Program-Verify operation, the method comprising:
providing a HiNAND2 memory chip in connection with a host and a flash controller via I/Os circuit, the HiNAND2 memory chip comprising:
a plane of NAND cells formed on a common Triple-Pwell (TPW) region over a deep-Nwell region on a P-substrate, the plane comprising J Groups arranged in column direction, each Group being associated with N global bit lines (GBLs) arranged in the column direction as top-level metal lines and being separated from adjacent Groups by a row of Group-divided devices, each of the N Groups comprising L Segments arranged in the column direction, each of the L Segments being associated with 2N local bit lines (LBLs) disposed as lower-level metal lines in parallel to the GBLs and being separated from adjacent Segments by a row of Segment-divided devices, the N GBLs being coupled to N odd-numbered LBLs and N even-numbered LBLs respectively by a first row of N Segment-select transistors gated by a segment-control SEGo signal and a second row of N Segment-select transistors gated by a segment-control SEGe signal, the N odd/even-numbered LBLs being coupled to a common power line respectively through a first/second row of N Precharge/Discharge (P/D) transistors commonly gated by a precharge PREo/PREe signal, each Segment being paired with a neighboring Segment by a row of Segment-divided devices commonly gated by a segment-connection TIE signal, each Segment comprising K Blocks wherein each Block comprises the 2N Strings one-to-one parallelly coupled to the 2N LBLs and each String comprising M cells connected in series and capped by a top String-select transistor and a bottom String-select transistor, the top String-select transistor connecting its drain to one corresponding LBL, the bottom String-select transistor connecting its source to a common source line disposed in parallel to but not connected to the common power line, the 2N Strings in a Block forming M pages of cells in row direction respectively gated by M word lines (WLs) and all corresponding top String-select transistors are gated by a SSL line and all corresponding bottom String-select transistors are gated by a GSL line, J, L, K, N, being integer chosen based on NAND cell density;
a data buffer configured to store N-bits of partial page SLC or MLC data received from external I/Os which are further transferred and stored in selected 2N LBLs locally precharged with an inhibit voltage Vinh from the corresponding common power line in one more sequential cycles through the N GBLs;
a Segment-decoder configured with two latches to respectively control the SEGo signal and the SEGe signal for controlling connection between each GBL and one odd-numbered LBL and one even-numbered LBL;
a Block-decoder configured with one latch to connect or disconnect a set of M+2 bus lines shared to m sets of M WLs, 1 SSL line, and 1 GSL line on one-set-per-Block basis, m being an integer equal to 1 or greater;
precharging, per one selected page in one Segment, four sets of LBLs associated with two paired Segments with the inhibit voltage Vinh up to 10V simultaneously in one cycle from one common power line per Segment, each set of LBL being associated with a pseudo CACHE;
loading and latching MCL (LSB) page data in pipeline manner in two cycles per page up to m pages from the data buffer by utilizing four (two paired) respective pseudo CACHEs with precharged Vinh, m being an integer larger than 1, each of the m pages being selected on one-page-per-Block basis from m Blocks selected on one-Block-per-Segment basis from m Segments in one or more Groups in the plane;
setting and latching corresponding voltages to m sets of M WLs, 1 SSL line, and 1 GSL line for the m Blocks each with one selected page;
selectively discharging-and-retaining the precharged inhibit voltage Vinh in the 2N LBLs on page-by-page basis for the m pages simultaneously in one cycle;
performing m-page Program concurrently for increasing each cell logic state from one initial erase state to two logic states including an erase state E-state with a threshold level Vt<0V and an initial program state B'-state with a predetermined minimum Vt value set to be no smaller than a maximum Vt value set for a final lowest program logic state A-state.

98. The method of claim 97 wherein performing m-page Program further comprises adjusting the initial program state B'-state comprising a Vt distribution divided to two sections of B1'-state and B2'-state by a Vtbmin value;
Converting B1'-state and B2'-state to generate a final second program logic state B-state and a final third program logic state C-state.

99. The method of claim 98 further comprising operation per page before loading:
discharging the Vinh in a first paired CACHE, a CACHEcel with the selected page being set with a WL voltage at a minimum Vt value Vtamin set for the A-state and a CACHEint paired with the CACHEcel, to store and latch updated data therein;

discharging the Vinh in the CACHEcel with the selected page being set with a WL voltage at a minimum Vt value set for a final second program logic state B-state while retaining and latching data in the CACHEint.

100. The method of claim 99 further comprising:
transferring last data from the CACHEint per bit to two first storage nodes of a Program/Read Buffer in the data buffer;
transferring MLC MSB page data previously stored in one of second paired CACHE, CACHEmsb, per bit to a Sense Amplifier in the data buffer through a Multiplier for amplification and then writing back to the CACHEmsb in same data polarity, and further transferring into one second storage node of the Program/Read Buffer;
verifying currently updated data from the CACHEcel in the Sense Amplifier per bit using the Vtamin as a verify voltage against data in both the first storage nodes and a second storage node of the Program/Read Buffer per bit based on Vt distribution of the A-state.

101. The method of claim 100 further comprising:
transferring MLC LSB page data previously stored in another one of the second paired CACHE, CACHElsb, per bit to the Sense Amplifier through a Multiplier for amplification and then writing back to the CACHElsb in same data polarity and transferring into one second storage node of the Program/Read Buffer per bit;
verifying currently updated data from the CACHEcel per bit in the Sense Amplifier using a predetermined Vtbmin verify voltage against data in the first storage nodes transferred from the CACHEint and data in second storage node of the Program/Read Buffer per bit based on Vt distribution of the B-state.

102. The method of claim 101 further comprising:
verifying currently updated data from the CACHEcel per bit in the Sense Amplifier using a predetermined Vtcmin verify voltage against only data in the first store nodes transferred from the CACHEint based on Vt distribution of the C-state;
updating verified data in the CACHEcel and the CACHEint;
continuously performing next iterative All-BL MLC LSB Program operation based on the updated data in the CACHEcel until the MLC Program-Verify operation is passed.

103. The method of claim 97 wherein each Group-divided device, each Segment-selected device, each Segment-divided device, each P/D transistor, each top String-select device, and each bottom String-select device is a same type NMOS 1-poly medium-high-voltage (MHV) transistor.

104. The method of claim 97 wherein M is selected from 8, 16, 32, 64, 128 or other integer numbers depending on NAND design density.

105. The method of claim 97 wherein N-bit is assigned to be 4 KB with 2N-bit 8 KB being set as a page size so that the data buffer is scaled down by half.

106. The method of claim 97 wherein the data buffer comprises three circuits with same bit length, including a Multiplier circuit per bit for a first amplification of a small analog cell signal to an multiplied analog signal, a latch-type Sense Amplifier (SA) circuit per bit for a second analog amplification of the multiplied analog signal and convert to a full digital signal, and a Program/Read buffer (P/RB) circuit per bit for temporarily storing 1-bit data.

107. The method of claim 106 wherein the P/RB circuit is configured to set "0" bit data to pass Vss voltage to channel of a program cell through each corresponding GBL and LBL and to set "1" bit data to pass Vdd voltage to channel of a program-inhibit cell through each corresponding GBL and LBL.

108. The method of claim 106 wherein the P/RB circuit comprises a pair of latch nodes as a first pair of storage nodes and a pair of gated capacitors as a second storage nodes so that an extra temporary storage bits are created to allow more flexible m-page all-BL concurrent MLC MSB and LSB Program-Verify and bit flipping logic operations.

109. The method of claim 106 wherein the Multiplier circuit comprises an input port receiving a first analog voltage coupled to every drain node of N+1 first transistors and an output port outputting a second analog voltage from a drain node of a first one of the N+1 first transistors, the Multiplier circuit further comprises N capacitors being respectively inserted between two drain nodes of two adjacent first transistors, the Multiplier circuit further comprises N second transistors being respectively coupled drain nodes of last N first transistors and ground, thereby outputting the second analog voltage equal to N-fold of the first analog voltage, where N is an integer ≥1.

110. The method of claim 97 wherein the Segment-decoder comprises a three-input pre-decoder and n number of latch circuits and a local HV pump circuit with a SEGpo input and a SEPpe input, a VHH input, and corresponding n outputs of the SEGo signal and the SEGe signal respectively for selecting odd-numbered section of a Segment and even-numbered section of the Segment, and further comprises a plurality of control signals to respectively set and clear the n latch circuits and enable and disable the local HV pump circuit to determine a HXS node voltage for controlling voltage charging, latching, and discharging between the two SEGpo, SEGpe inputs and corresponding two outputs connected to the two SEGo, SEGe signals per Segment for performing multi-page all-BL Program, Program-Verify, Erase-Verify, and Read operation.

111. The method of claim 110 wherein the Segment-decoder comprises a function to instantly set the HXS node to Vss by setting one ESB signal of the plurality control signals with one-shot pulse of Vdd for a preset duration when an unintentional Vdd power lose is detected, allowing the two SEG signals to be set to Vss so that inhibit voltage Vinh precharged to the LBLs can be immediately saved after unexpected power-down but can be reused to continue the operations after power back within a certain idle time.

112. The method of claim 97 wherein the Block-decoder comprises a latch circuit coupled with one pre-decoder with three address inputs and a local HV pump circuit with a set of M+2 bus lines inputs, a VHH input, and corresponding M+2 outputs coupled to one set of M WLs, SSL, and GSL lines per Block, and further comprises a plurality of control signals to set and clear the latch circuit and enable and disable the local HV pump circuit to determine a HXD node voltage for controlling voltage charging, latching, and discharging between the M+2 bus lines inputs and M+2 outputs connected to a set of M WLs, SSL, and GSL lines of a selected Block for m-page all-BL Program, Program-Verify, Erase-Verify, and Read operation.

113. The method of claim 112 wherein the HXD node is controlled to be a program voltage Vpgm ramped to 15~25V plus a cell threshold Vt margin during a SLC or MLC Program operation, or to be a read voltage of Vread of 6-8V plus a Vt margin during a SLC or MLC Read operation or a SLC or MLC Program-Verify operation or a SLC or MLC random-page Erase-Verify operation, or to be Vss for latching voltages for a set of M WLs, SSL, and GSL lines of a selected Block.

114. The method of claim 112 wherein the Block-decoder further comprises a function to immediately set the HXD node to Vss by setting an ENB signal of the plurality of control signals with one-shot pulse of Vdd for a preset duration when an unintentional Vdd power lose is detected, allowing the voltages of one set of M WLs, SSL, and GSL lines of the selected Block to be locked to continue last operation.

115. The method of claim 97 wherein the inhibit voltage Vinh comprises a variable value ranging from Vdd for the selected Segment in a selected Group nearest to the data buffer to 10V for the selected Segment in a selected Group farthest to the data buffer to save LBL precharge power consumption, wherein the Vinh value is one between Vdd and 10V for the selected Segment in a selected Group between the nearest one and farthest one depending on how many number of Groups are connected from the selected Group to the data buffer.

116. The method of claim 97 wherein the plane comprises at least one hybrid Block having interleavely mixed pages for respectively storing SLC and MLC data for reducing MLC WL-WL coupling effect.

117. The method of claim 116 wherein the hybrid Block is configured to place all SLC WLs in odd-numbered WLs thereof and all MLC WLs in even-numbered WLs thereof.

118. The method of claim 97 wherein the N GBLs are top-level metal lines in parallel to the column direction characterized by a pitch size of 4 or 8 base units and a length of one Group size and the 2N LBLs are lower-level metal lines below the GBLs in parallel to the column direction characterized by a pitch size of 2 base units and a length of one Segment.

119. The method of claim 97 wherein each common power line per Segment and each common source line per Block are conductive lines made of metal or conductive polymer formed below the LBLs and perpendicular to the column direction.

120. The method of claim 97 wherein each NAND cell in the plane comprises a high-voltage 2-poly floating-gate NMOS transistor, or an 1-poly charge-trapping MONOS or SONOS transistor, or 2-poly floating-gate or 1-poly charge trapping Nitride layer 3D transistor, or Vertical-gate or Vertical channel 3D NAND transistor.

121. A method for operating a HiNAND2 memory chip with two-level bit line (BL) hierarchy array structure during multi-page concurrent SLC and MLC Read operation, the method comprising:
providing a HiNAND2 memory chip in connection with a host and a flash controller via I/Os circuit, the HiNAND2 memory chip comprising:
a plane of NAND cells formed on a common Triple-Pwell (TPW) region over a deep-Nwell region on a P-substrate, the plane comprising J Groups arranged in column direction, each Group being associated with N global bit lines (GBLs) arranged in the column direction as top-level metal lines and being separated from adjacent Groups by a row of Group-divided devices, each of the N Groups comprising L Segments arranged in the column direction, each of the L Segments being associated with 2N local bit lines (LBLs) disposed as lower-level metal lines in parallel to the GBLs and being separated from adjacent Segments by a row of Segment-divided devices, the N GBLs being coupled to N odd-numbered LBLs and N even-numbered LBLs respectively by a first row of N Segment-select transistors gated by a segment-control SEGo signal and a second row of N Segment-select transistors gated by a segment-control SEGe signal, the N odd/even-numbered LBLs being coupled to a common power line respectively through a first/second row of N Precharge/Discharge (P/D) transistors commonly gated by a precharge-control PREo/PREe signal, each Segment being paired with a neighboring Segment by a row of Segment-divided devices commonly gated by a segment-connection TIE signal, each Segment comprising K Blocks wherein each Block comprises the 2N Strings one-to-one parallelly coupled to the 2N LBLs and each String comprising M cells connected in series and capped by a top String-select transistor and a bottom String-select transistor, the top String-select transistor connecting its drain to one corresponding LBL, the bottom String-select transistor connecting its source to a common source line disposed in parallel to but not connected to the common power line, the 2N Strings in a Block forming M pages of cells in row direction respectively gated by M word lines (WLs) and all corresponding top String-select transistors are gated by a SSL line and all corresponding bottom String-select transistors are gated by a GSL line, J, L, K, N, being integer chosen based on NAND cell density;
a data buffer configured to store N-bits of partial page SLC or MLC data received from external I/Os which are further transferred and stored in selected 2N LBLs locally precharged with an inhibit voltage Vinh from the corresponding common power line in one more sequential cycles through the N GBLs;
a Segment-decoder configured with two latches to respectively control the SEGo signal and the SEGe signal for controlling connection between each GBL and one odd-numbered LBL and one even-numbered LBL;
a Block-decoder configured with one latch to connect or disconnect a set of M+2 bus lines shared to m sets of M WLs, 1 SSL line, and 1 GSL line on one-set-per-Block basis, m being an integer equal to 1 or greater;
precharging the 2N LBLs associated with a selected page per Segment up to m pages with the inhibit voltage Vinh up to 10V simultaneously in one cycle from one common power line per Segment, the inhibit voltage Vinh being stored and latched in 2N metal parasitic capacitors formed by the 2N LBLs serving as a pseudo CACHE;
discharging the Vinh charge of the pseudo CACHE in the selected Segment selectively with a predetermined VR1 read voltage being applied to each selected page;
performing charge-sharing between the 2N LBLs per Segment and the data buffer via N GBLs in two cycles while identifying cells with an initial program state with Vt>0 in each page.

122. The method of claim 121 wherein the initial program state is a transient state B'-state for reading MLC (MSB) data utilizing one pseudo CACHE for storing and latching temporary data for using the predetermined VR1 read voltage to distinguish the B'-state from an erase state E-state per cell on half-page basis in two cycles, wherein the B'-state is characterized by a predetermined minimum Vt value set to be no smaller than a maximum Vt value set for a final lowest program logic state A-state for MLC (LSB) data, with partially overlapping time intervals in a concurrent/pipeline manner regardless of m random pages or m non-random pages with a condition that each page includes a Flag cell assigned to 1 to indicate each addressed MLC-WL storing 2-Vt of MSB page data.

123. The method of claim 122 further comprising:

utilizing three pseudo CACHEs respectively associated three Segments to precharge, latch, and discharge temporary read data for reading m pages of MLC (LSB page) data and using the predetermined VR1 read voltage, a predetermined VR2 read voltage, and a predetermined VR3 read voltage to distinguish four logic states per cell including an erase state E-state, a first program state A-state, a second program state B-state, and a third program state C-state, wherein the B-state and the C-state are generated by adjusting the initial program state B'-state through one or more bit-flipping operation, with a condition that each page includes a Flag cell assigned to 0 to indicate each addressed MLC-WL storing 4-Vt of both MSB and LSB page data.

124. The method of claim 123 further comprising:

utilizing a first CACHEcel and a second CACHEint respectively associated with two Segments tied as a pair by a row of Segment-divided devices commonly gated by the TIE signal to simultaneously store and latch temporary read MLC (LSB) page data via the VR1 read voltage for distinguishing the E-state from the A-state, the B-state, and the C-state;

setting the TIE signal to Vss to isolate the second CACHEint from the first CACHEcel;

utilizing the first CACHEcel for storing and latching temporary read page data via the VR2 read voltage for distinguishing the E-state and the A-state from the B-state and the C-state, the page data in the first CACHEcel being latched with a MSB page data;

transferring the MSB page data to a Sense Amplifier of the data buffer per bit and writing a page data having same polarities back and latch to a third CACHEmsb associated with a third Segment not paired with the two Segments;

utilizing the first CACHEcel for storing and latching temporary read page data via the VR3 read voltage for distinguishing the E-state, the A-state, and the B-state from the C-state;

restoring the page data in the second CACHEint to two first storage nodes of a Program/Read Buffer in the data buffer per bit;

restoring the page data in the third CACHEmsb to the Sense Amplifier per bit and transferring to two second storage nodes of the Program/Read Buffer per bit;

restoring the page data in the first CACHEcel to the Sense Amplifier per bit;

flipping bit polarity of each B-state bit per cell in the Program/Read Buffer; and reading out data from the P/RB per bit for to obtain MLC LSB page data.

* * * * *